United States Patent [19]

Brown et al.

[11] 4,392,201
[45] Jul. 5, 1983

[54] DIAGNOSTIC SUBSYSTEM FOR A CACHE MEMORY

[75] Inventors: Richard P. Brown, Acton; George J. Barlow, Tewksbury; Arthur Peters, Sudbury, all of Mass.

[73] Assignee: Honeywell Information Systems Inc., Waltham, Mass.

[21] Appl. No.: 221,855

[22] Filed: Dec. 31, 1980

[51] Int. Cl.³ .................. G06F 13/00; G06F 13/06
[52] U.S. Cl. .................................................. 364/200
[58] Field of Search ... 364/200 MS File, 900 MS File

[56] References Cited
U.S. PATENT DOCUMENTS

| | | | |
|---|---|---|---|
| 4,075,686 | 2/1978 | Calle et al. | 364/200 |
| 4,084,236 | 4/1978 | Chelberg et al. | 364/200 |
| 4,149,239 | 4/1979 | Jenkins et al. | 364/200 |
| 4,195,341 | 3/1980 | Joyce et al. | 364/200 |
| 4,195,343 | 3/1980 | Joyce | 364/200 |

Primary Examiner—Mark E. Nusbaum
Assistant Examiner—Mark P. Watson
Attorney, Agent, or Firm—John S. Solakian; Nicholas Prasinos

[57] ABSTRACT

A cache memory wherein data words identified by odd address numbers are stored separately from data words identified by even address numbers. A group of diagnostic control registers supply signals for controlling the testing of the cache within the cache memory to determine the operability of the individual elements included in the cache memory.

12 Claims, 115 Drawing Figures

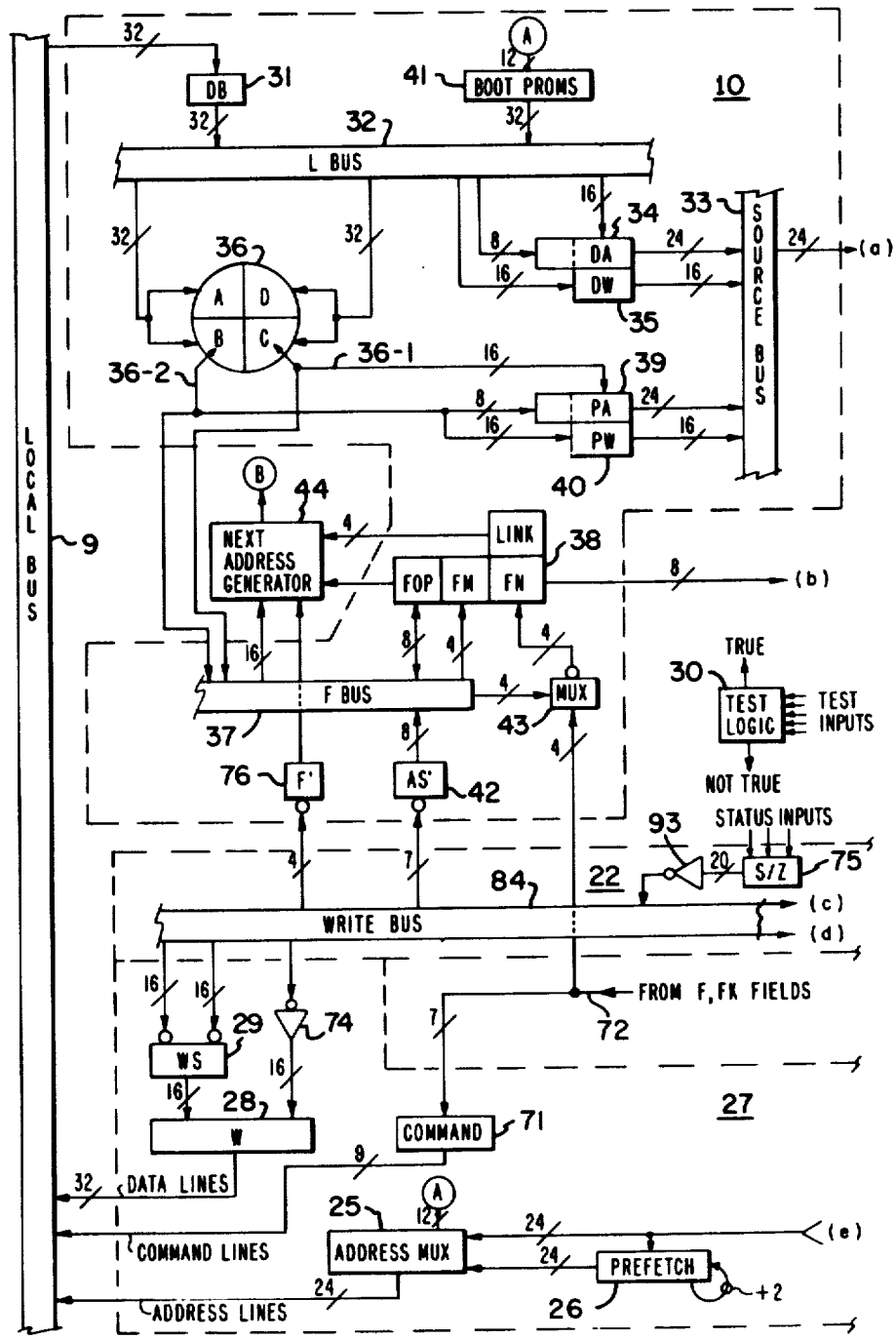
FIG. 2 (SHEET 1 OF 2)

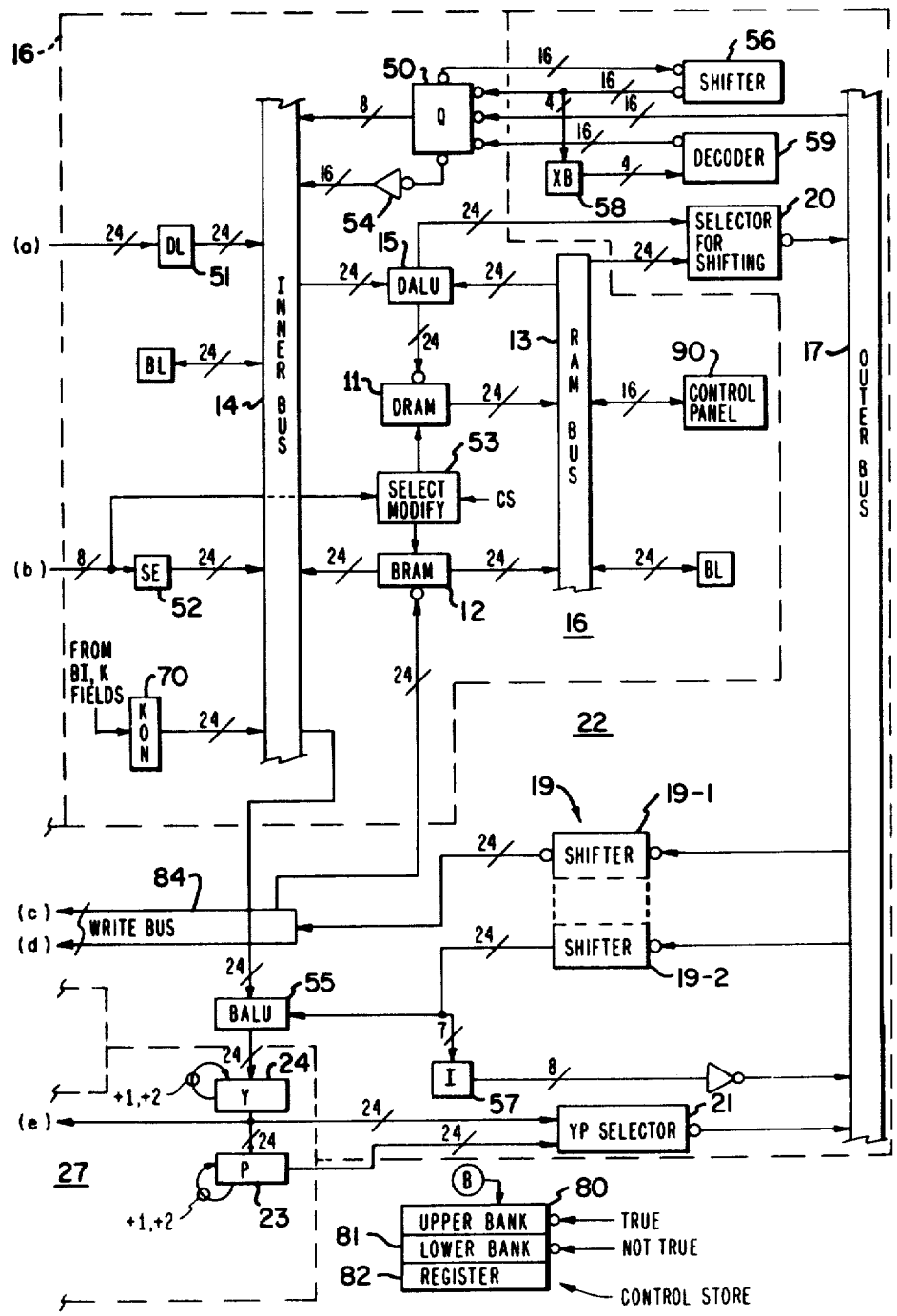
FIG. 2 SHEET 2 OF 2

|    | LOWER BANK | UPPER BANK |
|----|-----------|------------|
| X0 | NA(1-10)  | NA(1-9),NA(A) |
| X1 | NA(1-10)  | NA(1-9),NA($\overline{A}$) |
| XA | NA(1-10)  | NA(1,2),XA PROMS(5)(3-10) |
| XB | NA(1-10)  | NA(1,2),110,F(12),XB PROM(1)(7-10) |
| XR | NA(1-10)  | NA(1,2),000,CF=(KOP),XR PROM(1)(7-10) |
| XE | NA(1-10)  | NA(1,2),KOP,F(0),#=0,F(4-8)(6-10) |
| XW | NA(1-10)  | NA(1,2),0,OD SIZ PROM(1)(4-6), 1,OD/ADDR. PROM(8), XW PROM(9,10) |
| XL | NA(1-10)  | NA(1-6), LINK(7-10) |

FIG. 6

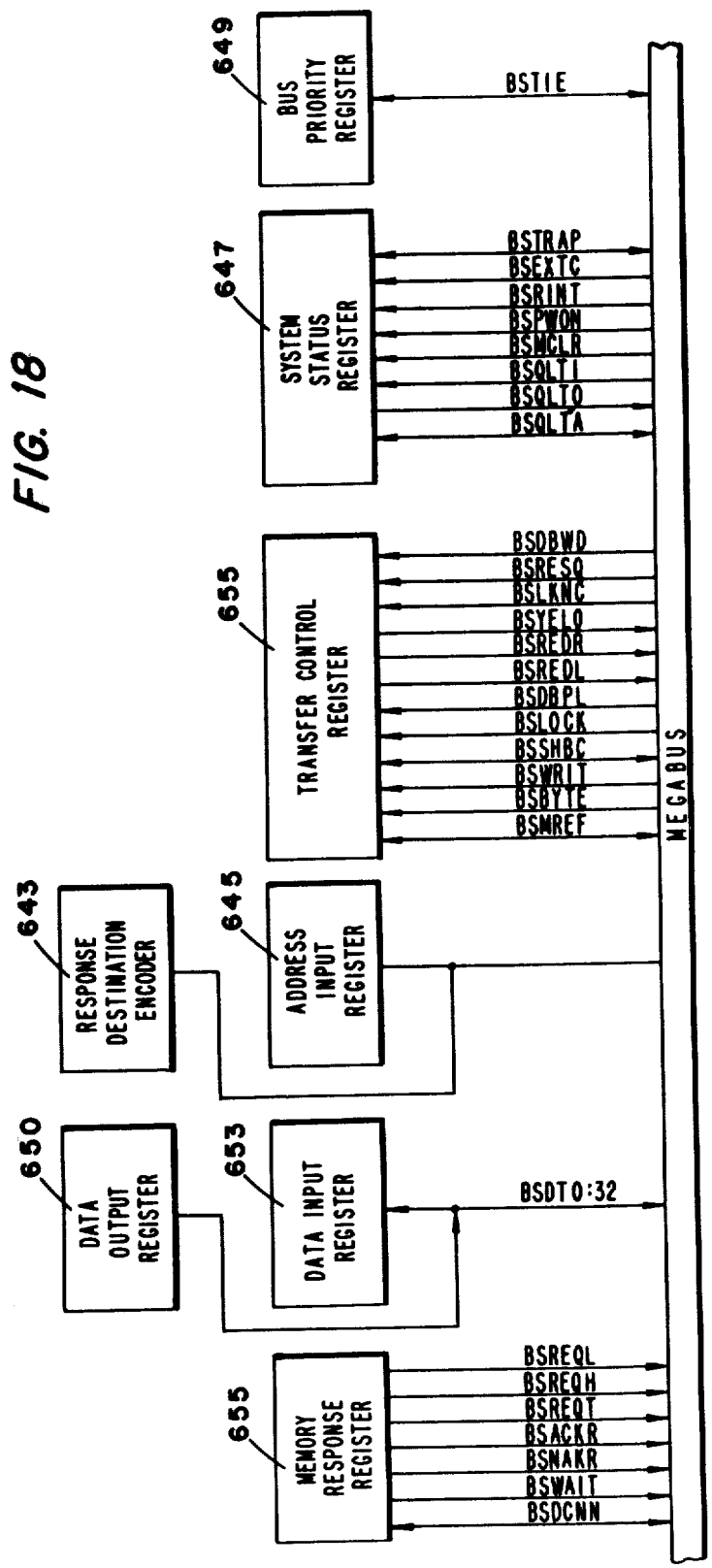

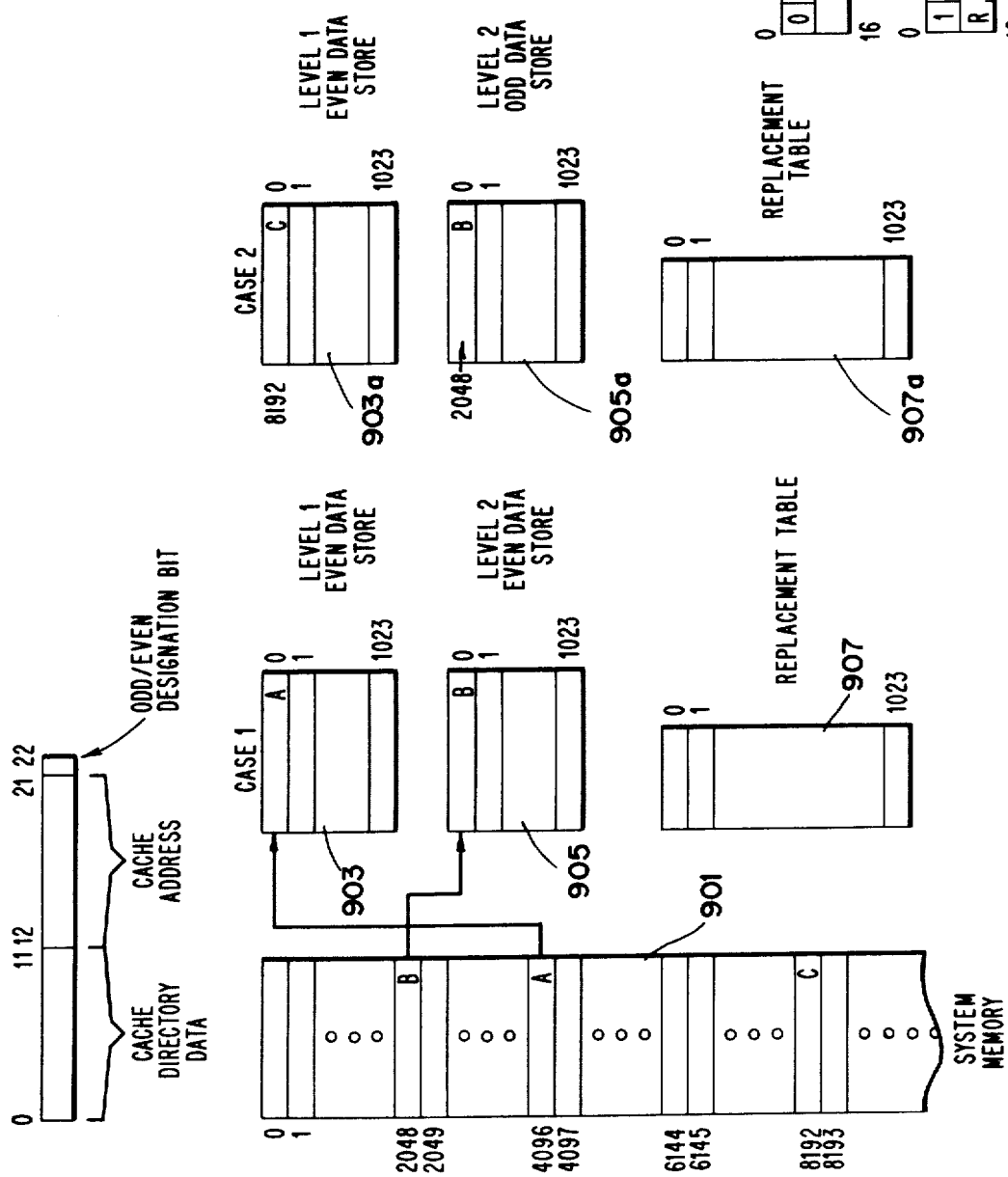

FIG. 25 b
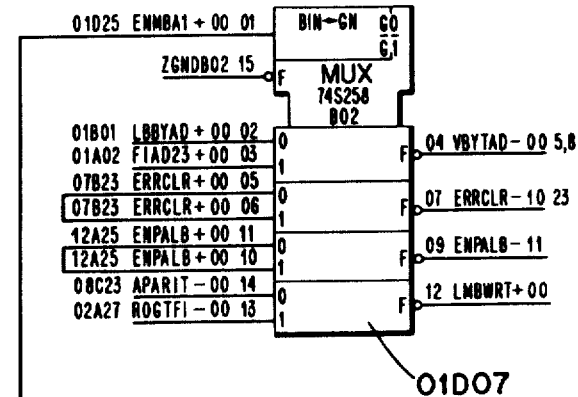
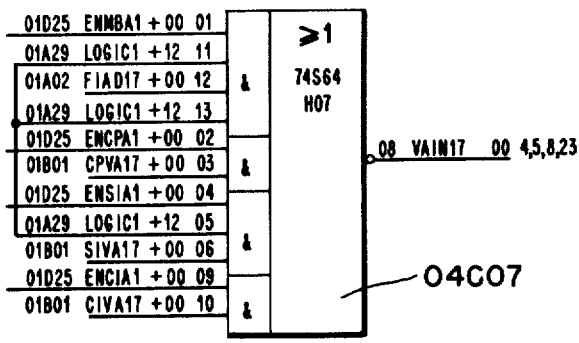
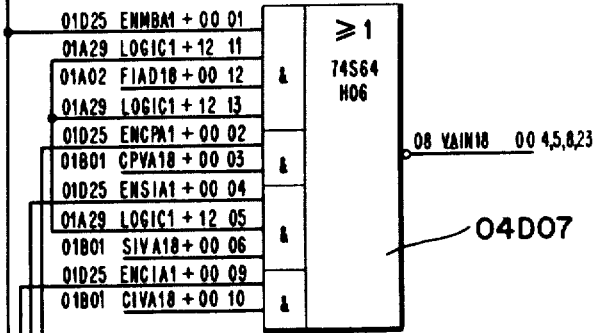
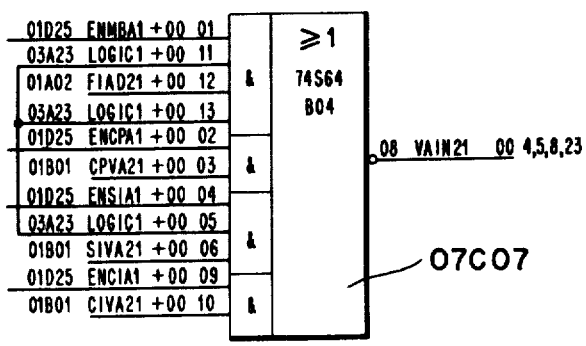
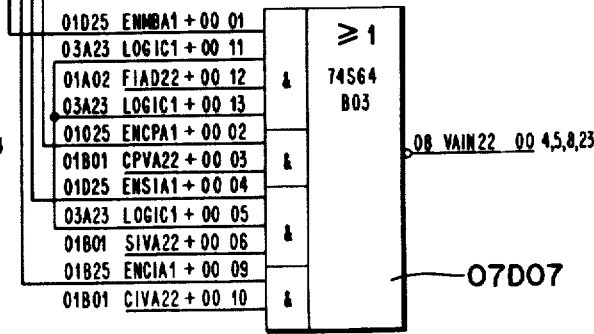

FIG. 42b
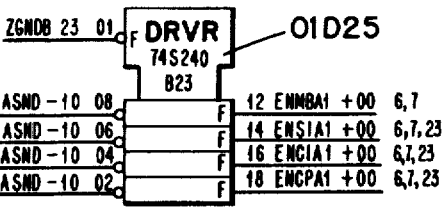
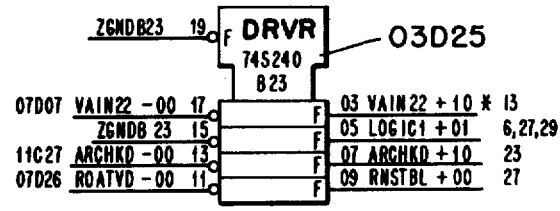
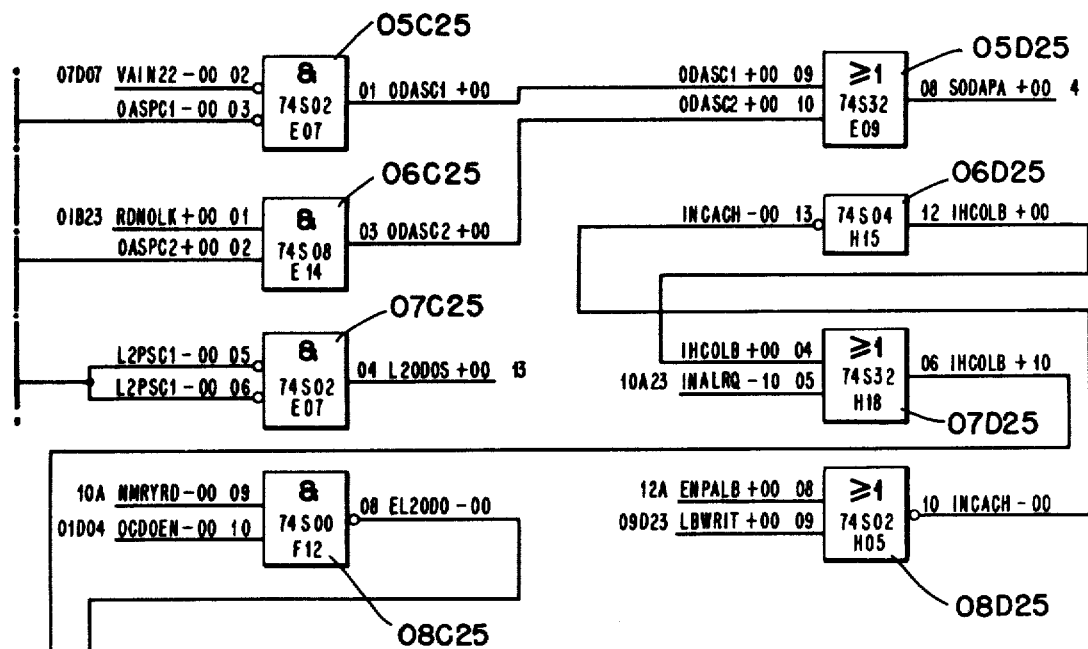
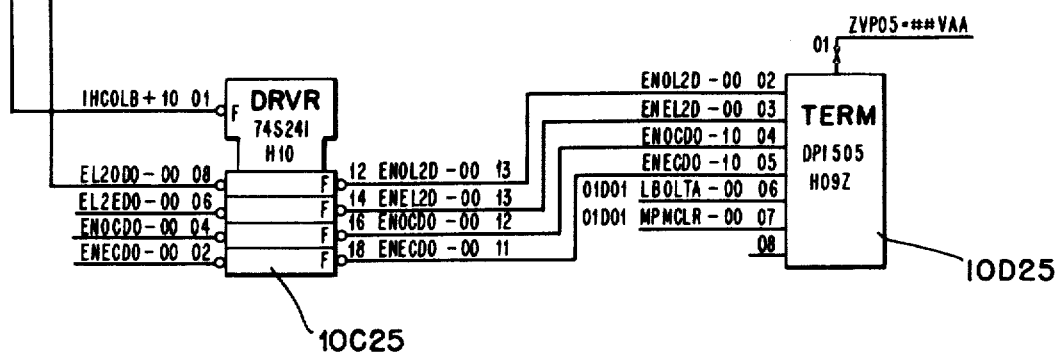

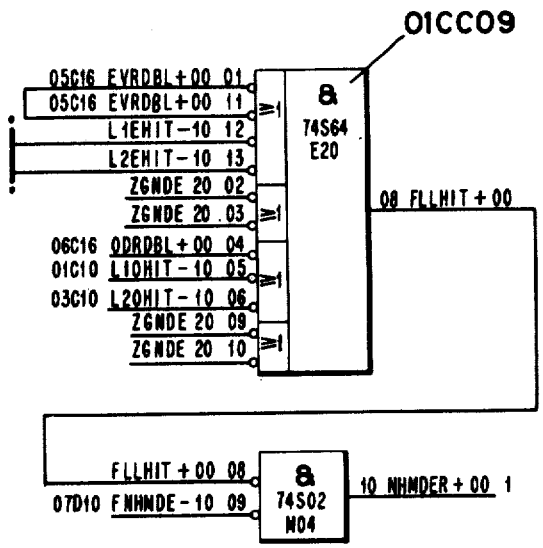
*FIG. 58b*
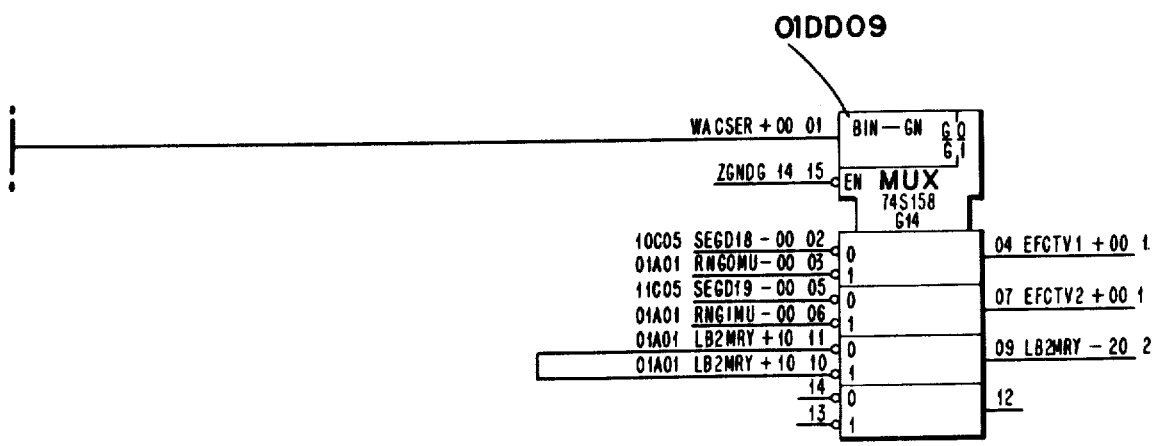

DIAGNOSTIC SUBSYSTEM FOR A CACHE MEMORY

FIELD OF THE INVENTION

This invention relates with particularity to a high speed cache memory for use in a data processing system.

BACKGROUND OF THE INVENTION

The continuing evolution in integrated circuit technology has resulted in the production of digital data processors with increasingly fast cycle times. Thus, a modern day processor is capable of performing 10 to 100 times more operations per second than was achievable in the not too distant past. Also, to further enhance processing capability, it has become commonplace to include multiple central processors within a computer system along with high speed peripheral and specialized front end processors to enable even higher data throughputs.

Even though there have been many concomitant developments in the art of data storage, oftentimes the data transfer rates of the memory systems have been unable to keep pace with the enhanced processing capabilities of the host of system processors. The result is that oftentimes the entire system becomes memory bound and inefficient because data is supplied to the processors at an insufficient rate.

Various memory structures have been adopted to resolve this problem. One of these structures is a cache memory comprising a limited-size memory having a cycle time much faster than the main or system memory of the processing system. The data stored in the cache memory comprises a constantly changing subset of the information stored in the system memory. The time penalties resulting from the continual access of the slower system memory and the relatively long data transfer path from the system memory to the processors can be avoided if the data being requested by the system processors is already stored in the much faster cache memory. It is, however, necessary to select the subset of the data to be stored in the cache memory carefully in order to minimize the number of system memory accesses that need to be performed. This can be accomplished by storing in the cache memory the information most recently requested by the system processors.

Even with the use of the prior art cache memories, the data processing systems often remain memory bound and underutilized. As a further means to correct this problem, data processing systems have been proposed wherein two words of data are simultaneously transferred from the system memory to the system processors or other system elements in response to a single memory request. This serves as a means of reducing the number of memory requests that must be issued. Such a double word transfer processing system is described in each of the following applications assigned to the assignee of the present invention:

| | | |
|---|---|---|
| LOCAL BUS INTERFACE FOR CONTROLLING INFORMATION TRANSFERS BETWEEN UNITS IN A CENTRAL SUBSYSTEM | Arthur Peters et al. Ser. No. 140,622 filed Pat. No. 4,323,967 | 4/15/80 |
| SELF-EVALUATION SYSTEM FOR DETERMINING THE OPERATIONAL INTEGRITY OF A DATA PROCESSING SYSTEM | Richard P. Brown et al. Ser. No. 140,621 filed Pat. No. 4,322,846 | 4/15/80 |
| BUFFER SYSTEM FOR SUPPLYING PROCEDURE WORDS TO A CENTRAL PROCESSOR SYSTEM | William E. Woods et al. Ser. No. 140,630 filed Pat. No. 4,349,874 | 4/15/80 |
| STACK MECHANISM WITH THE ABILITY TO DYNAMICALLY ALTER THE SIZE OF A STACK IN A DATA PROCESSING SYSTEM | Phillip E. Stanley et al. Ser. No. 140,624 filed Abandoned | 4/15/80 |
| INTERFACE FOR CONTROLLING INFORMATION TRANSFERS BETWEEN MAIN DATA PROCESSING SYSTEM UNITS AND A CENTRAL SUBSYSTEM | George J. Barlow et al. Ser. No. 140,623 filed Pat. No. 4,371,928 | 4/15/80 |

The use of double word transfers between the system processors and the system memory has resulted in an incompatibility with the cache memories heretofore in existence. If a processor has requested two words from the system memory and the words were also present in the cache memory, the cache memory was not able to respond in the most efficient manner, i.e., by simultaneously transferring both of the requested data words.

In the prior art cache memories, each double word memory request resulted in two cache memory reads or writes. This caused an unnecessary duplication of memory cycles and lessened the efficiency of the cache memory.

Thus, there has been a need to provide a cache memory compatible with the use of double wide data transfers and capable of reading, writing, and transferring two data words in response to a single memory request.

SUMMARY OF THE INVENTION

It is accordingly an object of the present invention to increase the data transfer rate between the system memory and the processing elements of a data processing system.

A further object of this invention is to provide a cache memory compatible with a data processing system wherein two words of data are simultaneously transferred between the system processors and the system memory in response to a single memory request.

Another object of this invention is to provide a cache memory capable of transferring simultaneously two data words within a data processing system.

It is yet another object of this invention to provide in the data processing system a cache memory capable of simultaneously transferring data words associated with any two successive addresses stored in the cache memory.

Yet another object of this invention is to provide a diagnostic control means for a cache memory whereby the operation of various elements within the cache memory may be tested on an individual basis under the control of registers stored diagnostic control signals.

Additional objects and advantages of the invention will be set forth in the description which follows and in part will be apparent from the description or may be learned from the practice of the invention. The objects and advantages of the invention may be realized and obtained by means of the instrumentalities and combinations particularly pointed out in the appended claims.

To achieve the foregoing objects in accordance with the invention, as embodied and broadly described herein, a cache memory is provided for use in a data processing system including a system memory for addressably storing a plurality of data words identified by a like plurality of associated odd and even address numbers having segment and offset portions. System elements generate memory requests for the transfer of a pair of data words identified by successive address numbers with a memory request including the address number identifying the first of the pair of data words requested. The cache memory receives from the system memory a selected subset of the data words and associated address numbers and supplies the requested data words to the requesting system elements in the place of the system memory if the requested data words are stored in the cache memory. The cache memory comprises memory means for storing the subset of the data words stored in the system memory, the memory means includes an odd memory module for storing the data words identified by the odd address numbers and an even memory module for separately storing the data words identified by the even address numbers; means for receiving the data words and the associated addresses from the system memory; cache data input multiplexer means coupled to the receiving means for supplying the received data words to the odd memory module and the even memory module; cache address driver means receiving the transferred addresses for controlling the cache data input multiplexer means to supply to the odd memory module the data words having associated odd address numbers and to supply to the even memory module the transferred data words having associated even address numbers; an odd directory memory for storing the address numbers identifying the data words stored in the odd memory module; an even directory memory for storing the address numbers identifying the data words stored in the even memory module; means for receiving each of the address numbers supplied by the system elements and for comparing the memory request address number and the next successive address number to the odd address numbers stored to the odd directory memory and the even address numbers stored in the even directory memory to determine if the data words associated with the received address number and the next successive address number are stored in the odd or even memory modules; hit detector circuit means coupled to the receiving and determining means for generating a full hit signal if both the memory request address number and the next successive address number are determined to be stored in the odd and even directory memories, a partial hit signal if only one of the memory request address number and the next successive address number are determined to be stored in the odd and even directory memories, and a no hit signal if neither the memory request address number nor the next successive number are determined to be stored in the odd and even directory memories; and diagnostic control means for enabling the testing of the operation of the cache memory, the diagnostic control means including means for selectively inhibiting the storing of a data word in the odd memory module or the even memory module and a hit detector override means for selectively controlling the generation of the full hit signal, the partial hit signal, and the no hit signal by the hit detector circuit means.

BRIEF DESCRIPTION OF THE DRAWINGS

The manner in which the apparatus of the present invention is constructed and its mode of operation can best be understood in light of the following detailed description, together with the accompanying drawings, in which:

FIG. 2 is a detailed block diagram of the central processing unit illustrated in FIG. 1;

FIG. 6 is a table illustrating the signals used for addressing the control store and for responding to various branch conditions;

FIG. 18 is a block diagram illustrating the registers within a double-wide memory for interfacing with the megabus adapter of the present invention;

FIG. 20 is a schematic illustration of the mapping of system memory address numbers to address numbers in the level one and level two even and odd data stores of the cache memory of the instant invention.

FIG. 21 schematically illustrates the information fields included in invalid and valid segment descriptors as employed in a data processing system including the cache memory of the instant invention.

FIGS. 24(a)-47(b) are detailed logic block diagrams illustrating a hardware embodiment of the data storing subsystem of the cache memory of the instant invention.

DETAILED DESCRIPTION OF THE PREFERRED EMBODIMENT

1. System Overview

Figure 1:
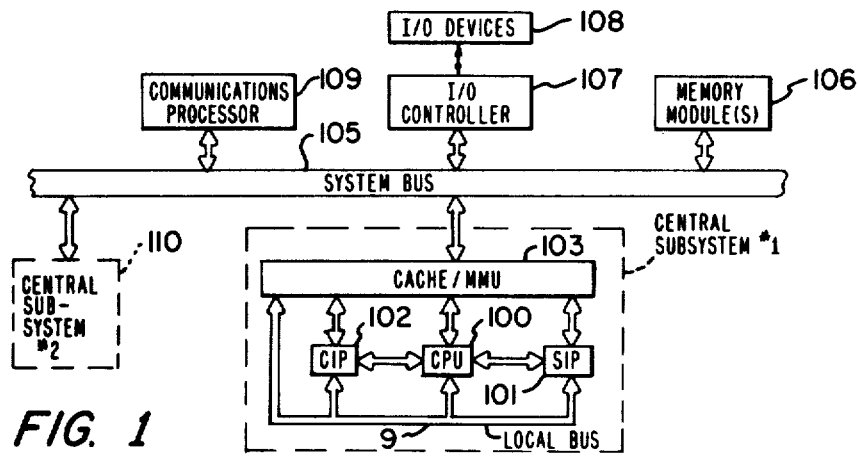
FIG. 1 is a general block diagram of a system in which the apparatus of the present invention may be included.

FIG. 1 is a general block diagram of the configuration of the system in which the cache memory to be described may be included. Such a system includes a central processor (CPU) 100, and optional processors which may include a scientific instruction processor (SIP) 101 and a commercial instruction processor (CIP) 102. These optional processors may be used to extend the range of the basic processor 100 for special applications. The system also includes a cache/MMU (cache memory/memory management unit) unit 103, an electrical system bus 105, memory modules (main or system memory) 106, and may include input/output (I/O) controllers 107 coupled to the I/O devices 108, and a multiline communications controller or processor (MLCP) 109. The system may also include a multiprocessor configuration in which there is a second central subsystem 110 which includes all or a portion of the above-described system.

The central subsystem processors are connected to each other by way of a local bus 9 and they are connected to the rest of the system by way of the cache/MMU unit 103. The function of the cache/MMU unit in the central subsystem is to provide a buffer storage for the portion of main memory 106 that is currently being used by the processors, and to provide for translation of the main memory address. The function of the local bus 9 is to provide an interconnection among the three processors and the cache/MMU unit 103.

The one physical local bus 9 is organized into numerous interfaces. As shown in FIG. 1, there are private interfaces between the CPU 100 and the other two processors. There is also a private interface from each processor to the cache/MMU. The local bus is a time-shared or public interface, that is, shared by all three processors and the cache/MMU. The cache/MMU 103 also provides an interface via the system bus 105 to the rest of the system, primarily the memory 106 and the I/O devices 108, via controllers 107.

The CPU block diagram of FIG. 2 will now be discussed. More particularly, the various electrical buses and functional units and their interrelationships will be discussed. The primary elements of the CPU are shown within the dotted lines. A first such element is the CPU local bus interface 10 which includes a data buffer 31, a round robin procedure storage buffer 36, and various procedure/data word and address multiplexers (muxes) coupled with a source bus 33 as well as other devices to be discussed. The first element 10 is utilized for the purpose of receiving data from the local bus 9.

A second element 16 is the arithmetic element and includes several devices including two sets of register arrays (RAMS) called the DRAM 11 and the BRAM 12, and the RAM or R Bus 13, to which RAMS 11 and 12 are connected. It also includes the Input or Inner Bus (IBUS) 14 to which the BRAM 12, as well as other devices, connects. The second element also includes the DALU 15, i.e., the arithmetic logic unit, which is coupled to drive the DRAM 11.

A third element 22 of the CPU includes the Outer Bus 17 and the Write Bus 84, the shifters 19-1 and 19-2 which connect them, and the selectors which drive them. These selectors include the DALU/R Bus selector 20 and the Y register/P register (YP) selector 21.

A fourth primary element 27 is the address section of the CPU and includes the procedure address register (P) 23 and the data address register (Y) 24. It also includes the address multiplexer 25 and the Prefetch address register 26. Also included in element 27 are the write data register (W) 28, and the write data selector (WS) 29. This portion of the CPU is utilized for the purpose of transferring data to the local bus 9.

Figure 5:
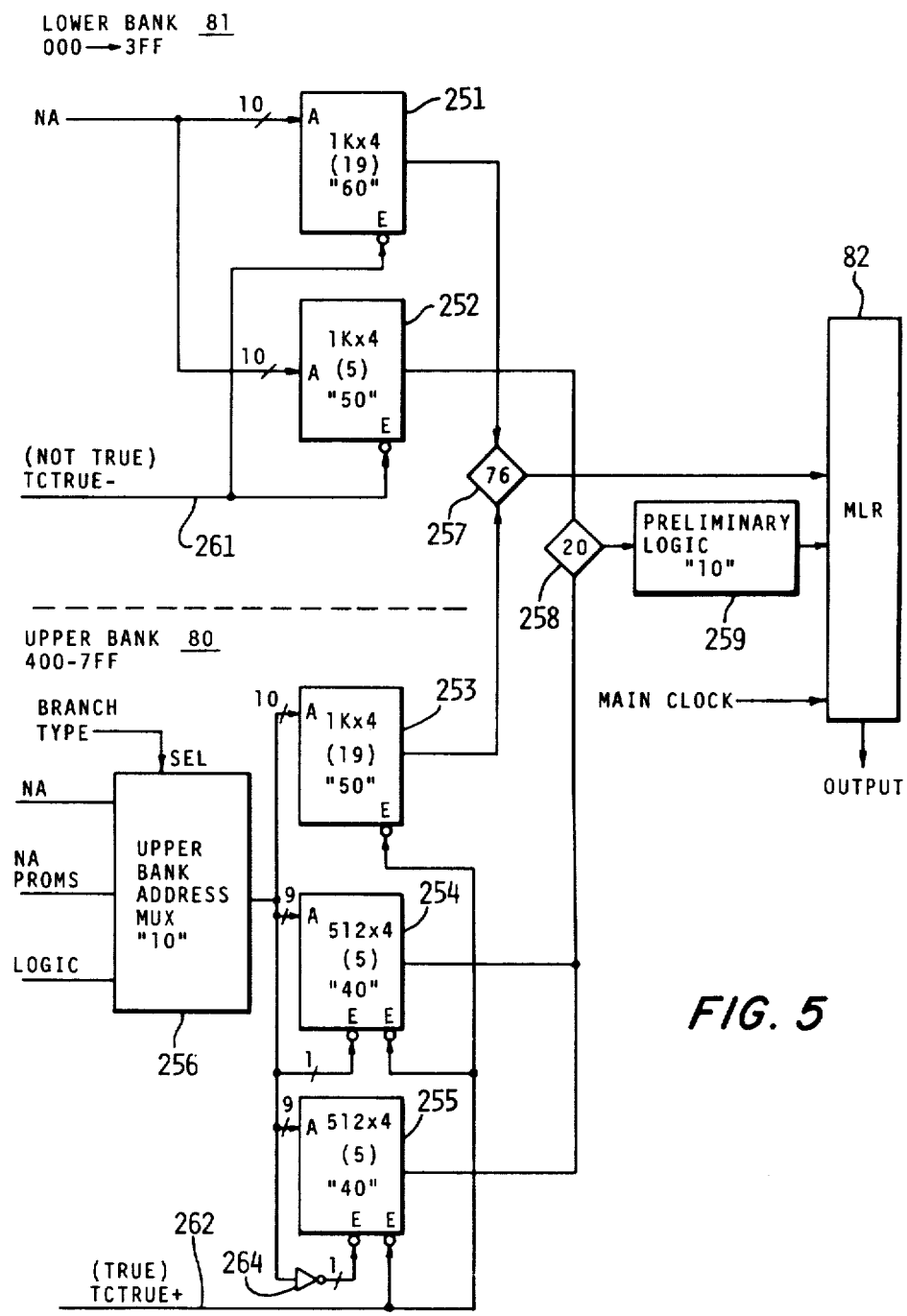
FIG. 5 is a detailed block diagram of the control store and associated logic included in the central processing unit of FIG. 2.
Figure 7:
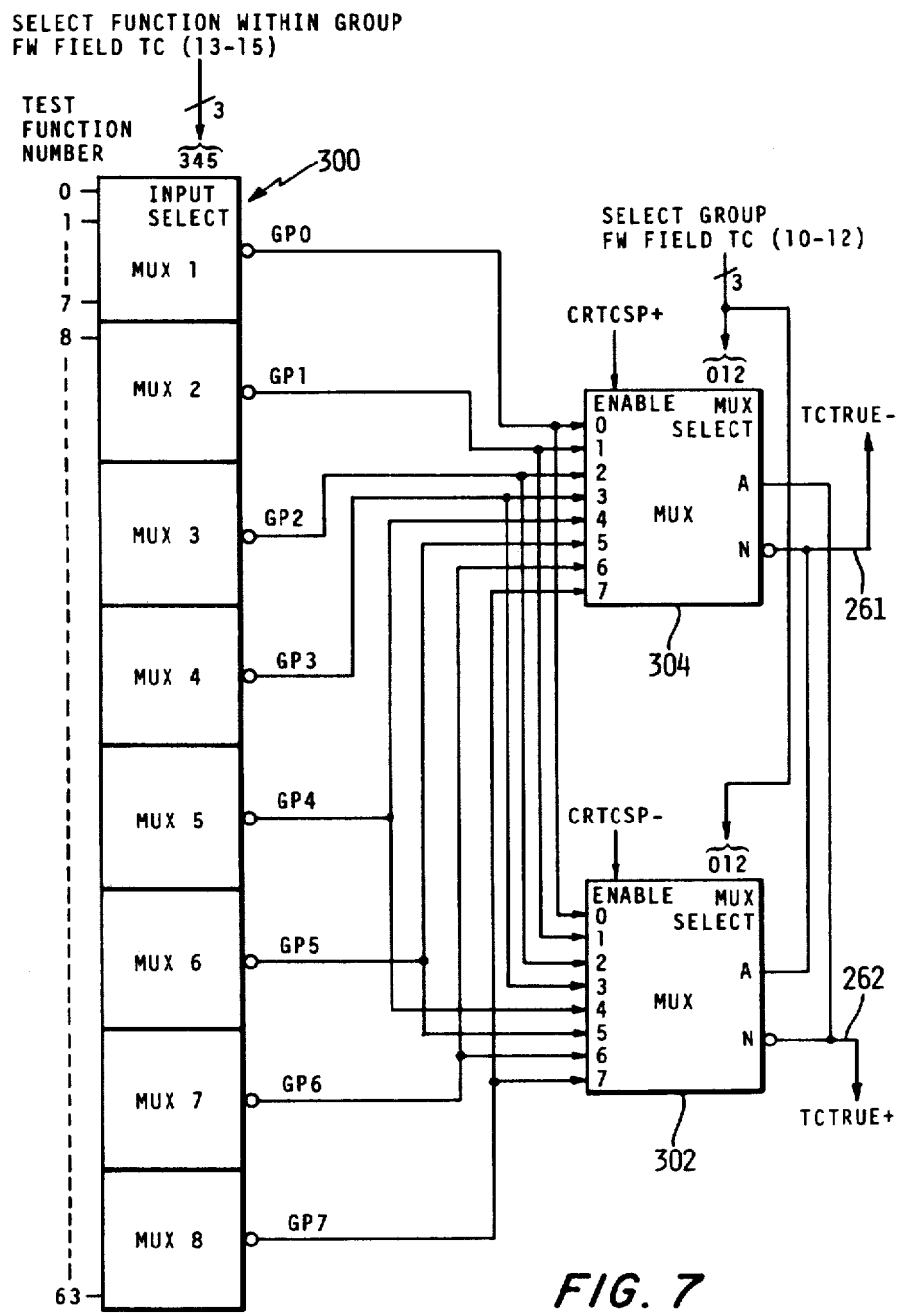
FIG. 7 is a detailed block diagram illustrating test logic used to enable the control store of the central processing unit of FIG. 2.

Device 30 is the test logic of the CPU, which is shown in FIG. 7, and includes a set of eight-to-one multiplexers which in turn drive a second set of at least two eight-to-one multiplexers which generate a single binary signal called "Test True" or "Test False", which is then used to control branching in the firmware. The Test True and False signals are coupled to the PROMS included in the control store banks 80 and 81 as shown in FIG. 5.

The next address generator 44 (FIG. 2) is coupled to the F register 38 and the F Bus 37. The next address generator is concerned with generating firmware addresses in the CPU.

The function of element 10, which is the local bus data input area, is to receive data which is returning from the cache/MMU 103 or from other devices on the local bus 9, to select data from the bootstrap PROMs 41 if a bootstrap procedure execution is requested, and to direct such data to the appropriate data buffer. If an instructional fetch is called for, for example, the data is placed in the function register. More particularly, the primary data buffer 31 receives 16 to 32 bit data words from the local bus 9. The output of the data buffer 31 is connected to the L bus 32. The L bus is used both to drive the source bus 33 by use of a pair of selectors DA 34 and DW 35 and to drive the four-word procedure buffer 36. Non-procedural data enters the CPU via the source bus 33 which is driven from the data selectors from the L bus 32.

Procedural data enters the CPU via a different set of selectors, PA 39 and PW 40, coming from the procedure buffer 36. The procedure buffer has the responsibility of containing the next two or three words of the procedure to be executed, so that when they are required, time will not have to be spent fetching them. It is automatically reloaded from the cache/MMU 103 via the local bus 9 as it is emptied by the CPU.

The F bus 37 is a special bus which is used for gating information for the F register 38, i.e., the four areas labeled FOP, FM, FN and Link. The F register is the primary instruction register of the CPU. The function of the F bus 37 is to take data from the F register 38 and provide data to the F register from various sources. There is also a multiplexer 43 which allows the loading of either constants or data from element AS' 42 into either the Link or the EN section of the F register 38.

Also in the element 10, which is the data input area, the set of bootstrap PROMs 41 can be used to provide instructions, in place of instructions from memory, if operating in the bootstrap mode.

The storage device (procedure store) 36 having locations A, B, C, and D, is a round robin four-word procedure store. Whenever it has room for two words of procedure, i.e., it is at least half empty, then it automatically initiates a memory read of procedure via the local bus 9, from the cache/MMU. The returning data is dropped into the next two locations which are available in this round robin store. As the CPU uses procedure by either emitting it to the source bus 33 for use inside the processing elements of the CPU, or by sending it to the F register 38 because it is part of an instruction, then the two pointers 36-1 and 36-2, which represent in effect cursors in the round robin store, advance to the next location available by use of a counter included in the device 36 which successively enables the four locations to the outputs of the device 36. The lefthand cursor or pointer 36-2 indicates the next word of procedure to be fetched; the right-hand cursor 36-1 represents the word following that. Sometimes one word of procedure is used up in which case the word indicated by the lefthand cursor would be used to generate the information, passing through the PW multiplexer 40. Sometimes there is a requirement for two words of procedure (as when pulling a large address form (LAF) address). Then the words indicated by both the left-hand and the right-hand cursors are combined in the PA multiplexer 39 of the procedure selector. This will be described more fully hereinafter.

Thus, element 10 is the area concerned with bringing data into the CPU through the source bus 33, via either data selectors 34 and 35, or the procedure selectors 39 and 40, or bringing data directly into the instruction (F) register 38 via the procedure buffer (round robin procedure store) 36 and the F bus 37. Device (F') 76 is used to hold selected bits from auxiliary address information or syllables. The address syllable is actually part of a 16-bit data descriptor. Certain bits in the descriptor have to be retained for subsequent analysis. The operand-size bit in the CIP descriptor and the operand size and signed versus unsigned bits in the K register descriptor have to be retained. These are retained in the five-bit F' register 76.

The second element 16 contains the arithmetic/logic unit (DALU) 15, the BRAM 12 and the DRAM 11, containing some of the programmer visible registers, plus a number of non-programmer visible word registers. These data storage elements are organized as follows: The DRAM 11, which is one of the two sources which can drive the RAM bus 13, contains 32 locations, each of which is 24 bits wide. These locations are used to hold to so-called D registers, two halves (K & L) of the so-called K registers which are 32 bits long, a number of internal pointers, and seven so-called M registers. The BRAM 12, which contains 16 words, each 24 bits wide, contains the nine base registers plus a number of programmer visible and programmer invisible pointers of various types.

Figure 3:
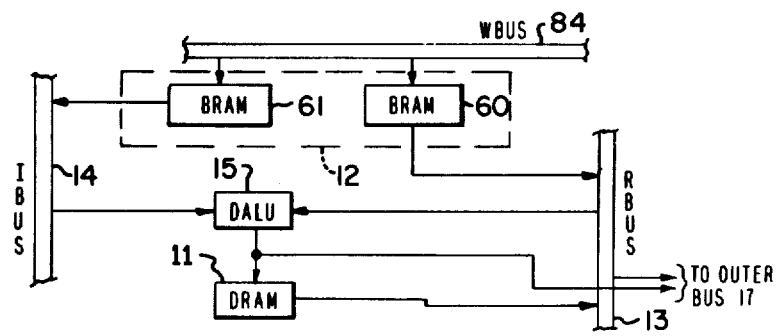
FIG. 3 illustrates details of the connections to the arithmetic logic unit of the central processing unit of FIG. 2.

FIG. 3 shows in more detail the relationship between the RAMs, the buses, and the DALU 15. The DRAM 11 and BRAM 12 can each be sources to the RAM bus 13. The BRAM 12 is actually a dual structure; that is, there are two parallel BRAMs 60 and 61 in the CPU. The two elements of the BRAM 12 are loaded identically. One such element which drives (or transfers data to) the R bus is element 60, and the other which drives the I bus 14 is the BRAM element 61.

Element 16 includes two buses of major interest. The so-called input or Inner bus (I) 14 is the primary source of original input within the processor, that is, data from memory comes into this bus as does the output of the Q register 50 via driver 54, and also the output of the BRAM 12. The second bus, the so-called R or RAM bus is the point at which the outputs of the two different RAMs, the BRAM 12 and the DRAM 11, are coupled. The outputs of these two buses are the inputs of the DALU 15, which generates data which can either be returned into the DRAM 11 or sent to the Outer bus 17 for further processing in the system.

Both the Inner and the RAM buses employ a hardware element referred to as a "batlatch" (BL) which is a gate whose input and output are tied together for coupling signals onto the bus. This batlatch is intended to take over control of that signal after the driving source is required to go off the bus for timing and sequencing reasons. When this happens, the batlatch then supports that signal at the same level as it was when the driving sources were present, until the batlatch is turned off at which time the bus signal can relax (go to a predetermined level such as zero volts).

The RAM bus 13 is the interface for the transfer of data between the control panel 90 and the central processing unit, and is connected to it via 16 bidirectional signal lines. Memory data couples to the Inner bus 14 via a set of drivers called the data latches (DL) 51. The data latches are paralleled by a second series of latches called SE or sign extension latches 52. These SE latches are used either to sign or zero extend the data latches when they are only providing a sixteen bit quantity to the 24 bit bus. Similarly, the SE logic 52 is used to take either 7 or 8 bits of the current instruction, and sign extend it to 24 bits for use by the branch and value instructions which get their displacement and their operand, respectively, from the right-hand portion of the instruction word.

There is also associated with the BRAM 12 and DRAM 11 logic called the select/modify logic 53, which allows the DRAM and the BRAM to be addressed in blocks of eight registers, using various fields in the instruction to control the individual register selection within that block.

Constant generator (KON) 70 is also included in element 16, the primary ALU area, and is another source to the Inner bus 14, that is, it is the source that can be used to generate bit constants onto the inner bus for use by the arithmetic unit under control of the firmware.

Thus, element 16 is the primary arithmetic operation area in the CPU; that is, it is concerned with operand manipulation and with the generation of operands for insertion into the data RAM 11, or operands which are intended to be sent to the Outer bus 17, either to be returned to the BRAM 12, or to be sent to various address and data registers for output to the local bus 9.

Element 22 is concerned primarily with the section of the CPU referred to as the Outer bus 17, and the Write bus 84. The Outer bus is the bus upon which various data paths are collected, i.e., the Y register 24, the P register 23, the output of the DALU 15 and the RAM bus 13. The Write bus 84 is the bus which is used to transfer operands to the BRAM 12, to the write data registers, and to the BALU 55 which is the ALU primarily responsible for address manipulation.

Between the Outer bus 17 and the Write bus 84, is a set of twenty-four multiplexing shifters 19, which allow the shifts of 1, 2 or 4 bits in either direction on Outer bus 17 operands. There is also a set of sixteen multiplexing shifters 56 which are used to load operands into the Q register 50.

Two of the four different types of operands which are sourced to the Outer bus 17 originate at the DALU 15 and at the RAM bus 13 and are selected through a two-to-one multiplexer 20 coupled to the Outer bus. Two other sources for the Outer bus 17 are the Y register 24, which is the data address register, and the procedure address (P) register 23. The outputs of these two units are coupled via the two-to-one multiplexer (Y/P selector) 21 and sourced onto the Outer bus 17. Also coupled to the Outer bus 17 is the I register 57, the indicator register for the CPU. The contents of the Outer bus 17 can be transferred either directly or shifted to the Write bus 84 for further processing in the CPU. They can also be loaded into the Q register 50 directly so that the Q register can be used for double precision shift operations.

Twenty-four shifters 19 are used to shift 24 bit operands, the size of the operands on the O bus 17 and W bus 84, left or right under the control of the control store word. They can shift by either 1, 2, or 4 positions, transfer the operand straight through, or transfer the operand through with the two right-hand bytes of the operand interchanged. The operation of these shifters is controlled by a field in the control store word. This section of the CPU is used for 24 bit operands shifts. When 32 bit (double register) operands, are shifted, the right-hand operand is loaded into the Q register 50 via the Outer bus 17, and then a shift is performed in which not only the W bus shifter 19, but also the sixteen Q register shifters 56 are operated. The Q register contents are thereby treated as a 16 bit extension on the right-hand end of the 24 bit operand which is being shifted onto the W bus 84; the ends of these two shifters are coupled together, thus, allowing a 40 bit shift to occur.

In such double register shifts, the operands of interest are the 16 bits which are returned to the Q register 50 and the 16 bits which are transferred to the right-hand two bytes of the Outer bus 17, while the left-hand eight bits of the data of the W bus 84 are usually discarded.

Element 75 represents the collection of the status bits in the CPU for emission to the W bus via driver 93 under certain conditions. The W bus has two sources, the primary one being the shifter 19 from the Outer bus 17. This shifter 19 can be disabled as an input to bus 84 and instead the status bits (S/Z) in element 75 can be placed on the Write bus 84 for subsequent analysis by the firmware.

One unit of hardware which is associated with the Q register 50 which has not been previously discussed is the XB register 58 and the decoder 59 coupled thereto. The XB register 58 is used during index shifting to capture those bits of the index which are shifted right for sub-word operands and which are lost because they move to the right of the single word bit in the address. They are captured in the XB register 58, one bit for half-word shifts, two bits for digit shifts, and four bits for bit-sized operand shifts. The XB register contents are subsequently used directly to control left versus right half selection when dealing with half-word operands, when generating a parameter to be sent to the commercial instruction processor for digit operands, and to generate a mask of 15 binary zeros and a single binary one, in conjunction with the decoder 59, when operating on bit operands. That is, for a bit operand, a word is read, a mask is used to set or clear the selected bit in the word, and then the word is written back into the memory. The mask may be generated from decoder 59 as an input to the Q register 50. That is, one of the items that can be loaded into the Q register is the decoded mask generated from the contents of the XB register 58.

The fourth major element in the CPU is area 27, the element which is concerned with the generation of addresses, commands, and operands for transmittal to the local bus 9, and via the local bus to either the CIP 102, the SIP 101, or the cache/MMU 103 and hence, to the memory or to the Input/Output (I/O) devices 108. This major element can be broken down into approximately three areas, the first being the write data register (W) 28 and the write selector (WS) 29. The register 28 is a 32 bit register with a partitioned load capability, that is, either the right half or the left half, or both halves of this register can be loaded. The right half is always loaded from 16 bits of the Write bus 84 via drivers 74. The left half is written with data which comes from the write selector 29. This write selector has as its 16 inputs either the 16 bits of the right half of the Write bus 84 or the eight left-hand bits of the Write bus with either one or zero extension. The Write bus is the primary path by which data can be sent to the W register 28 in order to subsequently write such data to any other device coupled on the local bus 9.

The next area in the local bus output interface 27 is the command driver 71. The command driver 71 drives a series of command lines which accompany all transfers by the CPU 100 on the local bus and indicates to the cache/MMU 103 either a memory reference cycle, an I/O reference cycle, or a local bus reference cycle to the cache/MMU or one of the local bus processing units. The information which is transferred onto the command lines is derived from the F and FK fields of the control store or firmware (FW) word shown in FIG. 4, which also at other times controls the functioning of the F register 38 of element 10.

The third portion of element 27 includes the three primary address registers, i.e., the Y register 24 for non-procedural memory addresses and for addresses to other devices on the local and system buses and the P register 23 (the program counter), and the prefetch register 26.

The P counter 23 keeps track of the memory address of the last word which the firmware has used, which word has been taken from the round robin buffer 36 and inputted to the CPU 100 for operations thereon. The prefetch register 26 keeps track of which location is next to be fetched from memory; that is, the P and PF registers may differ by any number in memory address from one to four words, depending on how full the round robin buffer is and how recently the central processing system has taken data from the buffer. If the central processing system has taken all the data from the buffer, it takes a finite amount of time for the cache/MMU 103 to respond with new data in response to a request, and fill buffer 36 again. Under those circumstances, the prefetch register 26 and the P counter 23 would be close together or the same in address content. When the buffer 36 is full, and the CPU 100 has not taken any data recently, then the P register will be two to four words behind the prefetch register.

The contents of the P register 23 are never admitted to the local bus 9 as a memory address source. The two sources for data which can go to the local bus via the virtual address multiplexer 25 are the Y register 24, which is used for all non-procedural fetches, and the prefetch register 26, which is used automatically by the prefetch logic.

The arrows on devices 23, 24 and 26 are indicative of the incrementing capability of those particular registers. That is, the P registers can increment by either one or two words depending on the number of words at a time which are taken out of the prefetch buffer 36. That is, pulling one word from the prefetch 36 buffer automatically increments the P register by one; pulling two words from the prefetch buffer 36 automatically increments the P register by two. The prefetch register 26 always increments by two, because prefetches are always performed on a pair of words. The Y register can increment by either one or two under the control of the firmware as it is used, or in preparation for future use. There is a bus control field in the firware word which allows control of such incrementing and the various cycle requests to the local bus.

The inputs to the W register 28 are two 16-bit data paths which are exercised in various ways. If it is desired to write a 24-bit address, then the drivers 74 are turned on, enabling the right-hand 16 bits of the Write bus to be transferred to the right-hand 16 bits of the W register. The multiplexer 29 is conditioned such that the left-hand eight bits of the Write bus and eight binary zeros are emitted to the left-hand half of the W register 28. This loads a two-word, 24-bit, address into the W register for subsequently writing into memory. If it is desired to write a single word into memory, then the right half of the W register is not clocked (i.e., enabled), and does not change; and the multiplexer 29 is conditioned to enable the 16 right-hand bits of the Write bus to the 16 left-hand bits of the W register where they are clocked in. For single word writes, the left half of the W register supplies the data that is written into memory.

The logic heretofore described is used to request and accept data from the other entities on the local bus 9, such as the cache/MMU 103 or the CIP 102 or the SIP 101, to operate on it and store it internally in various registers via the two ALUs which are contained in the system, to create new operands which are subsequently modified and sent out to the local bus to one of the entities thereon with an address of which entity (computed internally in the CPU and used to control the local bus). All of these operations are performed under the control of control firmware which is stored in a 2,048-word by 96 bits-per-word control store 80 and 81 which is included in the CPU.

Figure 4:
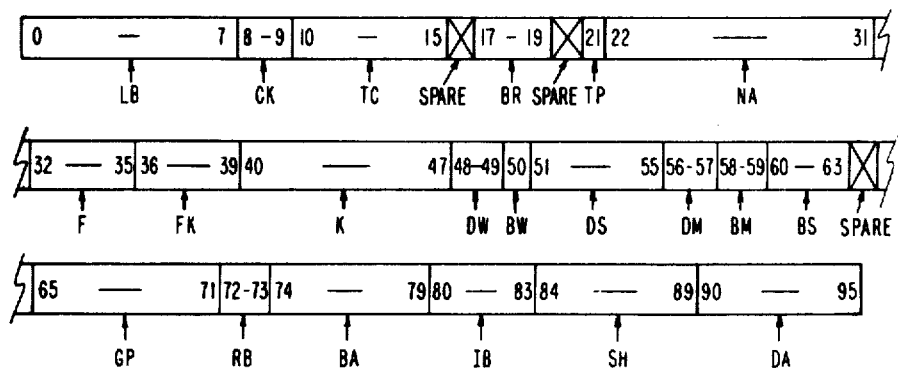
FIG. 4 illustrates details of the composition of locations of the control store included in the central processing unit of FIG. 2.

The control store is partitioned into a number of individual fields, each of which controls some aspect of the internal performance of CPU. FIG. 4 illustrates the firmware word and the various fields of interest therein. The first of these fields is the local bus (LB) field, bits 0 through 7 of the control store. The LB field is concerned with the requesting of various cycles from the local bus 9 and the responses thereto. It is also responsible for the emission of virtual addresses via the prefetch register 26 or the Y register 24, and it controls the various incrementing of the Y and P registers. The local bus field also controls the successive reading of data from the round robin procedure buffer 36, and the enabling of the data and procedure multiplexers 34, 35, 39 and 40, respectively, onto the source bus 33 for use by the Inner bus 14.

The next field, the clock (CK) field, bits 8 and 9 of the control store, is used to control the CPU clock speed, i.e., the interval between successive clock pulses in the CPU. Each firmware step has assigned to it the clock speed which is appropriate to its complexity. In the system of the present invention, there are four possible intervals between successive clock pulses: 96 nanoseconds, 105 nanoseconds, 130 nanoseconds, or 170 nanoseconds. Which of these is used for a firmware step is controlled by the CK field for that firmware step.

The next field is the TC field, bits 10 through 15 in the control store word. This is a 6-bit field and selects one of 64 possible logic functions within the CPU for testing and control of firmware sequences.

The next field is the BR field, bits 17 through 19, used to control the type of action which is taken as a result of a test condition, that is, what type of branch occurs: whether the branch simply selects between two firmware steps, or whether it selects between a firmware step and a so-called control store splatter (the generation of one of a multiplicity of control store next addresses based on the state of one or more logic elements in the CPU in which the next address is controlled by some function of contents of the F register 38).

The next field of interest, the TP field bit 21, is the Test Polarity field. It controls whether the test condition is inverted before being tested.

The NA field, bits 22 through 31, is a ten-bit field which is used to generate at least one of the two addresses which are selected by all branches. The other address is either derived from the same NA field or from the control store splatters previously mentioned.

The next field, bits 32 through 39, is the F register control field, partitioned into a four-bit part called F and a second four-bit part called FK. The F and FK fields are used to control the loading and strobing of various elements in the F register and in the area of the F bus; that is, it is used to control the strobing of F' and AS' devices, the subparts of the F register 38 and the multiplexer 43. Which of these devices are loaded and what sources they have for their loading are all controlled by the F and FK fields.

The next field, bits 40–47, is the K (i.e., constant) field, and is used to drive the I bus 14. It is an 8-bit field which provides the right-hand eight bits for all constants which are admitted to the I bus. The left-hand 16 bits of the constant are controlled by the I bus field which will be discussed hereinafter. The K field is directly related to the KON device 70.

The next fields in the control store, bits 48–63, are concerned primarily with the addressing and control of the DRAM 11 and the BRAM 12. The two-bit field, DW, is used to control writing into the DRAM with one bit controlling write operations into the left most (the most significant) 8 bits of the DRAM, and the other bit controlling write operations into the right most (the least significant) 16 bits. The next bit, bit 50 (field BW), is used to control write operations into both parts of the BRAM, which are always written into together. The next field DS is five bits in length and provides the selection of one of 32 registers in the DRAM 11. The DM field, bits 56 and 57, is the select-modify field associated with the DRAM and allows the selection of either the DRAM directly or any of three different functions of the F register 38 for qualifying the addressing of the DRAM.

The B select field (BS), bits 60 through 63, is used for the selection of one of the 16 registers in the BRAM. The two-bit field comprising bits 58 and 59, is the select-modify field (BM) for BRAM addressing. It performs similarly to that for the DRAM addressing except that it is separate so that independent select and modify functions can be specified for both the BRAM and DRAM.

The next field is the GP field, which is seven bits in length (bits 65–71), and is used to control a large number of general purpose microoperations within the processor, such as the clocking of various bistable flip-flops and the enabling of various control functions. It is also used to control access to the control panel 90 from the CPU, to input and output data to the control panel, and to control various flip-flops therein.

The next field, the RB field, bits 72 and 73, is used to control the sourcing of data onto the R bus 13 with one bit controlling the BRAM and the other bit controlling the DRAM.

The BA field, bits 74 through 79, is used to control the functions of the BALU 55, the arithmetic/logic unit which has as its inputs the I bus and the W bus and which can be used to drive the Y register 24.

The next field is the IB field, bits 80 through 83, which is used to control which data source is enabled to the Inner bus 14. This field can enable the data latches, sign extend the F register or select a constant, or the BRAM in various combinations to the I bus. The next field, the SH field, bits 84 through 89, is used to control both the shifters and the W bus sourcing which was discussed earlier.

The final field, the DA field, bits 90 through 95, is the function control for the DALU 15 with six bits having analogous functions to those in the BA field.

The control store for the CPU (FIG. 5) is actually two control stores: an upper bank 80 and a lower bank 81. The upper bank is addressed by the next address generator 44 and the lower bank is addressed directly by a portion of the contents of the current control store word. In the case of the more common types of branches, both use the NA field of the control store word as the basic source of the next address, and modify it in some way so that the two addresses which go to the the upper and lower banks are essentially identical. In the case of the other branches, those which select between a next address and a PROM generated splatter, the lower bank receives the next address field unchanged from the current control store word, while the upper bank receives the splatter address from the current control store word. The control store is partitioned in this way so that the system can be doing a simultaneous access of both possible next address control store words and can postpone the decision of which one is going to be used until almost the very end of the current control store step, just prior to clocking the data in the control register 82. The details of the control store shall be discussed hereinafter.

The manner in which the CPU and firmware interact to perform certain typical control processor operations, such as (a) reading a word from memory; (b) computing a next address for reading another word from memory; (c) writing a word into memory; and (d) performing some type of iterative algorithm in which the operations are entirely internal to the CPU, will now be discussed. The situations given will be typical and representative operations will be described.

In the case of reading a word from memory, during a control store step, the control store word will enable the virtual memory address of the word from the BRAM 12 onto the RAM bus 13 via the RB, BS, and BM fields. The SH field will condition the Outer bus and the W bus sourcing such that the signals on the RAM bus are enabled through the selector 20 to the Outer bus 17, and then unaltered through the shifter 19 onto the W bus 84. The W bus is an input to the BALU 55, which is conditioned by the BA field to enable its W bus input directly to its output. At the same time, the LB field causes the Y register 24 to load, thus, transferring the address into the Y register.

In the next firmware step, the LB field causes a request to be directed to the local bus indicating that a memory request is required and that the address provided to the local bus should be used to make a such request. The command lines 71 are conditioned by the F and FK fields (shown as 72 in FIG. 2) to indicate that a memory read request is required. The address multiplexer 25 is conditioned to enable the contents of the Y register onto the local bus via the 24 address lines. The cache/MMU memory, which monitors and controls all activity on the local bus, acknowledges the request, while the CPU proceeds to the next firmware step. In the next firmware step, the local bus field will specify a stall, indicating that the CPU should not leave this firmware step until the end of the local bus cycle has been detected returning the data from the cache/MMU via the local bus into the CPU data buffer. As soon as this return cycle is detected, the stall ends and the CPU enters the fourth step of this read cycle.

The fourth step is one in which the firmware specifies an LB field which uses the data that is in the data buffer, and sources it onto the Inner bus for use by the CPU. The LB field thus enables either the DW driver 35, or the DA driver 34, depending on whether a word, 16 bits in length, or an address, 24 bits in length, is required on the source bus. In turn, the I bus field specifies that the source bus, either all 24 bits of it, or 16 bits sign-extended to 24, is to be enabled onto the Inner bus. In the Inner bus, assuming that a 16-bit word is being received from the data buffer, the DA field enables the DALU to read the Inner bus, and the DW, DS, and DM fields address and write into one of the 32 registers in the DRAM. This would complete the fourth step of this control sequence, the first of which loaded the Y register, the second of which made the read request, the third of which waited for data to come back, and the fourth of which took the data and copied it into one of the registers in the CPU.

A second typical sequence of operations which may be performed by the system is the manipulation of operands in an arithmetic operation, such as adding an operand which has been fetched from memory to one of the data registers and then, after the addition, returning the result to the data register and also placing it into the write data buffer so that it can be subsequently written back into memory. This sequence of operations would begin following the stall referred to in the previous operation. This step would be one which enabled the data, which in the case of a word operand would be a word, from the data buffer 31, via the L bus and the data multiplexers 35, onto the source bus. Then, the I bus field would specify that the source bus, sign extended via the sign extension device 52 and the data latches 51, be enabled onto the inner bus. At the same time, the R bus control field would specify that the particular data register of interest be enabled to the R bus 13 from the DRAM 11. The DA field, i.e., the DALU control field, would specify that the DALU be conditioned to add the 24 bits on the R bus 13 to the 24 bits on the I bus 14. This logic 15 would have as its output 24 bits representing the sum. The DW bit would indicate that the output of the DALU was to be written back into the DRAM 11.

At the same time, the output of the DALU would be enabled to the W bus via the SH field. This field would indicate that the selector 20 would be enabled to the Outer bus and would be conditioned to select the DALU output instead of the R bus output for that purpose. Also, at the same time, the shifter 19-1 would be conditioned to pass the Outer bus contents through without change to the Write bus 84. The same LB field which specified DW 35, to the source bus 33, would also have specified that the Write bus would be enabled to the left half of the W register 28 via the selector 29. This would all take place in a single firmware step. Since this is an add operation, presumably the overflow from the add would be tested by a test specified by the test logic 30. The next address logic would generate one address which would indicate a particular entry to go to if the operand is to be written back into memory immediately. The other address, which would be to the lower bank, would be generated to take the next step which would deal with the overflow condition.

The third operation would consist of writing an operand into memory. This would take three firmware steps to perform. The first would be a step in which the address in which the operand is to be written is loaded into the Y register 24. The second step would be to put the operand to be written into the W register 28. The third step would be one in which the LB field would specify that a local bus request, specifying a memory write, be addressed to the local bus for the cache/MMU to receive and execute.

The first step, loading the Y register 24, would get the address presumably from one of the 16 locations in the BRAM random access store. This would be performed by conditioning the I bus field so that the I bus would look at the output of the BRAM. The B select field would indicate which of the 16 BRAM registers was addressed for this purpose. The BALU 55, which is controlled by the BA field, would be conditioned to pass the contents (24 bits) of the Inner bus to its output. The LB field would be one which specified "load the Y register." Since input to the Y register is the output of the BALU, this would transfer the contents of the selected BRAM into the Y register. The next control store step would take the operand from its origin, wherever that might be, in this case, for example, one of the 32 DRAM locations. The DS field would select which of the 32 DRAMS would be enabled. The RB field would enable the DRAM onto the R bus. The SH field would select the RAM bus to the Outer bus 17 via selector 20, and the Outer bus to the Write bus 84 via shifter 19 with no shifting taking place. The LB field would specify load the W register, left half. This would be performed by conditioning the W selector 29 to enable the right two-thirds of the Write bus to the left half of the W register, and the W register would be enabled to load its left half.

Finally, the third firmware step would be performed. In this firmware step, the only essential operation is that the local bus field, the LB field, should specify a local bus write to memory. This would use the F and FK bits as command lines going to the local bus to indicate to the cache/MMU that this is a memory write operation. The address would be enabled to the local bus via the virtual address selector 25 from the Y register 24. The data would be enabled to the local bus from the W register 28. The cache/MMU memory, arbitrating all local bus transfers would recognize this as a memory write cycle, and would take the address, map it, send it to memory accompanied by the data, and indicate on the system bus to the memory that this is a memory write operation.

The fourth sequence of a typical operation which the CPU could perform is that in which a double precision operand is shifted some number of bits to the left or right. Presuming that the operands are both in the BRAM, that is, the two operands of interest are in the BRAM, the first firmware step would initiate the transfer of the right-hand of these two operands to the Q register. This would proceed as follows. The BS field would be conditioned to address one of the 16 locations that contains this operand in the BRAM 12. The R bus field, controlling the RAM bus 13, would be conditioned to take the BRAM output instead of the DRAM output. The SH field would be conditioned to transfer the R bus to the Outer bus via the selector 20, by enabling it to the Outer bus and selecting its input from the R bus, and would also specify that the Q register and the W bus both receive the contents of the Outer bus and would clock the Q register to load it. This would cause the operand addressed in the BRAM to be transferred to the Q register.

The next step, or steps, would be those in which the shifts are actually performed. In this step, the other of the two registers containing the second operand in the BRAM is addressed by the B select field and the BRAM is enabled onto the RAM bus 13, via the RB field. Then the RAM bus would be enabled to the Outer bus via the selector 20. The SH field would take any of a number of values depending on which direction and for how many bits the shift is to be performed. The SH field is capable of selecting a left or right shift of either one, two or four bits. In any of these cases, the Q register is considered to be connected as an extension of the Outer bus, creating a 32-bit operand. Actually, it is a 40-bit operand, but the left-hand eight bits of the Outer bus can be ignored. This 32-bit operand is shifted either left or right as indicated by the particular SH field. The 16 right-hand bits are returned to the Q register and the 16 left-hand bits together with the eight bits which were ignored are transferred onto the W bus. This is controlled by the SH field which has control over the shift distance.

After the operand has been shifted from the Outer bus to the W bus and from the Q register back to the Q register, the SH field causes the Q register to reload the shifted operand while at the same time the BW field causes the W bus to be written into the addressed BRAM location. Thus, the contents of the B and Q registers have been shifted and returned back to the B and Q registers. The particular end effects associated with this shift, whether this is an open, circular, or arithmetic shift, are a function of control flip-flops in the CPU. This type of step, in which the actual shifting is accomplished, is performed some number of times in various combinations, that is, if it were desired to shift left by five places, a step which shifted left by one bit would be succeeded by a step which shifted left by four bits. To shift right by three would require a shift right by two and then by one, for example.

Then, after the final shift has been performed, i.e., after the operands are now correctly aligned in the addressed BRAM location and the Q register, the final step does not cause a shift, but instead returns the Q register contents back to the BRAM location from which it was originally loaded. This would be performed as follows. The I bus field would specify that the I bus is driven by the Q register (16 bits of Q extended by eight bits of binary zeros). The DALU 15 would be controlled by the DA field so that it passed through the I bus unchanged. The SH field would be selected so that it enabled the DALU, unchanged via the selector 20, to the Outer bus 17, and again unchanged, via the shifter 19 to the W bus 84. The BW bit 50 in the firmware word would then be set to condition the loading of the BRAM from the W bus, and the BS (B select) bits would be conditioned to specify which of the 16 locations in the BRAM were to receive the shifted operand. This would all take place in some number of firmware steps, for example, three or more. One step would be used to load the Q register creating a 40 bit operand, one or more to perform the shifting of that operand as required, and then one to return the Q register contents (the right-hand 16 bits) to the BRAM to complete the operation.

FIG. 5 illustrates the organization of the upper and lower bank control store PROMs 80 and 81, respectively, and more particularly the manner in which they are coupled or paired for maximum speed. Each of the banks of the control store includes one or more PROMs, each of which PROMs include a plurality of electronic chips. By way of example, the storage capacity of each bank may be 1024 (1K) addressable locations, each containing 96 bits, i.e., twenty-four chips of 1K each, each chip having four bits of storage. To increase the speed of operation, each bank has at least two PROMs, with one PROM faster (lower propagation time) than the other in each bank in order to compensate for propagation time in other elements included in the control store. The two banks are utilized primarily for efficiently accommodating branch decisions derived from the current firmware word and the next address generator 44. One bank is organized to be addressed directly by the firmware word whereas the other bank (for example, the upper bank) is organized to be addressed by the firmware word and/or a derivative function of the firmware word and various logic elements included in the CPU 100. Accordingly, the upper bank requires a multiplexed input and, as shall be discussed, one of the two PROMs in the upper bank is provided with a faster address propagation time than any of the other PROMs in either bank. This is done as a practical matter by utilizing two PROMs, each with an increased speed of operation, i.e., lower propagation time.

The purpose of pairing of the control store PROMs is to reduce the amount of time necessary in order to generate the next control store address, to select data appropriate to that address, and to enable it to the input of the main control store data register, the so-called MLR 82, which is the output register of the control store. This has been done in the past by using a single set of control store PROMs and selecting the address supplied to them. In such cases, the time required to propagate data through the control store logic is the address select time, i.e., the time from the change of the address input to the PROM to the time at which the output is stable. For typical control store PROMs, this is much longer than the so-called "enable time". Control store PROMs which have an enable input can typically be turned on and off much faster (the "enable time") than addressed outputs can be provided. Therefore, the basic approach here is to separate the control store PROMs into two groups or banks so that the respective address for each group, for example, one of two branch addresses, can be propagating through the control store chips simultaneously, and so that the decision as to which address to utilize can be postponed until the very last moment when the decision is implemented by enabling the output of one or the other of the two groups or banks.

In the described CPU, as with some other computers, all so-called branch operations have a selection of one of a pair of addresses, one of which addresses is explicitly provided by the control store word in the current step, and the other of which is more or less indirectly generated from data available in the current step. In the instant CPU, this pair of addresses is constrained in such a way that all branches consist of selecting between two addresses, one of which is for the lower bank and the other of which is for the upper bank. The lower bank may utilize addresses in the range from 000 through 3FF (hexadecimal), and the upper bank control store addresses from 400 through 7FF (hexadecimal).

The structure used to implement this method of control store partitioning is shown in the block diagram of FIG. 5. As can be seen, the control store is partitioned into five sets of control store elements of PROMs 251 thorugh 255. Elements 251 and 252, which, as indicated in the drawing in parentheses, include a total of 24 control store ships (19 in element 251 and 5 in element 252) contain the data for the lower bank of the control store. Elements 253, 254 and 255 (which include a total of 29 chips) contain the data for the upper bank. Three types of integrated circuits are used to implement these elements. Element 251 is made up of 19 1K (1024)×4 bit control store chips with a typical address propagation time of 60 nanoseconds. Elements 252 and 253 are made up of specifically selected 1K×4 bit control store chips with a typical address propagation time of 50 nonoseconds. Elements 254 and 255 are made up of selected 512×4 bit control store chips with a typical address propagation time of 40 nanoseconds.

There are two reasons why chips or circuits with different propagation times are used in this logic. The parts in elements 253, 254 and 255 are selected to be faster than their counterparts in elements 251 and 252 in order to compensate for the propagation time through the upper bank address multiplexer 256. Furthermore, the elements 252, 254 and 255 are selected to be faster than the elements 251 and 253, respectively, because of the propagation delay required in the preliminary logic 259 that is in series with their output to the MLR 82.

The upper bank address multiplexer 256, which is included in the next address generator 44, is used to provide one of the two addresses that are being selected during any firmware branch. The lower bank address (the address used by the lower bank control store PROMs) is the next address which is in the control store word (the NA field) and is the address which is explicitly selected in that control store word. The other address which is used for a branch, that which is used in the upper bank, is some logical derivative of the NA field or is a logically generated address from PROMs or other logic in the CPU as shown by the three inputs to MUX 256, which are selected in accordance with the branch type. This other logic, i.e., the PROMs, and the logic and the upper bank address multiplexer which select then takes additional propagation time which is not present in the address path in the lower bank. The difference between these two address paths is compensated for by the difference in the speeds of the control store chips in series with it. By utilizing one bank (i.e., the lower bank) which has a direct address path, only some of the PROMs need to have increased speed whereas if a MUX, such as MUX 256, were used for both banks, all PROMs would have to have increased speed in order to provide the same propagation time.

As has been noted, the propagation delay up to and through the upper bank address MUX 256, which is generating address bits which are received by the faster PROMs of the upper bank, are uniformly faster than their lower bank counterparts. Thus, the data at the output of each PROM is stable at approximately the same time.

The preliminary logic 259 which is connected to the output of the fastest PROMs in each bank, that is elements 252, 254, and 255, is used to perform some preliminary logic decoding of the next control store word prior to latching it in MLR 82. That is, this may include the select/modify logic 53 which is used to generate the address inputs for the DRAM 11 and the BRAM 12, and which address inputs have to be available early in the control store cycle. More particularly, the address inputs cannot wait to be generated after the main clock has enabled the data into the MLR, but must be generated at the input to the MLR so as to be available as soon as the clock transition has taken place.

The source for the two addresses which are used for selecting a control store word in the lower bank and the upper bank are as follows. The lower bank address, NA, comes directly from the control store word for the current firmware step. Thus, it is available as soon as that control store word has been clocked into the MLR 82. The address NA is an input to both elements 251 and 252. The upper bank address, at the output of multiplexer 256, i.e., the address inputs to elements 253, 254, and 255, is a logical derivative of a number of logic functions included in the CPU. The address multiplexer, of the present embodiment, may generate eight different functional addresses which can be used by the upper bank. These are the result of the eight possible branch types which can be specified in the control store word.

These branch types are known as X0 and X1, XA, XB, XR, XE, XW and XL, as shown in the table of FIG. 6. Branch types X0 and X1, which are the most common types of branches, are basically a direct logical function of the NA field. Such branch types use the NA field, with the low order bit NA10 unchanged NA($\overline{A}$) or complemented NA(A). The other six branches are used for specific purposes. The XA branch is used for selecting the appropriate starting address to initiate the decode of a new instruction's opcode. The XB branch is used to perform the initial decoding of some of the address syllables which are possible in the CPU. The XR branch is used to select the starting address for the execution of the routine to read the operand in most cases, or for the execution of certain instructions which are capable of execution immediately. The XE branch is used to select among the starting addresses of the firmware routines which are used to execute the individual instruction algorithms. The XW branch is used to select one of a number of routines which are used to store the operand. The XL branch is used to allow a simplified firmware splatter under the control of the firmware. This branch uses the contents of the link register, which can be loaded under firmware control to control four bits of the upper bank address.

All of the major branches, XA, XB, XR, XE, XW, and XL use the two high order bits (NAS 1, 2) of the NA field as their high order bits, but generate the remaining eight bits for their particular address in different manners.

The XA splatter uses the output of the five (5) XA PROMs to generate bits 3 through 10 of the XA next address.

The XB splatter uses three constant signals, two binary ones (11) and a binary zero (0), one bit of the F register 38, and four outputs from a PROM which is driven by the F register to generate bits 7 through 10 of its NA field.

The XR splatter uses three binary zeros (000), generates the next bit with the contents of a control flop (KOP) whose state relates to an instruction type, and generates the last four bits, bits 7 through 10, from an XR PROM.

The third bit of the XE splatter is the aforesaid instruction type signal. The next bit indicates whether bit 0 of the F register is zero; the follwoing bit whether bits 1 through 3 of the F register 38 are all zeros, and bits 4 through 8 of the F register are utilized as bits 6–10 of the NA field.

The XW splatter uses a combination of signals: a constant zero and three outputs of a PROM which decodes and classifies operand size type for bits 4 through 6. Bit 7 is a logic one, bit 8 is an output of the PROM which classifies operands as either addresses or non-addresses, and finally two bits which are the output of an XW PROM, for bits 9 and 10 of the NA which identifies whether the result is to go to memory, to a base or data register or to a so-called K register.

The address lines for the XL branch use bits 1 through 6 of the NA field for the first six bits, and four bits of the link register to generate the last four bits (bits 7 through 10).

These various inputs are selected by the set of eight-to-one multiplexers which comprise the upper bank address MUX 256. The particular address which is selected through this MUX is selected by use of the current control store word. In the current control store word, branching is performed by selecting one test condition and testing it for either being satisfied or not being satisfied. The output of this logic is two signals, one TCTRUE— or NOT TRUE, the other TCTRUE+ or TRUE. TCTRUE— is the signal on line 261 in the block diagram of FIG. 5 and TCTRUE+ is the signal on line 262. These signals are connected to the enable inputs of the respective control store PROMs.

At the beginning of a given firmware step, the NA field becomes stable and that address immediately begins propagating through the control store elements 251 and 252. As fast as the logic operates thereafter, the output of the upper bank address MUX 256 becomes stable, and that address begins propagating through the control store elements 253, 254, and 255. One of the address bits at the output of the MUX 256 selects between element 254 and element 255 because these elements are implemented with higher speed PROMs having a smaller word storage capacity. Accordingly, what is an address line for a 1K word (4 bits/word) PROM, becomes a selective enable line for two 512 word PROMs, with one enable input of PROM 255 being coupled via inverter 264.

More particularly, in elements 254 and 255, which are the selected 512×4 bit control store PROMs, the address bits are partitioned slightly differently. The reason for this is that a 512 word PROM only accepts nine bits of address. The tenth address bit, which is an address bit to all the other control store PROMs, is used instead as a second enable on the 512×4 control store PROMs. That is, element 254 would be enabled for addresses 400 through 5FF, and since the inverse of that same address line is coupled to element 255, it would be enabled for addresses 600 through 7FF.

Thus, as fast as the addresses are available, they are propagated through the control store PROMs. Meanwhile, in parallel, the TC (test condition) logic 30, as shown in detail in FIG. 7, determines whether the test condition is satisfied or not satisfied, with the outputs TCTRUE— and TCTRUE+ becoming stable thereafter. If the test condition in the polarity indicated was satisfied, then the low state TCTRUE+ will enable PROMs 253, 254, and 255, while TCTRUE—, being in a high state, will disable PROMs 251 and 252. Thus, the outputs of the wired OR connections, as shown by symbols 257 and 258 (76 and 20 lines coupled respectively), will be the contents of the addressed upper bank control store location. However, if the condition was not satisfied, then TCTRUE— (not TRUE) will have the other polarity or state and will enable control store elements 251 and 252, while TCTRUE+ will disable elements 253, 254, and 255. In such a case, the outputs of the wired OR connections 257 and 258 will be the contents of the addressed lower bank location.

The enable time for the control store PROMs is typically 15 to 20 nanoseconds. This is significantly faster than the address propagation time for a PROM which, as noted on FIG. 5, may be, for example, 60 nanoseconds for PROM 251. Thus, the "delay" from the time when the test condition results are known has been enhanced so that the enable propagation time of the PROMs is controlling rather than the address propagation time through the PROMs. The reason that these particular concerns have been taken with the timing through this chain of logic, i.e., the propagation time through the upper bank address generation and selection, the timing through the control store PROMs, and the timing through the preliminary logic, is that the worst case time at which the data at the input to the MLR 82 must be stable, is the time at which the main clock is triggered. It is one of the major functions controlling the cycle time, and, thus, the speed of the CPU.

Now referring to FIG. 7, details of the test logic 30 for generating the TCTRUE+ and TCTRUE— signals is shown. The TCTRUE+ signal is generated at the negation output of multiplexer (MUX) 302 on line 262, and the TCTRUE— signal is generated at the negative output of MUX 304 on line 261. The lines 261 and 262 are coupled to the PROMs as shown in FIG. 5. The multiplexers 302 and 304 each have eight inputs (0-7), with each like numbered input coupled to receive the same input. Such inputs are received from the eight outputs of multiplexer 300 which actually includes eight multiplexers MUX1-MUX8, each having eight inputs and one output. The sixty-four inputs to the multiplexer 300 are each coupled to receive a test condition from various functions included in the central processing unit 100 as indicated by the test logic 30. Depending upon the condition of the function tested, either the upper bank or the lower bank of the control store will be enabled and accordingly addressed. The inputs to the multiplexers which are selected and/or enabled are determined by control bits received from the current control word, i.e., firmware word from the control store.

Thus, it is desirable to branch on a variety of different signals, which may, by way of example, be sixty-four in number, such that only one signal represents the selected one of the sixty-four inputs. The logic of FIG. 7 provides this capability with minimal propagation time by use of two levels of multiplexers, one level comprising multiplexer 300 and the other level comprising multiplexers 302 and 304. The logic of FIG. 7 also enables such branching based on either of the two polarities of the same signal.

The operation of the logic of FIG. 7 is as follows. One input of each of the eight multiplexers included in multiplexer 300 is selected for propagation to the negation outputs, GP0 though GP7, respectively, by the three bits received at select inputs 3, 4 and 5 of each of the eight multiplexers. These three bits are received from the TC field (bits 13-15) of the firmware word. The outputs GP0-GP7 are respectively coupled to the 0-7 numbered inputs of each of the multiplexers 302 and 304. The multiplexers 302 and 304 are also coupled to receive at their enable inputs the signals CRTCSP— and CRTCSP+, respectively. The CRTCSP signals (assertion and negation) are also received from the current firmware word, and more particularly, the TP field in the firmware word, transferred via the register 82.

The multiplexers 302 and 304, which may be purchased from a semiconductor vendor such as Texas Instruments Inc. under part number SN74S251, will allow the switching of the assertion and negation outputs of the multiplexer if the signal on the enable input is low or a binary zero. If such signal on the enable input is high, the outputs are floating, and as configured, such multiplexer having a high enable input will be effectively removed from the logic of FIG. 7. Thus, as can be seen, only one of the multiplexers 302 and 304 will be enabled at any given time. The outputs of the multiplexers 302 and 304 are coupled so that the assertion output of each multiplexer is coupled to the negation output of the other multiplexer to produce a so-called wired-OR circuit connection. Thus, with either of the multiplexers 302 and 304 enabled, the TCTRUE signals are obtained with the proper polarity. The TCTRUE signal which is low or a binary zero, will enable the bank to which it is coupled. That is, if TCTRUE− is low, the lower bank will be enabled.

Thus, as can be seen from the operation of the logic of FIG. 7, if the CRTCSP− signal is high and accordingly the CRTCSP+ signal is low, then MUX 304 is active or enabled and the signal TCTRUE+ reflects the level (high or low) of the one of sixty-four conditions being tested and TCTRUE− reflects the inverse of such level. If the CRTCSP− signal is low and accordingly the CRTCSP+ signal is high, then MUX 302 is active or enabled and the signal TCTRUE− reflects the level of the condition being tested and TCTRUE+ reflects the inverse of such level. Whether the upper or lower bank of the control store is enabled depends upon which of the signals TCTRUE− or TCTRUE+ is low.

Figure 8:
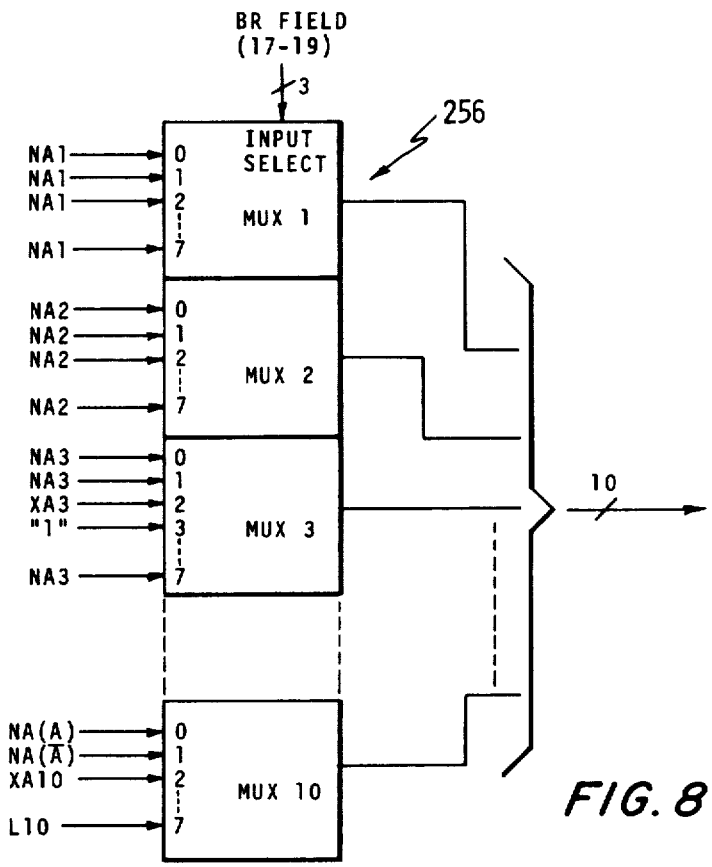
FIG. 8 illustrates the details of a multiplexer used in addressing the control store included in the central processing unit of FIG. 2.

Details of the MUX 256 and the connections thereto are shown in FIG. 8. More particularly, the MUX 256 is shown to include ten multiplexers each with eight inputs. The inputs to these ten multiplexers correspond to the signals identified in the table of FIG. 6. These signals are coupled for the eight branch types depicted in FIG. 6, such that the first signal for each of the branch types is received at the corresponding eight inputs of MUX 1 included in multiplexer 256. Thus, MUX 1 has coupled to each of its eight inputs the signal NA1. MUX 2 also has the same signal (NA2) coupled to each of its inputs. For each of the other multiplexers of MUX 256, except for the first two inputs, the signals coupled to the input are, for the most part, different. For example, MUX 3 has coupled to its number three input, the signal XA3 which, as shown in FIG. 6, is the third bit of the upper bank address for the XA branch, such third bit being a bit from position 3 of a so-called XA PROM which is not shown, but which may simply be a decoder coupled to receive its primary inputs from the F register 38 and whose output is coupled for receipt by MUX 3 of multiplexer 256.

The other inputs of the remaining multiplexers of MUX 256 also receive the inputs as depicted in FIG. 6. The first two inputs of MUX 10, NA(A) and NA ($\overline{A}$) are of further interest. More particularly, the use of these two bits, one the complement of the other, allows more flexible and efficient pairing of control store (PROM) locations for branch operations. In the prior art, it has been known to branch on a branch hit condition to an odd PROM location and to branch on a branch no-hit condition to an even location, or vice versa. However, such prior art technique has limitations. For example, assuming four consecutive locations whose addresses are XXX00, XXX01, XXX10, and XXX11 (where X is either a binary 1 or a binary 0), a sequence which is branching can go to address XXX00 or XXX01 depending on a no-hit or hit condition, or another sequence can go to address XXX10 or XXX11. However, even if locations XXX11 and XXX01 certain exactly the same information, they cannot be shared, i.e., two locations have to be used even for the same contents. This is because both addresses are odd and the only pairing allowed is for odd/even addresses. In another prior art technique, a no-hit condition could be made to cause the addressing of the location specified by the control store word and a hit condition could cause the addressing of a location specified by the higher order address bits with the two lowest order bits, for example, both being binary ones. In this manner, an address whose two lowest order bits were both binary ones, could be paired with addresses whose two lowest ordered bits were either two binary zeros or a binary one and a binary zero (in either order). However, this restricted the common address to an address which had its two lowest ordered bits binary ones (or vice versa, i.e., two binary zeros with appropriate change of the other paired addresses to one whose two lowest ordered bits are either both binary ones or a binary one and a binary zero).

In a data processing unit which allows a variety of sources to generate or form the next address for the control store, the use of the arrangement as shown in the Figures, more specifically FIGS. 5 and 8, is desirable. More particularly, the logic shown in such Figures allows a reduction in the total number of firmware or control store locations by allowing all locations to be used as alternates to an increased number of selected locations. In order to accomplish this, the least significant bit position (NA10) is coupled so that for the X0 branch, NA10 is in fact the same as the NA10 bit, NA(A), received from register 82 for the current control store word, whereas, for the X1 branch, the complement of such bit, NA($\overline{A}$), is used.

Figure 9:
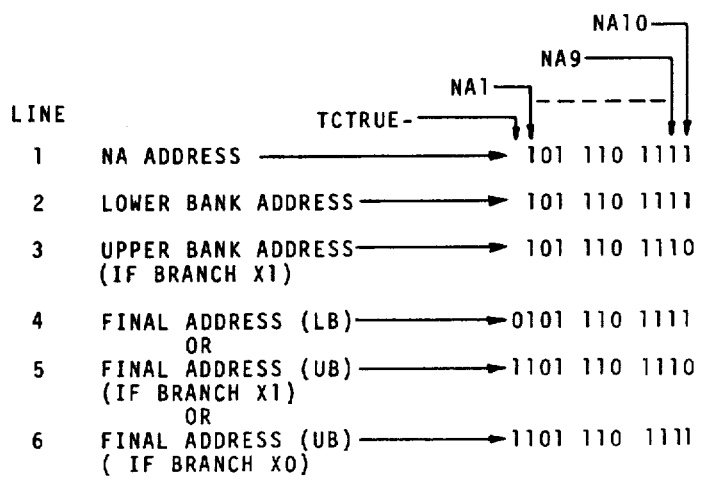
FIG. 9 illustrates an example of the operation of pairing locations in the control store included in the central processing unit of FIG. 2.

By way of example, FIG. 9 should be referenced. If the NA address is as shown on the first line, then the lower bank address is, as shown, the same. The upper bank address is, however, dependent upon whether there is an X0 or X1 branch. If there is an X1 branch, then the upper bank address is shown in the third line. The final address depends upon whether the signal TCTRUE− is a binary zero or one. If a binary zero, then the lower bank PROMs will be enabled. Thus, as shown in the fourth line, the final address will be for the lower bank if TCTRUE− is a binary zero. If TCTRUE− is a binary one, then the final address will be for the upper bank. Depending upon whether the branch is X1 or X0, the final address will be as shown in line 5 or 6 respectively of FIG. 9. More particularly, it can be seen that the lower bank address on line 4 may be paired with either of the addresses for the upper bank as shown on lines 5 and 6.

In this manner, more efficient pairing of locations may be obtained. Variations of the example shown in FIG. 9 will illustrate that an even address location of the lower bank may be paired with an even or odd address location of the upper bank, and that an odd address location of the lower bank may also be paired with either an even or odd address location in the upper bank.

2. Overview of Information Transfer

Of particular interest in the instant application is the transfer of information within a central subsystem and between the central subsystem and the system elements such as communications processor 109, I/O controller 107 and I/O devices 108, and the memory modules 106 by means of the system or megabus 105. The information includes control signals, data, and addresses flowing bidirectionally among the elements within a central subsystem and between a central subsystem and the other system elements. The megabus 105 and the local bus 9 provide the capability for transmitting in parallel two data words each comprising two bytes, i.e., 32 bits plus parity bits, 24 address bits plus parity bits, and a plurality of bits of control signals all on different signal lines or conductors.

Within a central subsystem, each of the cache/MMU 103, CPU 100, SIP 101, and CIP 102 includes circuitry elements for receiving and transmitting bits of information from and to the other elements connected to the local bus 9 within the central subsystem. The cache/MMU 103 additionally interfaces with the megabus 105 and, therefore, includes along with the other circuit elements connected to the megabus, circuitry elements for similarly receiving and transmitting information transmitted along the megabus.

The operating characteristics of the megabus and the local bus are quite similar in that they each permit any two units connected thereto to communicate with each other at a given time via both dedicated and common signal paths transmitting the bits of data, addresses, and control signals. Also, communications along the megabus and the local bus are asynchronous. Any unit wishing to communicate to another unit, requests a bus cycle. When that bus cycle is granted, the initiating unit becomes the master, and may address any other unit in the system as the slave whether that unit is within a central subsystem or connected to the megabus.

Most transfers are in the direction of master to slave. In cases where a response cycle is required, the initiating or requesting unit assumes the role of master, secures a bus cycle, and transmits an operational request to a destination or slave unit. Within the request is an identification, in the form of a channel number, of the source of the operational request to enable the slave unit to direct a subsequent response to the master unit. When the slave unit has performed the requested operation and must transmit a response to the requesting unit, the slave assumes the role of master and, during a second bus cycle, initiates a transfer to the initiating unit which will then assume the role of a slave. These two bus cycles may complete the interchange between the units. Intervening time on the bus between the two cycles (the request cycle and the response cycle) may be used by other system elements for requests unrelated to the two elements.

A master may address any other unit on either the local bus or the megabus as a slave. It does this by placing the slave addres on the address leads of the bus. Thus, the CPU 100 would couple a slave address on the address leads of the local bus 9 whereas the communications processor, for example, would place the slave address on the address lines in the megabus 105. As stated above, there may be 24 address leads which can have either of two interpretations depending on the state of an accompanying control lead, called the memory reference signal, MREF. If the memory reference signal is TRUE, the requesting unit is addressing a location in the memory modules 106. If, however, the memory reference signal is FALSE then the address leads contain a ten-bit channel number and a six-bit function code. When a channel number and function code are being transmitted along the address leads, the source and destination units, i.e., master and slave, respectively, are passing control information, data, or interrupts. Each of the system units both within and without a central subsystem is identified by a ten-bit channel number uniquely set by switches within the particular unit.

When a master requires a response cycle from a slave, it indicates this to the slave by the state of a binary control lead designated WRIT. In one state, WRIT indicates to the slave unit that a response cycle is required as, for example, in a read command, and when WRIT has its other binary state it indicates to the slave unit that no response is required.

When WRIT indicates that a response is expected, the data lines of the megabus contain the channel number of the requestor unit. The response cycle is then directed to the requestor by a non-memory reference transfer, and a control lead SHBC, designated as the second-half bus cycle lead, is enabled to communicate to the requestor unit that the information transferred thereto is a response by the slave unit to a previously issued request by the master unit.

As stated above, a channel number will exist for every end point in a particular system with the exception of the memorytype processing elements which are identified by memory addresses. A channel number is assigned for each such device, and full duplex devices as well as half-duplex devices utilize two channel numbers. Output only or input only devices use only one channel number each. Channel numbers are easily variable and accordingly one or more hexadecimal switches (e.g., thumb wheel switches) may be utilized for each unit connected to the the megabus to indicate or set that particular unit's address. Thus, when a system is configured, the channel number may be designated for each particular unit connected to the bus as may be appropriate for that particular system. Units with multiple input/output (I/O) ports generally will require a block of consecutive channel numbers. By way of example, a four-port unit may use rotary switches to assign the upper seven bits of a channel number and may use the lower order three bits thereof to define the port number and to distinguish input ports from output ports.

The channel number of the slave unit will appear on the address bus for all non-memory transfers and each unit compares that number with its own internally stored number (internally stored by means of the switches). The unit which achieves a compare is, by definition, the slave and must respond to the current bus cycle. Generally, no two end points in a single system will be assigned the same channel number.

A specific bus or I/O function is indicated by lines 18-23 of bus address leads during a non-memory reference cycle. Function codes designate either input or output operations and, for example, all odd function codes could designate output transfers (writes) while all even function codes may designate input transfer requests (reads).

There are various output and input functions. One of the output functions is a command whereby a data quantity, for example 32 bits, is loaded from the data leads of the megabus into the system unit designated by the channel number in the channel number field of the address lines. The meanings of the individual data bits are component specific, but the term "data quantity" is taken to mean the data to be stored, sent, transmitted, etc., depending upon the specific component functionality. Another such output function is a command whereby a 24-bit quantity, for example, is loaded into a channel address register. The address is a memory byte address and refers to the starting location in memory where the channel will commence input or output of data. Various other output functions include an output range command which defines the size of the memory buffer assigned to the channel for a specific transfer, an output control command which by its individual bits causes specific responses, output task functions such as PRINT commands, and output configurations indicating functions such as terminal speed, card reader mode, etc.

The input functions include functions similar to the output functions except in this case the data is transferred from the unit to the bus. Thus, the input functions include the input data and input range commands as well as the task configuration and input interrupt commands. Furthermore, there is included the device identification command whereby the channel places its device identification number on the bus.

In addition to memory writes and reads and I/O input and output commands, a unit connected to the megabus can request an interrupt of the CPU 100.

A unit wishing to interrupt the CPU requests a bus cycle and, when the bus cycle is granted, the unit places its interrupt vector on the bus. The interrupt vector includes the channel number of the transferring unit, and the desired interrupt level number. The CPU will accept the interrupt if the level presented is numerically smaller than the current interrupt CPU level and if the CPU has not just accepted another interrupt. Acceptance of an interrupt is indicated by a bus ACK signal and nonacceptance of an interrupt is indicated by a NAK signal. Devices receiving a NAK will again request an interrupt when a signal indicating resumption of normal interrupting is received from the CPU, i.e., RINT (resume interrupts) is true. The CPU issues this signal when it has completed a level change and, therefore, may be capable of accepting interrupts once again. The channel number of the master is supplied in the vector for use since more than one channel may use the same interrupt level. Interrupt level ZERO is of special significance since it is defined to mean that the unit shall not interrupt.

Figure 10:
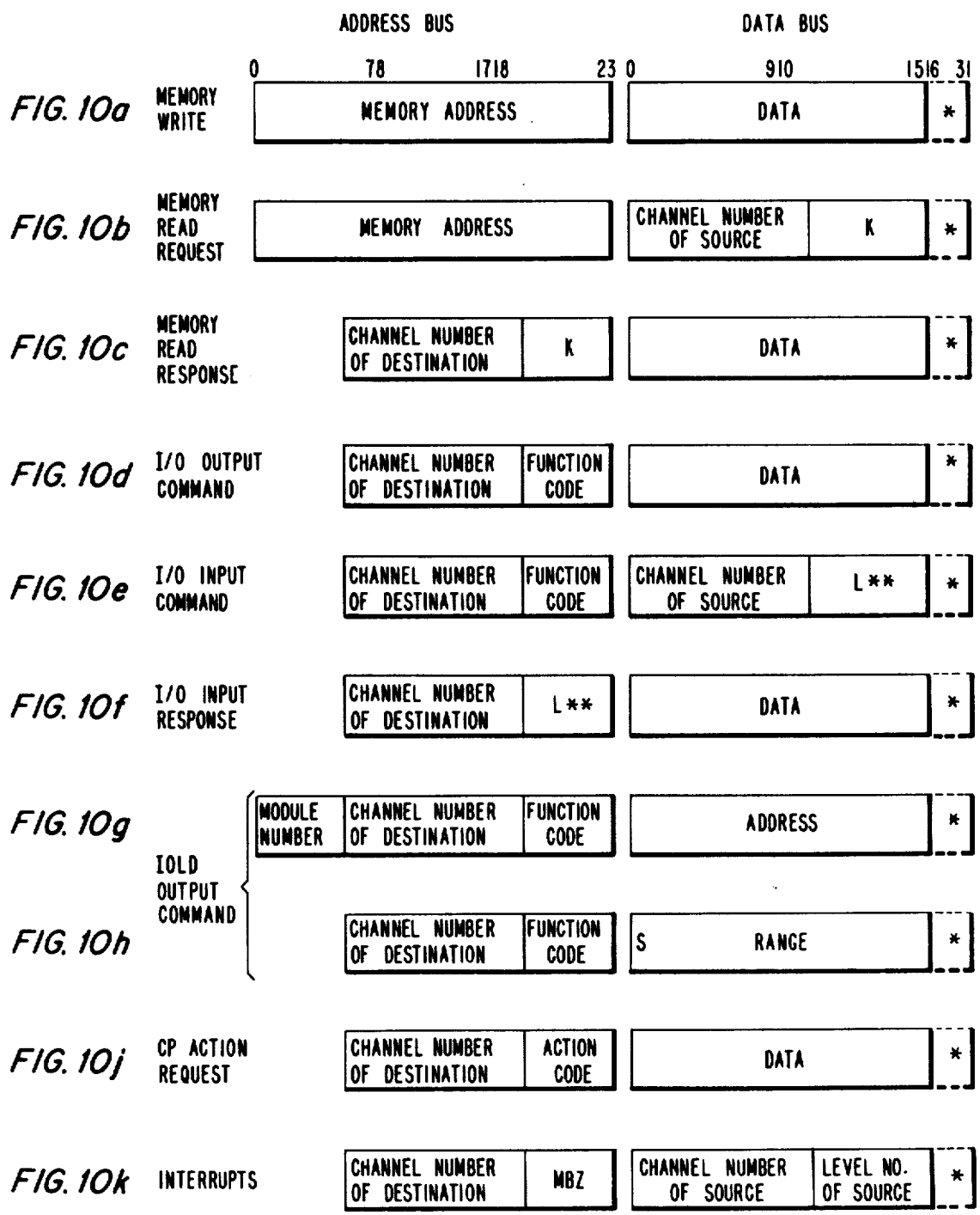
FIGS. 10a-10k illustrate formats for transferring information in the address and data fields of the megabus connecting the processing units of the present invention.

FIGS. 10a–10k illustrate the data and address bus formats for the above-described bus operations. FIG. 10a illustrates the format for a memory write and it can be seen that the 24 address bits (0–23) designate a particular memory address and the data bus transfers either a single word (bits 0–15) or a double word (bits 0–31) of data to be transferred to the designated memory address. A memory read request is illustrated in FIG. 10b and, once again, address bits 0–23 designate the memory address to be read from and data bus bits 0–9 designate the channel number of the source of the memory read request.

A slave unit, in response to a memory read request, transmits information according to the format of FIG. 10c. Bits 8–17 of the address field contain the channel number of the destination unit (the requesting unit) for the 1 or 2 words contained in bits 0–15 or bits 0–31 of the data bus, respectively.

FIGS. 10d and 10e illustrate the formats for an I/O output command and an I/O input command, respectively. In the output command, bits 8–17 of the address bus contain the channel number of the destination unit and a function code is specified in bits 18–23. The data bus contains either 16 to 32 bits of data to be operated upon according to the specified function code. The input command has a similar address bus format and contains, in bits 0–9 of the data bus, the channel number of the source of the command which will be the same as the channel number in bits 8–17 of the I/O output command. Thus, the data bus in the I/O input command specifies to the slave or response device the identification of the source of the input command.

FIG. 10f illustrates the response of a slave to an I/O input command. Bits 8–17 of the address bus contain the channel number of the destination (requesting) unit as specified in bits 0–9 of the data bus for the I/O input command. The data bus contains either 16 or 32 bits of data retrieved as a result of the input command.

FIGS. 10g and 10h illustrate two commands generated during the execution of an IOLD instruction by the CPU, wherein bits 0–7 of the address bus specify the module number of the beginning address of the data and the device is designated by the channel number set forth in bits 8–17. Bits 18–23 of the address bus specify the function code, and the data bus sets forth in bits 0–15 the remainder of the memory address of the data to be affected. The format of FIG. 10h specifies the destination channel number in bits 8–17 and a function code in bits 18–23. The bus specifies in bits 10–15 the range of addresses to be loaded.

FIG. 10k illustrates bus formats for CPU interrupts. Bits 8–17 of the address bus specify the destination (CPU) channel number. The data bus during an interrupt request contains the channel number of the source of the interrupt request in bits 0–9 and the priority level number desired in bits 10–15.

Figure 11:
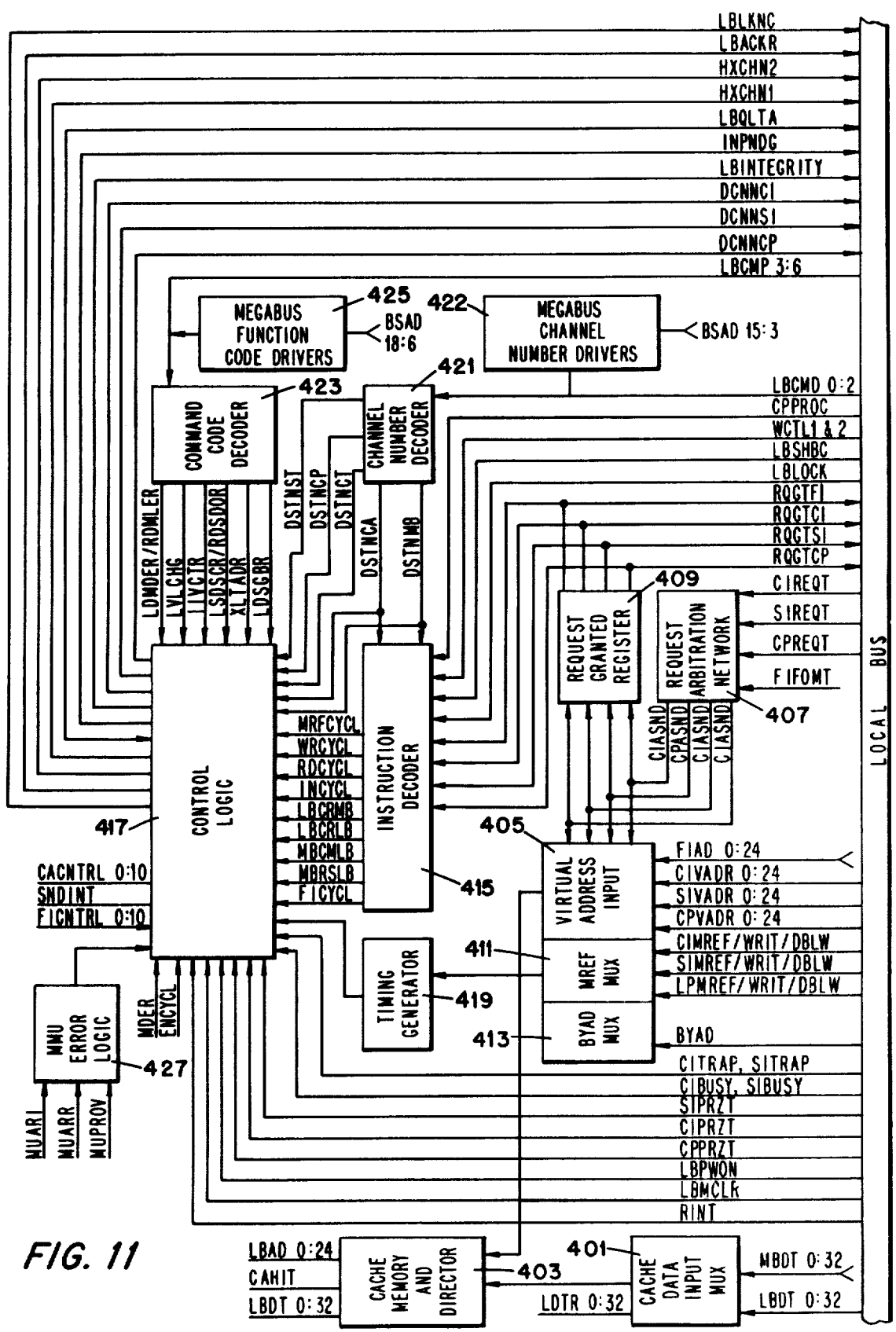
FIG. 11 is a detailed block diagram illustrating the local bus adapter for controlling the transfer of information between the processors and a cache/MMU in a central subsystem of the present invention.
Figure 12:
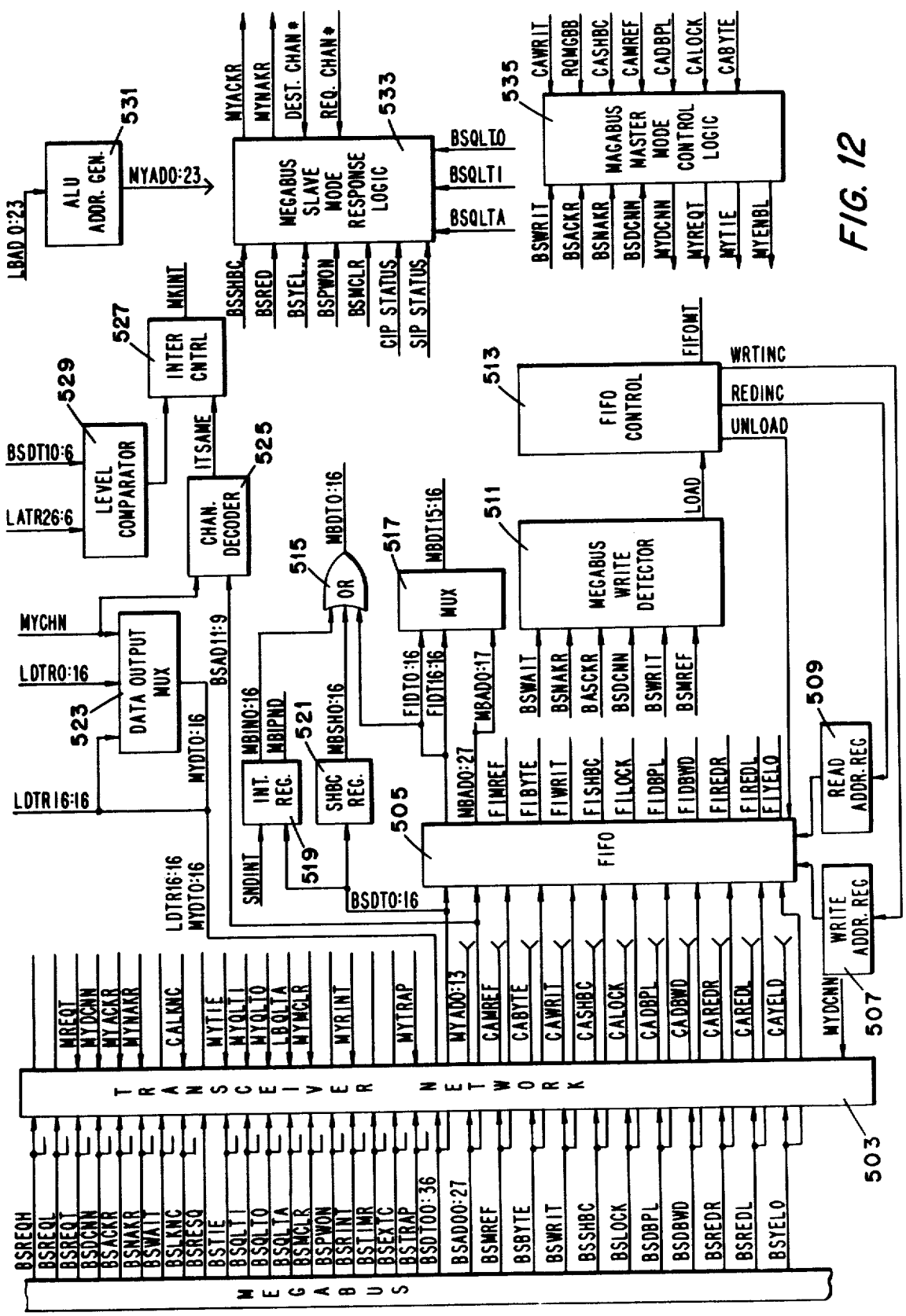
FIG. 12 is a detailed block diagram illustrating the megabus adapter for controlling the transfer of information between the central subsystem and the megabus adapter of the present invention.

The specifics of the cache/MMU 103 pertinent to the transfer of information between the CPU 100, SIP 101, CIP 102 and the cache memory in the cache/MMU 103 are set forth in block diagram form in FIG. 11. This is also referred to as the local bus adapter. FIG. 12 shows in block diagram form the apparatus within the cache/MMU 103 for interfacing the system or megabus 105 with the central subsystem and for controlling transfers of information along the megabus. This is hereinafter referred to as the megabus adapter.

Considering now FIG. 11, the signals which comprise the local bus are set forth as having the local bus as their source or destination.

Cache data input multiplexer 401 selectively provides 32 bits of data (2 words of 2 bytes each) for storing in the cache memory 403 and non-data information for storing in the directory of the cache memory. Cache data input multiplexer 401 selects either the 32 data bits (plus the 4 parity bits for a total of 36 bits) currently residing on the data lines of the local bus (LBDT 0:32) or the 32 data bits (plus parity bits) currently being supplied from the megabus adapter (MBDT 0:32). The local bus data LBDT has as its source either the CPU 100, SIP 101, CIP 102, or cache/MMU 107 whereas the source of megabus data MBDT could be the memory modules 106, I/O devices 108, communications processor 109 or other units connected to the megabus. The megabus data is normally supplied as a response to an I/O command or a memory read.

The cache memory and directory 403, which is the subject of the present invention and will be described in detail hereinafter, is a very high-speed, limited capacity memory for storing duplicates of a selected group of data words also stored in the memory modules 106. As an example, the cache memory could have a data storing subsystem capacity of 4,096 words with an equal number of entries in the cache directory subsystem. Commonly, the cache memory stores the most recently requested information. It is, however, important to understand that the integrity of a cache memory must be maintained at all times and, therefore, if a unit outside of a particular central subsystem performs a memory update on a location in the memory module 106 that is also stored in cache memory 403, the entry in the cache memory must also be updated. As will be hereinafter described, the megabus adapter performs such integrity updates.

The purpose of a cache memory is to reduce the time necessary to supply data addressed by one of the processors, CPU 100, SIP 101, or CIP 102. Thus, whenever a memory read is requested by one of these processors, an inquiry will be made into the directory of the cache to see whether the requested data words are stored therein. If they are, then the information will be transmitted from the cache memory 403 as local bus data LBDT. Similarly, the output, CAHIT, signals whether the requested data is resident or nonresident in cache 403.

If one of the processors, CIP 100, SIP 101, or CIP 102 performs an update on a memory location represented in cache 403, a memory write to perform a similar update will be issued to the affected location in the system memory module 106 in order to insure the integrity of data stored therein.

The directory subsystem within the cache memory 403 stores designations of the addresses associated with the data stored in the data storing subsystem. These originate at the virtual address input multiplexer 405. Multiplexer 405 selects from a virtual address supplied from the CPU (CPVADR), the SIP (SIVADR), the CIP (CIVADR), or from the megabus FIAD. These addresses are 24 bits long. The output of virtual address multiplexer 405 is VAIN0A, VAIN 0:23 supplied as an input to the directory of the cache memory 403.

As stated above, communication along both the megabus and the local bus is performed on an asynchronous basis. Thus, the CPU 100, SIP 101, and CIP 102 must request a local bus cycle before they can transfer information to another unit within the central subsystem, the cache/MMU, or a unit on the megabus. A fourth source of requests for a local bus cycle is a first-in first-out (FIFO) memory resident within cache/MMU 103 and containing a limited number of "snapshots" of information transfers along the megabus 105. The information transfers stored in the FIFO memory are commonly main memory writes performed by an I/O unit coupled to the megabus.

The request signals CPREQT, SIREQT, CIREQT, and FIFOMT are supplied to the request arbitration network 407 which, when there is an available local bus cycle, will assign the bus cycle to one of the requestors. Such an assignment is reflected in the enable signals CIASND, CPASND, SIASND, and FIASND provided to request granted register 409, virtual address input multiplexer 405, memory reference multiplexer 411, and BYAD multiplexer 413.

Request granted register 409 generates an enable signal to be transmitted to the requesting unit that was granted a local bus cycle. Thus, the signals RQGTCP, RQGTSI, RQGTCI, and RQGTFI take on values which indicate the granting of a local bus cycle to the CPU, SIP, CIP, and FIFO, respectively. The outputs of the request granted register are also supplied as inputs to instruction decoder 415.

Additional control signals are transferred over the local bus between the cache/MMU and the local bus processors. The previously mentioned signal RINT (resume interrupts) is generated by the CPU to indicate that the CPU will accept an interrupt from a non-central subsystem unit, i.e., a unit coupled to the megabus.

The signal LBMCLR is normally false and becomes true when the Master Clear button on the CPU maintenance panel is depressed. When LBMCLR is true, units on the bus will be initialized and the units capable of doing so will perform quality logic test (QLT) routines. The signal LBQLTA shown as an output of control logic 417 indicates that such a quality logic test cycle is being performed or that an error has been detected during the course of a QLT routine.

LBPWON is true when all power supplies in the system are operating correctly; on power failure, LBPWON goes false at least two milliseconds before the loss of +5 vdc to the logic. Controllers on the bus must at this point cease all bus traffic to enable the CPU software to perform any cleanup operations which may be necessary especially in conjunction with the memory. On the return of power, +5 vdc will be stable at the logic before LBPWON goes true. Controllers on the bus will initialize upon the return of +5 vdc.

The processor present signals, CPPRZT, CIPRZT, and SIPRZT, indicate that the associated processors are installed and operating within the central subsystem. The processor busy signals, CIBUSY and SIBUSY, are transmitted along the local bus by dedicated lines and are responses generated by the CIP and SIP, respectively, indicating that the processors are not able to accept certain requests or data transfers because they are performing other operations.

Similarly, CITRAP and SITRAP are dedicated lines in the local bus originating at the CIP and SIP, respectively, and indicating when that unit has detected a processing condition that requires a trap, which is often implemented by a forced branch to a particular firmware location.

BYAD multiplexer 413 receives the input signals collectively referred to as BYAD. These are the address bit 23 of the addresses supplied by the CPU, CIP, SIP, and FIFO. The output of the multiplexer is supplied to control logic unit 417. BYAD is a signal which indicates reference to a particular byte within a data word. As embodied herein each data word is 16 bits long and comprises two eight-bit bytes. As stated above the local bus is able to trasfer in parallel two words of data although one, two, or three bytes of data may also be transferred at one time.

MREF multiplexer 411 receives the enable signal from request arbitration network 407 indicating which of the subsystem processors or the FIFO has been assigned a local bus cycle. MREF multiplexer 411 selects inputs from either the CPU, SIP, CIP, or FIFO and supplies the selected signals to the timing generator 419. The input signals to MREF multiplexer 411 are MREF, WRIT, and DBLW with the two-letter prefix, e.g., CP,SI, CI, and FI, designating the source of the signals. This convention is implemented throughout this detailed description.

As stated above, the signal WRIT, indicates, when true, that no response is expected as a result of the accompanying transfer from a master to a slave. When this signal is false and accompanies a transfer, it indicates that a response by the slave to the master is expected. MREF identifies whether the information on the address bus is a memory address or an I/O address (channel number and function code). DBLW indicates the number of words in the data field of the local bus during a write operation or response to a read request.

The signals DBLW, BYAD, WCTL1 and WCTL2 are used in combination to control which bytes are to be written into the cache/MMU and the system memory in a write cycle. These are four binary signals and, thus, can give rise to 16 possible combinations not all of which are used. Since the local bus is capable of transferring two words or four bytes of data simultaneously, they can be considered to be byte 0 and byte 1 of word n and byte 0 and byte 1 or word N+1. When WCTL1, DBLW, and WCTL2, are all equal to ZERO then the cache/MMU or the system memory interprets a write request to write byte 0 and byte 1 of word n regardless of the value of BYAD. When BYAD, DBLW, and WCTL2 are ZERO and WCTL1 is equal to ONE, then only byte 0 of word n is written. If BYAD and WCTL1 are both equal to ONE and DBLW and WCTL2 are both equal to ZERO then byte 1 of word n is written. Bytes 0 and 1 of word n and byte zero of word n+1 are written when WCTL1 and WCTL2 are equal to ZERO, DBLW equals ONE and BYAD equals either ZERO or ONE. When BYAD, WCTL1, and DBLW are all equal to ONE and WCTL2 is equal to ZERO, byte 1 of word n and byte 0 of word n+1 are written. Bytes 0 and 1 of both word n and word n+1 are written whenever both DBLW and WCTL2 are equal to ONE, WCTL2 equals ZERO, and BYAD equals ZERO or ONE. Finally, byte 1 of word n and bytes 0 and 1 of word n+1 are written when all four control signals are equal to ONE.

Timing generator 419 receives the selected outputs from MREF multiplexer 411 and supplies appropriate timing control signals to control logic unit 417 depending upon whether a memory reference or an I/O reference is currently being received from the local bus 9 and whether it is an initial request or a response to a request.

The signals LBLOCK and LBSHBC both have independent meanings as well as a combinational interpretation. When LBSHBC is equal to ONE and is transmitted over the local bus to the processors in the central subsystem, it identifies that the accompanying data is transferred in response to an input command previously transmitted by one of the central subsystem processors to the cache/MMU. When generated by the processors in the central subsystem with MREF inactive (equal to ZERO), LBSHBC identifies a processor's response to an input command previously transmitted to the responding processor during a previous local bus cycle. In essence, LBSHBC when considered independently defines in one state that the accompanying data is a response bus cycle to a previously received request bus cycle.

LBLOCK when equal to ONE indicates that a read, modify, write (RMW) has been requested by the CPU. A lock, in effect, is a means for inhibiting a CPU memory reference to a particular address in the cache/MMU and the system memory when that location is being accessed by another CPU. The concept of locking a particular memory location to prevent access by another requesting unit under certain conditions is well-known and is used to insure the integrity of the information stored within the locked memory location. In the instant invention, LBLOCK is true for both lock and unlock types of RMWs and is used in conjunction with LBSHBC to specify the lock/unlock function during a RMW cycle. LBSHBC is false (equal to ZERO) for the lock RMW operation and true (equal to ONE) for the unlock RMW operation. MREF must also be true for both lock and unlock RMW requests since a memory reference is being performed. LBWRIT specifies whether a given RMW operation will read or write memory as described above since LBWRIT specifies the direction of the transfer being performed, i.e., from master to slave or from slave to master.

As a further explanation, the lock is implemented by a flip-flop within the memory, the condition of which is determined by the bus cycles which set or clear the lock. The lock may be set as part of a write cycle or a read request and may be cleared in a similar manner. Once a lock is set, a unit attempting a WRITE, TEST and SET LOCK, or a READ, TEST and SET LOCK will be given a NAK response from that unit. Units which perform normal write or read cycles will be unaware of the condition of the lock and will receive ACK, NAK, or WAIT responses as will be discussed below.

The signal CPPROC when true indicates to the cache/MMU that the current memory request must be checked for execute protection validation. This relates to the concept of ring numbers and involves an access hierarchy established within the system wherein certain memory locations are accessible for read only, for read and write by only certain systems elements, or for access only under certain specified conditions. The general concept of restricted access to particular information or memory locations is well-known in the data processing art and does not comprise a specific feature of the instant invention. It is sufficient to understand that if a request is made for a memory access by a requestor not permitted to access the requested location, the MMU will indicate that a protection violation has occurred and pass an error indication to the requesting unit. Again, further information concerning protection violations as they relate to ring numbers is set forth in the above-referenced U.S. patent application.

The first 3 bits of the local bus command lines LBCMD are supplied to the local bus by one of the CPU, SIP, or CIP and supplied to channel number decoder 421. Within a central subsystem, the cache/MMU will use a 3-bit (local) channel number unrelated to the corresponding 10-bit (system) channel number. Thus, for example, the CPU could be referred to by the local bus channel number 000, SIP by 001, CIP by 010, cache/MMU by 001, and a reference to a unit coupled to the megabus by a common local bus channel number 111. As can be seen, channel number decoder 421 will indicate to instruction decoder 415 that either the cache or the megabus is the destination unit and will also indicate to control logic 417 that either the cache, megabus, CIP, CPU, or SIP is the destination unit. Channel number decoder 421 also receives the three least significant bits of the megabus address, BSAD15:3, from megabus channel number decoder 422 when either a request or response is being transmitted to the cache/MMU by a unit on the megabus.

LBCMD3:6 supplies decoder 423 with the command code generated by the CIP, SIP, or CPU, or a command code supplied by the megabus command code drivers 425 (BSAD18:6). The command code decoder 423 is capable of supplying one of eight outputs to control logic 417 indicating the function requested to be performed. The commands include: LSDSCR, requesting a load of a segment descriptor assembled by the requesting processor into the segment descriptor table of the cache/MMU; LDSGBR, requesting a load of the segment base register; LDMDER requesting a load of a selected bit of the cache/MMU's mode register; REDSCR, requesting the unloading of a segment descriptor; RDMDER, requesting the unloading of the mode register; XLTADR requesting a translation of a virtual address to a physical address without the performance of a memory access and the transmission of the translated address back to the requestor; IIVCTR, requesting the unload of the interrupt vector to the CPU; and LVLCHG, requesting a load of the interrupt level register.

A precise understanding of the exact operations performed in response to a decoded function is not required for an understanding of the purpose and operation of the instant invention.

Control logic 417 also receives an input from MMU error logic module 427. In general, the output of module 427 reflects the occurrence of a request for a resource currently unavailable to the data processing system or the occurrence of a memory protection violation. As an example, if the CPU requests a read from the system memory of an address that is not included within the system memory, then that address is said to be unavailable to the CPU and the system memory will indicate this through the signals UARL (left word unavailable) and UARR (right word unavailable). Similarly, if a violation of the priority ring structure has occurred as a result of a prohibited request by a CIP, SIP, or CPU, then this will be indicated by the PROV (protection violation) signal.

Control logic unit 417 also receives inputs FICNTRL0:10 directly from the FIFO reflecting transfers from the megabus to the cache/MMU and directed to elements within the central subsystem. These inputs are shown on FIG. 12 to be the outputs of the FIFO 505: FIMREF, FIBYTE, FISHBC, FILOCK, FIDBPL, FIDBWD, FIREDR, FIREDL, and FIYELO. The functionalities of some of these signals have not been discussed: it should be noted, however, that the functionality FIBYTE and FIDBWD correspond to the meanings BYAD and DBLW, respectively, as discussed with relation to the local bus. The signals FIREDR, FIREDL, and FIYELO together define the integrity of data being transferred in that same bus cycle. FIREDL, when true, indicates that the accompanying transferred data is in error. This signal is used by the system memory on a response to a read to indicate an uncorrectable error in the left most word returned (if two words are returned in parallel). If only one word is returned, it is considered to be the left most word. FIREDR, when true, also indicates that the accompanying transferred information is in error. This signal is used by the memory on a response to a read request to indicate an uncorrectable error in the right most word returned (if two words are returned in parallel). An example of an error that would cause FIREDR and FIREDL to be true would be an uncorrectable parity error in the appropriate words of returned data. FIYELO, when true during a second-half bus cycle, indicates that the accompanying transferred information is correct, but that an error correction operation has been performed. Thus it designates a soft failure such as a corrected parity error and is taken to mean that maintenance action should be considered before the failure becomes uncorrectable. When an EDAC (error detection and correction) memory is used, FIYELO, when true, indicates that a single-bit parity error, for example, had been detected and corrected by the memory.

The function of FIDBPL (double pull) will be discussed later and, in general, signifies that instead of two words being transferred in parallel during one bus cycle, two bus cycles must be employed to transfer single words in succession.

The outputs of control logic unit 417 include what are indicated to be cache control signals CACNTRL0-10. These signals are the same status signals as the above-described FICNTRL0:10 signals and comprise CAMREF, CABYTE, CAWRIT, CASHBC, CALOCK, CADBPL, CADBWD, CAREDR, CAREDL, and CAYELO which are transferred by the megabus adapter shown in FIG. 12 to/from the megabus.

The data-coming-now outputs DCNNCP, DCNNSI, and DCNNCI signify that a response cycle is being directed by the cache/MMU to the CPU, SIP, or CIP, respectively. When received by their respective processors, these signals serve as enables to clock the transferred data, address, and control signals into the appropriate registers in the processor units.

The LBINTEGRITY line, shown in FIG. 11 collectively, refers to signals LBREDR, LBREDL, LBYELO, LBUARL, LBUARR, and LBPROV transmitted to CIP, SIP, or CPU to indicate the condition of the transferred data.

Signal INPDNG is transmitted solely between the cache and the CPU and indicates to the CPU that an interrupt of higher priority than the current priority level has been accepted by the megabus adapter and the MMU. Signals MYCHN1 and MYCHN2 are transmitted from the cache/MMU to the CPU to inform the CPU of the channel number assigned to it. These lines represent, respectively, the 21 and 22 outputs of a HXRTRY switch (hexadecimal rotary switch) located in the cache/MMU defining, as mentioned above, the manually assigned channel numbers of the cache/MMU and its associated processors.

The signal LBACKR generated by control logic 417 transmits the well-known NAK signal from the units on the megabus to the CPU. LBACKR is a binary signal having two states wherein one state signifies an ACK or lack of response and the other state a NAK.

The final signal shown in FIG. 11 is CALKNC which is activated only during a locked memory read request to the system memory. When LBLOCK is true and an addressed memory location is resident in the cache, CALKNC instructs the system memory not to conduct an actual read operation requested but to set/-clear its lock flop and not transmit data back to the cache/MMU. Since the system of the instant invention can include different types of memory modules (as will be discussed hereinafter), the exact response of the memory module to a CALKNC will vary.

Figure 13:
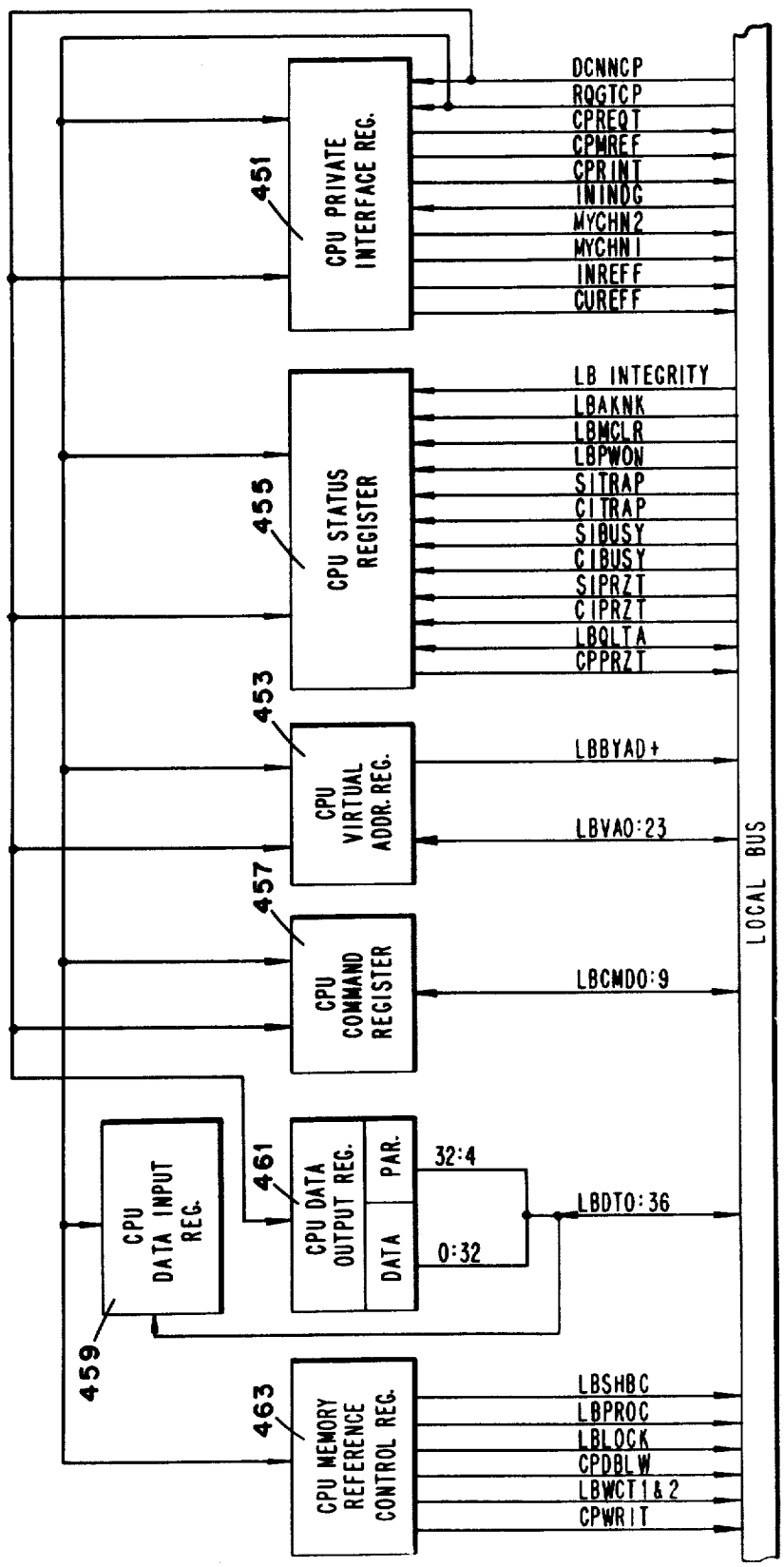
FIG. 13 is a block diagram illustrating the registers in the central processor unit for interfacing with the local bus adapter.
Figure 14:
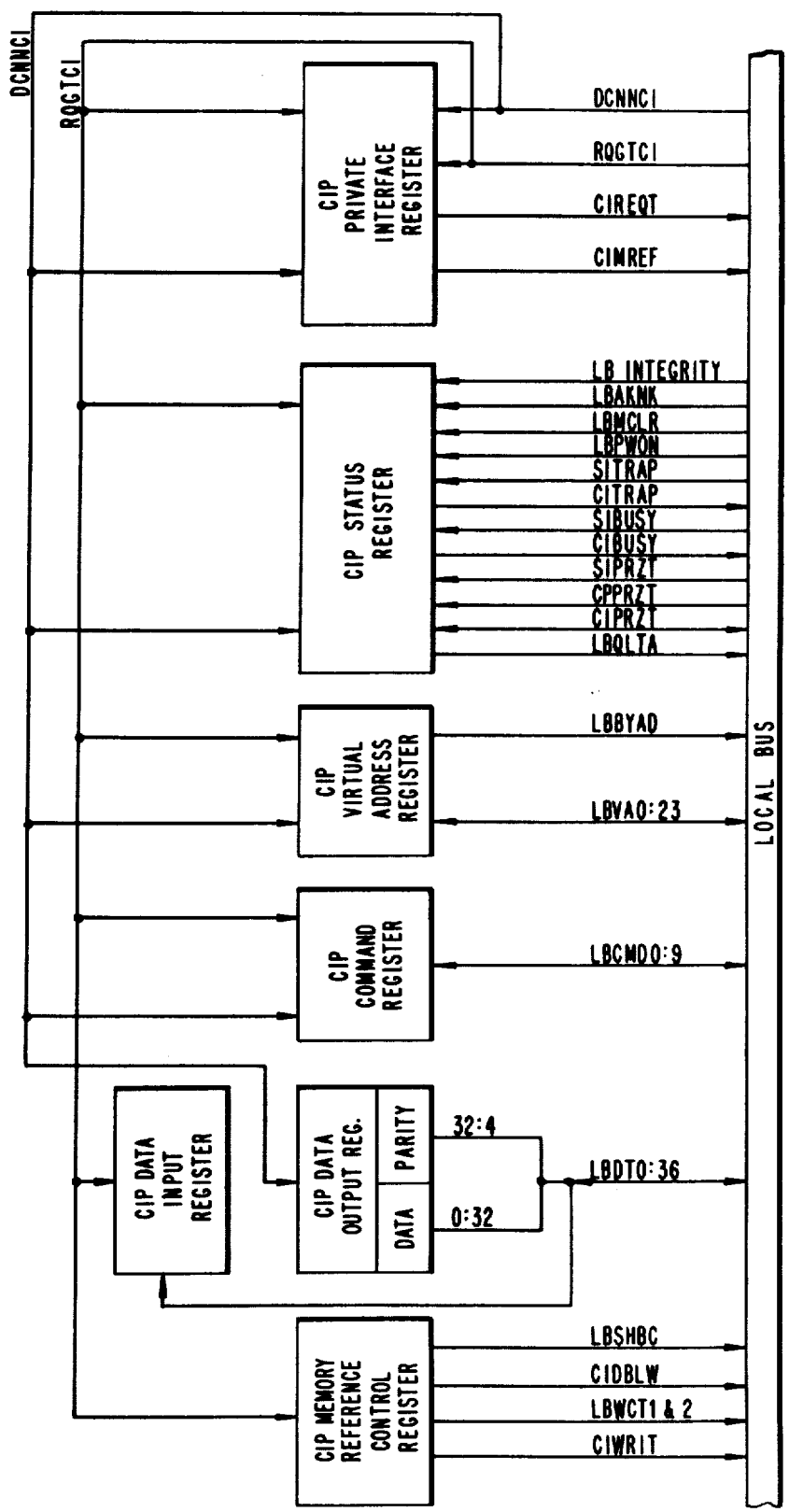
FIG. 14 is a block diagram illustrating the registers in a commercial instruction processor for interfacing with the local bus adapter.
Figure 15:
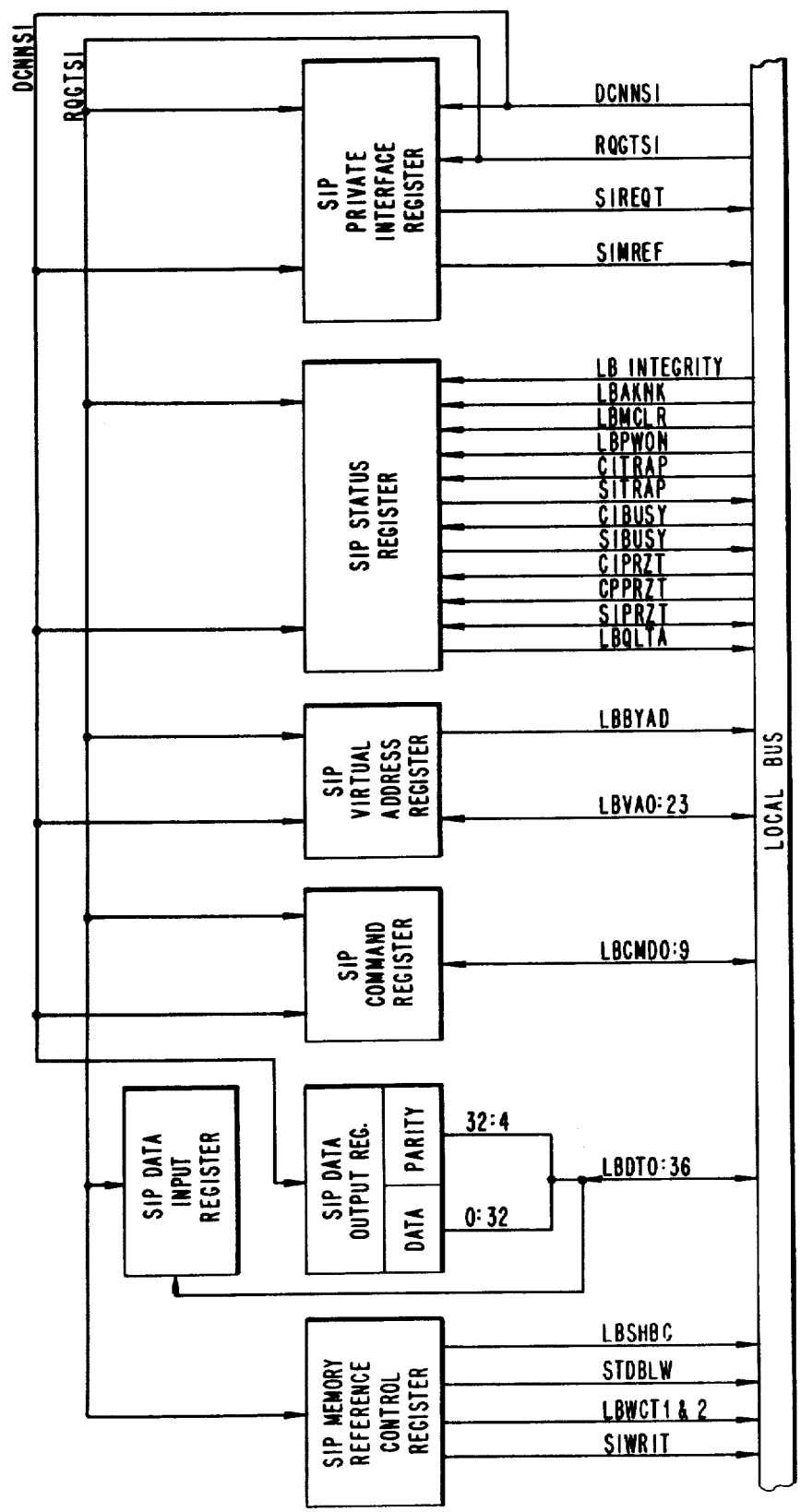
FIG. 15 is a block diagram illustrating the registers in a scientific processor for interfacing with the local bus adapter.

FIGS. 13, 14, and 15 show in block diagram form the interface of the CPU, CIP, and SIP, respectively, to the local bus. An in-depth discussion of the structure of the CPU was set forth in the preceding section 1 of the detailed description of the invention and will not be repeated here. It is sufficient for an understanding of the present invention to consider only the interfacing elements shown in FIGS. 13-15.

Referring to FIG. 13, the CPU interface includes a private interface register 451 which receives the signals RQGTCP and DCNNCP transmitted over the local bus to the CPU by the local bus adapter. RQGTCP serves as an enable signal to initiate a transfer of information from the CPU to a destination unit during a particular bus cycle. The signal DCNNCP enables the interface elements in FIG. 13 to receive information over the local bus.

The definitions of the signals received and/or transmitted by the registers shown in FIG. 13 have been previously discussed with the exception of the output of CPU virtual address register 453. This register transmits 23 address bits labelled CPVADR0:23 corresponding to either a virtual address when a memory reference is being initiated by the CPU or a destination channel number when an I/O or other communication to a non-memory unit is being requested. The output CPBYAD is a single-bit signal indicating whether a reference is being made to byte 1 or byte 2 of a data word.

The CPU status register 455 receives mostly input signals to inform the CPU of the condition of the other elements in the system. The status register reports the presence of an operational CPU in the system by CPPRZT.

CPU command register 457 generates the nine-bit commands including a three-bit local channel number and six bits of command data. Since the CPU can both receive and transmit data, it includes both a CPU data input register 459 and a CPU data output register 461. As illustrated by the CPU data output register 461, thirty two bits of data go into a data receiving portion and 4 parity bits are transmitted to a parity bit portion. This same facility, i.e., the four parity bits, is duplicated in the CPU data input register 459 and, in fact, is included in any element in the system that transmits or receives two data words simultaneously. Finally, the CPU memory reference control register 463 generates the information which describes the type of operation being requested by the CPU and defines the bytes within an addressed data word that are to be accessed.

FIGS. 14 and 15 illustrate, in block diagram form, the local bus interfacing portions of the CIP and SIP. Details, beyond those presented in FIGS. 14 and 15, concerning the numerous other elements which are included within the CIP and the SIP are not necessary to an understanding of the purpose, construction, and function of the instant invention and are well understood by one of ordinary skill in the art.

Referring to FIG. 14, the request granted signal to the CIP (RQGTCI) signals that a bus cycle has been granted to the CIP and enables transfer of information over the local bus. The signal DCNNCI informs the CIP that a bus cycle is being directed to it and that the data is being transferred in the bus cycle. Thus, DCNNCI enables the registers in the interfacing portion of the CIP to accept information transferred over the local bus.

FIG. 15 shows in block diagram form the interfacing apparatus within the SIP for receiving and transmitting information to other elements in the system over the local bus. As herein embodied, the signal RQGTSI, as generated by the request granted register and transferred to the SIP over the local bus, enables the SIP to transfer information to the local bus from the registers depicted in FIG. 15. The signal DCNNSI, which accompanies an information transfer to the SIP, enables the illustrated registers to accept the information from the local bus.

A megabus interfacing portion, the megabus adapter, supplies the above-referenced outputs from the FIFO memory, the 32 bits of data transferred from the megabus, MBDT0:32 and the transferred megabus address FIAD0:24. Similarly, the data transferred from the local bus LDTR0:32, the local bus address LBAD0:24, and the control signals, e.g., CAMREF, CABYTE, CAWRIT, etc., generated by the control logic 417 (FIG. 11) are transferred by means of the apparatus depicted in FIG. 12 to the megabus.

Figure 16:
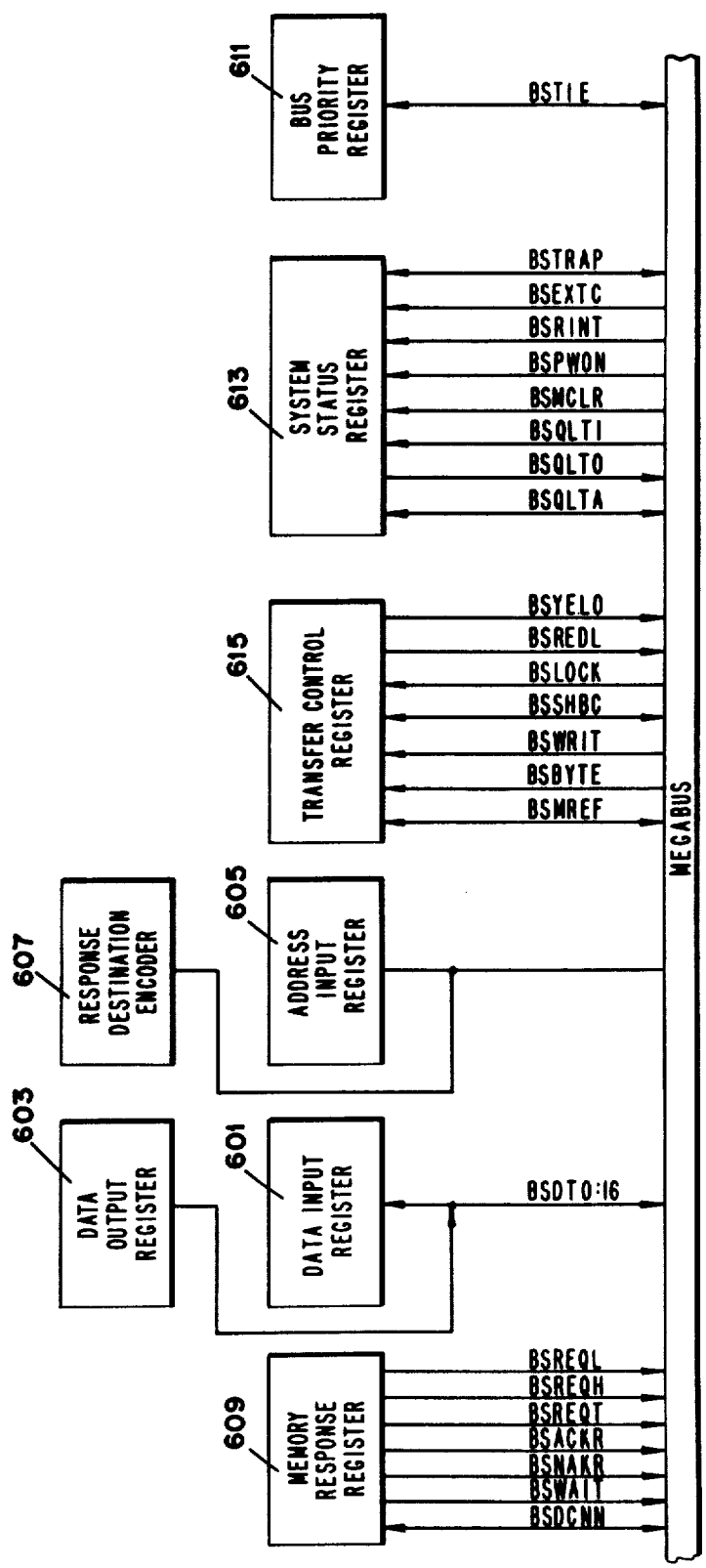
FIG. 16 is a block diagram illustrating the registers within a single-width, single-pull memory module for interfacing with the megabus adapter of the present invention.
Figure 17:
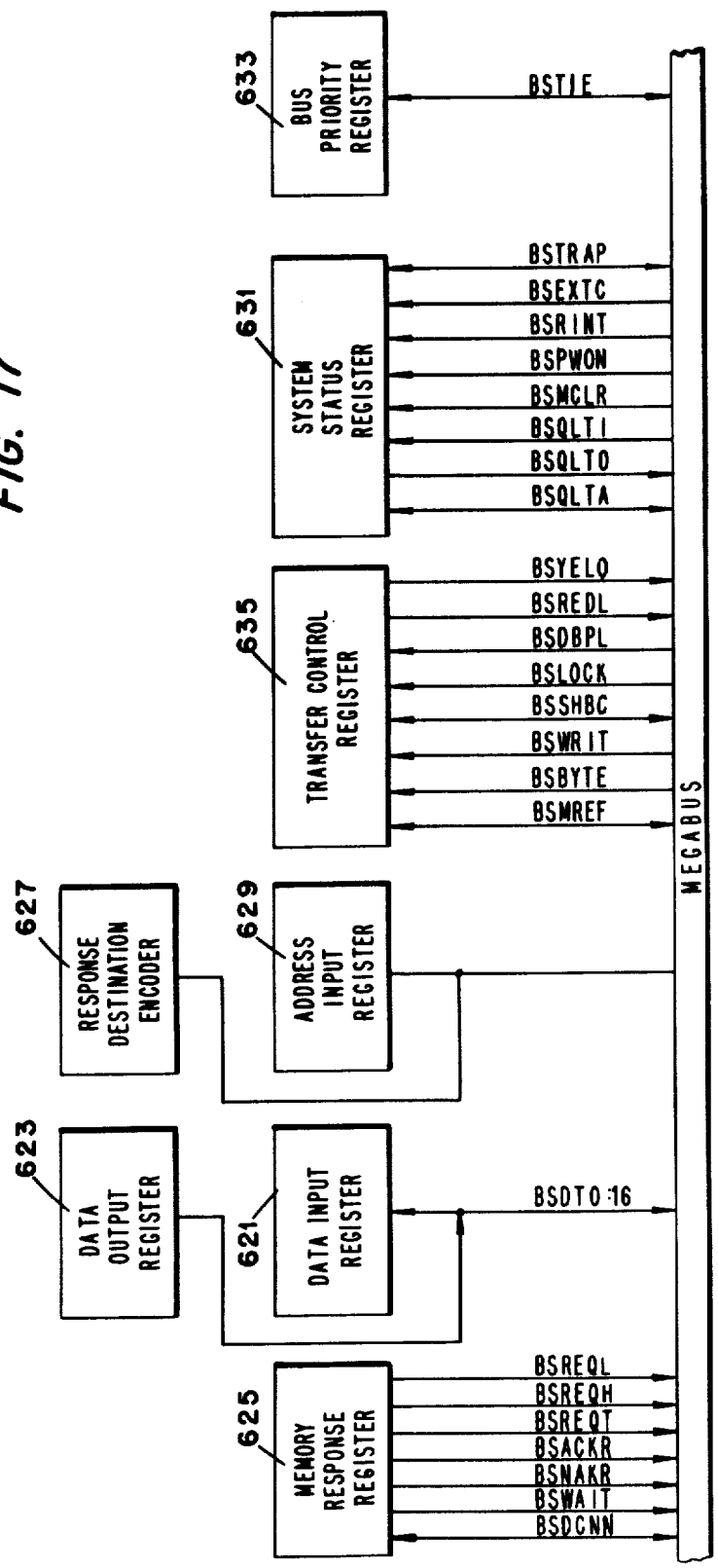
FIG. 17 is a block diagram illustrating the registers within a single-width, double-pull memory for interfacing with the megabus adapter of the present invention.

Before considering the details of FIG. 12, certain portions of FIGS. 16-18 should be considered since these figures depict in block diagram form the interfacing portion of memory modules 106 suitable for use in the instant data processing system. As explained above, the local bus has the capacity of transferring 32 bits of data in parallel within a central subsystem. Similarly, the megabus can bidirectionally transfer 32 parallel bits of data. It is a feature of the system, however, that the megabus can interface with memory modules or other processing units that have the capacity of only transferring 16 data bits in parallel. Thus, if a central subsystem directs 32 bits of data during a bus cycle to the cache/MMU 103 for transfer over the megabus to a memory module 106 and the destination memory module is of the type capable of only receiving 16 bits in parallel, as in FIGS. 16 and 17, the cache/MMU, and particularly the megabus adapter, will generate two bus cycles and transfer 16 bits in each cycle. Similarly, if a 16-bit memory module is responding to a read request for two words or 32 bits, the megabus adapter will issue two megabus cycles to the transferring memory module in order that all 32 data bits requested will be transferred and assembled into a 32-bit parallel data field.

Referring to FIG. 12, the megabus 501 transfers the 32-bits of bus data BSDT (plus 4 parity bits), a 24-bit bus address BSAD (plus 1 parity bit), and numerous control signals to a transceiver network 503. When one of the units on the megabus is transferring information via the megabus to the megabus adapter of a particular central subsystem, the transceivers 503 enable, for example, the transfer of the 32 bits of data BSDT to FIFO 505. When, however the transfer is from the cache/MMU to a megabus unit, the 32 bits of data LDTR0:16 and MYDT0:16 are transmitted by transceivers 503 to the megabus data lines BSDT. As a further example, control signal BSBYTE transferred from a megabus unit over the megabus to the cache/MMU will be transmitted by transceivers 503 to the FIFO. On a central subsystem output, the corresponding signal generated within the central subsystem, i.e., CABYTE, will be coupled to the BSBYTE line of the megabus 501 by the transceivers 503.

Many of the control signals included within the megabus are duplicates of the previously explained local bus control signals and, therefore, a general functional understanding of the meaning of these signals will be immediately apparent from the above discussion. These signals include BSREQT, BSDCNN, BSWAIT, BSLKNC, BSQLTA, BSMCLR, BSPWON, BSRINT, BSDT, BSAD, BSMREF, BSBYTE, BSWRIT, BSSHBC, BSLOCK, BSDBWD, BSREDR, BSREDL, and BSYELO. The remaining control signals will be discussed in greater detail.

The signal BSREQH indicates a high priority bus request from a high priority unit on the megabus. When true, the signal indicates that one or more units in a high priority group on the megabus have requested a bus cycle. When false, the signal indicates that there are no requests pending from the high priority units. The signal BSREQL when true indicates that one or more units in a low priority group on the megabus have requested a bus cycle. Similarly, when false, the signal indicates that there are no requests pending from a low priority unit.

The concept of the units on the megabus being grouped into a high priority group and a low priority group does not form a part of the instant invention. It is well-known in the art that particular units will be assigned different priority levels according to the design of a data processing system. For instance, a central processing unit will normally be granted a low priority and a memory unit will be granted a high priority. Such a priority scheme insures that whenever the memory unit is capable of transferring data in response to a memory read, a bus cycle will be granted to the memory before a bus cycle will be granted to the central processing unit. The rationale behind such a scheme is that the central processing unit has issued the memory read and will be waiting for the requested information.

The data line BSTIE represents a further group of priority signals employed by the megabus adapter to arbitrate among requests for megabus cycles and to determine which unit on the megabus will be granted the next megabus cycle. The group of signals represented by the line BSTIE include BSIUOK, BSHUOK, BSGUOK, etc., which are passed along the megabus on dedicated lines so that each megabus unit can request a megabus cycle or can grant access to itself in an orderly manner. A suitable apparatus and method for performing the tie-breaking routines to enable an ordered system of accessing amongst the megabus units and the cache/MMU is set forth in detail in U.S. Pat. No. 4,050,097 issued to Miu et al on Sept. 27, 1976 and entitled SYNCHRONIZATION TECHNIQUE FOR DATA TRANSFERS OVER AN ASYNCHRONOUS COMMON BUS NETWORK COUPLING DATA PROCESSING APPARATUS. This patent is assigned to the assignee of the instant invention and the disclosure therein is hereby incorporated by reference. Since the precise operation of the tie-breaking apparatus within the cache/MMU and the megabus units is not necessary to a complete understanding of the subject of the instant invention, the disclosure in the Miu et al patent will be relied upon for the details of the timing sequences and operational elements employed within the tie-breaking apparatus and such details will not be further explained herein.

Signals BSACKR and BSNAKR correspond to the previously explained values of the signal LBACKR. Thus, BSACKR indicates that a slave has accepted a transfer from a master and, for example, could be issued by a memory module following a read or write request directed to it by one of the central subsystem processors through the cache/MMU. Similarly, BSNAKR indicates that the slave is refusing the transfer for reasons which may be specific to the particular slave unit. In general, BSNAKR is made software visible so that the specific actions to be taken become a software decision.

In addition to an addressed slave unit issuing a BSACKR, BSWAIT, or BSNAKR, there exists the additional possibility that the slave will not issue any response whatsoever. Thus, if several microseconds elapse from the issuance of a BSDCNN by the megabus adapter indicating that a data transfer is being conducted to the slave unit during a particular bus cycle and no response is forthcoming from the slave, the presumption is that the addressed slave does not exist within the system. Each system will contain at least one dead man timer for the megabus, which will issue a NAK on behalf of the missing slave. This will clear any hangup which would otherwise result. The provision and operation of a dead man timer is well-known in the data processing art.

As further explanation of a BSWAIT response, a master having received a BSWAIT response will compete for the very next bus cycle via the above-referenced tie-breaking network.

Before discussing the functionalities of the remaining megabus signals, the relationship of FIGS. 16, 17, and 18 to FIG. 12 will be discussed.

FIGS. 16-18 show the interfacing portions of three different types of memory modules which may be coupled to the megabus for interfacing with the cache/MMU and the central subsystem. FIG. 16 illustrates, in block diagram form, the registers within a single-width, single-pull memory module. As embodied herein, a single-width, single-pull memory comprises a memory capable of receiving and transmitting 16 data bits in parallel and of issuing only one second-half bus cycle in response to a memory read. The interfacing device shown in FIG. 16 includes a data input register 601, data output register 603, address input register 605, and response destination encoder 607. As described above, when a unit coupled to the megabus, e.g., the central subsystem, requests a memory read of a single-width, single-pull memory, 24 bits of address information, BSAD0:24 are transmitted to address input register 605 and the channel number of the requesting unit is transmitted on leads BSDT0:32 to the data input register 601. The memory module will attempt to read the designated location and if successful will direct the requestor's channel number into the address field BSAD0:24 by means of response destination encoder 607, and will couple 16 bits of data into the data output register 603. The memory module will request a bus cycle by means of the memory response register 609 causing BSREQT to be true and, if the module secures a bus cycle by means of the tie-breaking circuit and signals BSTIE received and transmitted by the bus priority register 611, the data in the data output register 603 and the destination channel number in the response destination encoder 607 will be transferred onto the megabus. The interfacing apparatus for a single-width, single-pull memory as depicted in FIG. 16 further includes a system status register 613 and a transfer control register 615 for receiving and transmitting, as indicated therein, the various signals for controlling the operation of the memory module vis-a-vis its interface with the megabus. The functionality of BSQLTO, BSQLTI, and BSEXTC will be subsequently discussed.

FIG. 17 illustrates, in block diagram form, the interfacing device for what is called a single-width, double-pull memory which may also be coupled to the megabus. This type of memory module operates in essentially an identical way to the memory module of FIG. 16 in that it receives and transfers 16 bits of data in parallel by means of its data input register 621 and data output register 623. Also, the memory response register 625 is sensitive to the exact same signals as the memory response register 609 of the memory module depicted in FIG. 16. Similarly, the response destination decoder 627, address input register 629, systems register 631, and bus priority register 633 receive and transmit the same signals as do their counterparts in FIG. 16.

The significant difference between the single-width, single-pull memory module of FIG. 16 and the single-width, doule-pull module of FIG. 17 is found in the transfer control register 635. Besides having all of the inputs and outputs of the transfer control register 615 of the memory module in FIG. 16, the transfer control register 635 of FIG. 17 receives the additional signal BSDBPL which, when true, causes the single-width, double-pull memory module to generate two second-half bus cycles in response to a single read request unless the requested addresses straddle a memory module boundary or the second address is not physically present in the system memory. Thus, instead of merely transmitting one 16-bit word in response to a read request, the single-width, double-pull when, when BSDBPL is true, transfer two successive 16-bit words, each associated with a different second-half bus cycle. The advantages of being able to transmit in a single-width, double-pull mode will be readily apparent to one of ordinary skill in the art since they decrease the overhead of memory requests by enabling a single memory request to initiate the transfer of two data words.

FIG. 18 illustrates, in block diagram form, an apparatus to be used to interface a third type of memory module with the megabus. This type of memory module is called a double-width memory and is capable of double-width, single-pull operation (the transfer of 32 bits of data in parallel during one bus cycle).

The signals transmitted between the megabus and the memory response register 649, response destination encoder 643, address input register 645, systems status register 647, and bus priority register 649 in the double-wide memory shown in FIG. 18 are identical to corresponding signals in the memory modules depicted in FIGS. 16 and 17. Differences are, however, present in the data output register 651, data input register 653, and transfer control register 655.

First, the data output register 651 and data input register 653 are now capable of handling 32 bits of data in parallel. Also, three additional signals are transmitted between the megabus and the transfer control register 655 than are transmitted in the interfacing device of FIG. 17. These signals are BSLKNC, BSRESQ, and BSDBWD. The functionality of BSLKNC has been previously discussed with reference to the local bus and the signal CALKNC. The signal BSDBWD when true indicates that the memory request involves 32 bits of data in parallel either to be written into the memory module or to be read from the memory module. The transfer control register 655 of a double-width memory module further receives and transmits the signal BSRESQ which will be driven true by a responding memory module that is capable of 32-bit parallel data transfers in conjunction with BSACKR to indicate to the memory-requesting device that memory has the capability of accomodating 32-bit wide data transfers.

It is a feature of the present invention that the megabus adapter enables a central subsystem to communicate with any of the three types of memory modules discussed in relation to FIGS. 16, 17 and 18. This facility is accomplished without the CPU, SIP, or CIP having to recognize or account for communication with any particular type of memory module. Thus, if the CPU requests a double-wide read of the system memory, the megabus adapter will respond with the 32 bits of data requested regardless of whether they are stored in a single-width, single-pull memory, a single-width, double-pull memory, or a double-width memory. This is accomplished by the megabus adapter generating and recognizing particular values of the control signals BSDBPL, BSDBWD, and BSRESQ in the following manner along with the other control signals.

If one of the central subsystem processors requests a read of two words in parallel, it will supply the memory word address in bits 0–22 of the local bus address field (LBAD). The signals CASHBC=0, CAWRIT=0, CADBPL=1, and CADBWD=1 will be generated and CAMREF will be set to ONE. The cache/MMU will, by means of the transceiver 503, transfer the signals including the address, data field, and control signals supplied from the local bus to the megabus and issue a bus cycle transferring the address to the addressed memory module.

If the addressed memory location is in a single width, single-pull memory module, the memory response will be to place the requesting channel number in bits 8–17 of the address field BSAD and one word of data (16 bits) in bits 0–15 of the data field BSDT. The signals BSMREF=0, BSWRIT=1, BSDBPL=0, BSDBWD=0, BSLOCK=0, and BSLKNC=0 will be generated and BSSHBC will be set equal to ONE. The megabus adapter will recognize from the combination of control signals received back from the memory module that only 16 bits of data have been returned and will issue another memory read after incrementing the previously transferred address by ONE in order to obtain the other 16 bits of the requested data.

If the responding memory module is a double-width memory module, the response will differ in that the data field BSDT will include 32 bits of data, BSDBWD will be set to ONE, and BSDBPL will be set to ZERO. The cache/MMU will recognize that the memory request has been completed and will transfer the data to the requesting unit via the local bus.

The single-width, double-pull memory will transfer the requesting unit's channel number in bits 8–17 of BSAD, one word of data in bits 0–16 of BSDT and set BSMREF=0, BSWRIT=1, BSDBWD=0, BSLOCK=0, and BSLKNC=0, BSSHBC=1, and BSDBPL=1. The module will then transfer a second second-half bus cycle, with the same address field, the next requested word of data in bits 0–15 of BSDT, and the same values for the control signals except that BSDBPL will be set to ZERO.

The instant apparatus is also capable of performing 7 types of non-locking write cycles. In each of the write requests, bits 0–22 of the bus address field BSAD are set to the memory word address to be written. If a byte of data is to be written beginning at the address, bit 23 of the address field BSAD is set to 0, bits 0–7 of the data field BSDT is set to the data to be written, BSMREF, BSWRIT, and BSBYTE are set to ONE and BSSHBC, BSDBPL, BSDBWD, BSLOCK, and BSLKNC are set equal to ZERO. All three types of memory modules are capable of performing this write and will either generate a BSACKR or a BSWAIT, BSRESQ will be equal to ZERO.

In the second type of write, the right-hand byte of the word addressed by the memory address in address field BSAD 0–22 is written. BSAD23 is set equal to ONE, bits 8–15 of BSDT contain the data to be written, BSMREF, BSWRIT, and BSBYTE are set equal to ONE and BSSHBC, BSDBPL, BSDBWD, BSLOCK, and BSLKNC are set equal to ZERO. Again, all three types of memory modules are capable of performing this write request.

The third type of write is wherein bytes 0 and 1 of an addressed word are to be written. The value of BSAD23 is not relevant, 16 bits of data are loaded into the data field in bits BSDT00–BSDT15, BSMREF, and BSWRIT are set equal to ONE, and BSSHBC, BSBYTE, BSDBPL, BSDBWD, BSLOCK, and BSLKNC are set equal to ZERO. This type of write is also performed in the same manner by all three types of memory modules.

In the fourth type of write, the right-hand byte of word n and the left-hand byte of word n+1 are to be written. The address of word n is placed in BSAD0-BSAD22, BSAD23 is set equal to ONE, the data is placed in BSDT8–BSDT23, BSMREF, BSWRIT, BSBYTE, and BSDBWD are set equal to ONE. Only the double-width memories are capable of performing this write operation in a single bus cycle and, if the addressed locations are included in a double-width memory, BSRESQ will be set equal to ONE. The megabus adapter will recognize that no further action would be required in such a case. If the write had been directed to a single-width, single-pull memory or a single-width, double-pull memory BSRESQ will remain ZERO because neither of these memories drives the signal line BSRESQ. In such an instance, the megabus adapter will recognize that only the right-hand byte of word n has been written and will issue another write request to write the left-hand byte of word n+1.

The fifth write request is wherein both bytes of word n and the left-hand byte of word n+1 are written. In this instance, the address of word n is placed in the address field BSAD00–BSAD22. BSAD23 is not relevant. The data is placed in BSDT0–BSDT23, and BSMREF, BSWRIT, and BSDBWD are set equal to ONE, while BSSHBC, BSBYTE, BSDBPL, BSLOCK, AND BSLKNC are set equal to ZERO. The memory will respond by setting BSRESQ equal to ONE if it is a double-width memory and the addressed locations are included therein. If the memory is a single-width, single-pull or a single-width, double-pull, BSRESQ will be set equal to ZERO for the same reasons as in a type-four write and the megabus adapter will generate a new write request to write the left-hand byte of word n+1.

Write request type six calls for writing the right-hand byte of word n and both bytes of word n+1. The address of word n is placed in BSAD0–BSAD22, BSAD23 is set equal to ONE, the data is placed in BSDT8–BSDT31, BSMREF, BSWRIT, BSBYTE, BDSDPL, and BSDBWD are set equal to ONE, and BSSHBC, BSLOCK, and BSLKNC are set equal to ZERO. Again, if the memory written is a double-wide memory, BSRESQ will be set equal to ONE to indicate that all three bytes of data have been written in one bus cycle. If the memory is not a double-width memory, the megabus adapter will issue a second write request to write the two bytes of word n+1.

The final type of write request is for writing two words or 32 bits of data at one time. The address of word n is placed in BSAD0–BSAD22, BSAD23 is set to either ZERO or ONE, the data is placed in BSDT0–BSDT31, BSMREF, BSWRIT, BSDBPL, and BSDBWD are set equal to ONE, BSSHBC, BSBYTE, BSLOCK, and BSLKNC are set equal to ZERO. As was the case in write types four-six, if the writing memory is a double-wide memory BSRESQ will be set equal to ONE if the write is successful. If not, the megabus adapter will recognize from the value of the control signals that only the first 16 bits of data has been written into word n and, thus, it will generate a second write request for writing BSDT16–BSDT31 into word n+1. The need for a second write cycle will be apparent from BSRESQ being equal to ZERO.

Referring now back to FIG. 12, the signal lines BSQLTO and BSQLTI are included as part of the megabus and provide the capability of running internal logic tests under certain conditions. The signal BSQLTO is initiated at the physical top of the system and enters the first unit on the bus as BSQLTI where it is logically combined by an AND gate with a signal that indicates that the particular unit has completed its logic test. From that unit, the output of the AND gate is sent to the next unit as BSQLTO where the process is repeated. The signal at the physical bottom of the system, when true, indicates that every unit in the system has completed its logic test successfully. Units which have no resident logic test must connect BSQLTI and BSQLTO together internally. The signal line BSQLTA runs the full length of the megabus and serves to carry the completed continuity and logic test signal from the bottom of the system to the control panel of the CPU wherein it is coupled to a suitable display. BSQLTA is normally false when all is operating correctly in the system but will be set true at the beginning of a logic test. A successful completion of all the quality logic tests in the system will return BSQLTA to false. U.S. patent application Ser. No. 140,621 entitled SELF-EVALUATION SYSTEM FOR DETERMINING THE OPERATIONAL INTEGRITY OF A DATA PROCESSING SYSTEM filed on Apr. 15, 1980 by E. Wayne Carroll et al and assigned to the assignee of the instant application relates to a quality logic test apparatus for use in the instant computer system.

The signals BSEXTC and BSTIMR are miscellaneous signals employed in the megabus and do not relate specifically to the instant invention. BSTIMR is supplied by each power supply in the system to the circuitboards within a particular card cage and provides a positive transition at the respective line frequency (60 Hz or 50 Hz).

The megabus adapter provides to a central subsystem the ability for the included CPU, SIP, and CIP to write and read the system memory as well as to transmit commands to other units on the megabus. The megabus adapter includes two almost independent data paths. The first data path allows information directed to the central system and generated by units connected to the megabus to pass from the megabus to the local bus. This is accomplished by the FIFO storage register having, for example, the capacity to store four 72-bit information records or transfers. FIFO 505 receives the megabus data BSDT00:32, megabus address BSAD00:23, and the megabus control signals BSMREF-BSYELO whenever an information transfer is directed to the central subsystem or a main memory write is performed. The information is written into the FIFO and no other immediate action is taken. This permits the local bus and the megabus to operate almost completely asynchronously which, as will be recognized by one of ordinary skill in the art, greatly increases the efficiency of both of the buses.

The information stored in FIFO 505 can be transferred to the local bus as data MBDT0:32, address FIAD0:24, and control signals FIMREF-FIYELO. As previously explained, cache data input multiplexer 401 (FIG. 11) receives the megabus data MBDT0:32 (plus four parity bits), virtual address input multiplexer 405 receives the megabus address FIAD0:24 as transferred from FIFO 505, and the megabus control signals are transferred to control logic 417 as indicated by the common line FICNTRL0:10.

The write address register 507 records the loading of megabus information into the FIFO 505 and the read address register 509 records the transfer of information stored in the FIFO 505 to the local bus adapter as shown in FIG. 11. The megabus write detector 511 receives the inputs BSWAIT, BSNAKR, BSACKR, BSDCNN, BSWRIT and BSMREF and, upon detecting a certain pattern in the signals, generates a load command to the FIFO control 513. If the information last stored in the FIFO 505 is to be saved, the FIFO control 513 generates write control signals as represented by WRTINC and supplies them to the write address register 507 to cause the next information transferred from the megabus 501 through the transceivers 503 to be stored in the next available address in the FIFO 505. If, however, it is determined that the previously written information in FIFO 505 is not to be saved, the next transferred information will be permitted to be written over the last-transferred information.

The FIFO control 513 also generates a representative REDINC signal and supplies it to the read address register 509 to control the transfer of information from the FIFO 505 to the appropriate receiving units in the local bus adapter.

The types of information transfers stored in the FIFO 505 are, for example, main memory writes directed to the main memory module coupled to the megabus by another processing unit also coupled to the megabus. As stated above, the cache/MMU must be updated whenever such main memory writes are performed, and the data are captured in the FIFO 505 whenever the megabus write detector 511 detects a main memory write. The captured information is shifted through the FIFO 505 and will initiate a request for a local bus cycle in order to be transferred to the local bus adapter to update, if necessary, the cache memory.

A second type of cycle that is captured by the FIFO 505 is a test command originated by a processor unit coupled to the megabus and directed to the SIP or the CIP in the central subsystem. Such a test command when placed on the megabus resembles, in format, an I/O operation and will contain the channel number of the SIP or CIP to which it is directed. If the channel number is determined to be indicative of one located in the central subsystem, the information will be captured in the FIFO 505. It will also cause a FIFO request to be sent over to the local bus and the transfer of appropriate information to the addressed CIP or SIP.

A third type of transfer captured in the FIFO 505 is an I/O or memory response to a read request promulgated by the CPU, SIP, or CIP in the central subsystem. Such responses must be kept in a first-in, first-out order of information flow, and since a memory or I/O response takes the form of a second-half bus cycle on the megabus, it must be accepted by the FIFO 505 and will be sent to the local bus adapter and to the requesting processor and the cache memory if it originated at a memory unit.

Another feature of the FIFO 505, the megabus write detector 511, and the FIFO control 513 is that they will operate to force the local bus adapter to transfer information from the FIFO 505 to the cache memory or local bus processors in order to insure that the storage capacity of the FIFO 505 is not exceeded. This is accomplished by the megabus adapter taking control of the cache memory away from the local bus and generating the commands necessary to do updates in the cache corresponding to previously detected main memory writes by processing units outside of the central subsystem. These cache updates are performed as many times as are necessary to empty the FIFO or detect that the FIFO no longer contains information corresponding to a main memory write. The reason that the FIFO 505 could be overflowed is that the priority of a central subsystem coupled to the megabus is set low compared to other processing units on the megabus and, thus, the megabus adapter may be attempting to gain access to the megabus for an extended period of time during which numerous megabus information transfers could be stored in the FIFO 505. The signal FIFOMT, when false, indicates that the FIFO 505 is not empty and is supplied to the request arbitration network to cause a local bus cycle to be granted to the FIFO.

As shown in FIG. 12, the data path within the megabus adapter for transferring megabus data to the local bus adapter is divided into two subpaths. Sixteen bits of data (MBDT0:16) are transferred by an OR gate 515 and 16 bits of data (MBDT16:16) are transferred by the multiplexer 517. The inputs to the OR gate 515 are MBIN0:16 from the interrupt register 519, MBSH0:16 from the second-half bus cycle register 521, and FIDT0:16 from the FIFO 505. The inputs to the multiplexer 517 are the left and right data words transferred from the FIFO 505, i.e., FIDT0:16 and FIDT16:16, respectively.

The interrupt register 519 enables the megabus adapter to temporarily store an interrupt transferred from the megabus to thereby enable the CPU to complete whatever current instruction it may be performing before assuming an interruptable state. This may be several CPU memory cycles away and by providing the interrupt register 519, the reception of an interrupt by the megabus adapter can be acknowledged and the interrupt itself can be stored away until the CPU can process it. When the CPU enters an interruptable state, it will send a command via the local bus to the megabus interface. This command is signalled by the line SNDINT supplied to interrupt register 519 to enable the transfer of MBIN0:16 to the OR gate 515 and thereby to the local bus adapter.

The second-half bus cycle register 521 accommodates the above-discussed situation wherein although the central subsystem requests a transfer of two words in parallel, the addressed memory module on the megabus transferring the data does not have the ability to transfer a double-wide word. Such a memory would be the above-discussed single-width, double-pull memory which delivers two words serially in successive megabus second-half bus cycles or the single-width, single-pull memory that requires a memory cycle for each delivered word. When in fact the requested two words of data are not transferred in parallel, the second-half bus cycle register 521 will store the first transferred word and the second transferred word will be written into the FIFO 505. When that word in the FIFO 505 appears at the output, MBSH0:16 will be transferred from the second-half bus cycle register 521 to the OR gate 515 simultaneously with the transfer of FIDT0:16 to the multiplexer 517. This will assemble in the proper sequence the 32 bits of data requested.

If all 32 bits of the data were received in a single bus cycle they are transferred into the FIFO 505 and upon output from the FIFO will be transmitted to the local bus adapter. The data, FIDT0:16, will be enabled to the OR gate 515 and the data FIDT16:16 will be selected as the input to the multiplexer 517.

The multiplexer 517 also receives a third input FIAD0:7 which is selected during certain test mode operations wherein a test mode I/O address must be transferred from the megabus to either the CIP or the SIP in the central subsystem. In such an operation, the unit on the megabus will place 16 bits to be interpreted as part of an address on lines MBDT0:16 and eight more bits on BASAD0:7. As these are passed into the FIFO 505 the data bits become FIDT0:16 and the address bits FIAD0:7. The data bits are passed by the OR gate 515 to MBDT0:16 and the multiplexer 517 selects the 8 address bits to be MBDT16:8 and ZERO fills the rest of the data field. By using the data field for 16 bits and the address field for 8 bits, the test mode operation can be implemented by devices capable of transferring only 16 data bits in parallel.

Data are transmitted from the local bus to the megabus over 32 dedicated lines LDTR0:32 (plus 4 parity lines). The data lines are supplied as inputs to the data output multiplexer 523 along with the channel number of the cache/MMU as set by the previously referenced rotary hexadecimal switch and supplied to data output multiplexer 523 over the line MYCHN. The output of data multiplexer 523 comprises the 16 bits of the output data field MYDT0:16. The data lines LDTR16:16 are also directly supplied to the megabus data transceiver 503 such that the 32-bit wide output data field, BSDT0:32, comprises either LDTR16:16, LDTR0:16, or MYCHN in the left-most 16 bits and LDTR16:16 in the right-most 16 bits. The purpose of the data output multiplexer 523 is to enable the cache/MMU to transfer either 32 bits in parallel or two 16-bit words sequentially, depending upon the type of destination processing unit on the local bus.

The signal MYCHN is also supplied to the channel number decoder 525 along with 10 bits of the address field BSAD8:10. This enables the megabus adapter to determine whether a response is being directed to its associated central subsystem. If it is, the signal IT-SAME is driven true and supplied to the interrupt control register 527. The level comparator 529 receives the level transmitted with an interrupt request from the megabus in field BSDT10:6 and the level number of the process currently assuming CPU time in LDTR26:6. The output of the level comparator 529 is supplied as an input to the interrupt control 527 which will drive MYINT true if the level number of the requested interrupt is less than (of a higher priority than) the level currently being processed by the CPU.

The ALU address generator 531 is employed by the megabus adapter to cause the proper addresses to be generated depending upon the type of unit on the megabus being addressed. The ALU address generator 531 receives the local bus address on LBAD0:23 and has the ability to increment the address by ZERO or ONE. If the address requested by LBAD0:23 is within a double-wide or a single-width, double-pull memory, then there will be no need to increment the output address MYAD0:23 because such memories are capable of transferring the requested 32 bits either simultaneously or successively. If, however, the addressed memory module is a single-width, single-pull memory then initially MYAD0:23 corresponding t LBAD0:23 will be transferred to BSAD0:23 by the transceivers 503 and, subsequently, the megabus adapter will generate a new read or write cycle wherein the ALU address generator 531 will supply MYAD0:23+1 corresponding to LBAD0:23+1 to BSAD0:23. This will cause the proper two words in the memory module to be addressed and transferred over the megabus.

The megabus adapter further includes a megabus slave mode logic circuit 533 for controlling the response of the cache/MMU to either a request by a megabus processing unit or a response by a megabus processing unit to a previous request by a central subsystem processor.

Similarly, the megabus adapter includes a megabus master mode control logic 535 which initiates a megabus transfer in response to the control signals from the local bus, i.e., the previously described control signals CAWRIT-CABYTE. The megabus master mode control logic 535 and the megabus slave mode response logic 533 are conventional in nature and do not comprise a feature of the instant invention. Broadly, these logic units enable the megabus to generate the necessary DCNNs in order to time the data and address transfers going out on the megabus through the transceivers 503. The logic also generates the ACKs, NACKs, and WAITs for responses going back to the megabus. Such signals are standard in the prior art CPU unit, controller, and memory interfaces. The circuitry and operational mode for the megabus slave mode response logic 533 and megabus master mode control logic 535 are further discussed in patent application Ser. No. 140,623, filed Apr. 15, 1980 by George J. Barlow et al. which is hereby incorporated by reference.

3. Overview of the Cache Memory

As stated above, one of the objects of the present invention is to provide a cache memory module wherein two data words can be simultaneously transferred into and out of the cache memory. This is accomplished as follows. When a request is made to the cache memory for two data words only the address number of the first data word (the low order or left data word) is supplied on the virtual address lines VAIN0:23. The cache memory will search its directory of entries to determine whether a data word identified by the address number VAIN0:23 is stored in the cache. Simultaneously, the cache will determine whether the data word identified by the next successive address number, i.e., VAIN0:23+1, is stored in the cache. If both searches are successful, the data words identified by address numbers VAIN0:23 and VAIN0:23+1 will be addressed in the cache. This corresponds to a "fullhit" condition. If only one of the data words is stored in the cache, a partial hit occurs and it will be identified as a left hit (LFTHIT) if the resident data word is identified by VAIN0:23 or a right hit (RGTHIT) if the data word identified by VAIN0:23+1 is resident in the cache.

Since the data words identified by VAIN0:23 and VAIN0:23+1 are stored in successive memory locations, if VAIN0:23 is an odd address number then VAIN0:23+1 is an even address number and vice versa.

Figure 19A:
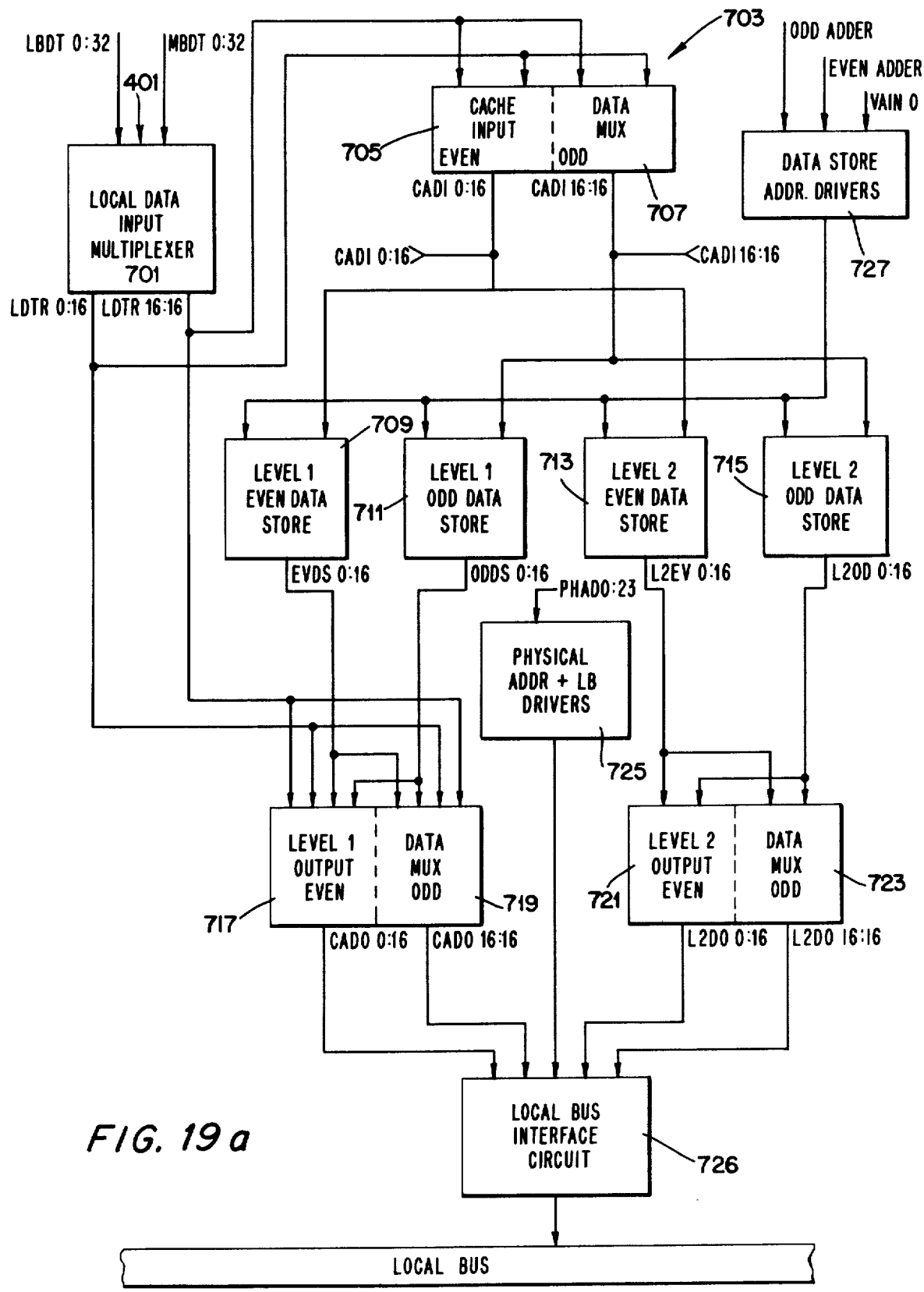
FIG. 19(a) is a block diagram illustrating an embodiment of the data storing subsystem of the cache memory of the instant invention.
Figure 19B:
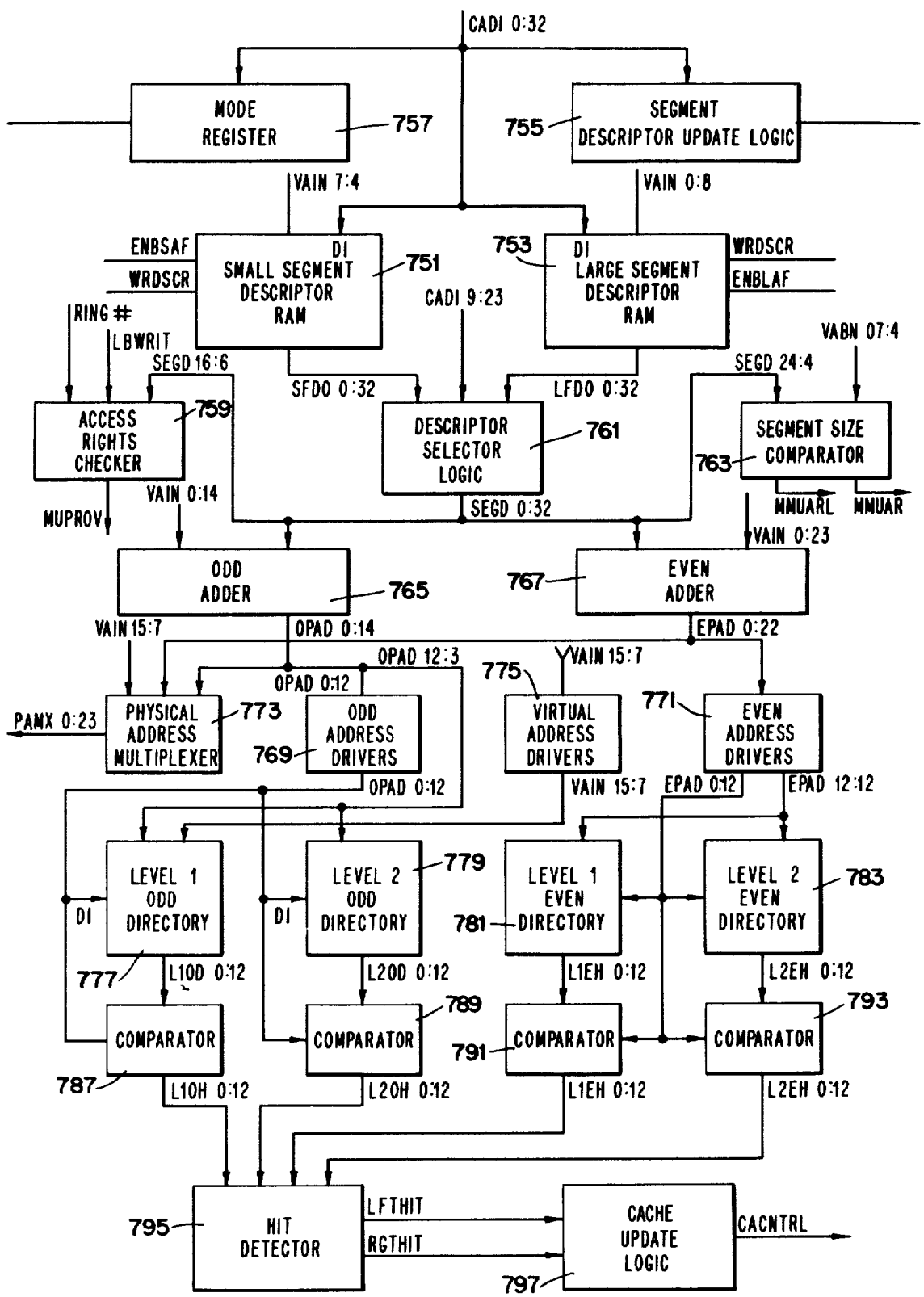
FIG. 19(b) is a block diagram illustrating an embodiment of the directory subsystem of the cache memory of the instant invention.

FIGS. 19(a) and 19(b) illustrate in block diagram form the cache memory of the instant invention. Specifically, FIG. 19(a) is directed to the data storing subsystem of the cache memory module and includes the circuit elements for transferring data words into and out of the memory units within the cache memory module. FIG. 19(b) illustrates the cache directory subsystem for maintaining a record of the addresses of the data stored in the data storing portion of the cache memory. The memory management unit used in conjunction with the cache directory subsystem includes the means for translating a virtual address into a physical address, and the logic for determining whether data requested from the main memory is also currently stored in the data storing subsystem of the cache memory module.

Referring now to FIG. 19(a), the local data input multiplexer 701 is capable of receiving as inputs two sixteen bit data words from the local bus, LBDT0:32, and from the megabus MBDT0:32. It is the function of the local data input multiplexer 701 to select one of the two inputs. The lines LBDT0:32 are selected if a local bus processor is doing a system memory write and the lines MBDT0:32 are selected if the system memory is transferring data to a local bus processor in response to a memory read or if another system device is updating data words in the system memory which are also stored in the data storing subsystem of the cache memory. Also, as will be hereinafter explained, other information including segment descriptors and control signals are transferred to the cache memory via the local data input multiplexer 701.

The local data input multiplexer 701 outputs the two selected data words individually as a data word designated LDTR0:16 and a data word designated LDTR16:16.

If, for example, one of the local bus processors has requested a two word data transfer from the system memory and it had been determined, in the manner to be subsequently described, that the data words were not currently stored in the cache memory it is the function of the local data input multiplexer 701 to pass the two data words to both the cache data input multiplexer 703 and to the level one data output multiplexers 717, 719. This dual output path of the local data input multiplexer 701 further speeds up the operation of the cache memory because as the requested data words are being inputted into the data storing subsystem through the cache data input multiplexer 703 they are also supplied to the requesting local bus processor through the level one data output multiplexers 717, 719. Accordingly, no unnecessary time is lost waiting for the data words to be stored in the data storing subsystem of the cache memory before transferring the words to the requesting processor.

The cache data input multiplexer 703 comprises an even input multiplexer 705 and an odd input multiplexer 707. Both the even and odd input multiplexers 705, 707 receive both the data word LDTR0:16 and the data word LDTR16:16. As will be hereinafter explained, the even input multiplexer 705 is controlled to accept as an input only data words that are identified by even address numbers. Similarly, the odd input multiplexer 707 is controlled to accept as an input only data words which are identified by odd address numbers. Since, as explained below, the data words LDTR0:16 and LDTR16:16 comprise successive data words stored in the system memory, one of the data words is necessarily identified by an even address number and the other of the data words is necessarily identified by an odd address number.

The data storing subsystem of the cache memory is divided into even and odd storage banks for storing data words identified by even and odd addresses, respectively. Moreover, the even and odd data banks are each further subdivided into levels one and two. This data storing structure is illustrated in FIG. 19(a) as being implemented by a level one even data store 709, a level one odd data store 711, a level two even data store 713, and a level two odd data store 715. Each of the data stores is coupled to the data store address drivers 727 which receives as one input the ten least significant bits of the physical address number.

The level one and level two even data stores 709, 713, also have inputs coupled to the outputs of the even data multiplexer 705. The level one and level two odd data stores 711, 715, each have inputs coupled to the outputs of the odd data multiplexer 707. It is a function of the data store address drivers 727 to select the address in one of the data stores where the data word, CADI0:16, identified by an even address number and the data word, CADI16:16, identified by an odd address number are to be stored.

Each of the data stores 709, 711, 713, and 715, selectively outputs a data word under the control of the data store address drivers 727. The level one even data store 709 outputs the data word EVDS0:16 which is received as an input by both the level one even (data word n) output multiplexer 717 and the level one odd (data word n+1) output multiplexer 719. Similarly, the level one odd data store 711 outputs a data word, ODDS0:16, which is received as an input by both the level one even and odd data output multiplexers 717, 719.

The level two even data store 713 outputs a data word L2EV0:16 to both the level two even data multiplexer 721 and the level two odd data multiplexer 723. Similarly, the level two odd data store 715 outputs a data word L2OD0:16 which is supplied as an input to both the level two even data output multiplexer 721 and the level two odd data output multiplexer 723.

The level one even data output multiplexer 717 selects a data word from one of its four inputs and supplies it as an output data word, CADO0:16 to the local bus. Similarly, the level one odd data output multiplexer 719 selects from one of its four inputs to produce a second data output word, CADO16:16. The level two even data output multiplexer 721 selects from one of its two inputs and supplies an output data word L2DO0:16 to the local bus. Finally, the level two odd data output multiplexer 723 selects one of its two input data words and supplies it as an output data word, L2DO16:16, to the local bus.

The data output multiplexers 717, 719, 721, and 723 enable the data storing subsystem of the cache memory to perform a data steering operation on the individual data words to be supplied to the local bus. In other words, if two data words are being outputted from the level one even and odd data store 709, 711 they will be supplied to the local bus in a particular order. The data word CADO0:16 will correspond to a data word identified by the address number VAIN0:23. Similarly, CADO16:16 will correspond to the data word identified by the incremented address number VAIN0:23+1. In some instances, the high order data word outputted (the word identified by VAIN0:23) will be identified by an odd address number and the low order data word outputted (the word identified by VAIN0:23+1) will be identified by an even address number. Conversely, the high order data word may be identified by an even address number and the low order data word may be identified by an odd address number. Thus, the level one even and odd data output multiplexers 717, 719 enable the steering of the outputs of the level one odd and even data stores 709, 711 into the appropriate high order and low order data output words CADO0:16 and CADO16:16, respectively.

The level two even data output multiplexer 721 and level two odd data multiplexer 723 are also capable of performing this data steering operation on two data words transferred to the local bus from the level 2 even data store 713 and the level 2 odd data store 715.

The physical-address-to-local-bus drivers 725 enable the direct transfer of an address from the megabus to the local bus without passing through the data storing subsystem of the cache memory.

Before describing in detail the cache directory subsystem illustrated in FIG. 19b, the manner in which data words stored in the system memory are mapped or stored into corresponding storage locations in the data storing subsystem of the cache memory will be explained. First, the system memory is capable of storing up to a megaword or more of data. These data words, as is known, are identified by sequentially increasing address numbers 0, 1, 2, -N where N+1 is the total number of memory words.

As embodied herein, each of the data stores in the cache data storing subsystem 709, 711, 713, 715 is capable of storing 1,024 data words. These data words are also identified by sequentially increasing address numbers, 0, 1, 2,-1023. Since there are two data stores in the even data bank and two data stores in the odd data bank the cache memory is capable of storing 2,048 data words identified by even address numbers and 2,048 data words identified by odd address numbers.

The address numbers for the system memory are mapped, i.e., correspond in a specific manner, to the address numbers in the data stores of the cache memory. For example, address number 0 of the level one and level two even data stores 709, 711 correspond to the address numbers of the system memory which equal 0 modulo 2,048. Thus, address number zero in the level one even data store and the level two even data store correspond to the address numbers 0, 2,048, 4,096, 6,144, -(n×2,048). The address numbers in the system memory which map to the address number one in the level one odd data store and the level two odd data store are identified by the quantity 1+(n×2048). Both the cache data stores and the system memory employ physical address numbers whereas the programs performed by the data processing system employ virtual address numbers.

As illustrated in FIG. 20, a 23-bit physical address contains three distinct fields relating to the cache memory. The least significant address bit, VAIN22, is the odd/even designation bit and is used by the data storing and cache directory subsystems of the cache memory to select either the even data store or the odd data store according to whether the bit is a ZERO or a ONE, respectively. The fields OPAD12:10 and EPAD12:10 designate the data store addresses within the data storing subsystem of the cache memory. Finally, the fields OPAD0:12 and EPAD0:12 correspond to the information which is employed in the processing operations of the cache directory subsystem. As will hereinafter be described, this field enables the addressing of level one and level two address number directories in order to determine whether data words identified by specific address numbers are stored in the cache data stores.

FIG. 20 further depicts a portion of the system memory 901 including storage locations identified by address numbers 0, 1, -8,193. The level one even data store 903 and level two even data store 905 are also depicted. In the initial state, address number 0 of the level one even data store 903 corresponds to address 4,096 of the system memory. Address 0 of the level two even data store 905 corresponds to system memory address number 2,048. Thus, address number 0 of the level one even data store 903 stores the data word that is also stored in address number 4,096 of the system memory 901 and address number 0 of the level two even data store 905 stores the data word that is also stored in address 2,048 of the system memory 901. Both system address numbers, 2,048 and 4,096, are equal, modulo 2,048, and map to the same cache storge location, i.e., address number zero of the even data stores. However, subdividing the even data stored into levels one and two enables the cache memory to store two different data words identified by two different address numbers in the system memory which happen to correspond or map to the same address number in the cache data store. Thus, both data words A and B may be simultaneously resident in the cache.

The instant cache memory operates upon the principle that if a data word in the cache data storing section must be replaced by another data word, the data word that has been resident in the cache for the longest time period will be replaced first. In other words, if a request is made for a data word identified by a third address number in the system memory different from the address numbers having their associated data words stored in address number location 0 of the level one and level two even data stores 903, 905, whichever of the data words stored in address number location 0 of the even data stores that has been resident in the cache for the longest period of time will be replaced.

A replacement table 907 is retained in the cache directory subsystem in order to identify which one of the two corresponding addresses in the level one and level two even data stores is to be replaced first. As illustrated in FIG. 20, the replacement table 907 comprises a 1,024×1 bit memory. The 1,024 memory locations in the replacement table 907 correspond to similarly numbered address locations in the level 1 and level 2 even data store. When a data word is written into one of the address number locations in the level one even data store 903, a ONE is also written into the correspondingly numbered storage location in the replacement, table 907. This indicates that the next data word to be written which maps to the same cache data store address number location should be written into the level 2 even data store 905. At the same time, the entry in the corresponding storage location in the replacement table 907 is to be changed to a ZERO. Thus, for any location in the replacement table 907, a ZERO entry identifies an address number location in the level one even data store 903 to receive the next data word corresponding to that replacement table location and a ONE entry identifies a data store location in the level two even data store 905 to receive the next data word corresponding to that replacement table location.

Referring again to FIG. 20, the replacement table 907 intially has a zero stored in address number location zero. This indicates that if it is necessary to write another data word having a system memory address number that maps to address number zero of the even data store, that address word is to be written into address number location zero of the level one even data store.

This is precisely what is illustrated to have occurred in the even data stores 903a, 905a and replacement table 907a labeled case 2 in FIG. 20. In response to a request being made for the data word in the system memory address number location 8192 it was necessary to store that data word in the cache memory. The address number 8192 modulo 2048 is equal to zero. Since the address number is even, the word will be stored in one of the even data stores 903a or 905a. Since address number location zero in the replacement table 907 was zero, the data word will be written into the storage location identified by address number zero of the level one even data store 903a. A similar replacement table, not shown, is provided for the odd data stores. The precise hardware embodiments of the directories and replacement table as employed in the cache memory of the instant invention will be hereinafter discussed in detail.

FIG. 19(b) illustrates, in block diagram form, the cache directory subsystem for maintaining and updating the directory of address numbers identifying the data words stored in the level one and level two even and odd data stores. The two data words, CADI0:16 and CADI16:16, as outputted from the even and odd cache data input multiplexers 705, 707 (FIG. 19(a)), are supplied as inputs to the cache directory subsystem. These two data words are supplied to the small segment descriptor RAM 751, the large segment descriptor RAM 753, the segment descriptor update logic 755, and the mode register 757. The small segment descriptor RAM 751 comprises a random access memory for storing 32 bit segment descriptors associated with different ones of sixteen small memory segments maintained in the system memory.

FIG. 21 illustrates the formats for a valid and an invalid segment descriptor. If bit zero of the segment descriptor is ZERO then the segment descriptor update logic 755 recognizes the segment descriptor as being invalid. However, if bit zero is ONE then the segment descriptor update logic 755 recognizes the segment descriptor as being valid.

Bits one through fifteen of a valid segment descriptor contain the segment base and the rest of a valid segment descriptor contains access rights and segment size information.

Access to data in memory is performed under what is known as rings of privilege which are well known in the art. To summarize, any device which is accessing the system memory includes a status register for storing a two bit current ring number having the value of zero through three. The most privileged ring is ring zero and the least privileged ring is ring three. A system device or element having a current ring number of three can only read in a system memory segment which is marked, in the segment descriptor field, as accessible to ring three. A system element having a current ring number of two can read in any segment which is marked as accessible to either ring two or ring three. The device with a status register having a current ring number of one can access any segment having ring numbers one, two, and three. Finally, a ring number of zero stored in the status register of a device indicates that it may access any valid segment in memory.

The read ring number field RR (SEGD16:2) sets forth the ring number for reading within a segment. The write ring number field RW (SEGD18:2) sets forth the priority for writing within a segment. Finally, the execute ring number field RE (SEGD20:2) sets forth the priority for executing instructions stored within a segment.

Bits 23–31 of a valid segment descriptor sets forth the size field for the system memory segment associated with the segment descriptor. The size field is presumed to have eight trailing zeros. If the offset portion of the virtual address is less than or equal to the size field then the requested data word is within the segment. If the offset portion of a virtual address is larger than the numbers stored in the size field, then an illegal request is being made because the physical address corresponding to the virtual address offset does not reside within the requested system memory segment.

In the system of the instant invention, the possible virtual address space, as designated by the virtual address numbers VAIN0:22, is divided up into sixteen segments of up to 64K words per segment. The first of these segments is further divided into sixteen small segments of up to 4K words each. The remaining fifteen of the original segments are referred to as large segments.

Each of the large and the small segments includes a number of data words that is a multiple of 256. The actual size of a large or small segment is set forth in the previously explained segments size field, SEGD24:8 (FIG. 21).

The virtual address segments can be resident anywhere within the physical system memory as long as the information corresponding to a virtual address segment begins at a physical address number that is a multiple of 256. The virtual address segments can overlap each other in the physical memory totally, partially or not at all.

A small segment description RAM 751 stores the sixteen 32-bit segment descriptors associated with the small segments. Similarly, a large segment descriptor RAM 753 stores the fifteen 32-bit segment descriptor which describe the large virtual memory segments.

The dividing of the system memory into segments, both small and large, enables the system to operate in a virtual addressing mode. In such a virtual addressing mode, instead of using actual physical memory address numbers for storing data and operations, the programmer is able to address relative to the first location of a program which is identified as virtual address number zero. When the program and data are stored in the system memory, however, they are assigned to particular segments. The physical address numbers of the system memory storage locations storing the program can be computed by incrementing the virtual addresses in the program by the physical base address numbers stored in the segment descriptors.

Figure 22:
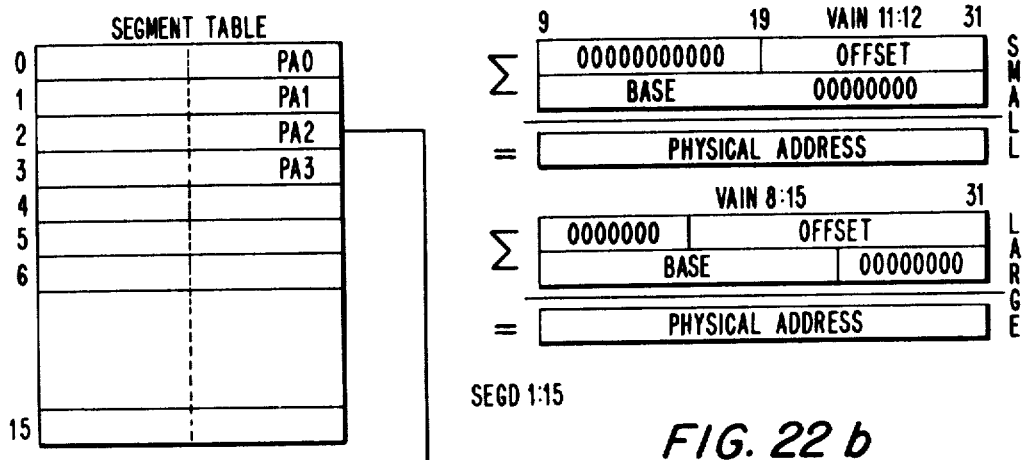
FIG. 22(a) is a schematic illustration of the relationship between the information fields stored in the segment descriptor table as used in the development of a physical address from a virtual address by the memory management unit employed with the cache memory of the instant invention.
FIG. 22(b) schematically illustrates the manner in which a physical address number is generated from a virtual address number and the information contained in a segment descriptor stored in the segment descriptor tables of the cache memory of the instant invention.
Figure 22:
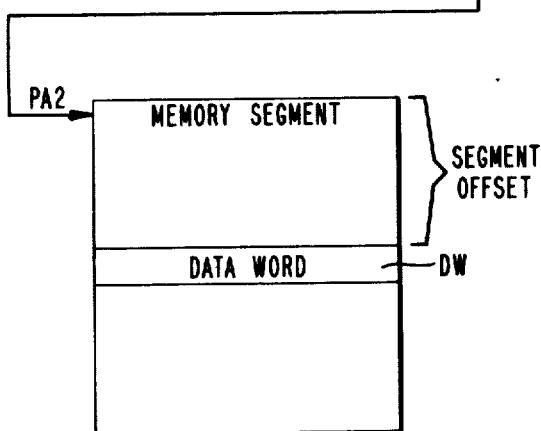

This is illustrated in FIG. 22(a) which schematically displays the large segment descriptor table. The first segment descriptor in the table, segment descriptor 0, is indicated to have a base of PA0, i.e a specific physical address within the system memory, meaning that the initial location of the first large segment is physical address number PA0 in the system memory. Segment descriptor one in the large segment descriptor table has a base or initial address of PA1 and the physical address numbers, PA2, PA3, PA4, etc. correspond to the physical address numbers storing the information associated with the first virtual address numbers of each of the virtual address segments.

As illustrated in FIG. 22(a), the third segment descriptor in the large segment descriptor RAM has been addressed and the base stored therein addresses physical address PA2 in the system memory. When addressing a particular data word within this memory segment, the segment base is incremented by a segment offset referred to as VAIN19:12, the twelve last significant bite of the virtual address number, for a small memory segment and VAIN15:16, the sixteen last significant bite of a virtual address number, for a large memory segment.

Thus, the physical address number of a data word, DW FIG. 22(a), is determined by adding the segment base, PA2, to the segment offset as specified in VAIN15:16.

FIG. 22(b) illustrates the generation of physical addresses for both small and large segments. In the case of a small segment, a 23 bit physical address is generated by adding the 12-bit offset field, VAIN11:12 preceded by eleven zeros to the 15-bit base field concatenated with eight trailing zeros. When addressing a large segment a 16-bit offset field, VAIN7:16, preceded by seven zeros is added to a fifteen bit base field concatenated with eight trailing zeros.

Referring again to FIG. 19(b), a small segment descriptor SFDO0:32 associated with a small segment in the system memory is outputted from the small segment descriptor RAM 751 under the control of VAIN0:11 outputted by the segment descriptor update logic 755 to the descriptor selector logic 761. Similarly, a large segment descriptor LFDO0:32 associated with a large segment is outputted from the large segment descriptor RAM 753 under the control of VAIN0:7 as outputted by the segment descriptor update logic 755 to another input of the descriptor selector logic 761. The descriptor selector logic 761 also receives the signal CADI9:23 which is employed to supply segment descriptor information directly to the descriptor selector 761 without passing through the small segment descriptor RAM 751 or the large segment descriptor RAM 753.

The output of the segment descriptor logic 761 comprises the signals SEGD0:32 which are supplied to the odd adder 765 and the even adder 767. The signals SEGD16:6 are also supplied to an access rights checker circuit 759 which also receives the current ring number field from the status register of a device making a request of the system memory. As stated above, if the ring number from the status register is greater than the corresponding ring number fields from the segment descriptor supplied by the descriptor selector logic 761, an access rights violation is detected and the access rights checker circuit will generate the signal MUPROV indicating that a protection violation has been detected.

The segment size comparator 763 receives the signals SEGD23:9 from the descriptor selector logic and compares it to VAIN07:8 or VAIN11:4. If the offset of the virtual address field is larger than the size field of the segment descriptor then appropriate error signals MMUARL or MMUARR as explained above will be generated to indicate that an attempt has been made to address an unavailable system memory address.

As stated above, the cache memory of the instant invention is designed to supply two data words in response to a memory request. For this reason, a portion of the cache directory subsystem is divided into two branches. One branch is for determining whether a data word identified by an odd address number is stored in the odd data store and the other branch is to determine whether a data word identified by an even address number is stored in the even data store. Also, as stated above, the two data words supplied by the cache memory correspond to the data word identified by the virtual address number VAIN0:23 and the data word identified by the address number VAIN0:23+1.

It is the function of the odd adder 765 to always generate an odd physical address number in the system memory. In one case, this odd physical address will correspond to the data word identified by the virtual address number VAIN0:23 when this address number is odd. Alternatively, the odd adder generates an odd physical address corresponding to the address number VAIN0:23+1 when VAIN0:23 identifies an even address number. In the first case, the odd adder 765 generates the odd physical address by adding the segment base to the address number VAIN0:23 when VAIN0:23 is an odd address number. When VAIN0:23 is an even address number, the odd adder 765 generates an odd physical address number by adding the segment base to VAIN0:23+1 when VAIN0:23 is an even address number.

The even adder 767 performs a function analogous to that of the odd adder 765 except that the even adder 767 always generates an even physical address number. Thus, if the address number VAIN0:23 is even, the even adder 767 will add the segment base to the address number VAIN0:23 to generate the even physical address number. If VAIN0:23 is an odd address number then the even adder 767 increments the sum of the segment base and the address number VAIN0:23 by 1 to generate an even physical address number.

Since, incrementing an even address number by 1 to generate an odd address number in the odd adder 765 never generates a carry the odd adder 765 is implemented by a 16 bit adder with odd physical address bits ODAD15:7 being equal to VAIN15:7. The least significant bit of the virtual address, VAIN23 is not carried through to either the even or odd physical address numbers. However, since incrementing an odd address number by one to generate an even address number will always propagate a carry, the even adder 767 is 24 bits long in order to propagate the carry across the entire physical address number, EPAD0:22.

It is the function of the descriptor selector logic 761 to control the odd adder 765 such that if the address number VAIN0:23 is odd then the odd adder is inhibited from incrementing by 1 the sum of the segment base and VAIN0:23. However, if the address number VAIN0:23 is even, then the descriptor selector logic 761 controls the odd adder 765 to increment the sum of the segment base and the address number VAIN0:23 by 1 in order to generate the odd physical address number identifying the second of the two addressed storage locations.

Similarly, the descriptor selector logic 761 controls the even adder 767 to increment the sum of the segment base and the address number VAIN0:23 by one whenever VAIN0:23 is odd. If the address number VAIN0:23 is even, then descriptor selector logic 761 inhibits the even adder 767 from incrementing the sum of the segment base and the address number VAIN0:23 by 1.

Also, since the cache directory control system is divided into odd and even branches beginning with odd adder 765 and even adder 767, there is no need to generate the least significant bit of the odd physical address generated by the odd adder or the even physical address generated by the even adder 767. In the case of the odd physical address, it may always be assumed that the least significant bit is a ONE and in the case of the even physical address it can be assumed that the least significant bit is always a ZERO. Thus, the physical addresses comprise 22 bits.

Referring again to FIG. 22(b), it is apparent that when generating a physical address in a small segment only 4 bits of the segment base and the segment offset overlap. Indeed, the least significant seven bits of the segment offset, VAIN15:7 are incremented by 0 and thus remain unchanged. Similarly, the most significant 11 bits of the segment base, SEGD1:11 are also incremented by 0 and remain unchanged subject to the generation of a carry by the addition of VAIN11:4 and SEGD12:4. Similarly, if a physical address in a large segment is being generated, the least significant 7 bits of the physical address will be the least significant 7 bits of the segment offset, VAIN15:7. The most significant 7 bits of the physical address will be equal to SEGD1:7 subject to the propagation of a carry from the addition of VAIN7:8 to SEGD8:8. Bits OPAD8:8 will be equal to the sum of SEGD8:8 and VAIN7:8.

It is apparent from FIG. 22(b) and from the above discussion concerning the propagation of a carry when the address number VAIN0:23 is odd why the even adder 767 must be larger than the odd adder. This enables any carry generated by incrementing VAIN15:7 by 1 to be propagated all the way through the generated even physical address. However, when the address number VAIN0:23 is even, incrementing it by 1 will not generate a carry and, thus, the portion of the segment offset defined by VAIN15:7 need not be included in the odd adder 765.

As illustrated in FIG. 19(b), the even adder 767 generates an even physical address EPAD0:22. The odd adder 765 generates the 15 most significant bits of the odd physical address OPAD0:15 and the entire odd physical address comprises OPAD0:15 as the fifteen most significant bits concatenated with VAIN15:7 as the seven least significant bits.

The output of the odd adder 765, OPAD0:15 and the output of the even adder 767, EPAD0:22, are supplied as inputs to the physical address multiplexer 773. The signals OPAD0:15 comprise the 15 high order bits of the odd physical address and the low order 7 bits of the odd physical address are supplied by the virtual address offset field VAIN15:7.

The function of the physical address multiplexer 773 is to select either the generated odd physical address or the generated even physical address and to transmit them to the megabus adapter.

An odd address driver circuit 769 also receives a portion of the odd physical address, OPAD0:12, generated by the odd adder 765. The output of the odd address drivers, OPAD0:12 is supplied as a data input to both the level 1 odd directory 777 and the level 2 odd directory 779. OPAD0:12 is also supplied as one input to the comparators 787 and 789.

The address inputs to the level 1 odd directory 777 and the level 2 odd directory 779 include 10 bits comprising three bits OPAD12:3 as outputted from the odd adder 765 and seven bits, VAIN15:7, which are the outputs of the virtual address drivers 775. Together these 10 low order bits of the odd physical address are employed to address the storage locations in the level 1 odd directory 777 and the level 2 odd directory 779.

The even address drivers 771 receive the even physical address, EPAD0:22, outputted by the even adder 767 and divide them into a row address data input field, EPAD0:12, and a column addressing field, EPAD12:10. The data input field, EPAD0:12, is supplied to the data input terminals of the level 1 even directory 781 and the level 2 even directory 783, and also to comparators 791 and 793. The address field, EPAD12:10, is supplied to the address input of the level 1 even directory 781 and the level 2 even directory 783 to select one of the storage locations in the even directory.

The level 1 odd directory 777, level 2 odd directory 779, level 1 even directory 781, and level 2 even directory 783 each comprise memory modules, e.g., random access memories, including 1024 storage locations. Each of the storage locations in the directories is associated with a different one of the storage locations in the data store of the cache memory. Thus, storage location 0 of the level 1 odd directory 777 stores the most significant 12 bits of the odd physical address, OPAD0:12, identifying the data word stored in storage location 0 of the level 1 odd data store 711. Similarly, each of the 1024 storage locations in the level 2 odd directory 779, level 1 even directory 781, and level 2 even directory 783 are associated with corresponding storage locations in the level 2 odd data store 715, level 1 even data store 709, and level 2 even data store 713, respectively.

As stated above, it is the function of the cache directories to store the most significant 12 bits of the physical address numbers identifying data words stored in the cache data stores. The storage locations in each of the directories are addressed by the low order 10 bits of the physical address numbers. As an example, the 1024 storage locations in each of the level 1 odd directory 777 and the level 2 odd directory 779 are addressed by the 10 low order bits of the odd physical address number, i.e., bits OPAD12:3 and VAIN15:7.

The 1024 storage locations in each of the level 1 even directory 781 and the level 2 even directory 783 are addressed by the 10 low order bits of the even physical address number, EPAD12:10. Each of the directories outputs a 12 bit data field when addressed. As stated above, these 12 bits correspond to the 12 high order bits of the physical address number identifying the corresponding data word stored in the cache data store. Thus, the level 1 odd directory 777 outputs the level 1 odd bits, L1OD0:12 to the comparator 787 and the level 2 odd directory 779 outputs the level 2 odd bits L2OD0:12 to the comparator 789. The level 1 even directory 781 outputs the level 1 even bits, L1EV0:12 to the comparator 791 and the level 2 even directory 783 outputs the level 2 even bits, L2EV0:12 to the comparator 793.

It is a function of the comparators 787, 789, 791, and 793 to determine whether a particular data word is stored in the data stores of the cache memory by determining whether the high order 12 bits of the physical address identifying a data word stored in the associated storage location of the data store are equal to the high order 12 bits of the physical addresses as generated by the odd adder 765 and the even adder 767 in response to a memory request. For example, the comparator 791 compares the output of the level 1 even directory 781, L1EV0:12, to the high order 12 bits of the even physical address as supplied by the even address drivers 771. The comparator 791 generates a 12 bit output signal L1EH0:12, wherein each of the 12 bits will be true if corresponding bits in the inputs L1EV0:12 and EPAD0:12 are equal. Thus, the bit L1EH0 will be true if the bits L1EV0 and EPAD0 are identical. The operation of the comparators 787, 789, and 793 are identical and they generate the outputs L1OH0:12, L2OH0:12, and L2EH0:12, respectively.

The outputs of the comparators 787, 789, 791, and 793 are supplied to the hit detector circuit 795. It is a function of the hit detector 795 to determine whether one, both, or neither of the two data words, i.e., data words identified by virtual address numbers corresponding to VAIN0:23 and VAIN0:23+1, requested from the system memory are currently resident in the data storing subsystem of the cache memory.

If all of the bits of the signals L1OH0:12 or L2OH0:12 are true then the hit detector circuit 795 will determine that the requested data word identified by the odd address number is currently resident in the odd data stores of the cache memory. Similarly, if all of the signals comprising L1EH0:12 or L2EH0:12 are true then the hit detector circuit 795 will determine that the requested data word identified by the even address number is currently resident in the even data stores of the cache memory.

As stated above, when a request is made for a data word from the system memory, both that data word and the next successive data word are supplied either directly from the system memory or from the cache memory. If the data word identified by the address number VAIN0:23 is resident in the cache then the hit detector circuit 795 will indicate this by generating the signal LFTHIT. If the data word identified by the address number VAIN0:23+1 is currently resident in one of the data stores of the cache memory, the hit detector circuit 795 generates the signal RGTHIT. Thus, if both data words are resident in the cache data stores, the left and right hit signals, LFTHIT and RGTHIT, will be generated and if neither of the requested data words is resident in the cache data stores then neither the left or right hit signals, LFTHIT and RGTHIT, will be generated.

The cache update logic 797 receives the hit signals LFTHIT and RGTHIT and determines whether a system memory access must be generated in order to supply the requested data words. If such a system memory access is necessary then the cache update logic 797 will generate the appropriate control signals to initiate a system memory access and also to insure that the data word or data words supplied by the system memory are properly stored in the data stores of the cache memory and that the proper entries are made into the directory stores of the cache memory. These control signals are symbolized by the output CACNTRL and will be discussed in detail hereinafter.

4. Overivew of the Cache Diagnostic Subsystem

Prior to describing in detail the circuits which comprise the cache memory of the instant invention, the operation of the diagnostic subsystem within the cache will be discussed. This subsystem is included in the segment descriptor update logic 755, cache update logic 797, and the mode register 757. As described above, the mode register is a sixteen bit register which is settable by software and firmware routines. Depending upon the combination of states of the sixteen bits, one or more individual aspects of certain machine operations may be modified.

The first of the bits is the initialize bit, INITLZ, the function of which is to provide a means for setting an initial state into the cache directories 777, 779, 781, and 783. Initialization is needed when power is applied to the machine with the result that the cache directories by are placed in unknown states. The purpose of initialization is to store known addresses in the cache directories. To this end, the data words stored in the first 2048 storage locations of the system memory are copied into the storage locations in the level 1 even and odd data stores 709 and 711, respectively. The data words stored in the next 2048 storage locations in the system memory are copied into the storage locations of the level 2 even and odd data stores 713, 715, respectively. As the data words are stored in the data storing subsystem of the cache memory, the cache directory subsystem stores the 12 high order bits of the associated physical addresses in the level 1 and 2 even and odd directory stores.

The second bit of the mode register is the inhibit rights check bit, IHRGCK. This bit controls the memory protect function of the MMU and is employed to bypass the operation of the access rights checker circuit 759 in determining whether a given user or requestor has the proper level of privilege to access referenced memory segments. If IHRGCK is set, the checking mechanism is suppressed and accesses are permitted to any memory location.

The address relocation inhibit bit, ARLINH, is employed to suppress the translation of virtual addresses to physical addresses and permit any address presented to the MMU in the VAIN0:23 field to be treated as a physical address. If ARLINH is set, the cache directory subsystem will not treat virtual and physical addresses differently.

When set, the cache bypass bit, CABYP, of the mode register 757 enables a user to make all memory references directly to the system memory without employing the cache memory. Thus, when CABYP is set, all memory reads will see a miss for the cache and the data will be supplied from the system memory. However, the cache data stores will be updated if any new information is written into the system memory from the central subsystem or other system processors and I/O devices.

The force miss bit, FRCMIS, of the mode register 757 performs a similar function to the CABYP bit. When FRCMIS is set, all memory references will see a miss in the cache directory subsystem and all memory reads will be done from the system memory. The purpose of this bit is to provide a means for checking the replacement of new information in the cache whenever there is a correction. This provides a diagnostic tool to test the response of the hardware in the absence of requested data words in the cache.

The fault no-hit mode bit, FNHMDE, causes the hardware to generate an unavailable resource signal for any memory reference that does not see a hit in the cache directory subsystem. The purpose of this bit is to enable the hardware mechanism determining whether data words are present in the cache to be checked. In this mode, specific data words are stored in the cache and then requests for access to those data words are generated. If the cache directory subsystem determines that the data words are not present in the cache an error indication will be generated.

The mode register 757 further includes a memory reference wrap bit, MRWRAP, to allow the local bus processors to enter write operations into the FIFO in the megabus adapter. This permits the generation of requests to the FIFO without the use of I/O operations. Normally, data written from one of the local bus processors goes directly into the system memory and bypasses the FIFO of the megabus adapter. If MRWRAP is set these memory writes will be entered into the FIFO.

The write directory bit, WRDRTY, of the mode register 757 controls the directory circuitry, and particularly the cache update logic circuitry 797 and the segment descriptor update logic 755 to check the current entries in the directory store 777, 779, 781, and 783. The function of the write directory bit is to suppress an unavailable resource error whenever a generated physical memory address number exceeds the maximum number of physical memory locations present in a given computer system. This enables all of the storage locations in the cache directory subsystem to be tested by enabling address numbers corresponding to the highest theoretical address number to be stored in the cache directories regardless of the actual amount of memory present in the system.

The bypass memory bit, BYPMRY, of the mode register 757 inhibits all communication from the cache/MMU to the megabus adapter so that all memory references are shortcircuited to the data storing subsystem of the cache memory and no references are made to the megabus. This enables faults to be isolated to the local bus system or the megabus system.

When set, the force hit bit, FRCHIT, of the mode register 757 allows every memory reference from one of the local bus processors to receive acknowledgement of a hit in the cache memory by the hit detector circuit 795. This functionality enables further testing of the cache memory because data words can be written into the cache memory when FRCHIT is set without having those data words written into the system memory. Thus, the integrity of the system memory will be maintained but the operability of the cache directory subsystem may be tested. Further, when FRCHIT is set, certain information can be written into the cache memory and completely different information written into corresponding addresses in the system memory. The operability of both the cache memory and the system memory can be tested by determining whether information is returned from the cache memory or the system memory in response to requests for data words.

The mode register 757 further includes a level 2 force hit bit, L2FHIT, which defines which path of the cache directory subsystem is being accessed. Thus, if FRCHIT is set indicating that the cache memory is operating in the force hit mode, the value of L2FHIT will determine whether the hit is to be forced in the even and odd data stores of level 1 or level 2.

5. Description of the Preferred Embodiment of the Cache Data Store

Figure 23:
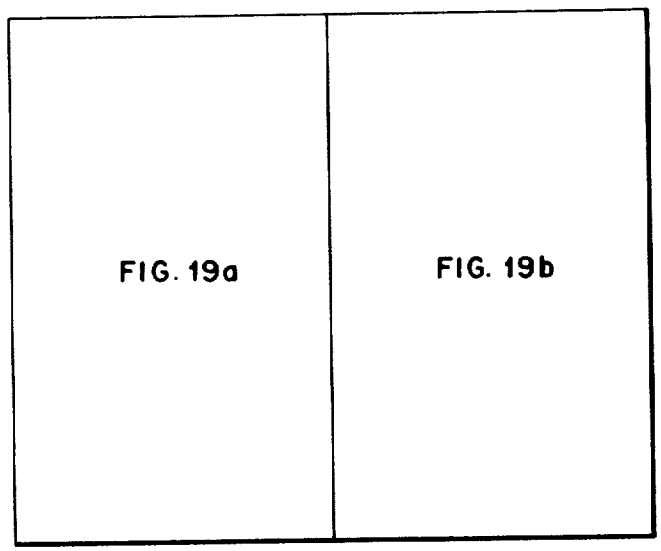
FIG. 23 is a block diagram illustrating the manner in which the (a) and (b) portions of FIGS. 24(a)-67(b) relate to each other.
Figure 24A:
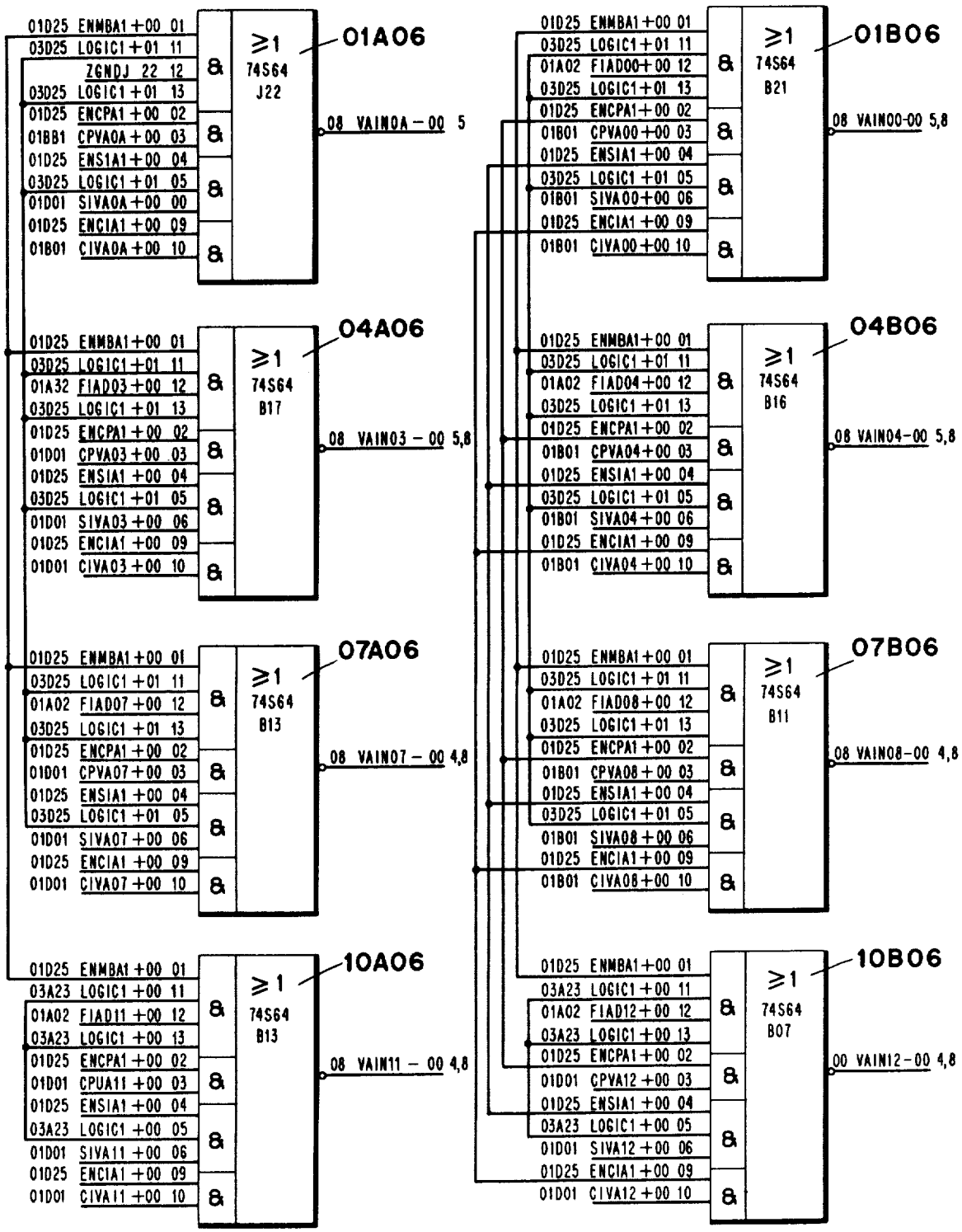

The relevant apparatus within the cache data store is shown in the detailed schematic logic block diagram (LBDs) of FIGS. 24(a)–47(b). To facilitate an understanding of the invention, any of FIGS. 24(a)–67(b) having both an "a" portion and a "b" portion, such as FIGS. 24(a) and 24(b), should be separated from the remainder of the Figures and joined in a side-by-side orientation as indicated in FIG. 23. In this manner, each of the diagrams with "a" and "b" portions can be referred to as an integrated drawing sheet. The basic structure and operation of the cache data store has been described with reference to FIGS. 19(a), 19(b), 20, 21 and 22, but the following discussion will provide additional description of the preferred embodiment of the cache data store.

The detailed logic schematics of FIGS. 24(a)–67(b) illustrate known, standard integrated circuit logic chips which are available from commercial integrated circuit (IC) suppliers. An individual part identification code is provided on each element shown. For example, a multiplexer 01A09 shown in FIG. 26(a) is a standard multiplexer circuit chip marketed under the identification 74298 by Texas Instruments. In fact, any circuit chip referred to in the drawings as having a commercial designation beginning with 74 is manufactured by Texas Instruments and further details of such circuits can be found in "The TTL Data Book for Design Engineers," (2d Ed.) published by Texas Instruments (1976). Such commercial designations will be immediately apparent to one of ordinary skill in the art.

FIGS. 24(a), 24(b), 25(a), and 25(b) illustrate an embodiment of the virtual address multiplexer 405 (FIG. 11). The circuit 01B06 of FIG. 24(a) will be explained as an example. This circuit comprises a four way selector and includes four AND gates having multiple inputs and an OR gate receiving as inputs the output of each of the AND gates. Only one AND gate of the four will have all inputs simultaneously equal to ONE. The OR gate will select that input to generate the output VAIN00 (bit 0 of the virtual address number field). The first AND gate included in selector 01B06 receives signals ENMBA1, LOGIC1, FIAD00, and LOGIC1. FIAD00, as previously explained, is supplied from FIFO 505 of the megabus adapter shown in FIG. 12. ENMBA1 and LOGIC1 are enable signals generated by circuitry found in FIG. 42(b). The driver circuit 01D25 of FIG. 42(b) receives the assigned signals FIASND, SIASND, CIASND, and CPASND from the request arbitration network 407 and generates enable signals for the megabus address (ENMBA1), the SIP address (ENSIA1), the CIP address (ENCIA1), or the CPU address (ENCPA1). If the FIFO has been assigned a local bus cycle in the manner previously explained, EMMBA1 will be ONE and the other outputs of the driver 01D25 will be ZERO.

The signal LOGIC1 is generated by the driver 03D25 also shown in FIG. 42(b). LOGIC1 is constantly true because its corresponding signal on input, ZGNBD23, is false but is inverted as it is applied to the driver circuit 03D25. The driver 03D25 is also enabled by the complement of ZGND023. Thus, if the FIFO has been assigned a megabus cycle, all inputs to the 4-input AND gate of the multiplexer 01B06 will be enabled and VAIN00 will have the value of FIAD00.

The remaining three AND gates included in the four-way selector circuit 01B06 receive the enable outputs of the abovedescribed driver circuit 01D25 and the most significant bit, bit one of the address as supplied by the CPU, SIP, and CIP. It is evident that the four-way selector circuit 01B06 causes VAIN00 to assume the value of the address bit supplied by whichever of the CPU, SIP, CIP, or FIFO is enabled.

Figure 24B:
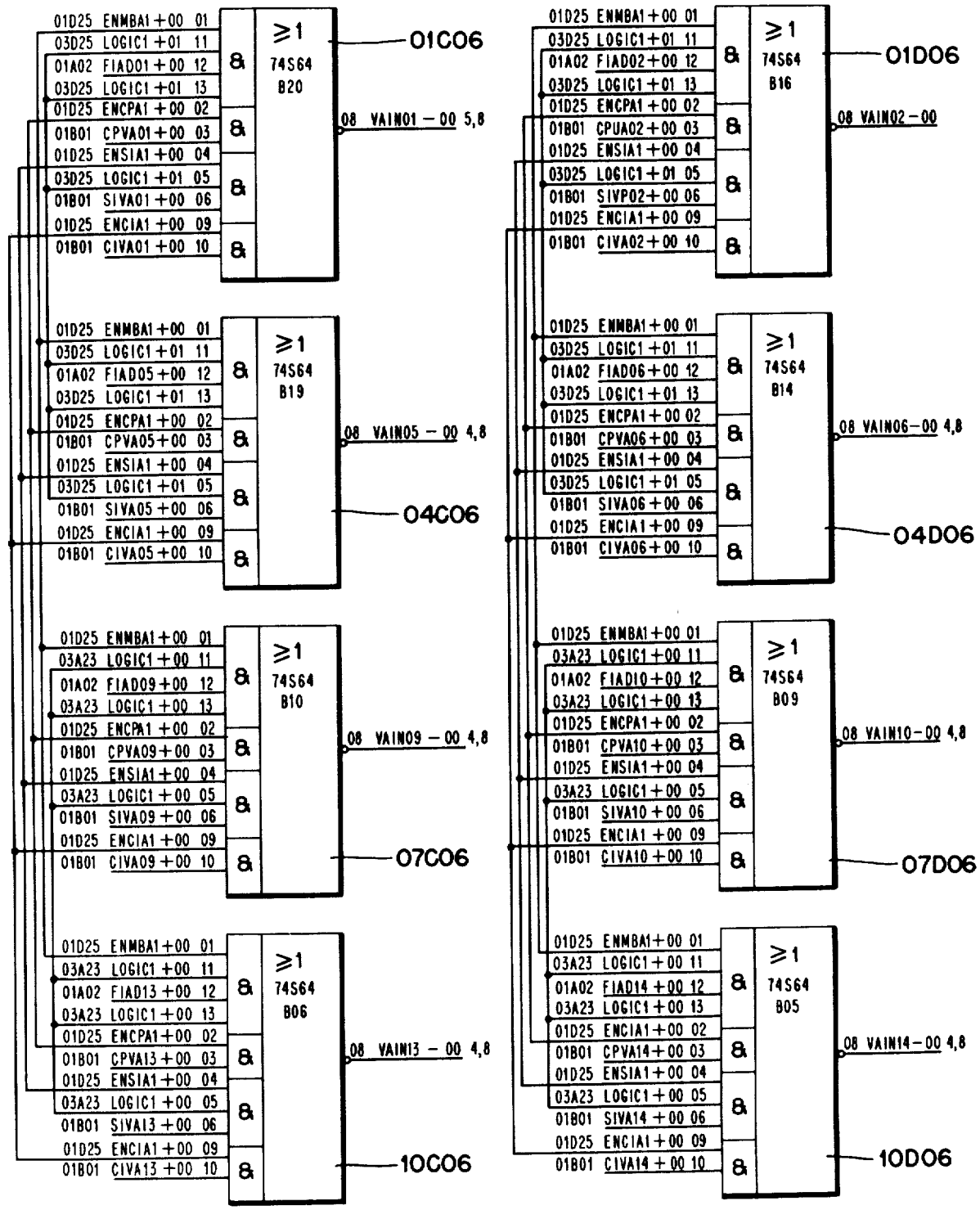
Figure 25A:
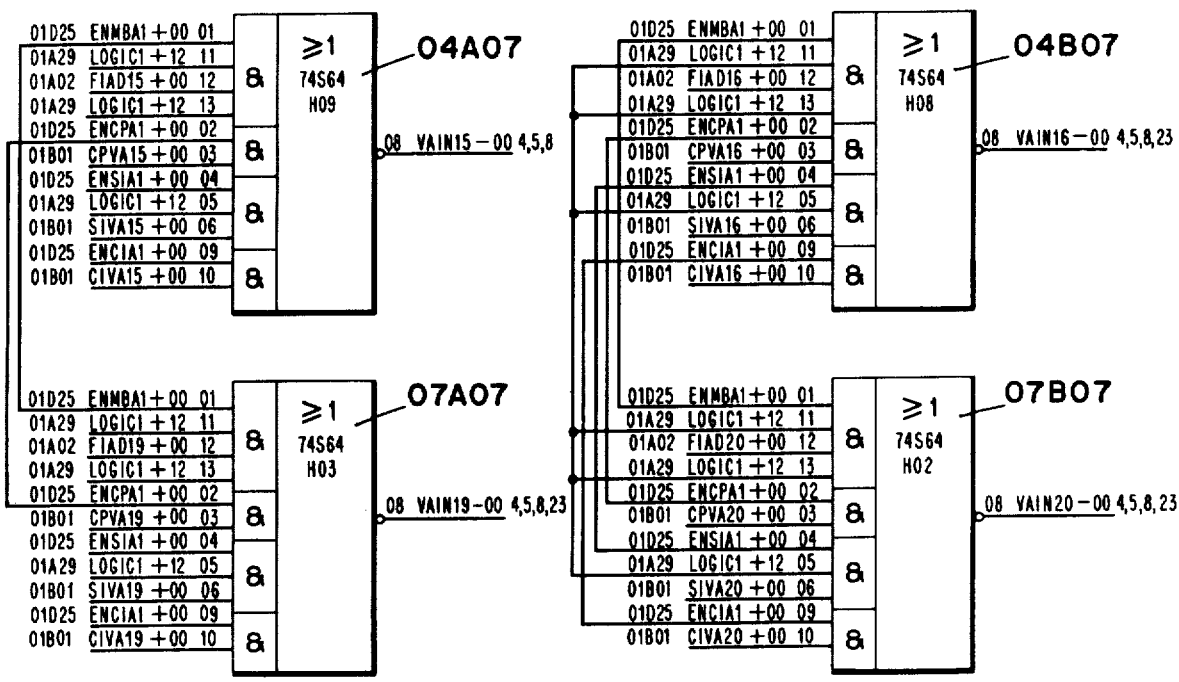

The remaining circuits in FIGS. 24(b), 25(a), and 25(b) operate in the same manner as the four-way selector circuit 01B06 to generate, in combination, bits 0–22 of the virtual address number, VAIN0:23. The only exception to this statement is a multiplexer 01D07 illustrated in FIG. 25(b). This multiplexer circuit is enabled by the previously defined ENMBA1 signal and comprises four 2×1 multiplexers. The first multiplexer corresponds to the BYAD multiplexer 413 shown in FIG. 11. It selects either LBBYAD or FIAD23 according to the value of ENMBA1 and generates the output signal VBYTAD.

VBYTAD is a binary signal which indicates which of the two bytes of a data word is to be read from memory or written into memory during a memory access. The signal ERRCLR is supplied to both inputs of the second multiplexer of the multiplexer circuit 01D07 and, therefore, the output of the second multiplexer circuit will be ERRCLR regardless of the value of ENMBA1.

The third multiplexer circuit receives as its two inputs the signal ENPALB controlling the transfer of a physical address to the local bus. The output of the third multiplexer circuit is the enable physical address to local bus transfer signal, ENPALB-11.

The final multiplexer in the multiplexer circuit 01D07 receives as inputs APWRIT and RQGTFI and generates the output LMBWRT. As previously explained, RQGTFI is the output of the request granted register 409 signifying that the FIFO and the megabus adapter have been granted the next local bus cycle. APWRIT, being a WRIT signal, indicates, in the manner explained above, the direction in which the local bus transfer is taking place, i.e., it designates whether it is a write to memory or a read from memory. Accordingly, LMBWRT is a binary signal indicating whether a write is being performed.

Figure 26B:
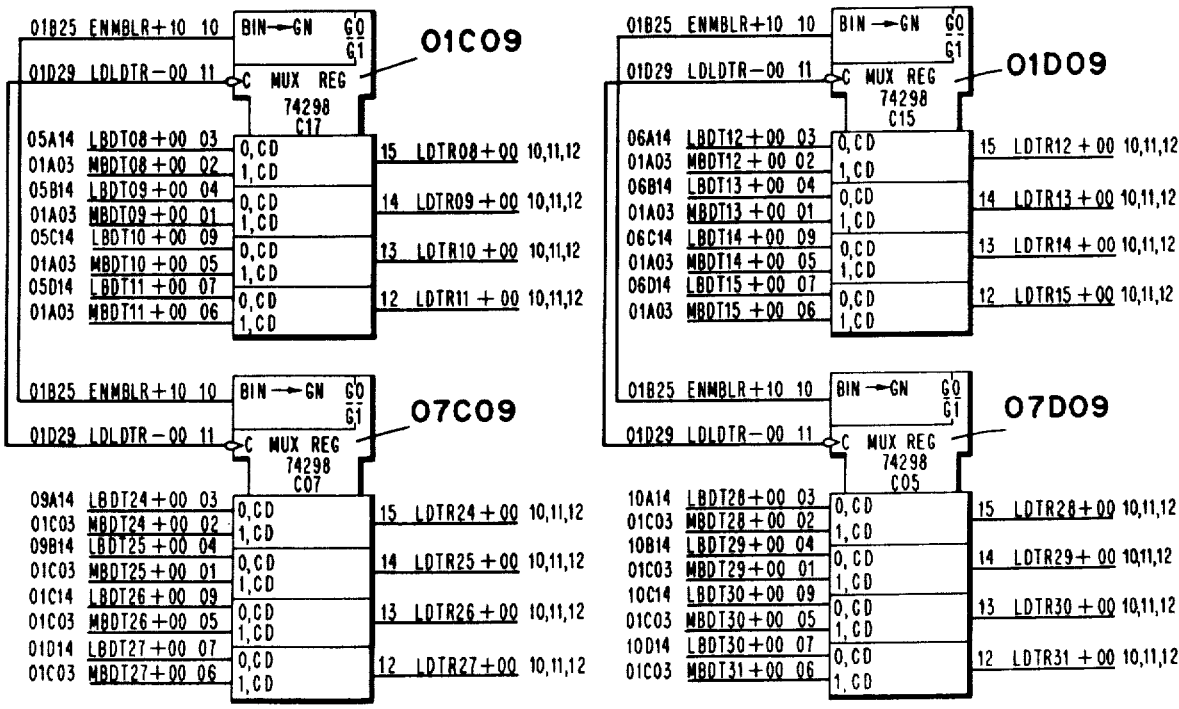
Figure 26A:
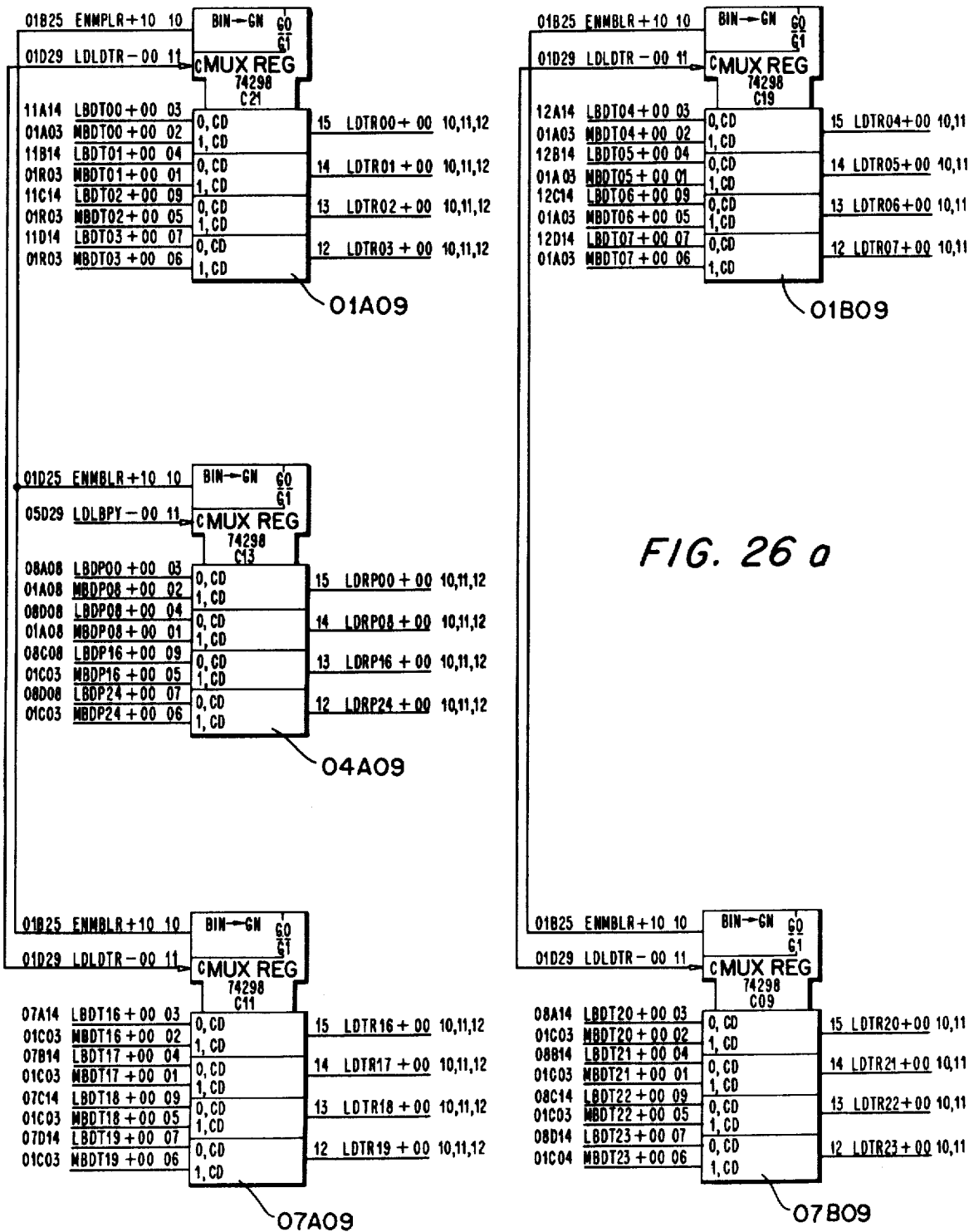
Figure 42A:
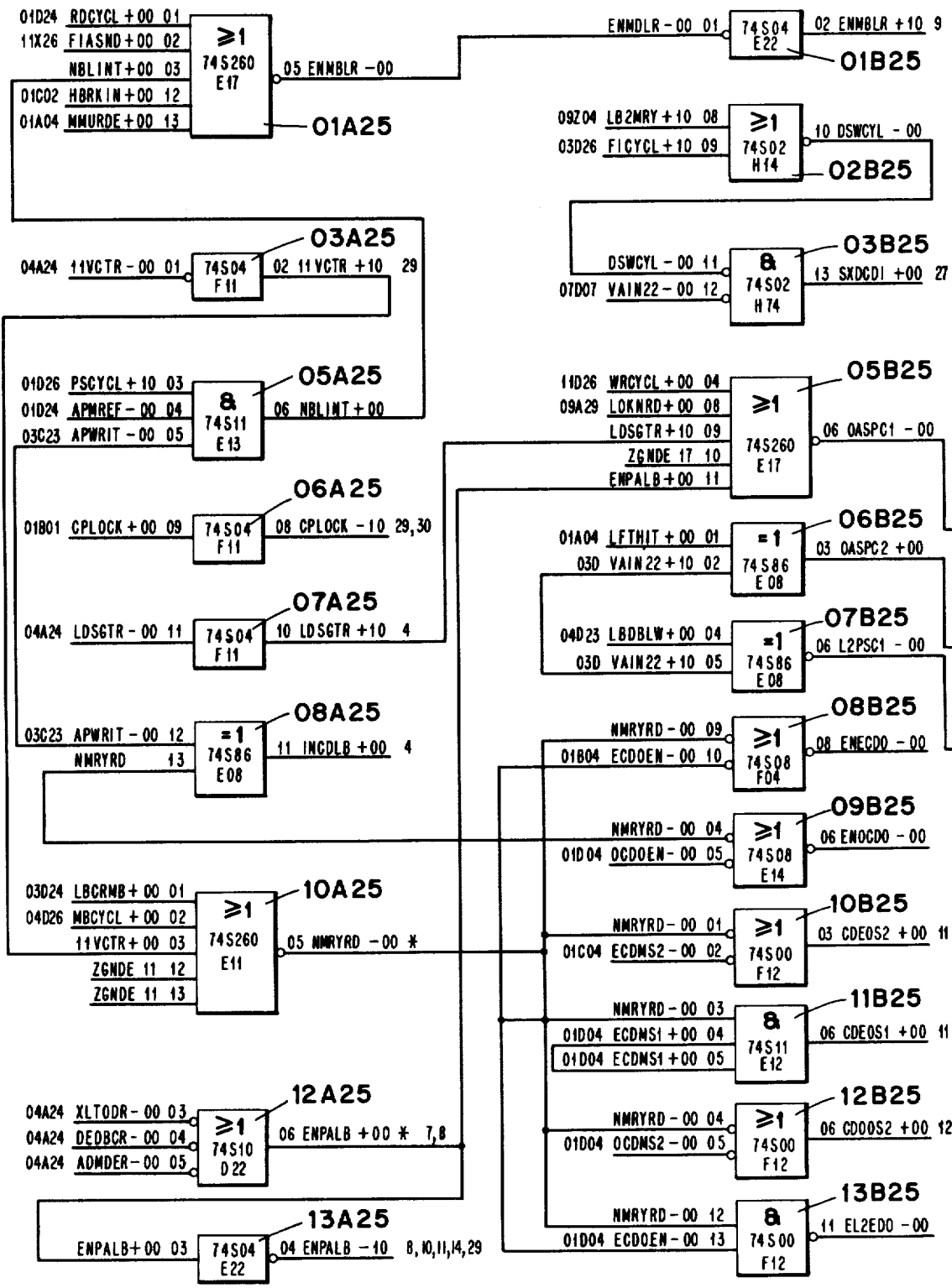

FIGS. 26(a) and 26(b) illustrate an embodiment of the local data input multiplexer 701 (FIG. 19(a)). This embodiment comprises 32 2×1 multiplexers controlled by the signals ENMBLR and LDLDTR (load data lines LDTR). When ENMBLR is true, megabus data (MBDT0:32) is enabled to the corresponding outputs LDTR0:32 of the multiplexers. ENMBLR is the output of inverter 01B25 and OR gate 01A25 as illustrated in FIG. 42(a). ENMBLR will be true whenever a read cycle has been requested, the FIFO has been assigned a local bus cycle, an interrupt has been enabled, a write breakin has been requested, or an MMU read error has been detected. Signals indicating these conditions are all inputted to the OR gate 01A25.

As discussed above with regard to FIG. 19(a), the output of the local data input multiplexer 701 is supplied to the cache data input multiplexer 703 and to the even and odd level 1 data output multiplexers 717 and 719.

Considering first the cache data input multiplexer 703, it has been previously stated that the function of the even cache data input multiplexer 705 is to select as an input whichever of the local data words LDTR0:16 or LDTR16:16 is identified by an even address number. Similarly, the odd cache data input multiplexer 707 selects as the local data word, which ever of LDTR0:16 or LDTR16:16 is identified by an odd address number.

Figure 27A:
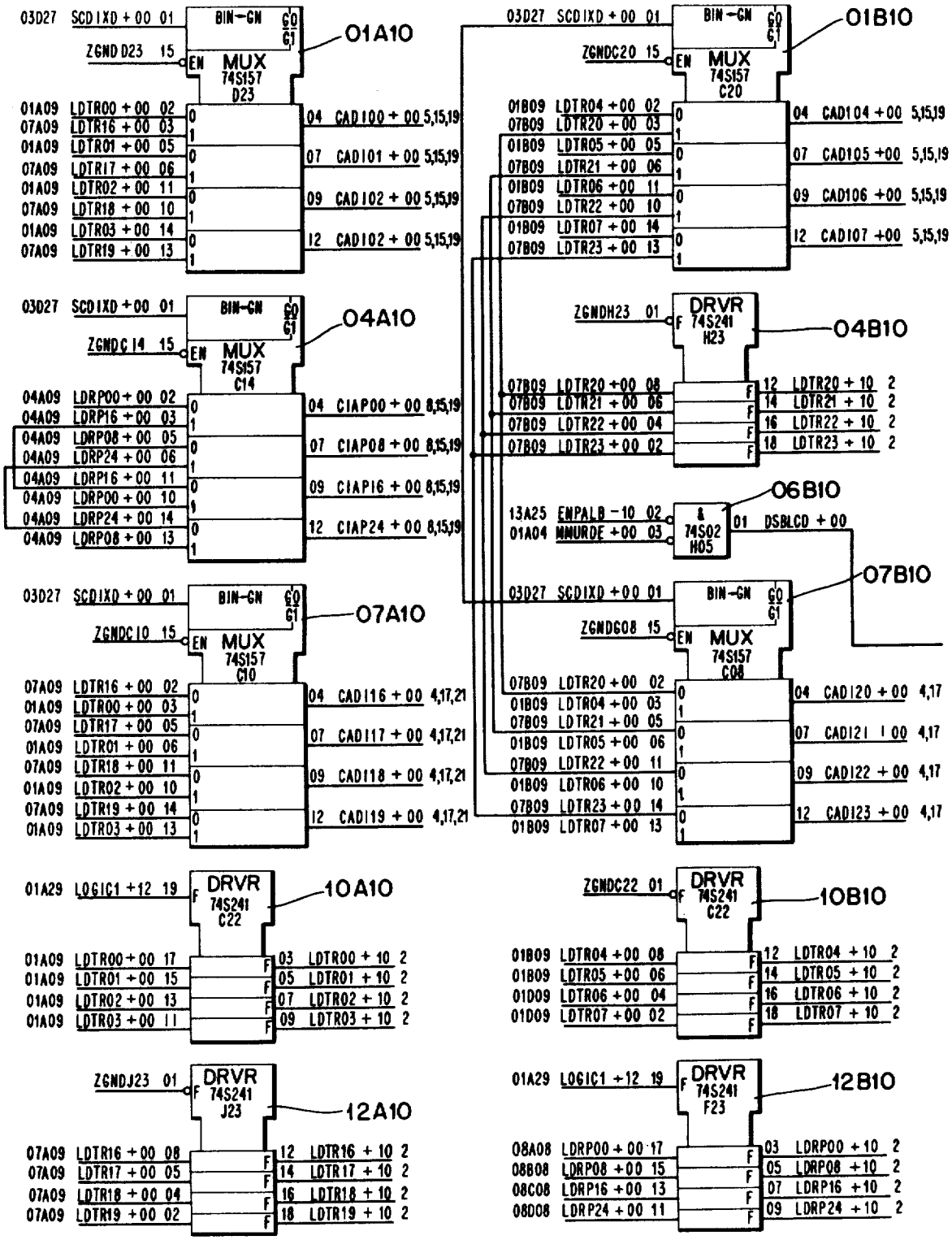
Figure 27B:
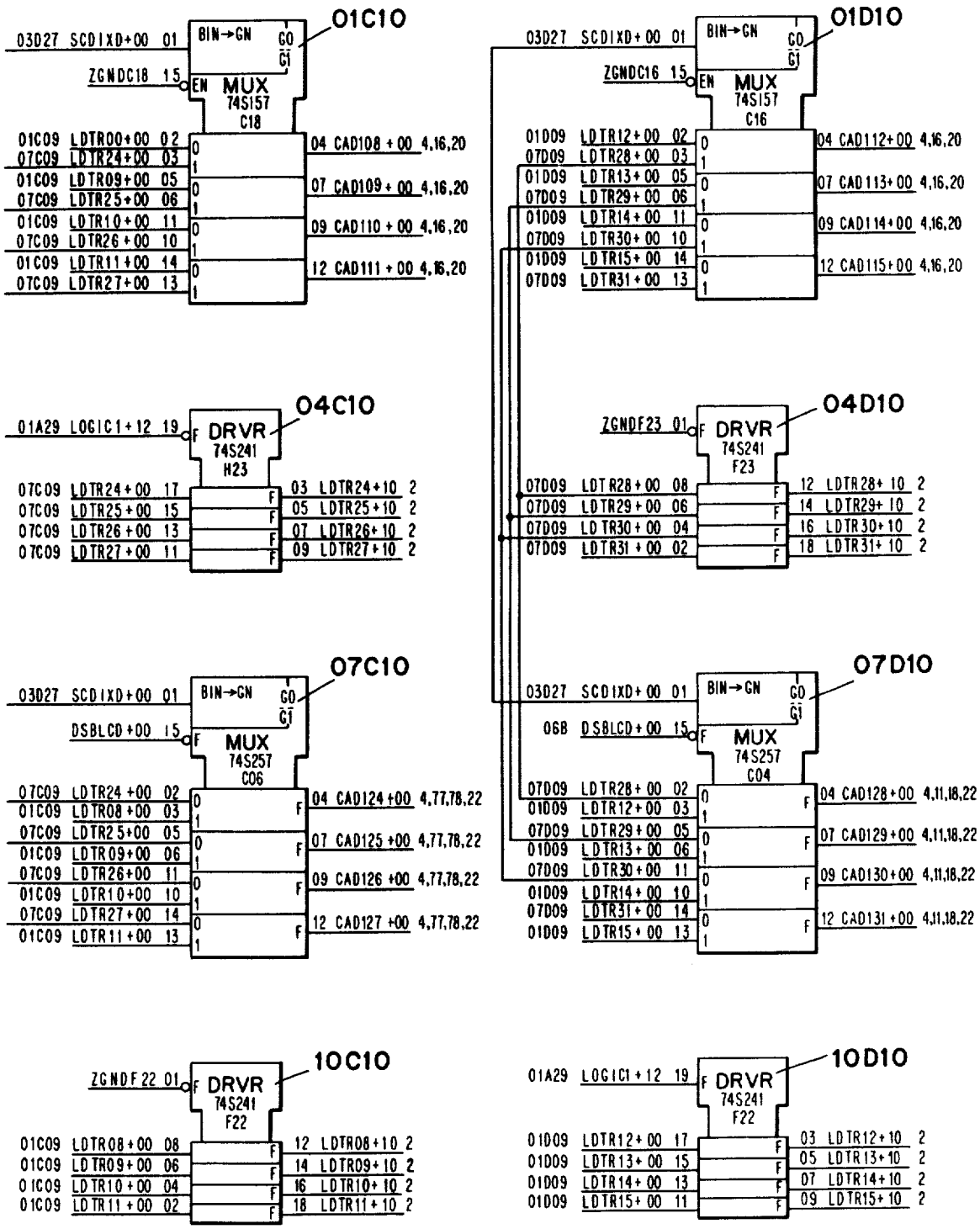

An embodiment of the cache data input multiplexer 703 is set forth in FIGS. 27(a) and 27(b). The even and odd cache data input multiplexer 705, 707 comprise 32 2×1 multiplexers. The even cache data input multiplexer comprises multiplexer circuit chips 01A10, 01B10, 01C10, and 01D10. The odd cache data input multiplexer comprises the multiplexer circuit chips 07A10, 07B10, 07C10, and 07D10.

The multiplexer circuit 01A10 (FIG. 27(a)) will be discussed as an example. This multiplexer circuit is controlled by the signal SCDIXD which is the output of the driver circuit 03D27 illustrated in FIG. 44(b). The input to the driver circuit is a signal SXDCDI which is the output of an AND gate 03B25 (FIG. 42(a)). SXDCDI will be equal to ZERO unless there is a local bus memory request signified by LB2MRY equal to one or a FIFO cycle as indicated by FICYCL being equal to ONE.

The other input to AND gate 03B25 is the least significant bit of the virtual address, VAIN22 and, therefore, SXDCDI can only be true if the least significant bit of the virtual address associated with local data word LDTR0:16 is ONE signifying that the left (the high order) data word is identified by an odd address number. If VAIN22 is odd then the odd cache data input multiplexer 707 will select as inputs the local data word LDTR0:16 and the even cache data input multiplexer 705 will select as inputs the second local data word LDTR16:16.

It is a function of the even and odd cache data input multiplexers illustrated in FIGS. 27(a) and 27(b) to supply their inputs selectively as outputs to the level 1 and level 2 even and odd data stores, 709, 711, 713, and 715. The output of the even cache data input multiplexer 705 is the data word CADI0:16 and the output of the odd cache data input multiplexer is the data word CADI16:16.

The multiplexer circuit 04A10 is provided to select and to transfer the parity bits for the data word CADI0:16 and CADI16:16.

FIGS. 27(a) and 27(b) also illustrate driver circuits 10A10, 10B10, 10C10, 10D10, 12A10, 04B10, 04C10, 04D10, and 12B10, for the local data words LDTR0:16 and LDTR16:16.

FIGS. 28(a), 28(b) 29(a), and 29(b) illustrate an embodiment of the level 1 even data store 709 (FIG. 19(a)). This embodiment includes 16 1×1024 random access memory chips for storing 1024 16 bit data words identified by even address numbers. Random access memory chip 07A15 (FIG. 28(a)) and 07A16 (FIG. 29(a)) store the parity bits associated with each of the data words stored in the level 1 even data store 709.

Figure 28A:
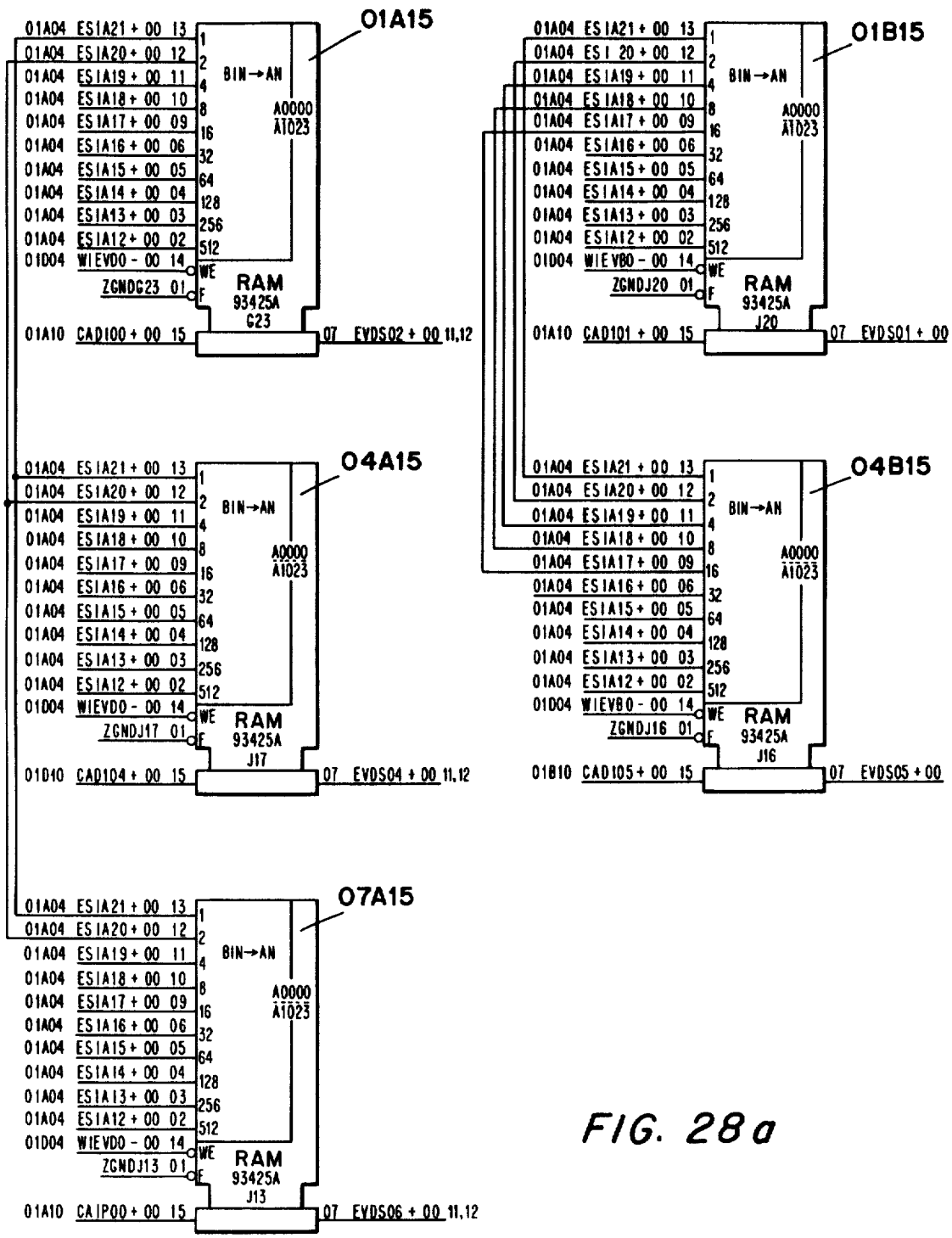
Figure 28B:
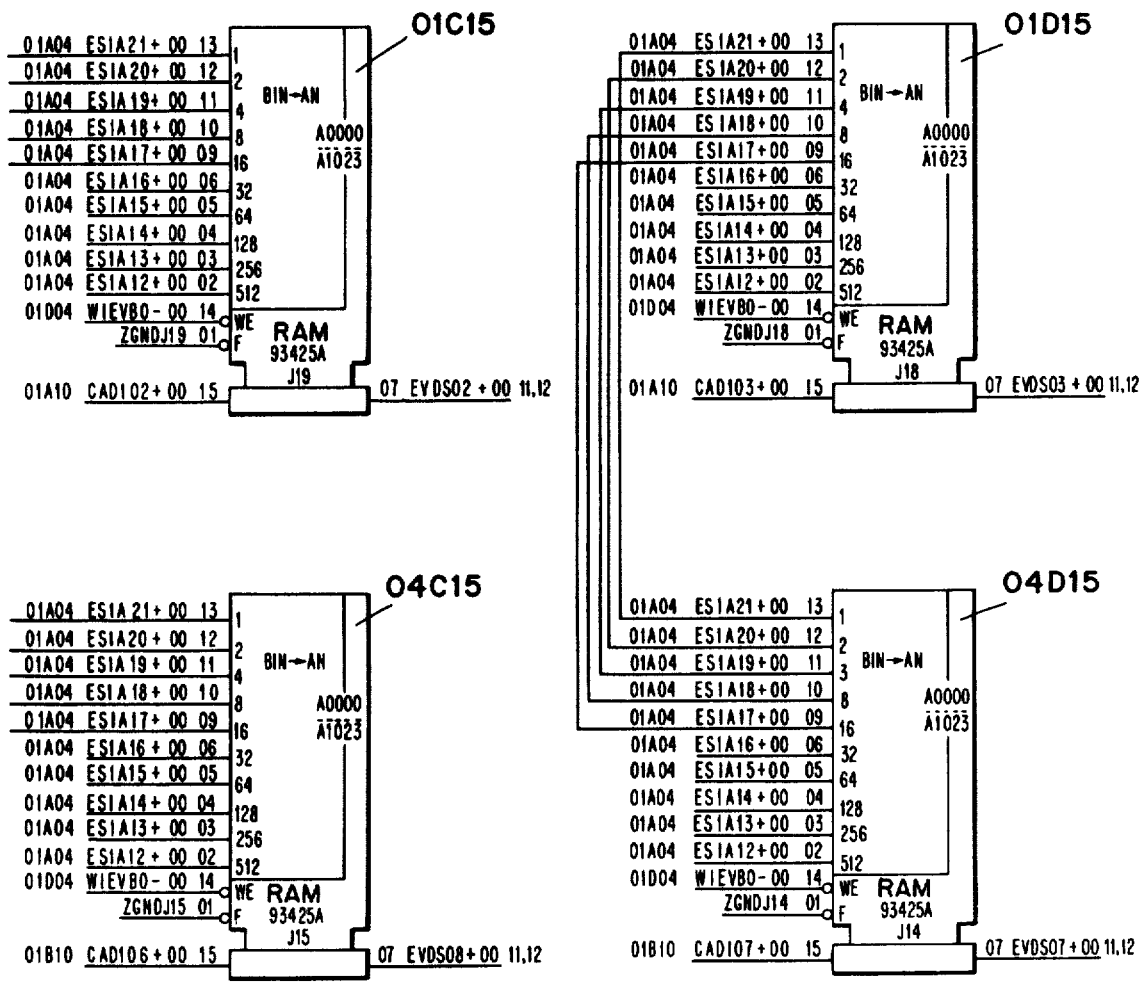
Figure 29A:
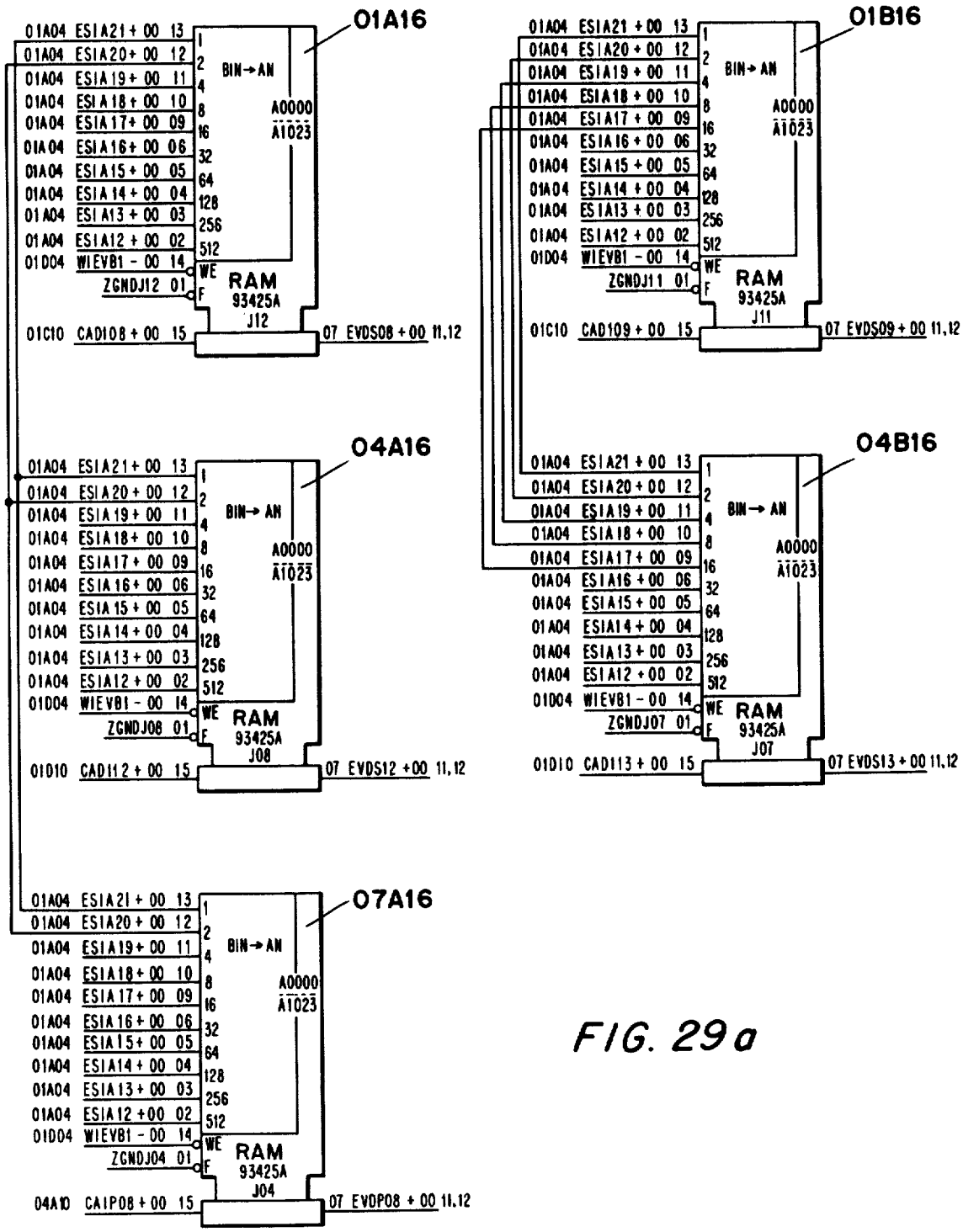
Figure 29B:
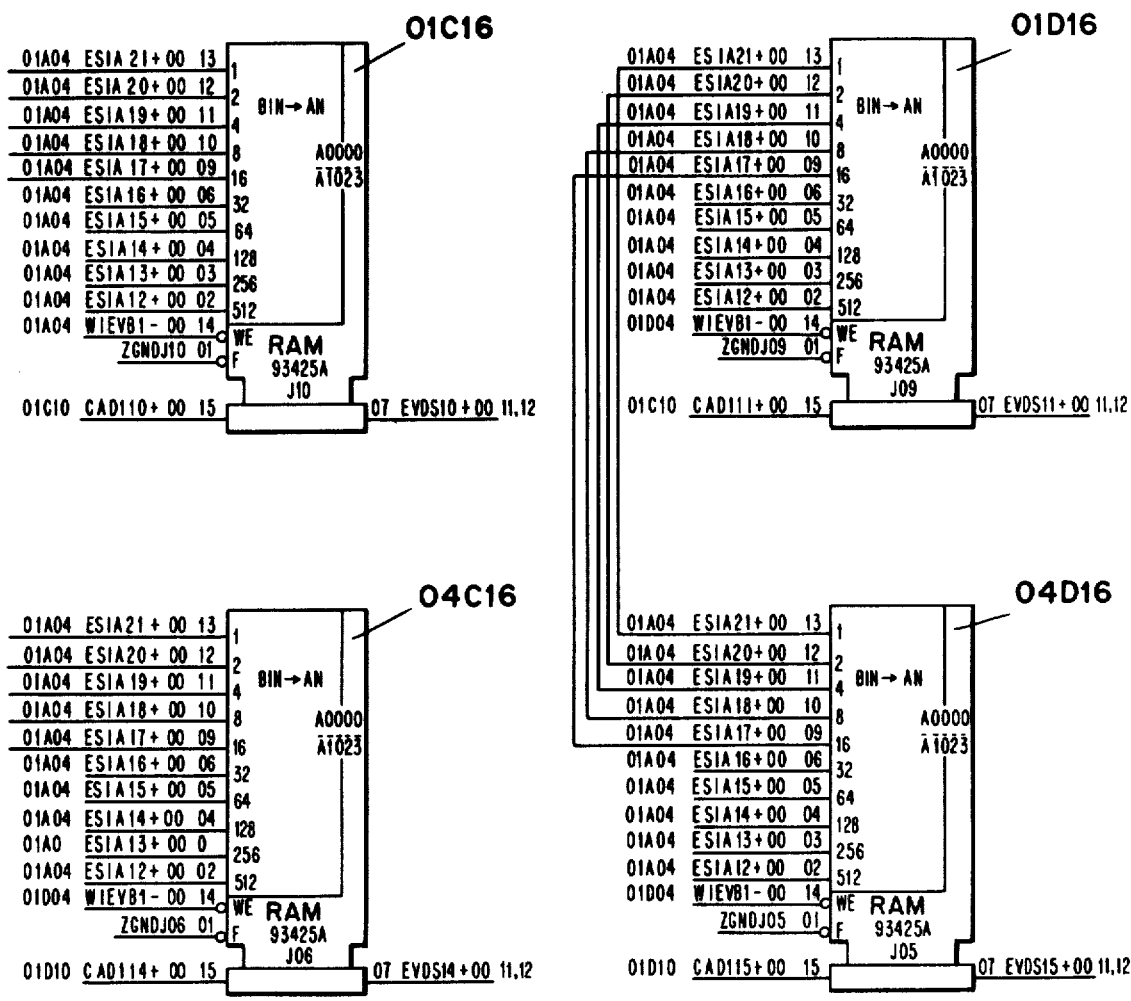
Figure 30A:
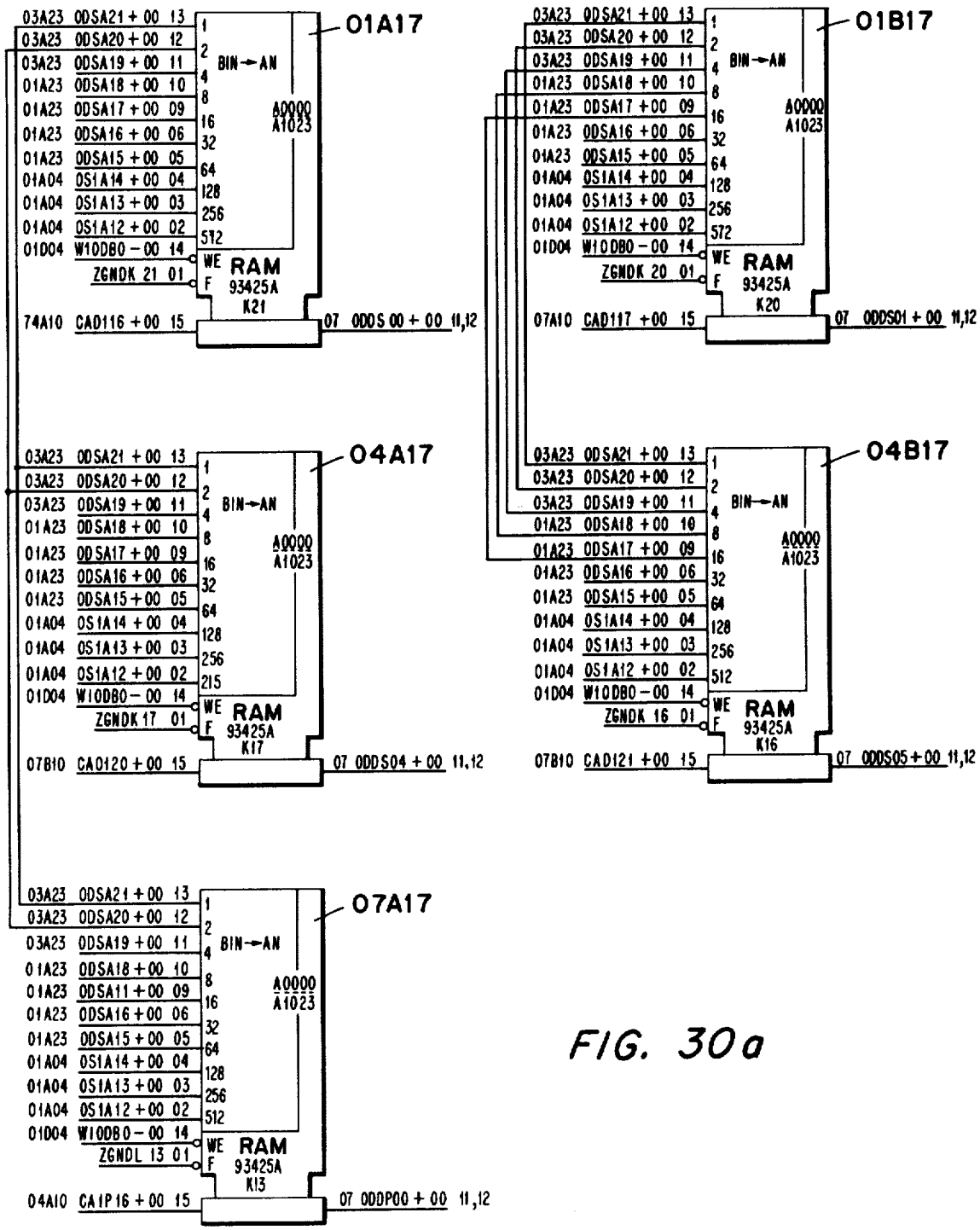
Figure 30B:
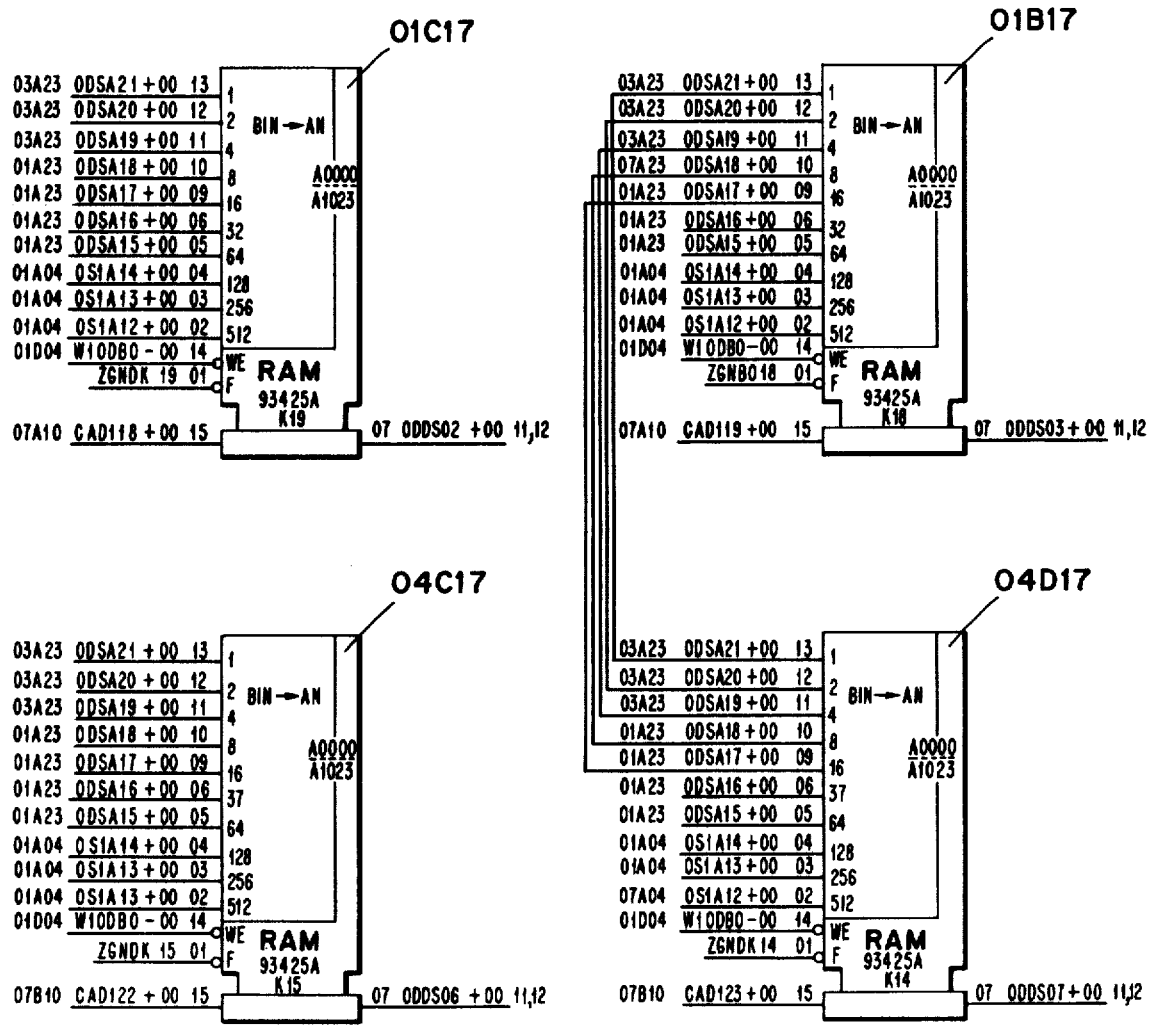
Figure 31A:
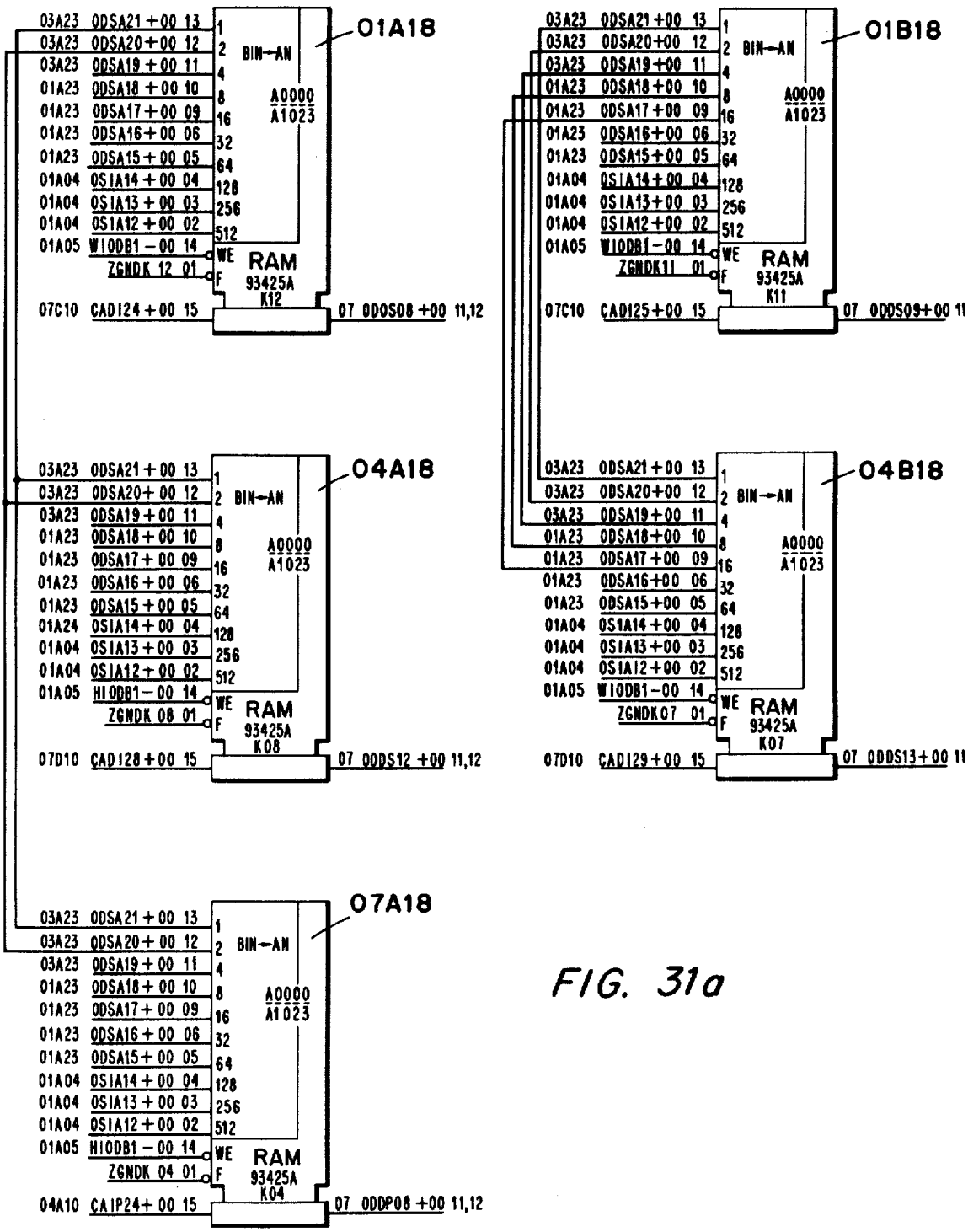
Figure 31B:
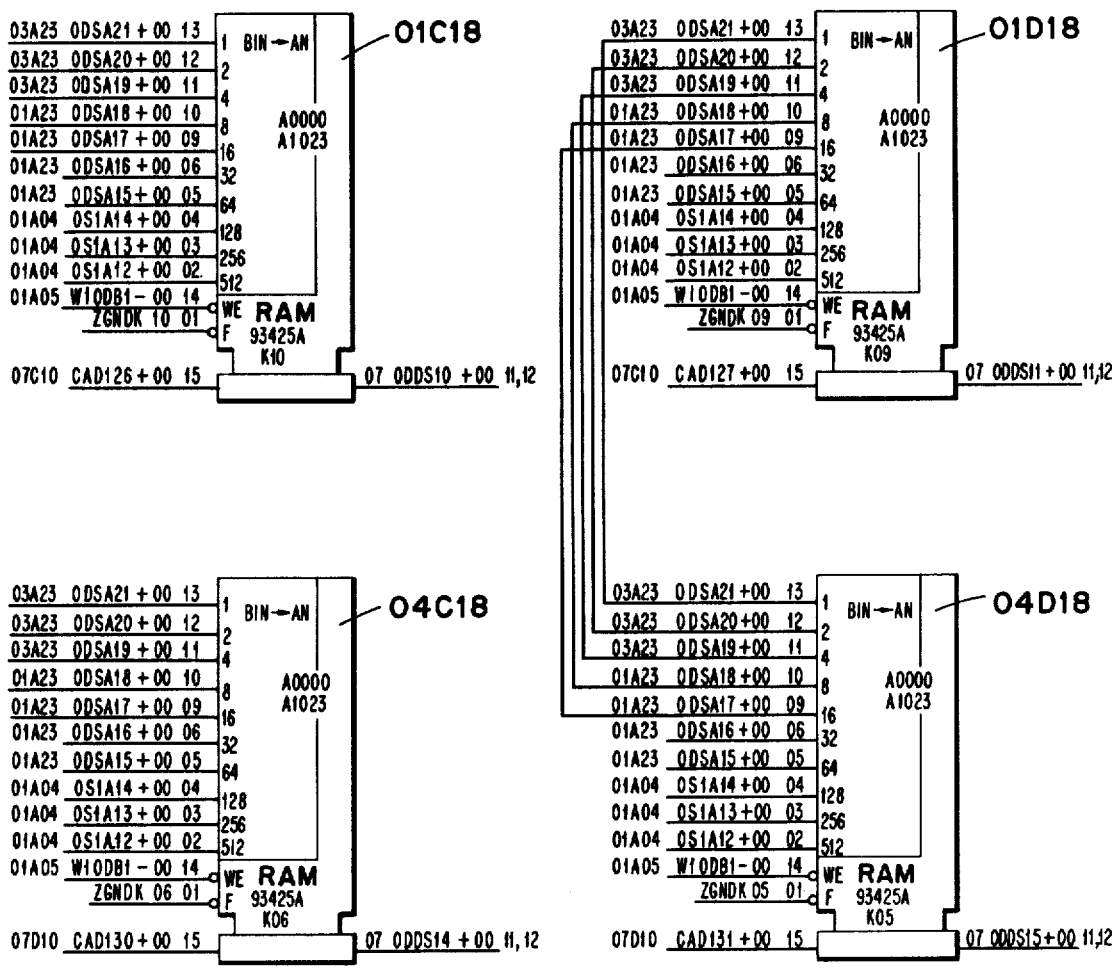
Figure 32A:
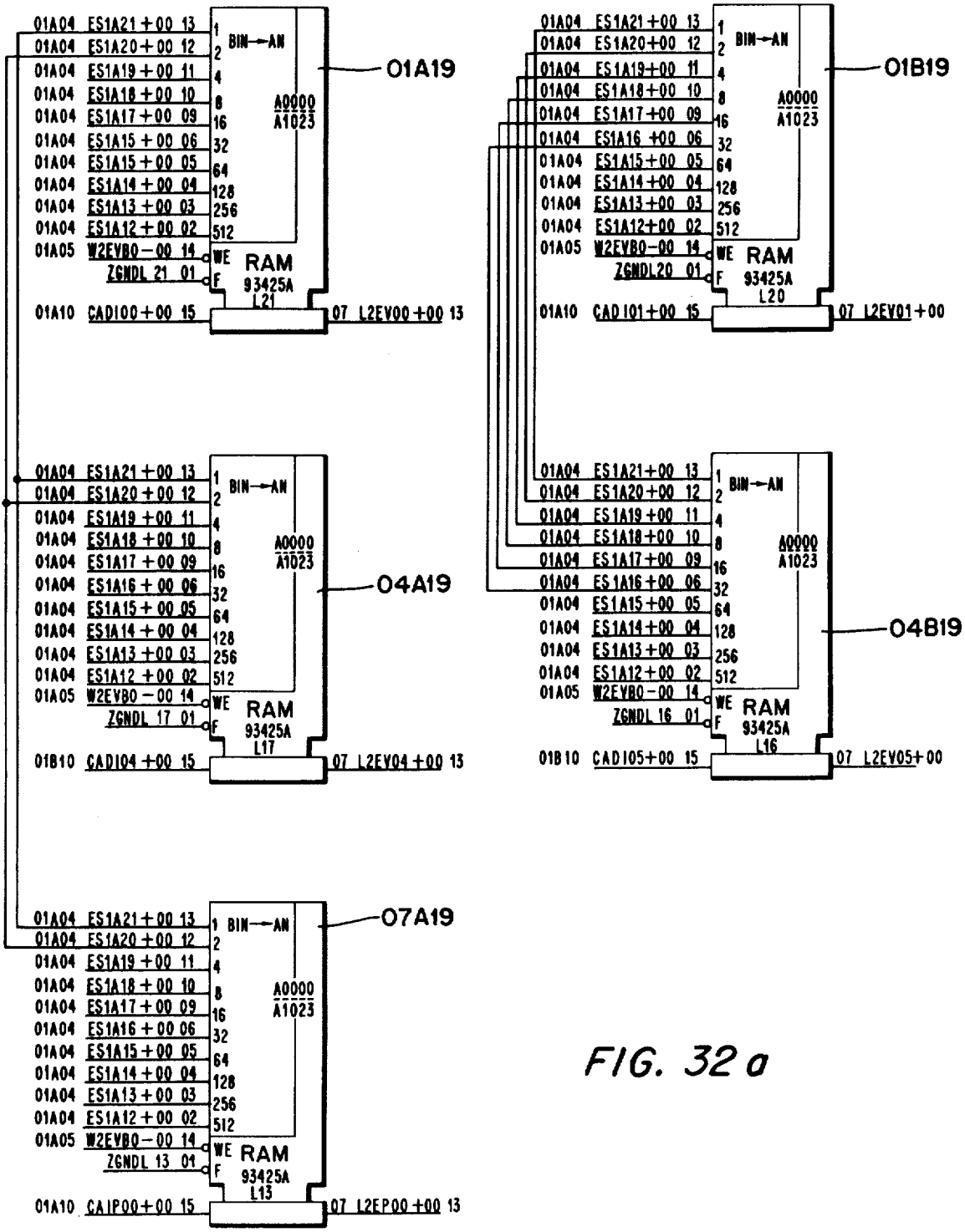
Figure 32B:
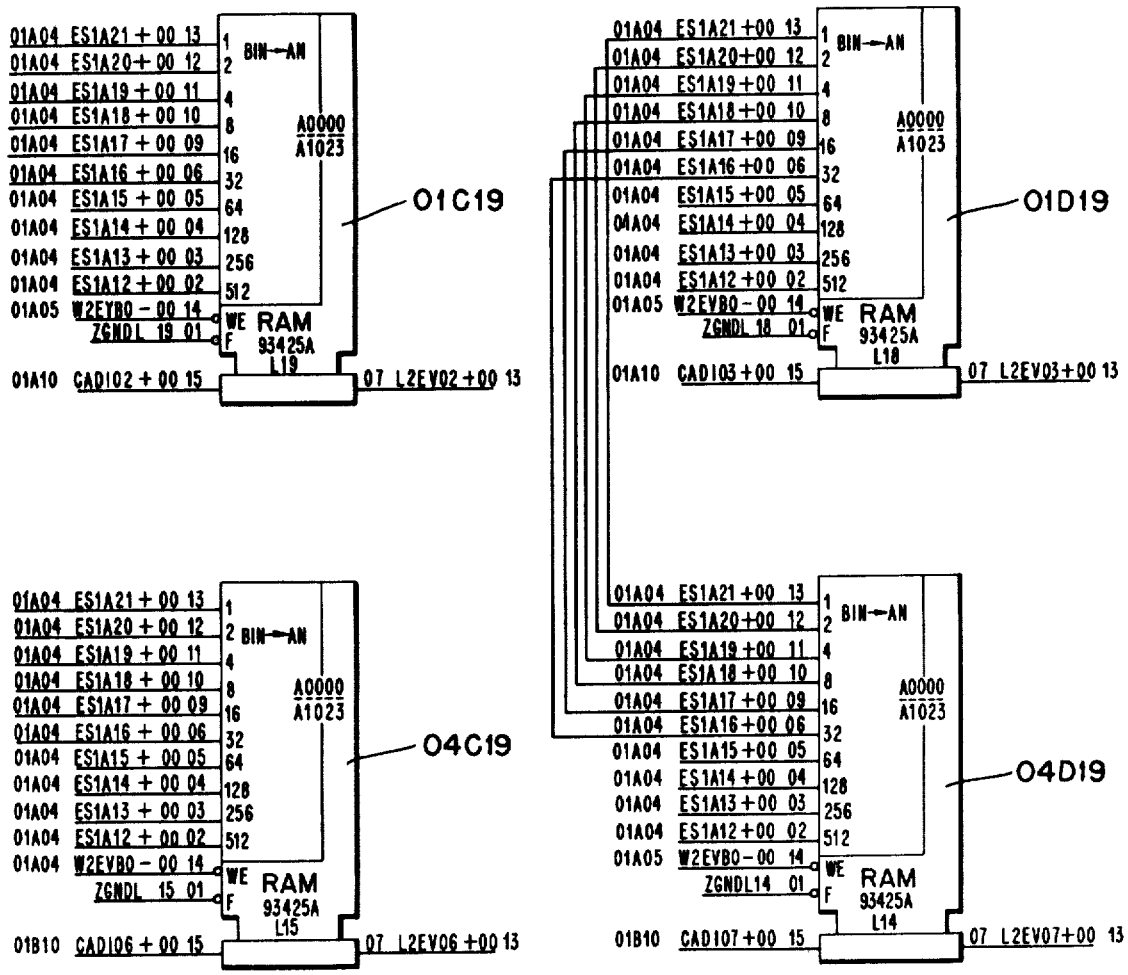
Figure 33A:
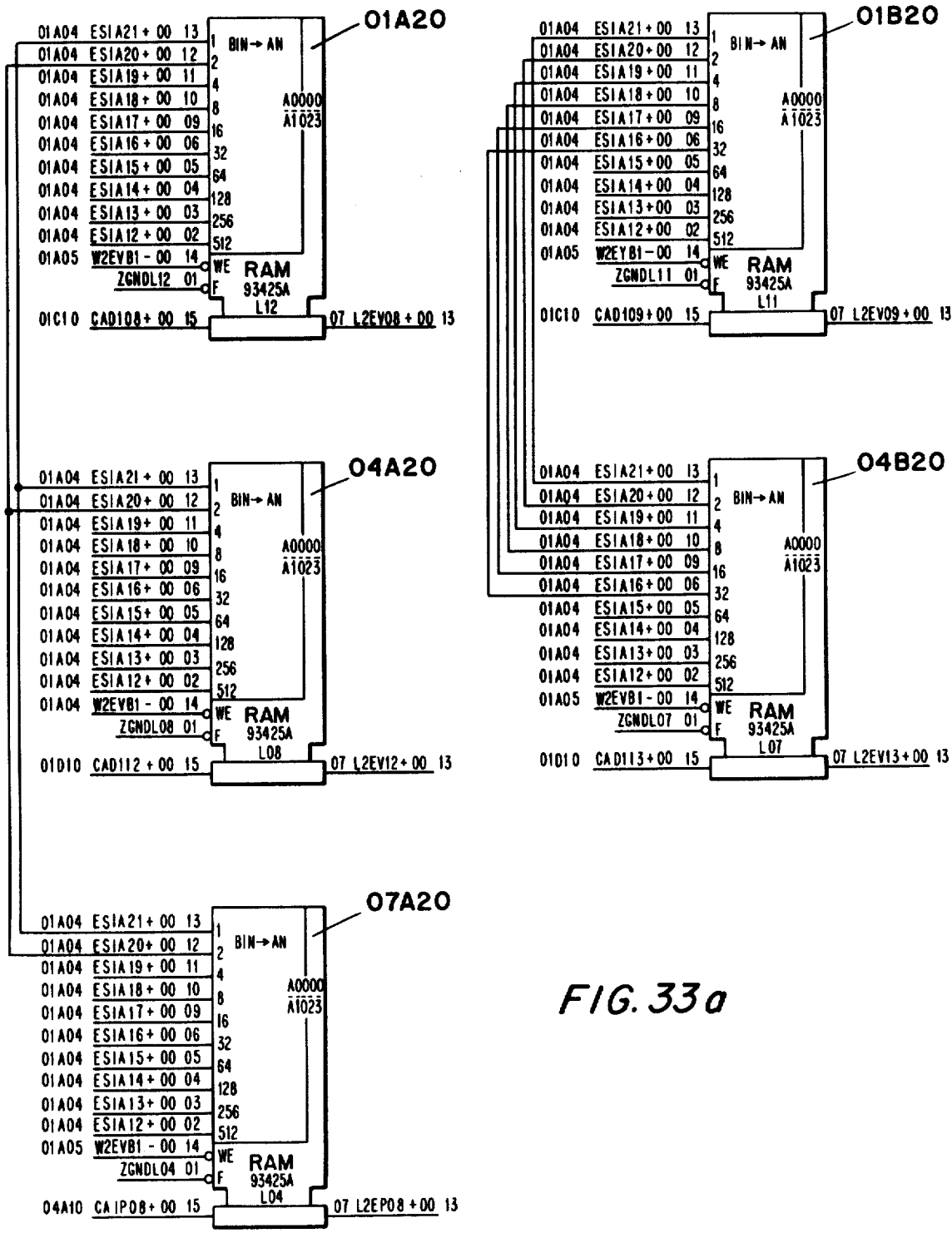
Figure 33B:
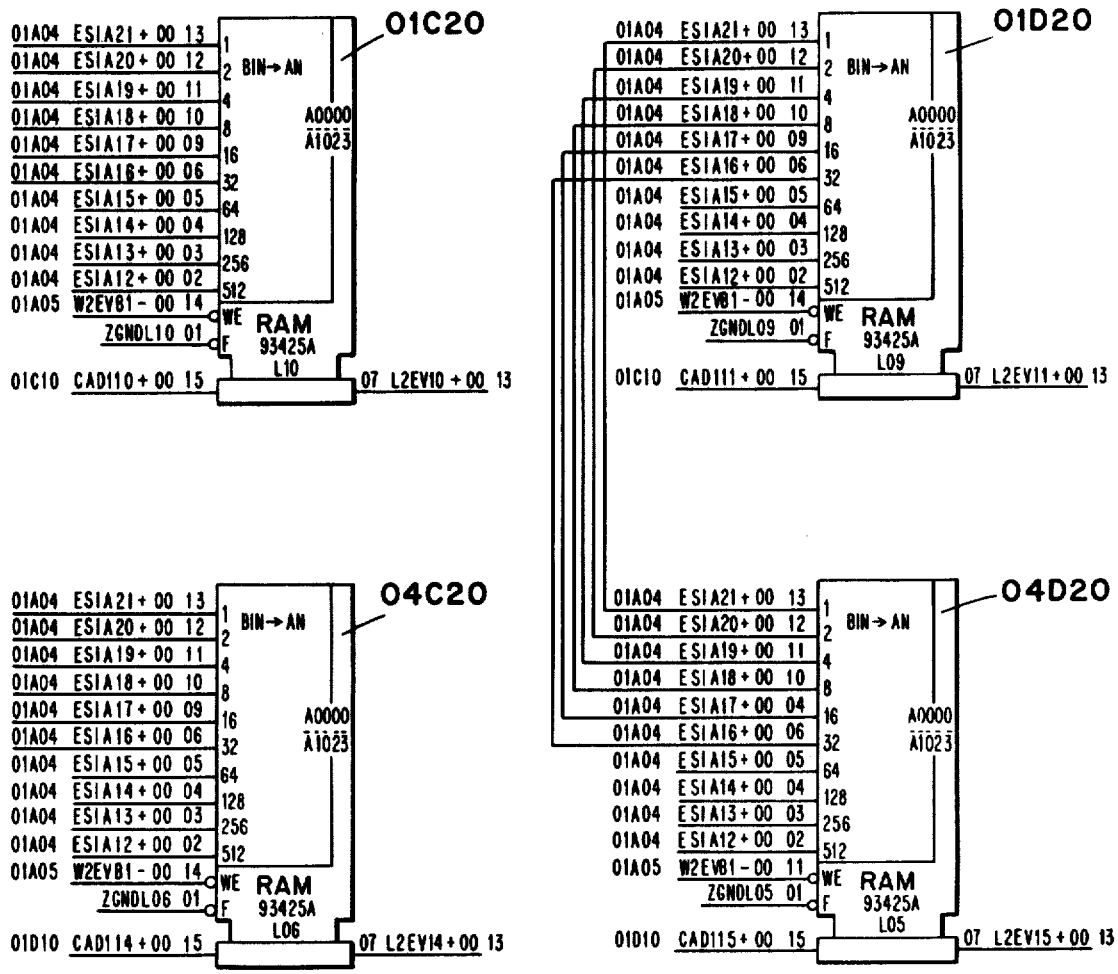
Figure 34A:
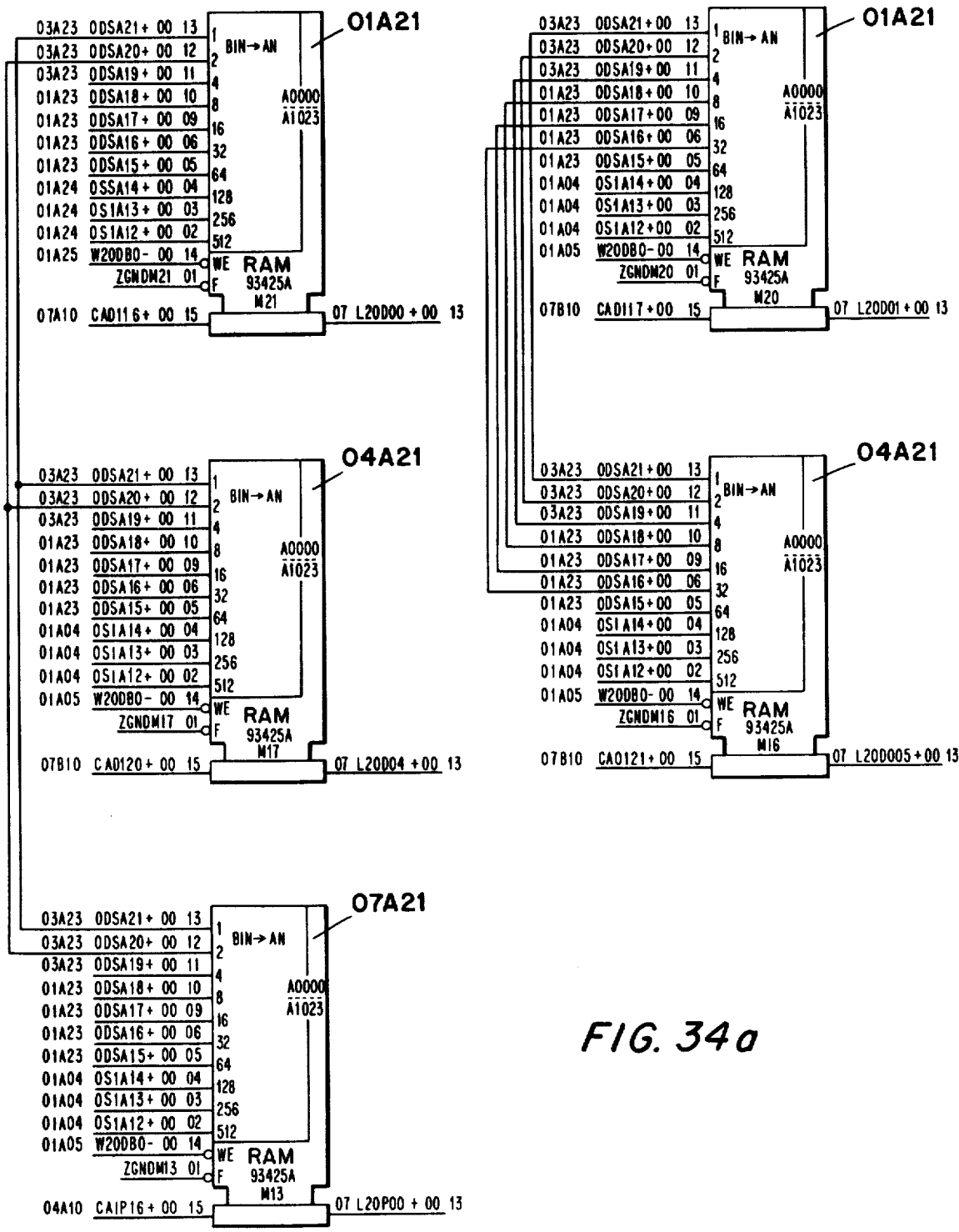
Figure 34B:
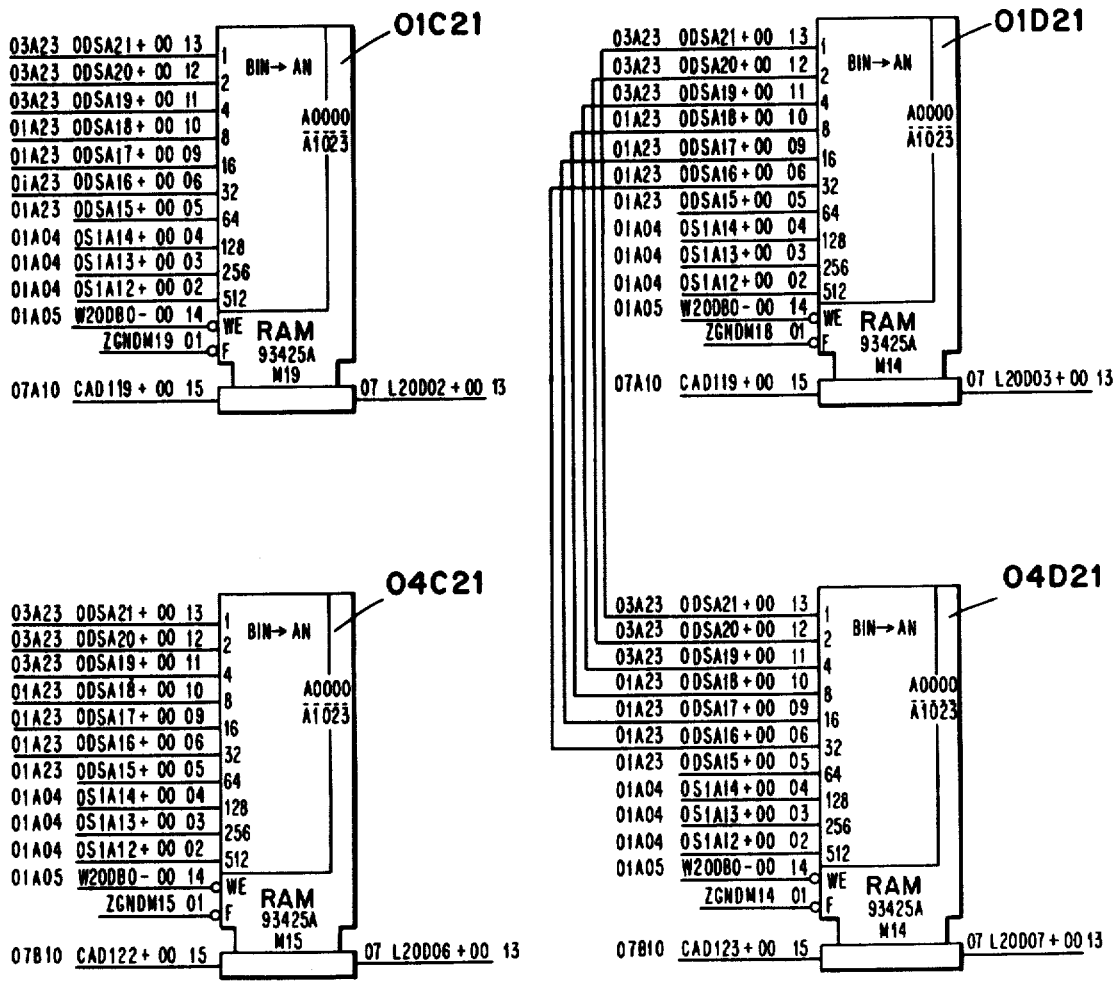
Figure 35A:
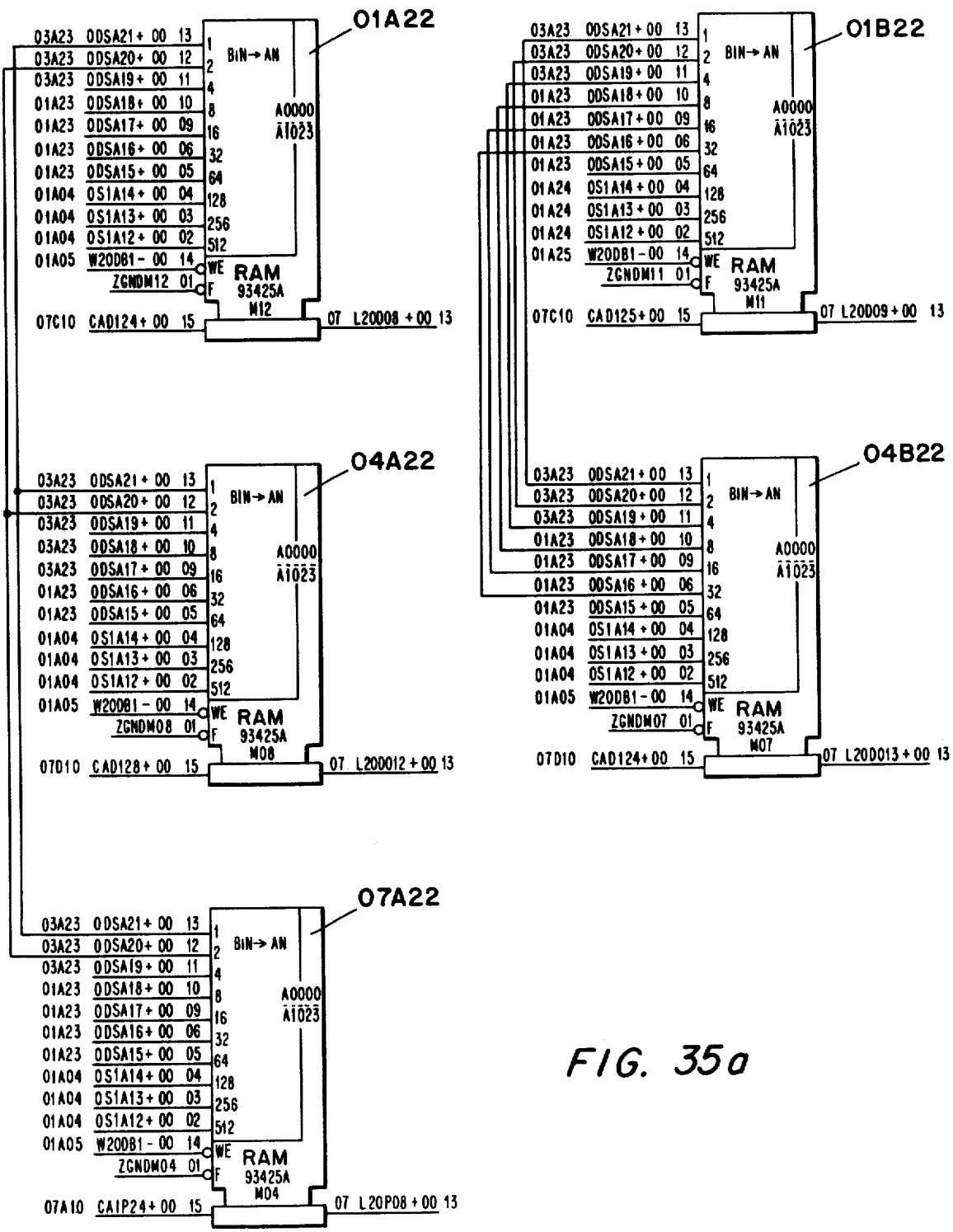
Figure 35B:
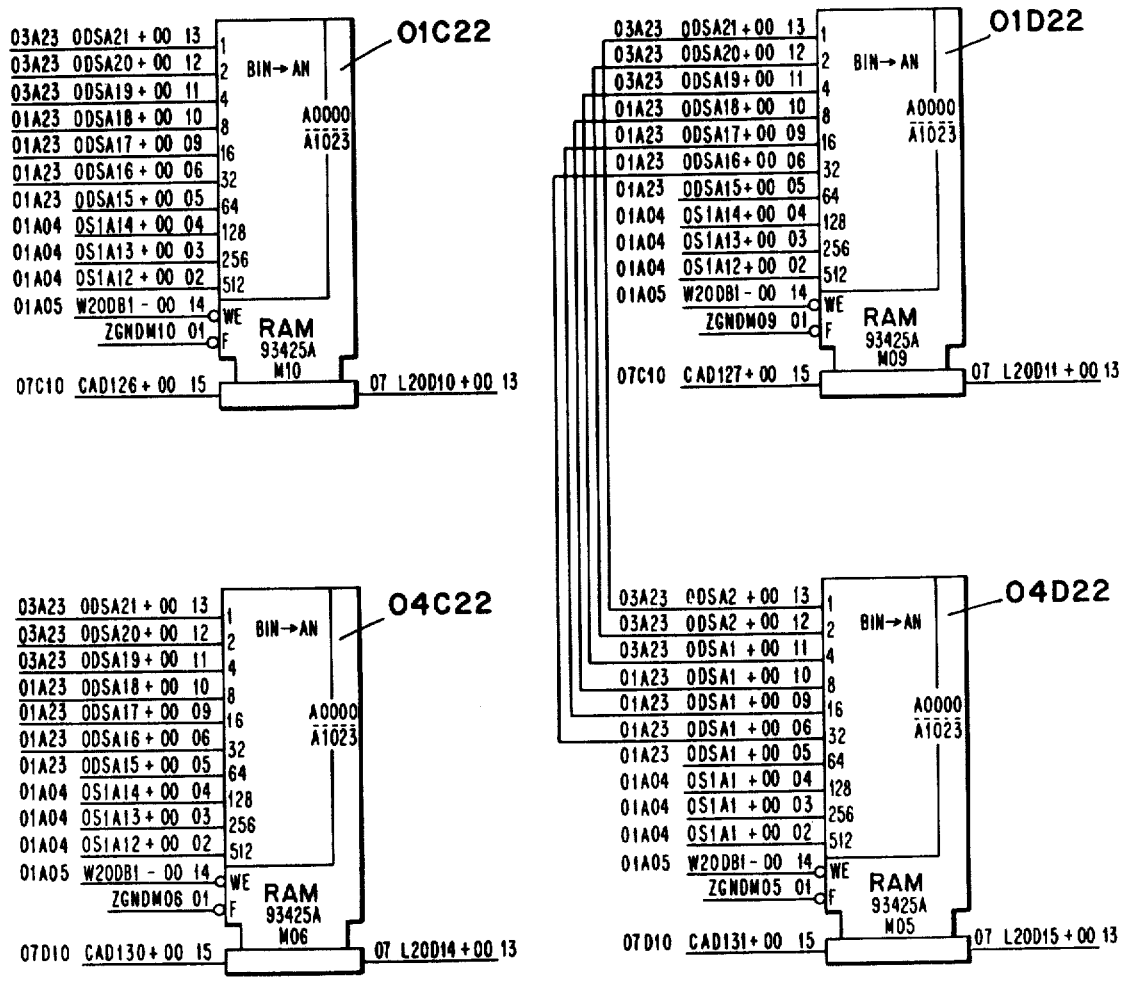

With reference to the random access memory chip 01A15 (FIG. 28(a)), a storage location within the memory is selected, i.e., addressed, by the 10 address lines labeled ES1A12–ES1A21 as generated by the cache directory subsystem in a manner hereinafter explained. These bits correspond to the least significant bits of the even physical address outputted by the even address drivers 771 (FIG. 19(b)). The write enable signal is W1EVB0 which is inverted upon input to the write enable terminal of the random access memory chip 01A15. When a data word is to be written into the level 1 even data store, W1EVB0 will be generated in a manner that will enable the storing of the 16 bits comprising the data word CADI0:16 into their associated random access memory chips. If, however, a word is to be read from the level 1 even data store, the W1EVB0 will have a value to disable writing into the random access memory chips but enable the reading of the memory chip 01A15 such that the output signal EVDS00 is equal to the value stored at the addressed memory location.

FIGS. 30(a), 30(b), 31(a), and 31(b) illustrate an embodiment of the level 1 odd data store 711. This embodiment also comprises 16 1024×1 random access memory chips which receive as inputs the signals CADI16:16 and generate as outputs the signals ODDS00:16. Each of the random access memory chips is addressed by the ten least significant bits of the odd physical address number, OS1A12–OS1A14 and ODSA15–ODSA21. The signals ODSA15–ODSA21 are the outputs of the driver circuits 03A23 and 01A23 (FIG. 36(a)) and correspond to the virtual address number bits VAIN15-VAIN21. The bits OS1A12–OS1A14 correspond to the odd physical address bits OPAD12–OPAD14 generated by the cache directory subsystem in a manner to be explained hereinafter. The read and write enable signal for each of the random access memory chips is the write level one odd signal, W1ODB0.

FIGS. 32(a), 32(b), 33(a), and 33(b) illustrate an embodiment of the level 2 even data store 713. FIGS. 34(a), 34(b), 35(a), and 35(b) illustrate an embodiment of the level 2 odd data store 715. The construction of each of these data stores is the same as the level 1 even and odd data stores explained with reference to FIGS. 28(a)-31(b) and the similarities between the level 1 and level 2 data stores will not be repeated.

The reading and writing of the random access memory chips comprising the level 2 even data store 713 is under the control of the write level two even signal, W2EVB0, generated by the cache directory subsystem. The random access memory chips comprising the level 2 even data store 713 receive as inputs CADI0:16 and generate as outputs L2EV00:16. The address signals for the random access memory chips comprising the level 2 even data stores 713 are the same as the address signals for the random access memory chips comprising the level 1 even data store 709.

Finally, the random access memory chips comprising the level 2 odd data store 715 receive as inputs CADI16:16 and generate as outputs L2OD0:16 under the control of the write level two odd data signal, W2ODB0. Furthermore, the address signals for each of the random access memory chips comprising the level 2 odd data store 715 are the same address signals which control the addressing of the random access memory chips comprising the level 1 odd data store 711.

Figure 36A:
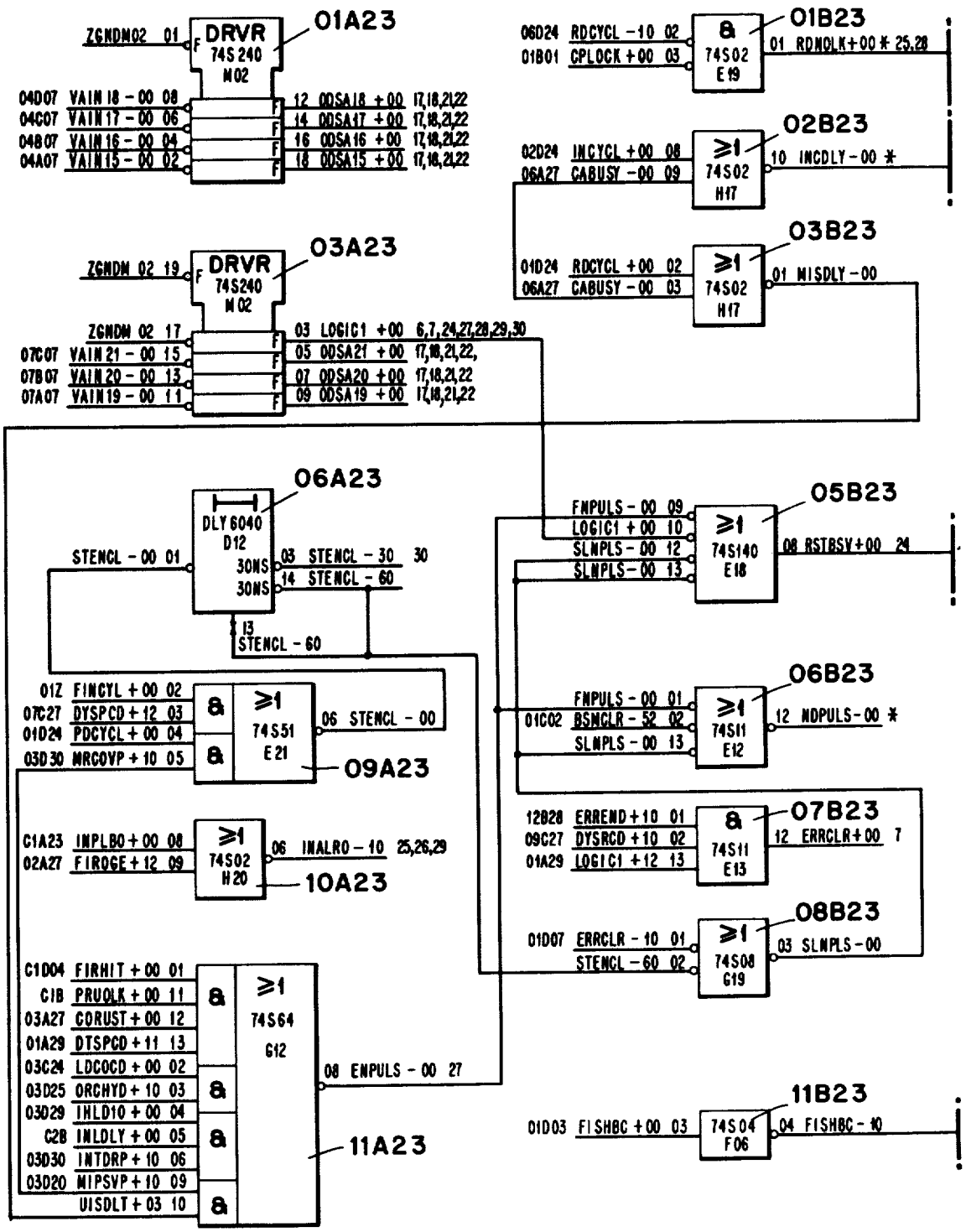
Figure 36B:
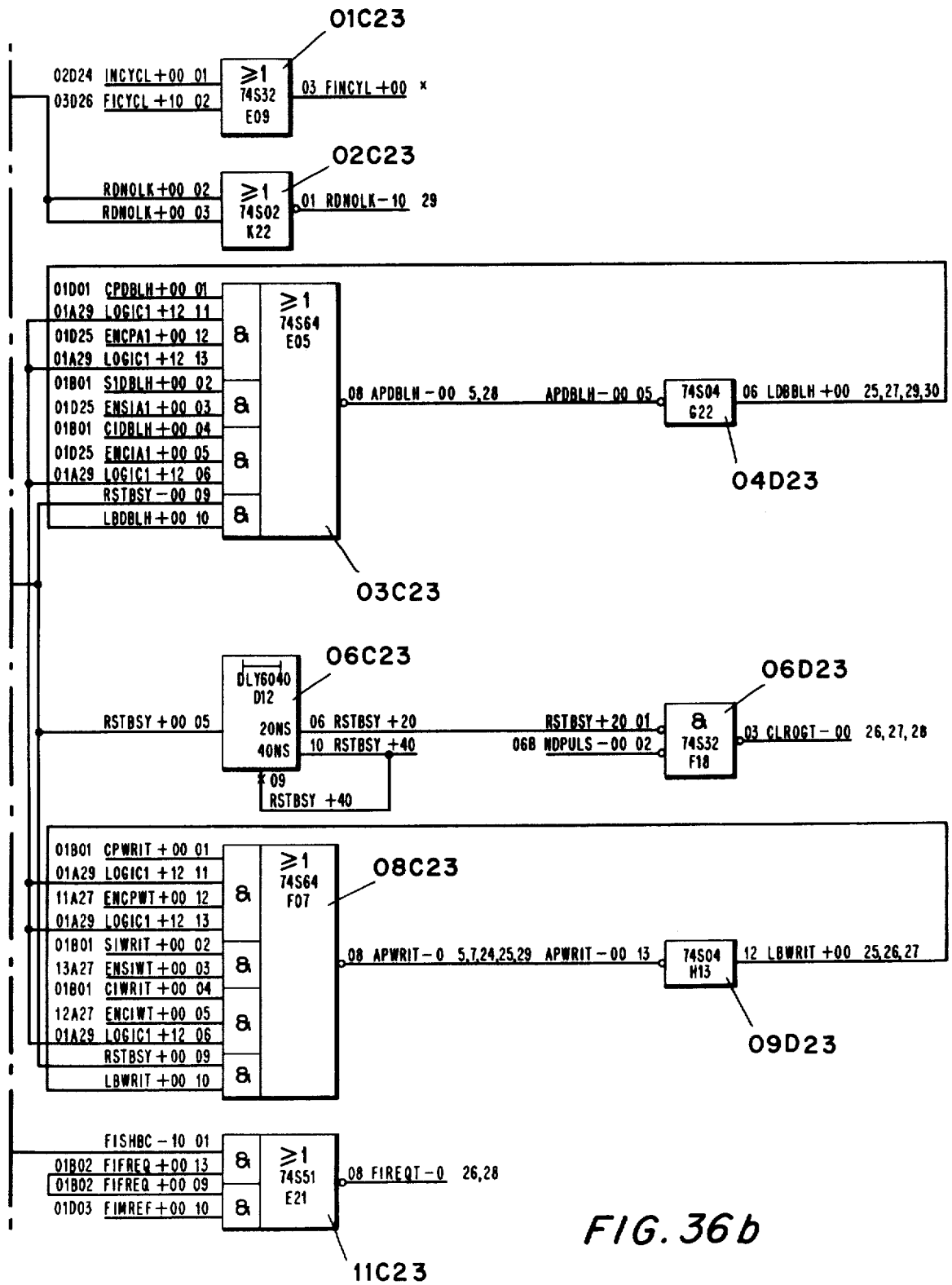

FIGS. 36(a) and 36(b) illustrate additional control circuitry for the cache/MMU. The circuitry illustrated in FIG. 36(a) other than the driver circuits 03A23 and 01A23 control the ending of a cache memory cycle. The output FNPULS of the four-way selector 11A23 is a finish pulse which causes the busy line to be cleared and an end pulse to be generated. The delay circuit 06A23 initiates the generation of a slow end impulse, SLNPLS, by the OR circuit 08B23.

The four way selector 03C23 illustrated in FIG. 36(b) is the double wide selector which will initiate the transfer of two data words simultaneously from the cache memory. A cache cycle is ended by the clear request granted signal CLRQGT outputted from AND gate 06D23. Finally, the write direction signal LBWRIT comprises the output of the four-way selector 08C23 and, as previously explained, the value of LBWRIT determines whether a local bus read or write is being performed.

Figure 37A:
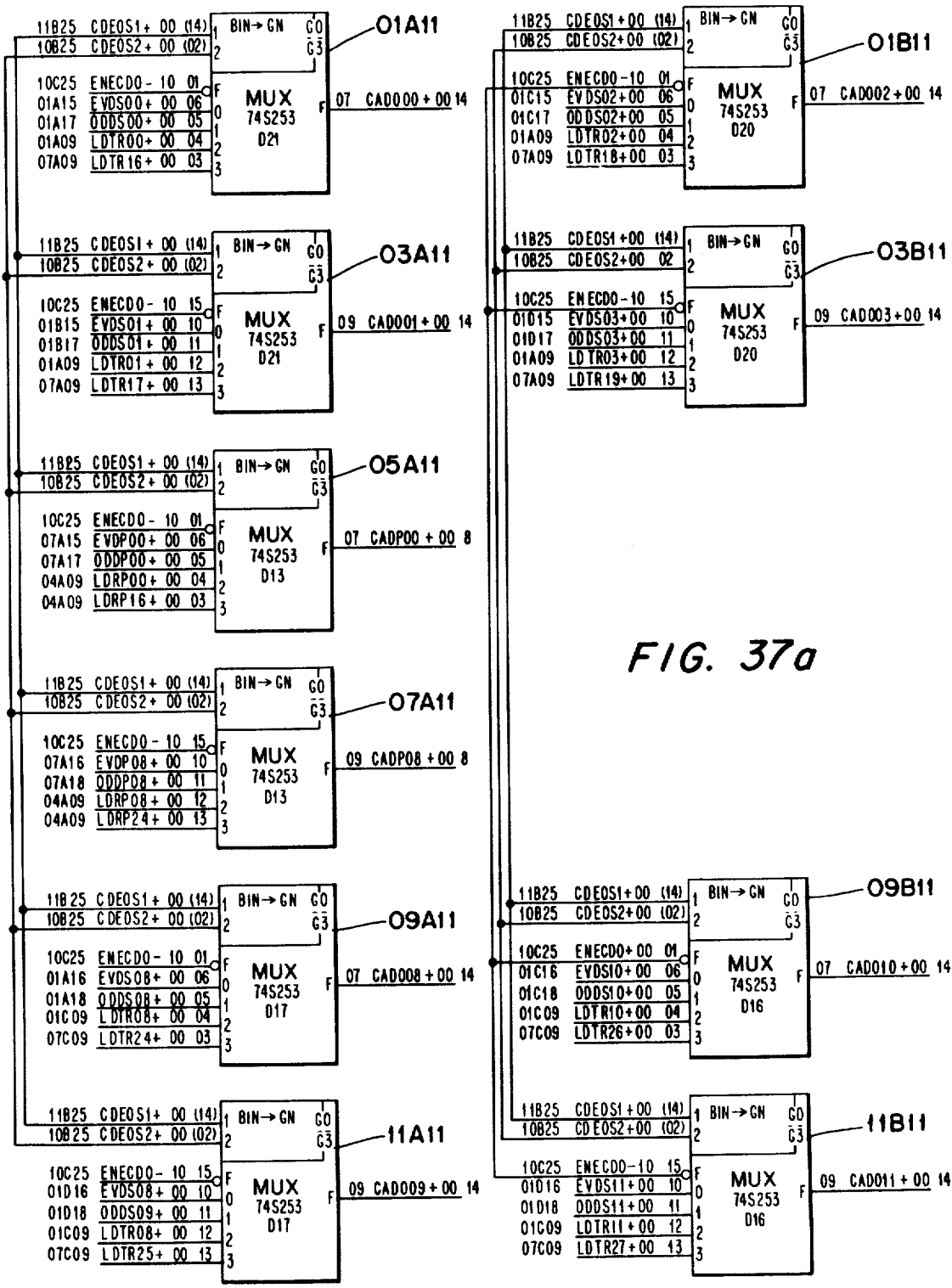
Figure 37B:
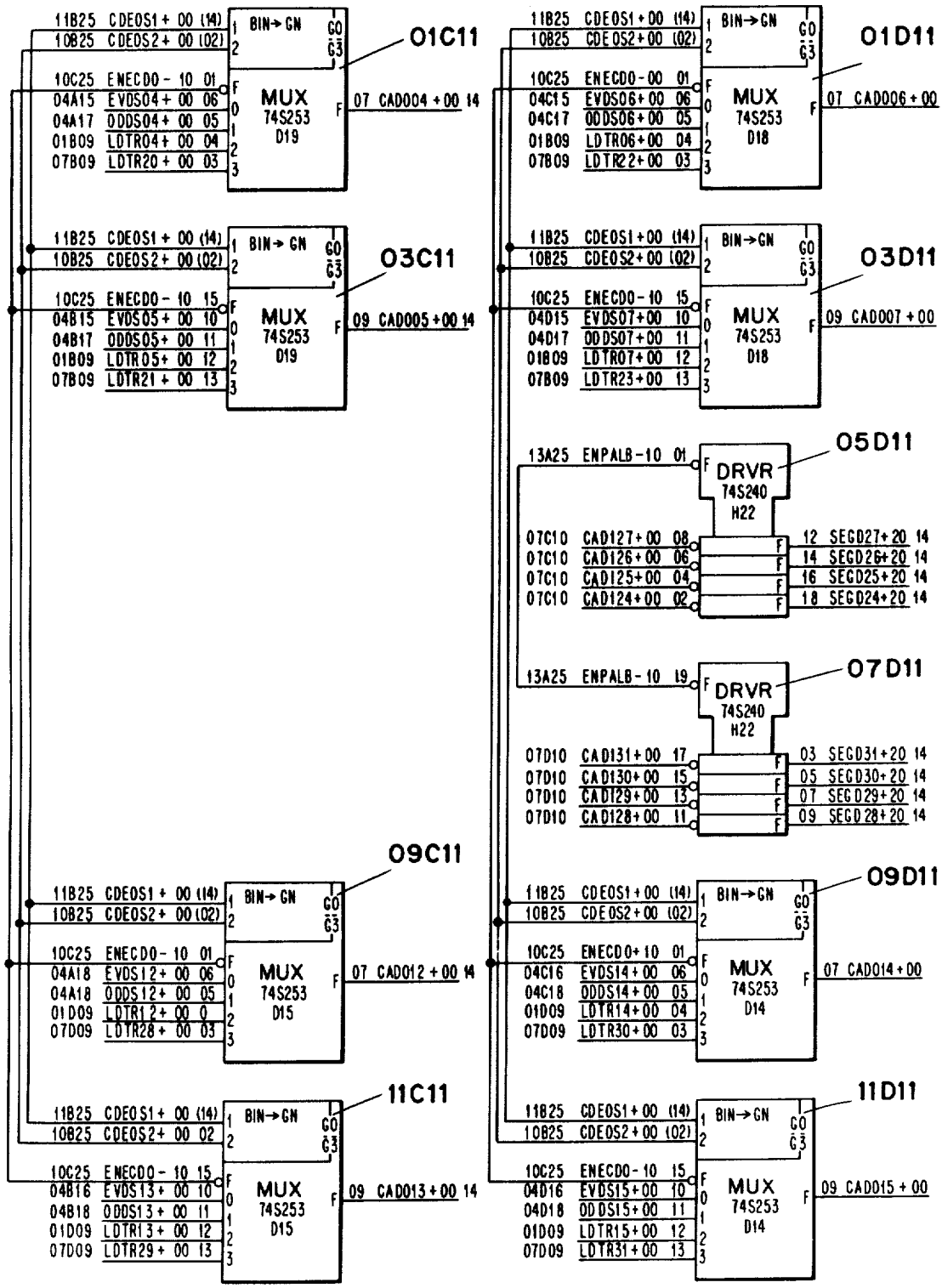
Figure 38A:
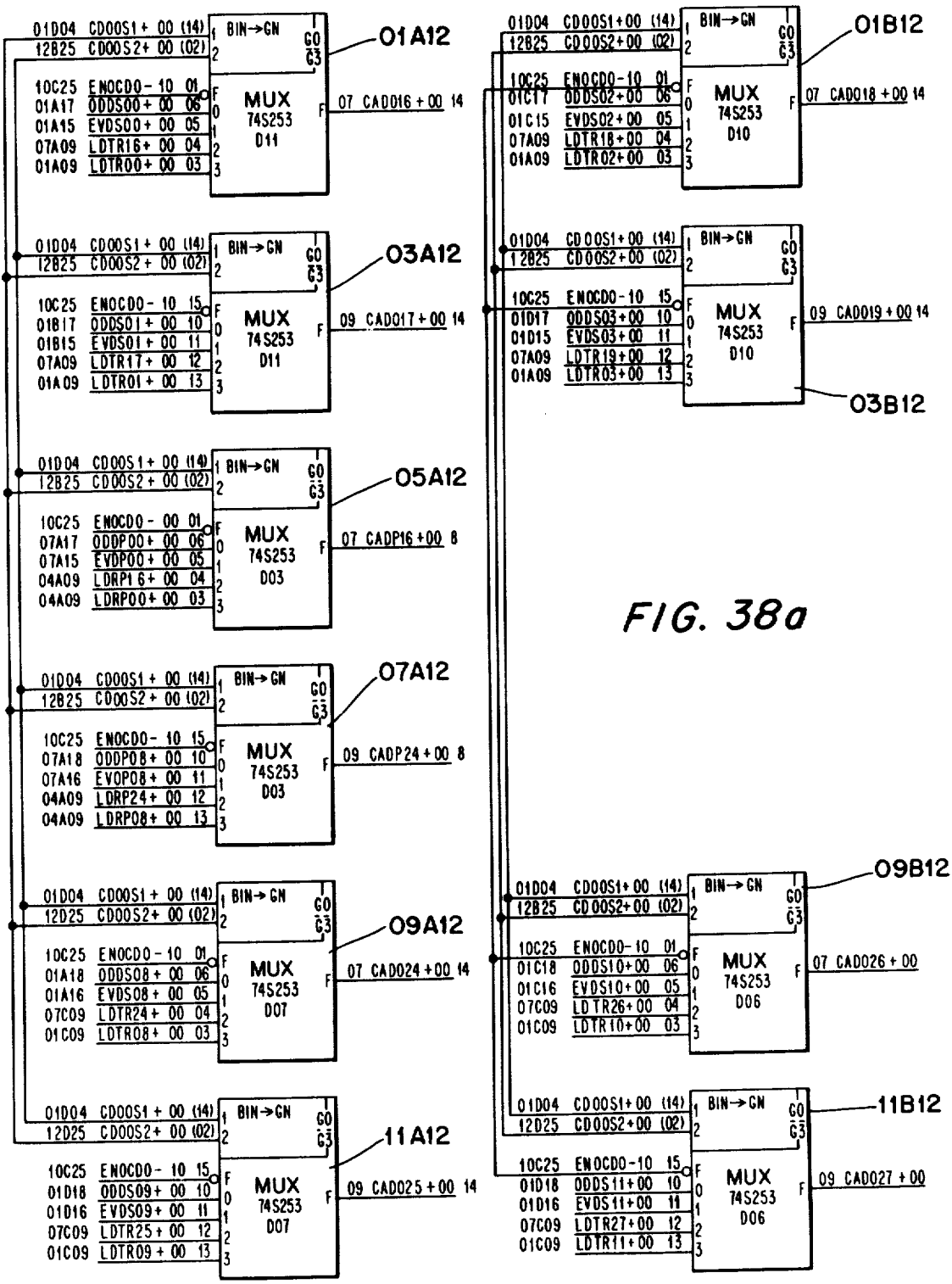
Figure 38B:
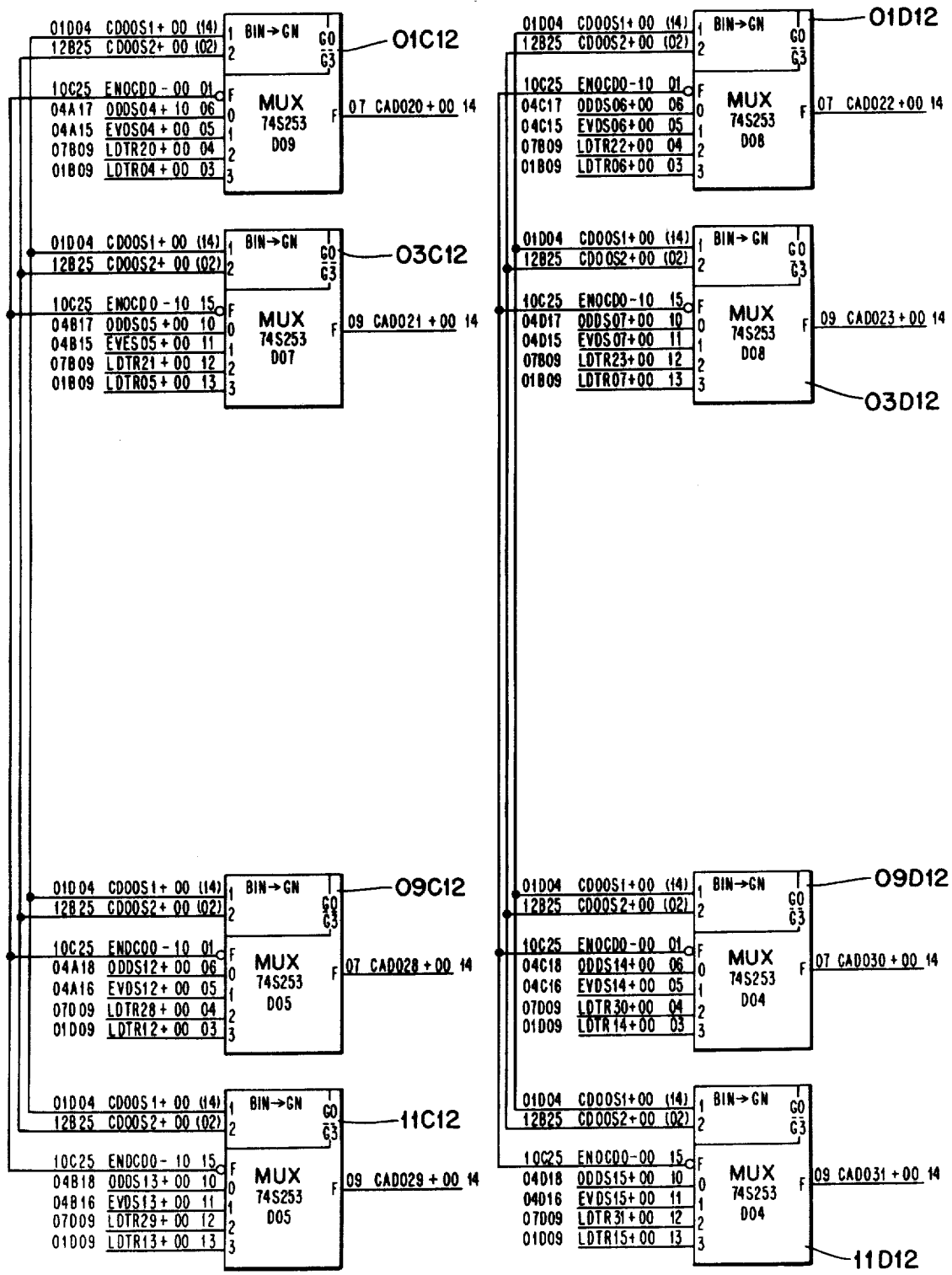

FIGS. 37(a), 37(b), 38(a), and 38(b) illustrate an embodiment of the even and odd level 1 data output multiplexers 717 and 719. Specifically, the multiplexer circuits illustrated in FIGS. 37(a) and 37(b) comprise the even level 1 data output multiplexer 717 and the multiplexer circuits illustrated in FIGS. 38(a) and 38(b) illustrate an embodiment of the odd level 1 data output multiplexer 719. It is a function of these multiplexer circuits to transmit data words outputted from the level 1 even and odd data stores 709, 711 to the local bus data line CADO0:32. Further, these multiplexer circuits perform the previously described steering of the data words EVDS0:16 and ODDS0:16 outputted from the level 1 even data store 709 and the level 1 odd data store 711, respectively, such that either the data word associated with an even address number or the data word associated with an odd address number can be selected either as the high order output data word CADO0:16 or the low order data output word CADO16:16.

As explained above, the output of the level 1 odd data store 711 will be selected as the output data word CADO0:16 if the address number VAIN0:23 is odd. Conversely, if the address number VAIN0:23 is even then the output of the level 1 even data store 709 will be selected as the output data word CADO0:16. The data word not selected for the output data word CADO0:16 is outputted as data word CADO16:16.

Referring to FIG. 37(a), the multiplexer 01A11 comprises a 4×1 multiplexer controlled by selector signals CDEOS1 and CDEOS2. The multiplexer circuit 01A11 outputs the high order bit of the output data word CADO00. The inputs are the high order bit of the high order local data word LDTR00, the high order bit of the low order local data word LDTR16, the high order bit of the data word ODDS0:16 (the bit transmitted by signal line ODDS00) outputted by the level 1 odd data store 711, and the high order bit of the data word EVDS00:16 (the bit transmitted by signal line EVDS00) outputted by the level 1 even data store 709.

The selector signals CDEOS1 and CDEOS2 are generated by the OR gates 11B25 and 10B25 of FIG. 42(a).

If both the signals CDEOS1 and CDEOS2 are ZERO then the output CADO00 assumes the value of EVDS00. If CDEOS1 is equal to ONE and CDEOS2 is equal to ZERO then the output CADO00 assumes the value of the input ODDS00. When CDEOS1 is equal to ZERO and CDEOS2 is equal to ONE the output signal CADO00 assumes the value of the input signal LDTR00. Finally, if CDEOS1 and CDEOS2 are both equal to ONE then the output signal CADO00 assumes the value of the input signal LDTR16.

Referring again to the control signals CDEOS1 and CDEOS2, CDEOS2 will be equal to one whenever a system memory read has been made because a requested data word is not resident in the level one even data store 709 or the level one odd data store 711. The control signal CDEOS1 will be equal to one whenever VAIN22 is equal to ZERO indicating that the first (high order) of the two data words to be transferred is identified by an even address number. If, however, VAIN22 is equal to ONE then the first data word (high order) to be transferred as CADO0:16 is identified by an odd address number.

The multiplexer circuits which comprise the level one odd data output multiplexer 719 are illustrated in FIGS. 38(a) and 38(b). These multiplexers are controlled by the signals CDOOS1 and CDOOS2. The signal CDOOS1 is controlled according to the value of VAIN22. If VAIN22 is equal to ZERO, i.e., the virtual address number is even, then CDOOS1 will be equal to ZERO to transfer the output of the level one odd data store 711 (ODDS0:16) to the local bus as the low order output data word CADO16:16. If, however, VAIN22 is equal to ONE indicating that the output data word CADO0:16 is identified by an odd address number, the level one odd data output multiplexer 719 will transfer the output of the level one even data store 709 to the local bus as the low order output data word CADO16:16.

The enable signal CDOOS2 will be equal to zero whenever a data word requested is resident in the cache. However, if the data word is not resident in the cache and the output of the local data input multiplexer 701 is to be transferred to the local bus directly through the level one output multiplexer then CDOOS2 will be equal to ONE. The enable signal CDOOS2 is the output of the AND gate 12B25 (FIG. 42(a)).

It will be apparent to one skilled in the art that the 4×1 multiplexers illustrated in FIGS. 37(a), 37(b), 38(a) and 38(b), enable data words outputted from the level one even data store 709 and the level one odd data store 711 to be selectively steered into the high order output data word CADO0:16 and the low order output data word CADO16:16. These multiplexers further enable data words received from the megabus to be transferred to the local bus through the even and odd level one data output multiplexers 717, 719, while they are simultaneously transferred into the data stores of the cache through the cache data input multiplexer 703.

Figure 39A:
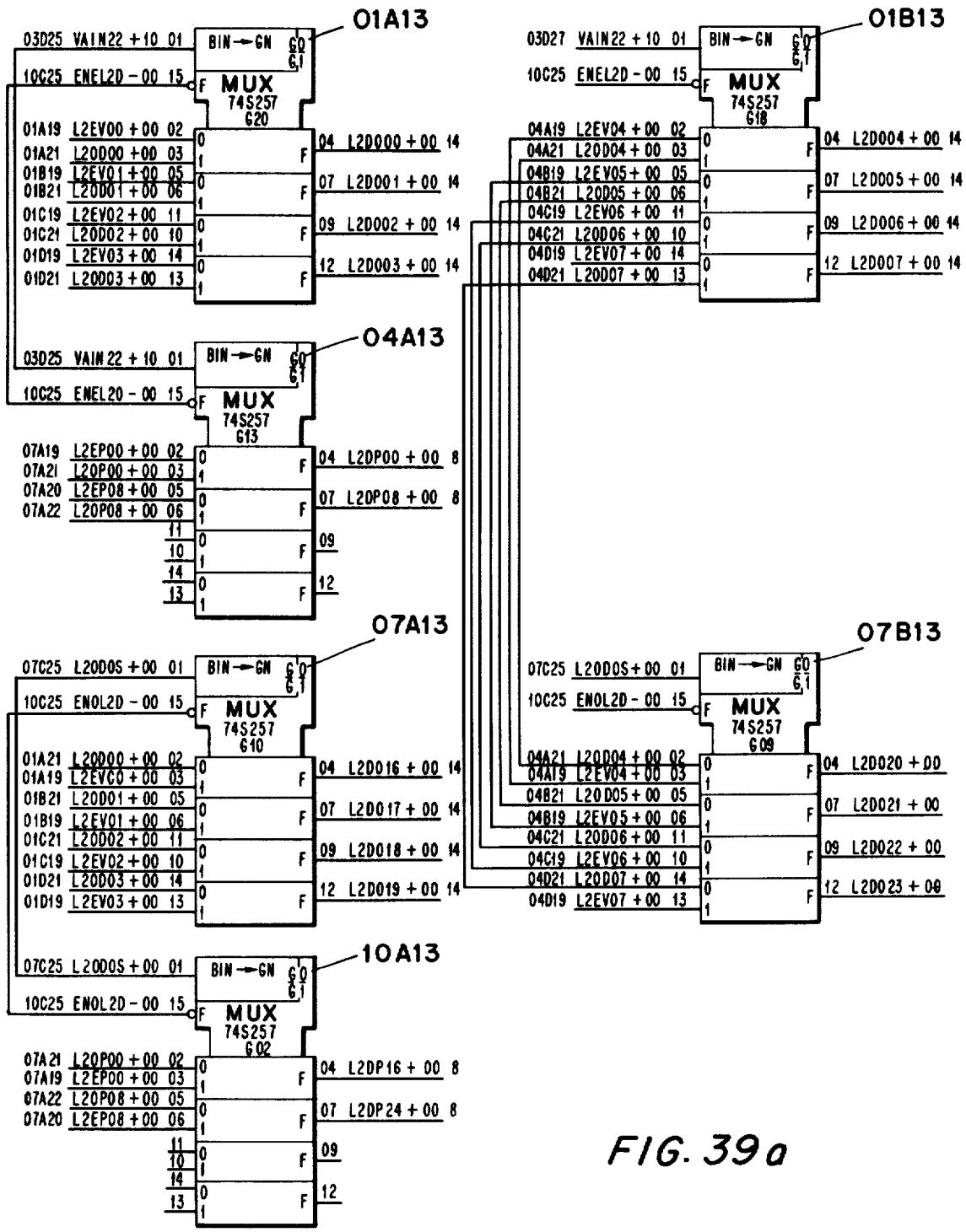
Figure 39B:
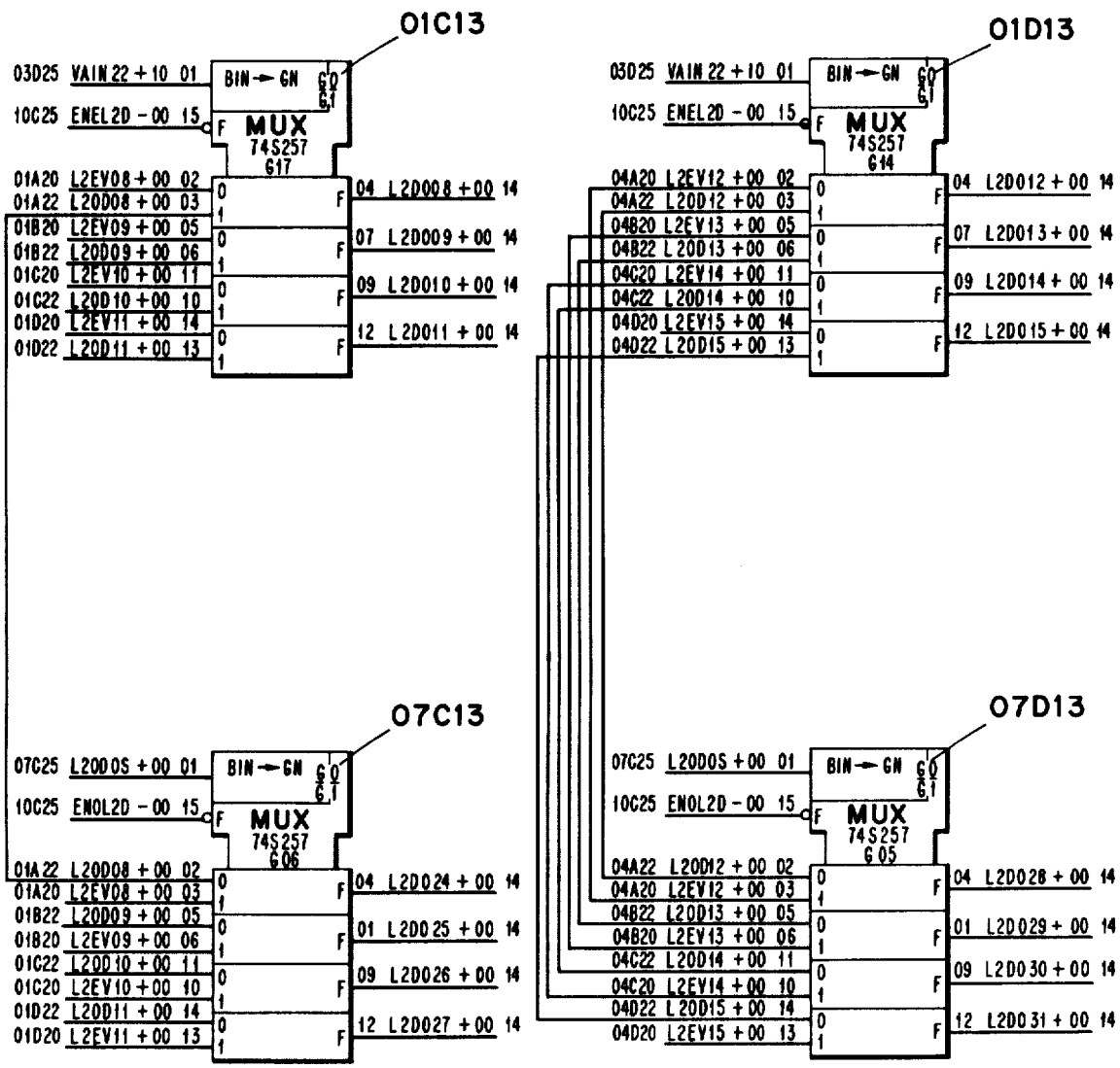

FIGS. 39(a) and 39(b) illustrate an embodiment of the level two even data output multiplexer 721 and the level two odd data output multiplexer 723. Specifically, the level two even data output multiplexer 721 comprises the four 2×1 multiplexer circuit chips 01A13, 01B13, 01C13, and 01D13. These multiplexers select between the output signals L2EV0:16 from the level two even data store 713 and L2OD0:16 from the level two odd data store 715 according to the value of VAIN22. As explained above, VAIN22 is the least significant bit of the virtual address number identifying the low order data word to be supplied to the local bus as L2DO0:16. If VAIN22 is ZERO, indicating that the address number identifying the first (high order) of two data words to be transferred is even, then, for example, multiplexer circuit 01A13 will select inputs L2EV00-L2EV03 as the values for the outputs L2DO00-L2DO03. Conversely, if VAIN22 is ONE, then the data word identified by an odd address number is to be selected as the high order data output word L2D00:16 and the multiplexer circuit 01A13 will set the output signals L2DO0-0-L2DO03 to the values 12OD00-L2OD03.

The multiplexer circuits 07A13, 07B13, 07C13, and 07D13 illustrate an embodiment of the odd level two data output multiplexer 723. These multiplexer circuits operate in the same manner as the multiplexer circuits comprising the level two even data output multiplexer except they are under the control of the enable signal L2ODOS which is the output of the AND gate 07C25 (FIG. 42(b)). L2ODOS will be set equal to ONE by the AND gate 07B25 if there has been a request for a double word transfer and the least significant address bit, VAIN22, is equal to ONE indicating that the second (the low order) of the two data words to be transferred is identified by an even address number. Conversely, if VAIN22 is equal to ZERO, then the first (the high order) data word to be transferred is identified by an even address number and the second (the low order) to be transferred by the signals L2DO16:16 is identified by an odd address number.

FIGS. 40(a)–47(b) illustrate embodiments of control circuitry used both within the cache memory and within the memory management unit. For these reasons, not all of the circuitry is specifically relevant to the operation of the cache memory of the instant invention.

Figure 40A:
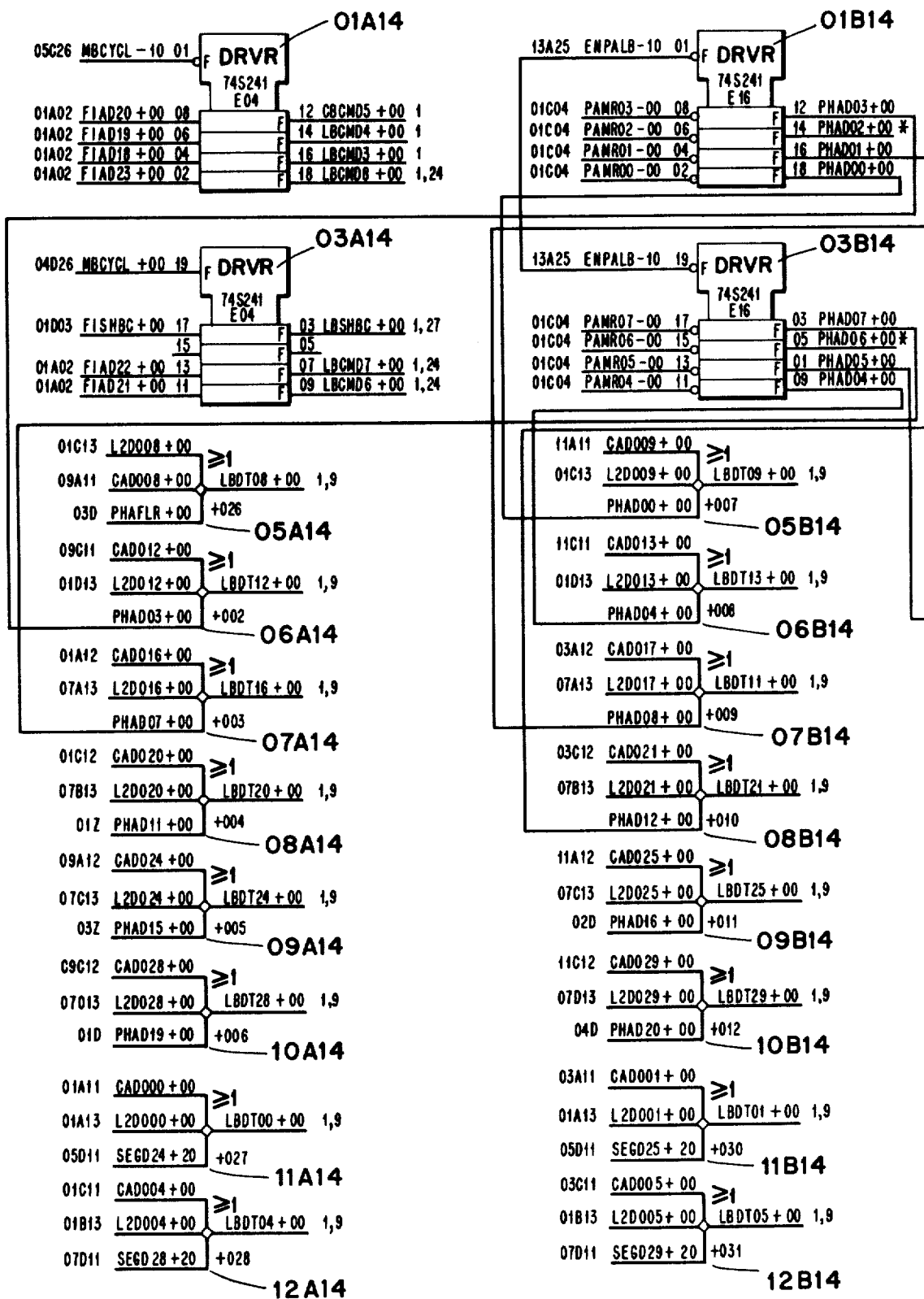
Figure 40B:
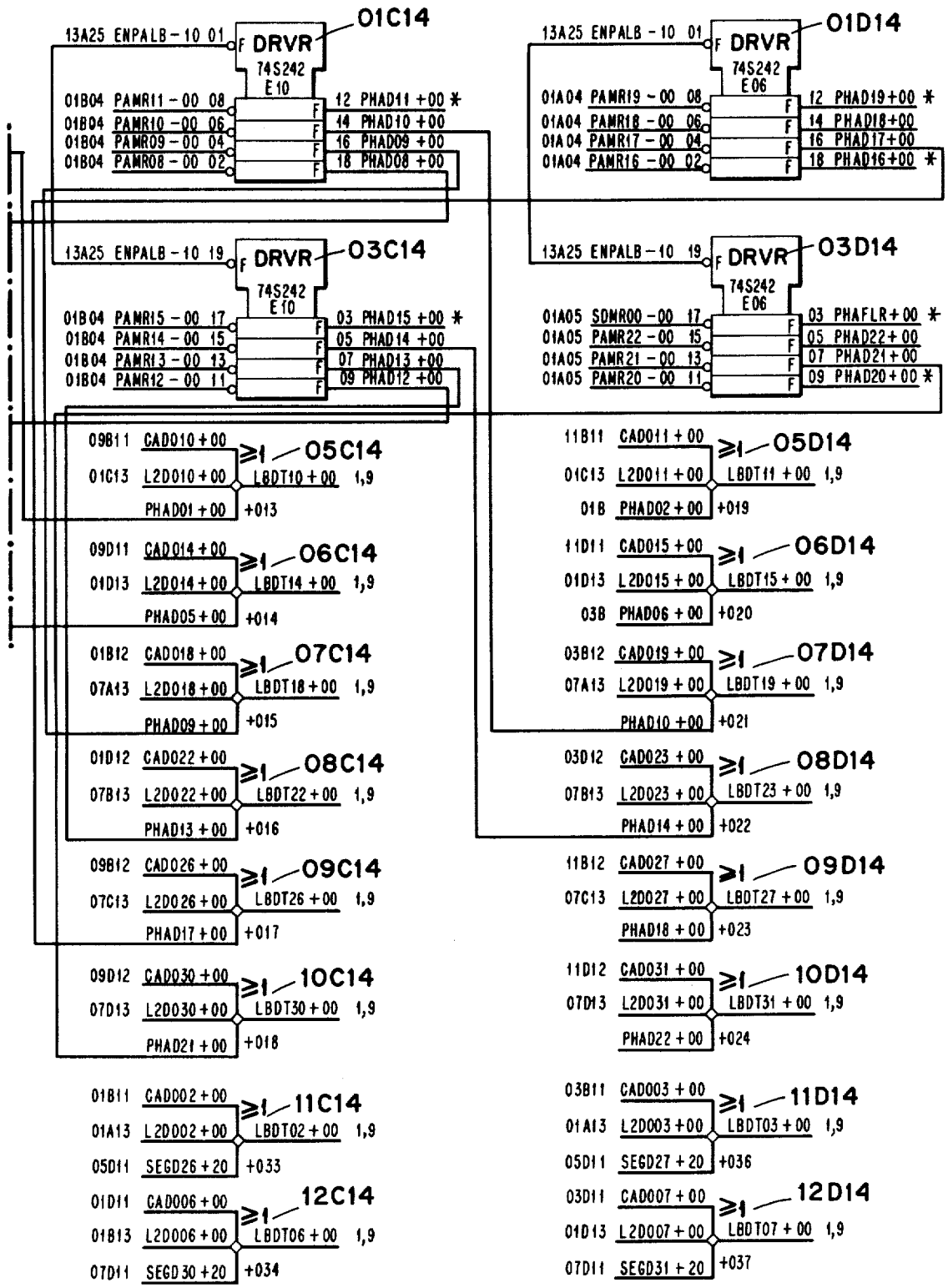

FIGS. 40(a) and 40(b) illustrate an embodiment of the local bus interface circuit 726 which receives the output of the level one even and odd data output multiplexers 717, 719, the level two even and odd data output multiplexers 721, 723, and the physical address to local bus drivers 725. The physical address to local bus drivers 725 (FIG. 19(a)) are embodied by the driver circuits 01B14, 03B14, 01C14, 03C14, 01D14, and 03D14. These drivers are enabled by the enable physical address to local bus signal, ENPALB, outputted by the inverter 13A25 (FIG. 42(a)). The input to the inverter 13A25 is the output of the OR gate 12A25 which has its inputs the translate address signal, XLTADR, the read segment descriptor signal, REDSCR, and the read mode register signal, RDMDER. Whenever one of these three input signals is true, the driver circuits, illustrated in FIGS. 40(a) and 40(b), are enabled.

As embodied herein, the local bus interface circuit 726 comprises the 32 three input OR gate circuits illustrated in FIGS. 40(a) and 40(b). These OR gate circuits each receive a different one of the bits comprising the cache data output words, CADO0:32, the level 2 data output words, L2DO0:16, and the combined bits of the physical address, PHAD0:23 and segment descriptor, SEGD24:8. The outputs of the OR gate circuits comprise the local bus data signals, LBDT0:32.

Figure 41A:
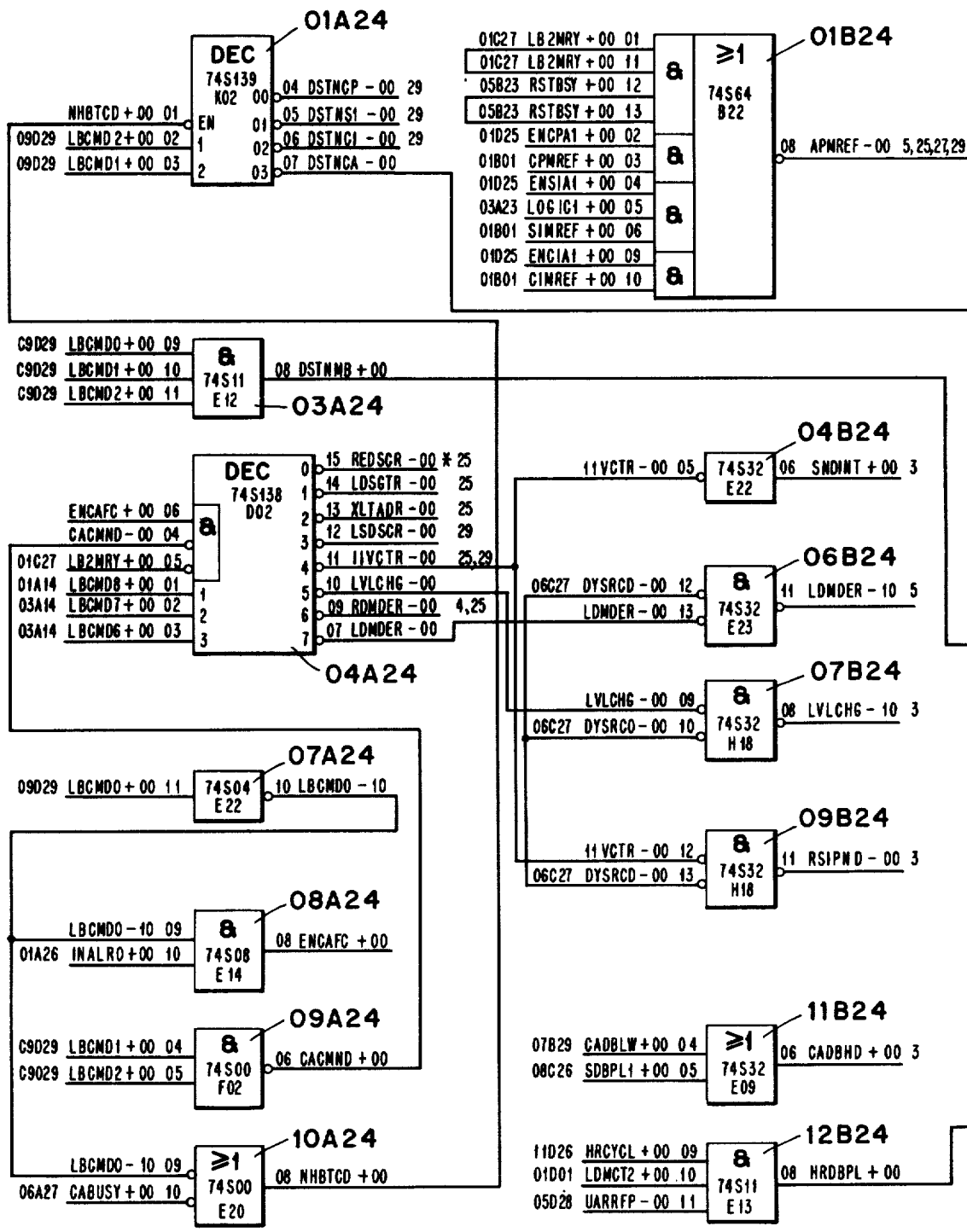

The decoder 04A24 (FIG. 41(a)) illustrates an embodiment of the function code decoder 423 (FIG. 11). As previously stated, the output signal REDSCR indicates that a segment descriptor is to be read. LDSGTR is a signal for controlling the loading of the segment descriptor table. XLTADR is a signal for controlling the translation of a virtual address to physical address. LSDSCR is a signal for controlling the loading of a segment descriptor into the segment descriptor stores. The signal IIVCTR controls the reading of an interrupt word or interrupt vector and the signal LVLCHG initiates a change in priority level of the central subsystem. The signal RDMDER controls the reading of the mode register 757 and the signal LDMDER controls the loading of the mode register 757. The relevance of certain of these signals to the cache memory of the instant invention will be discussed in more detail during the explanation of the preferred embodiment of the mode register 757 and the small and large segment descriptor RAMs 751, 753.

Figure 41B:
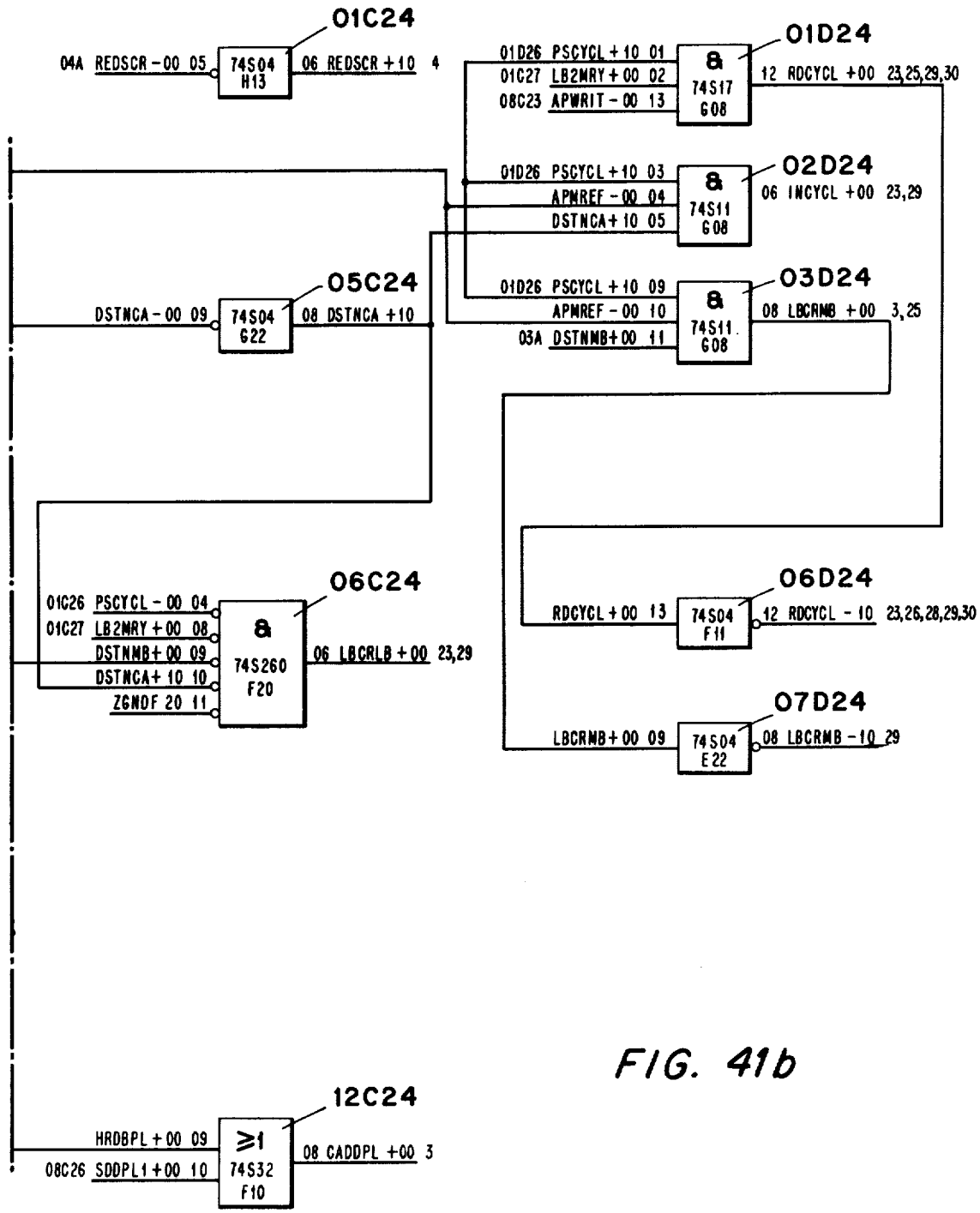

The five-input AND gate 06C24 illustrated in FIG. 41(b) generates an output signal LBCRLB which, when true, enables the transfer of information from one local bus processor to another. The AND gate 03D24 generates the output signal LBCRMB which, when true, enables a non-memory reference to be transferred from the local bus to the megabus. Also, the four way selector 01B24 generates the memory reference signal, APMREF, whenever a local bus processor is enabled and is requesting a system memory reference or whenever a local bus to system memory transfer is requested.

The function of the circuitry illustrated in FIG. 42(a) and 42(b) in generating enable signals for use in the cache data store subsystem has been discussed above.

Figure 43A:
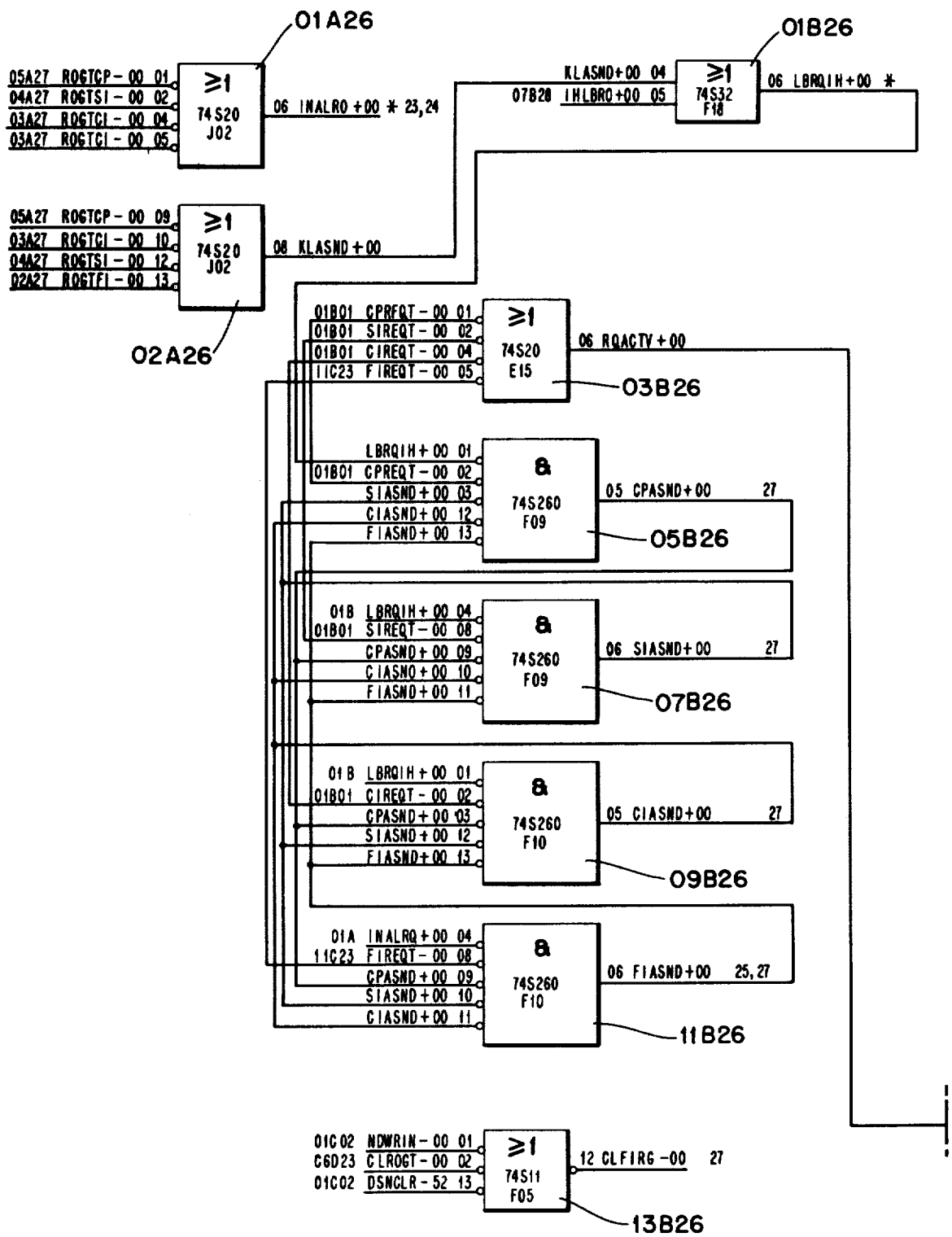
Figure 43B:
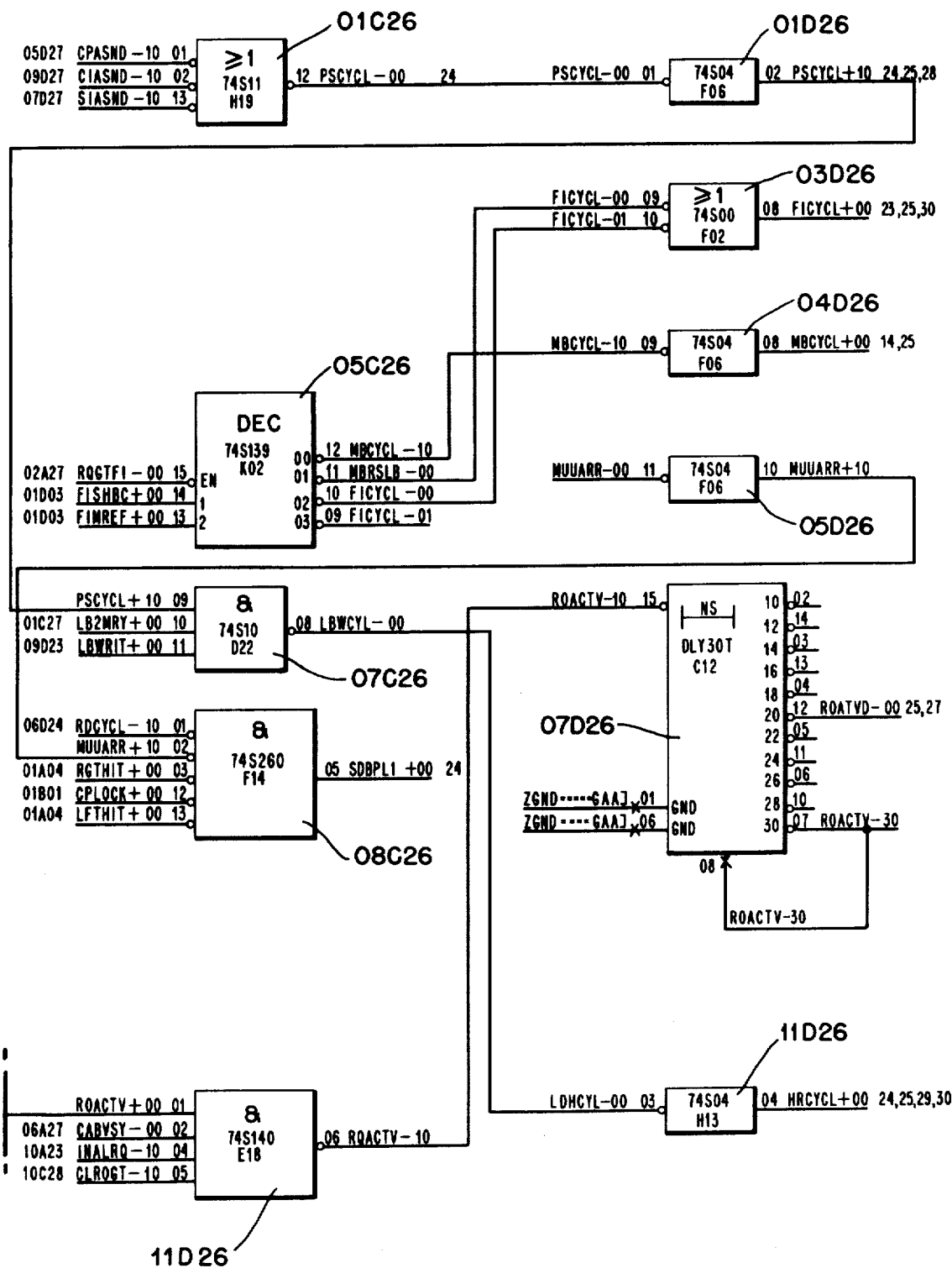

The AND gate circuits 05B26, 07B26, 09B26, and 11B26, in combination with the OR gate 03B26 in FIG. 43(a), comprise an embodiment of the request arbitration network 407 (FIG. 11). The control signal, MRCYCL, is the output of inverter 11D26 (FIG. 43(b)) which receives as an input signal LBWCYL from the AND gate 07C26. MRCYCL will be true whenever there is a cycle assigned to either the CPU, CIP, or SIP. The request arbitration network circuitry as illustrated in FIG. 43(a) will assign a local bus cycle to a requesting local bus processor whenever the local bus is not currently assigned and local bus requests have not been inhibited.

Figure 44A:
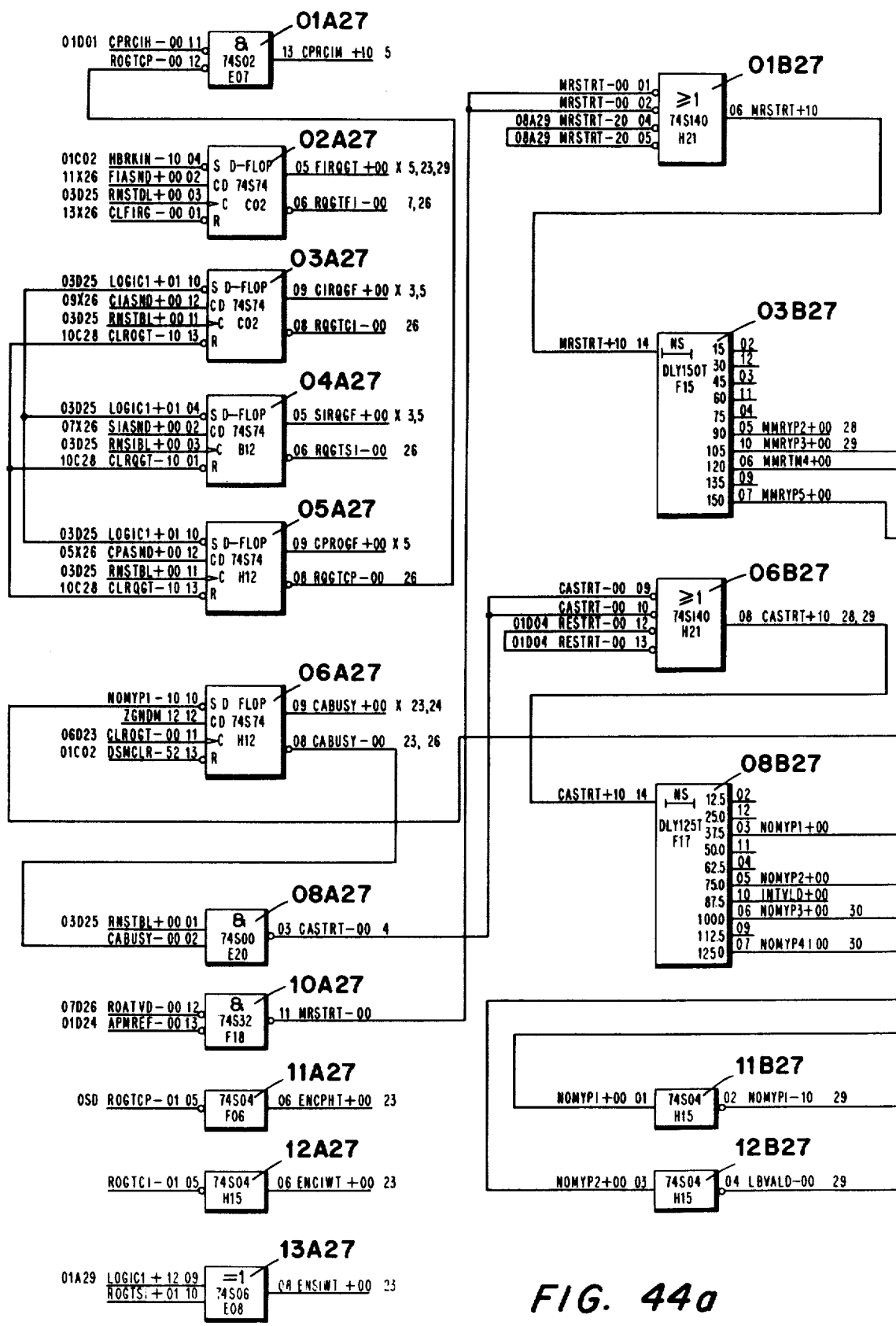
Figure 44B:
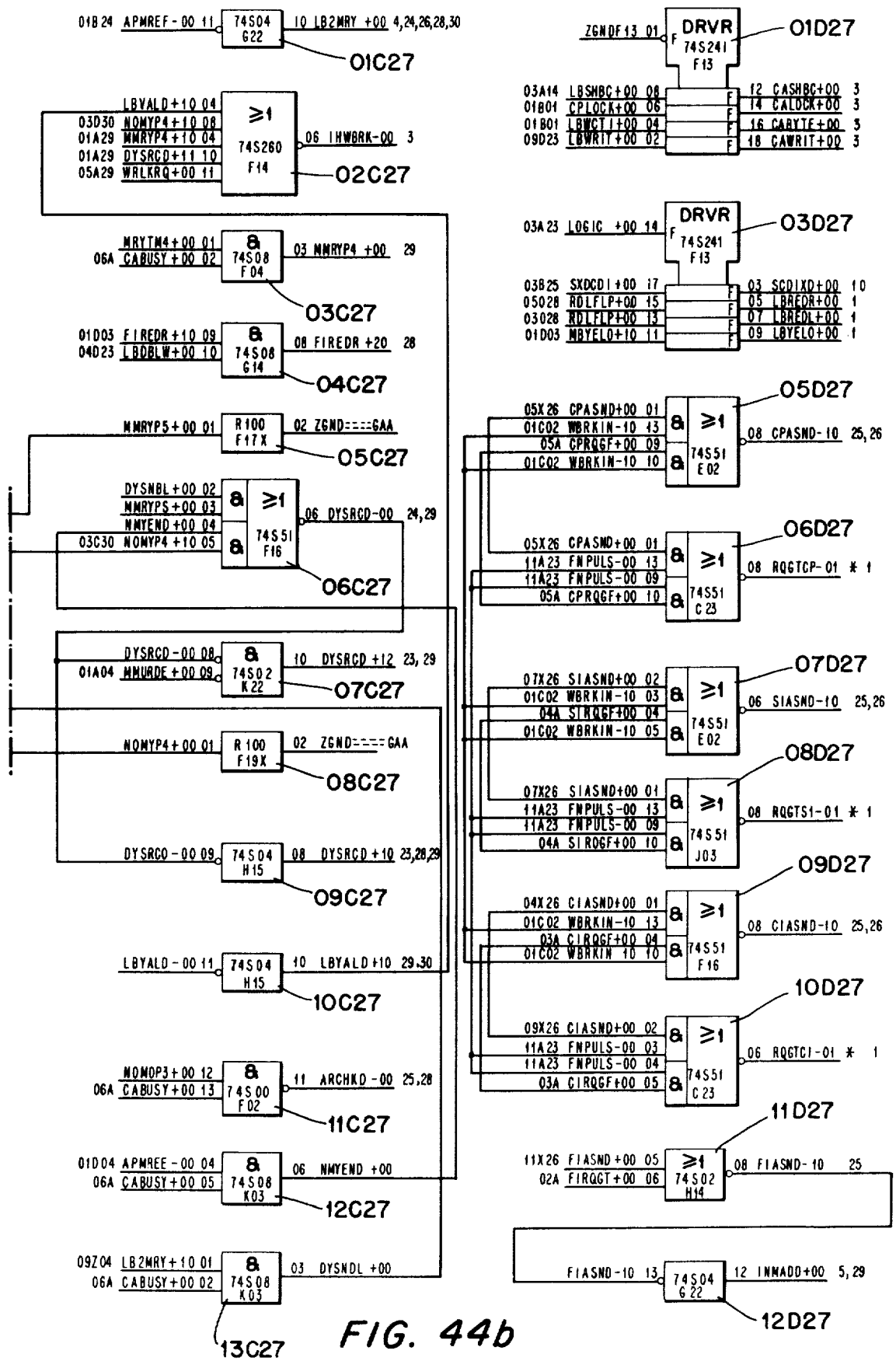

FIGS. 44(a) and 44(b) illustrate an embodiment of the request granted register 409. This register is embodied by the flip-flops 02A27, 03A27, 04A27, and 05A27. If the cache memory is busy at the time a memory request is made by a local bus or megabus unit, the flip-flop 06A27 generates the cache busy signal, CABUSY. The reception of a local bus assignment signal by one of the flip-flops will result in the flip-flop sending a request granted signal to its associated processor or to the FIFO.

Figure 45A:
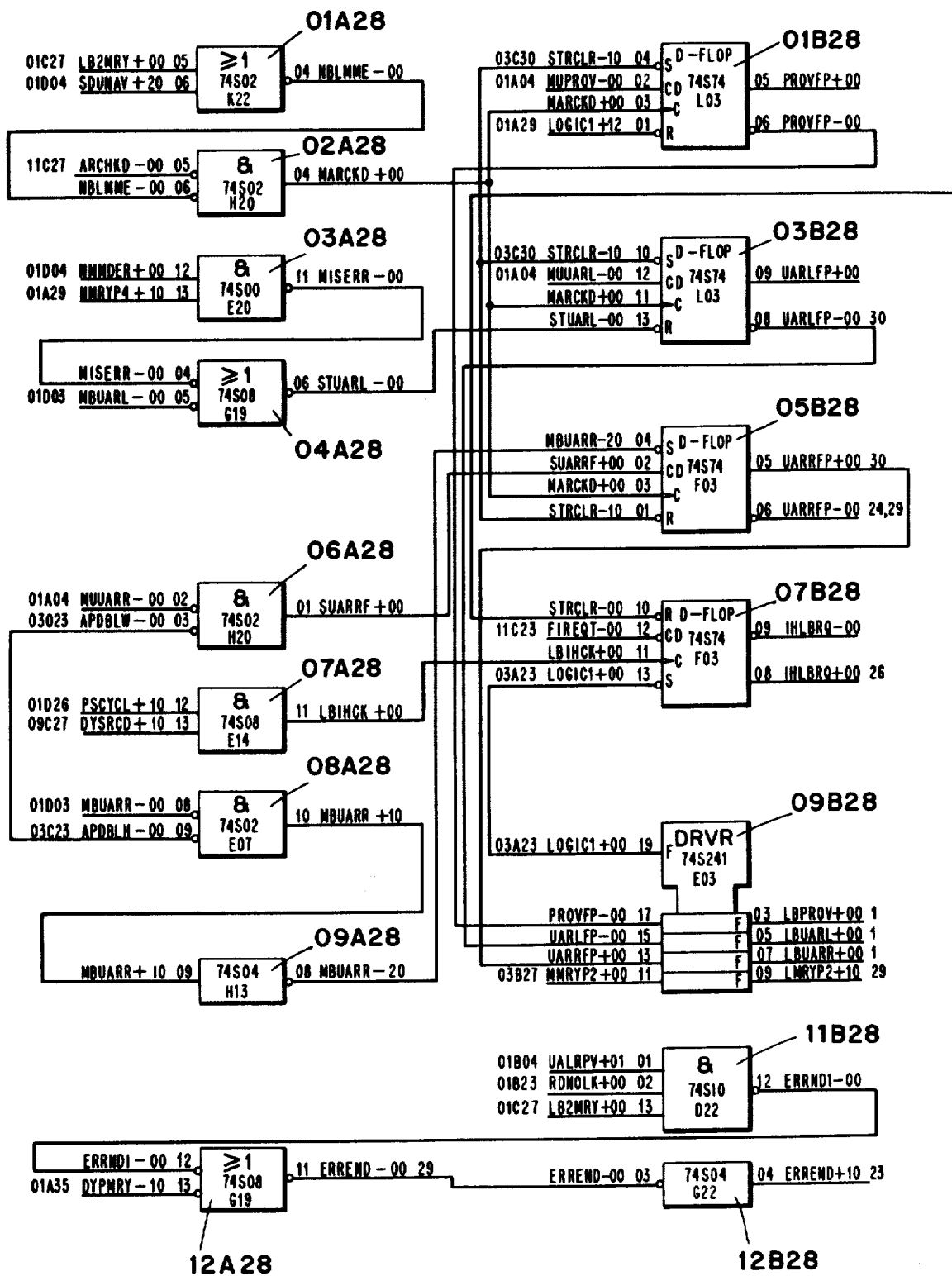
Figure 45B:
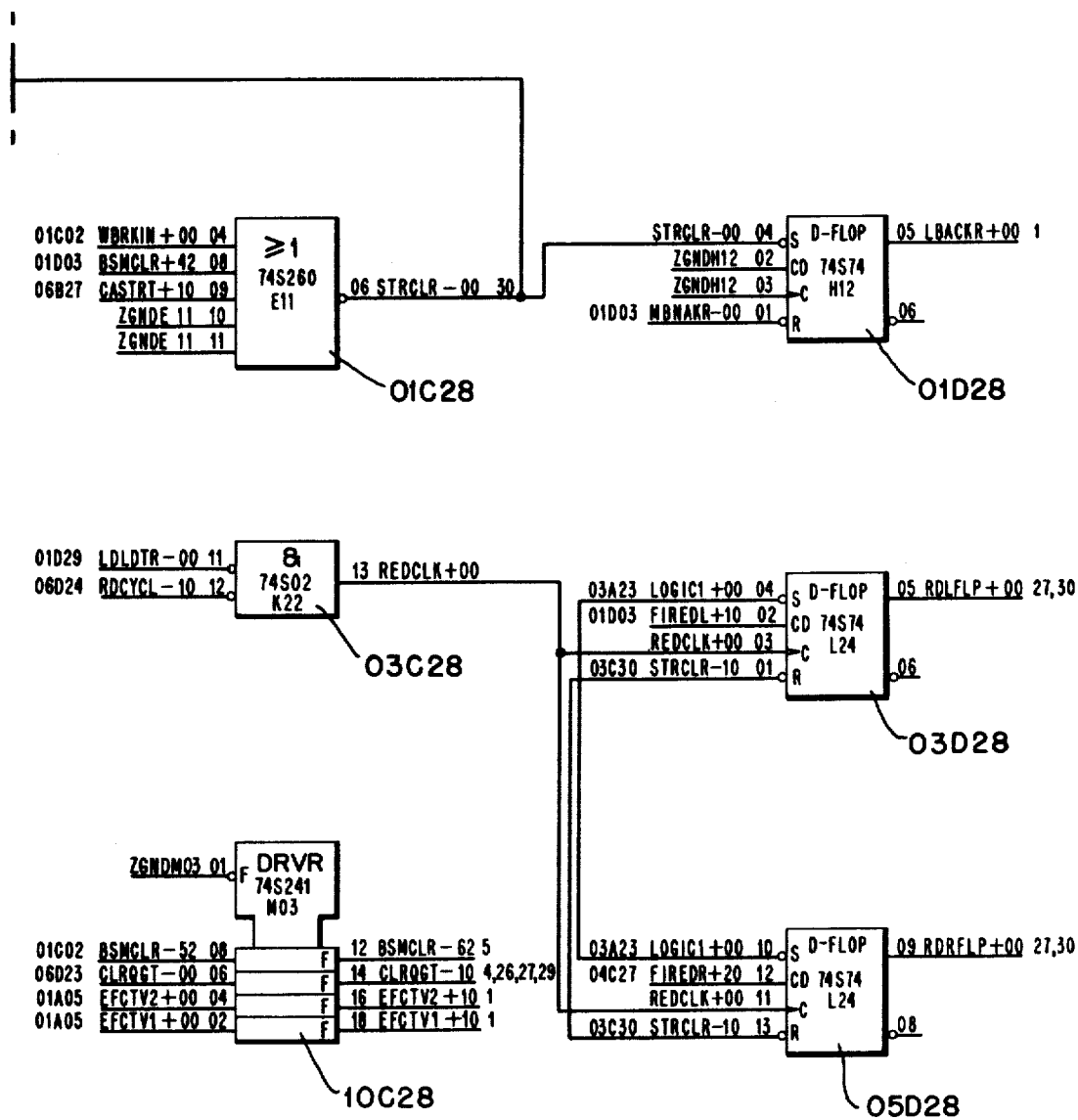

FIGS. 45(a) and 45(b) illustrate circuitry for generating error signals indicating the occurrence of the above-defined protection violation (LBPROV) or unavailable resource requests (LBUARR, LBUARL).

Figure 46A:
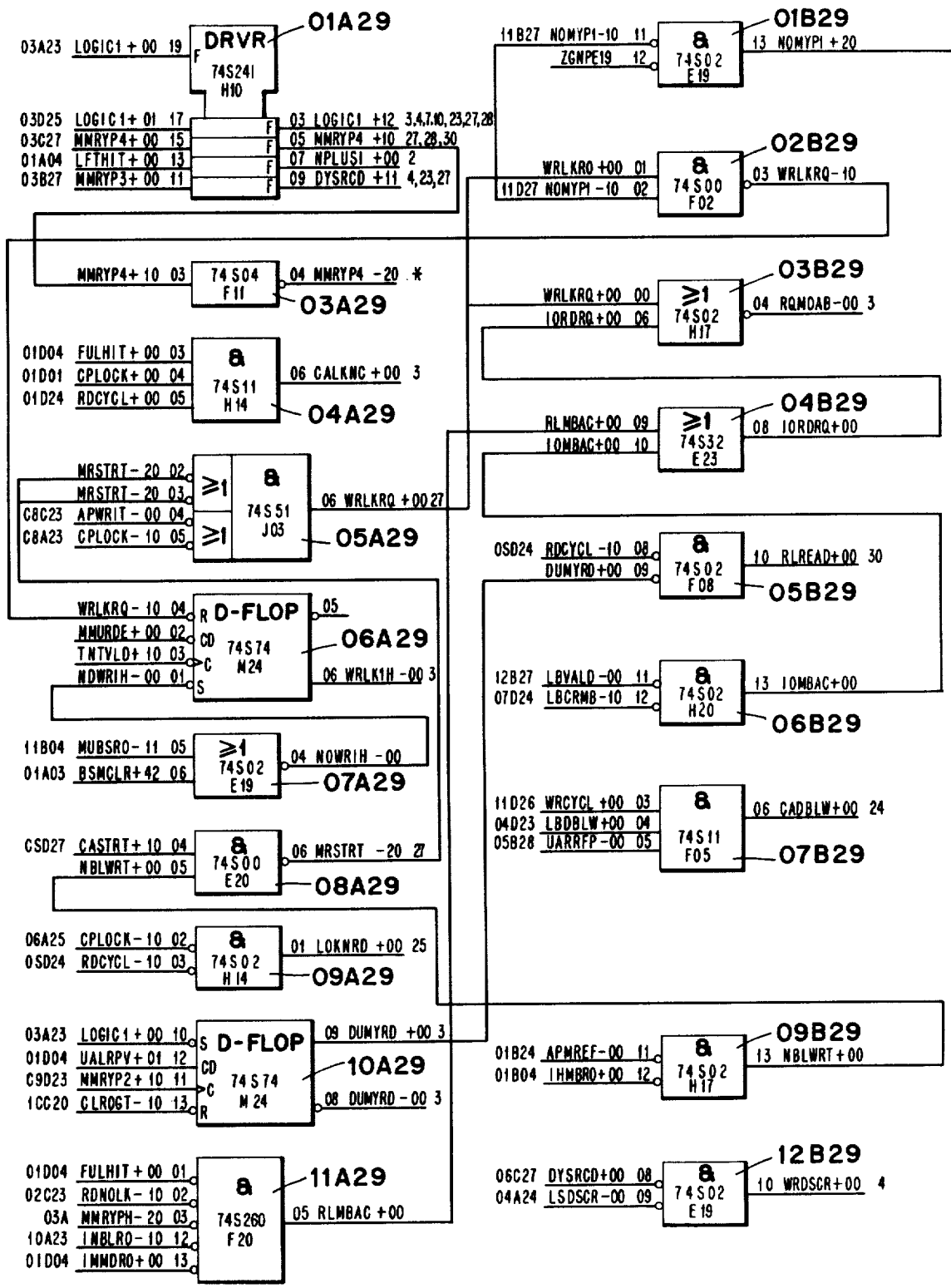
Figure 46B:
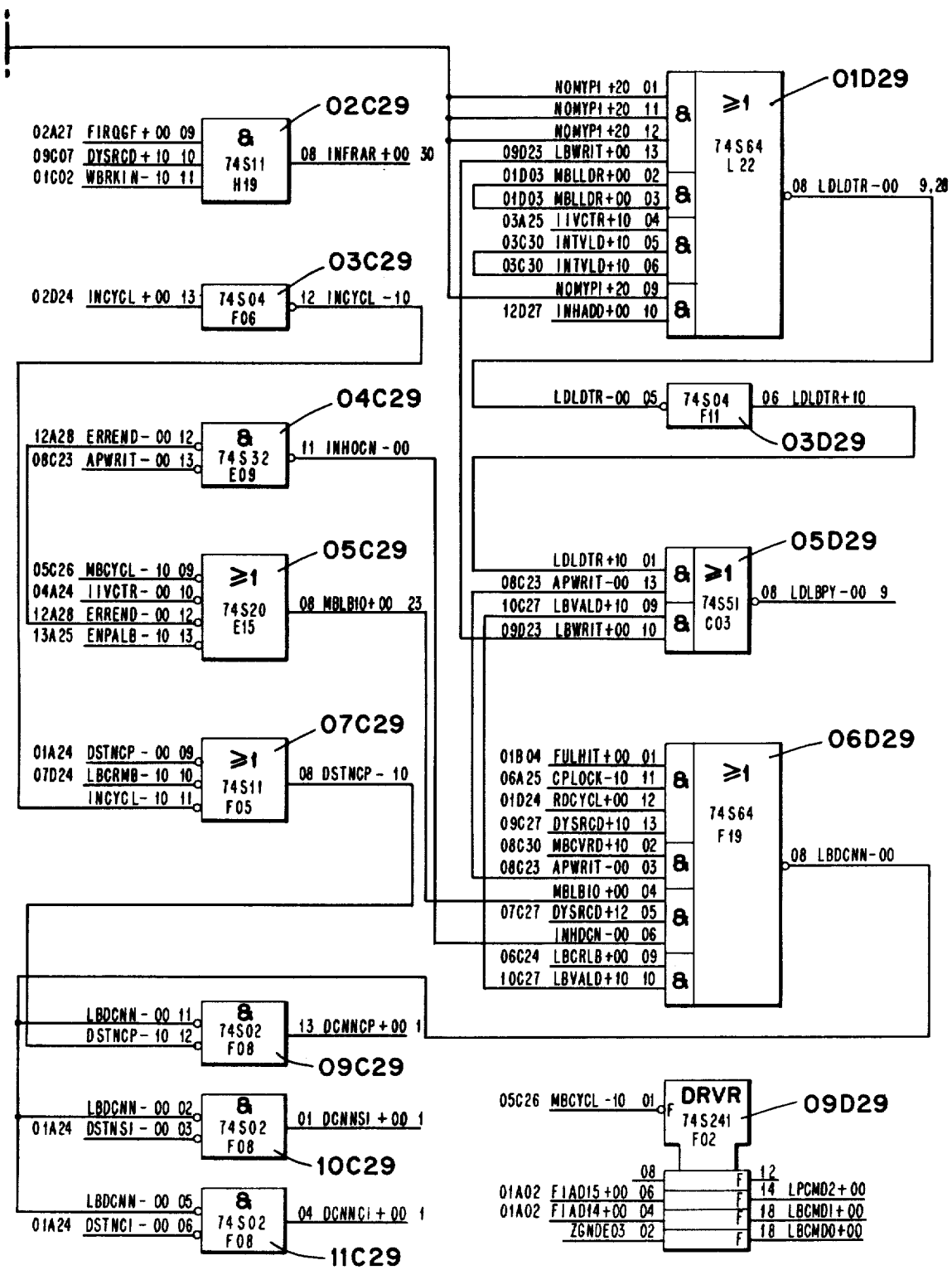

FIGS. 46(a) and 46(b) illustrate circuits for generating the signals alerting a local bus processor that the results of a memory request are being returned to the processor. The AND gates 09C29, 10C29, and 11C29 generate the actual acknowledgment signals DCNNCP, DCNNSI, and DCNNCI, which are supplied to the CPU, SIP, and CIP, respectively.

The four-way selector 01D29 generates the control signal for the local data input multiplexer 701. This signal is LDLDTR which enables data to be entered into the cache memory from either the megabus or the local bus.

Figures 47A, 47B:
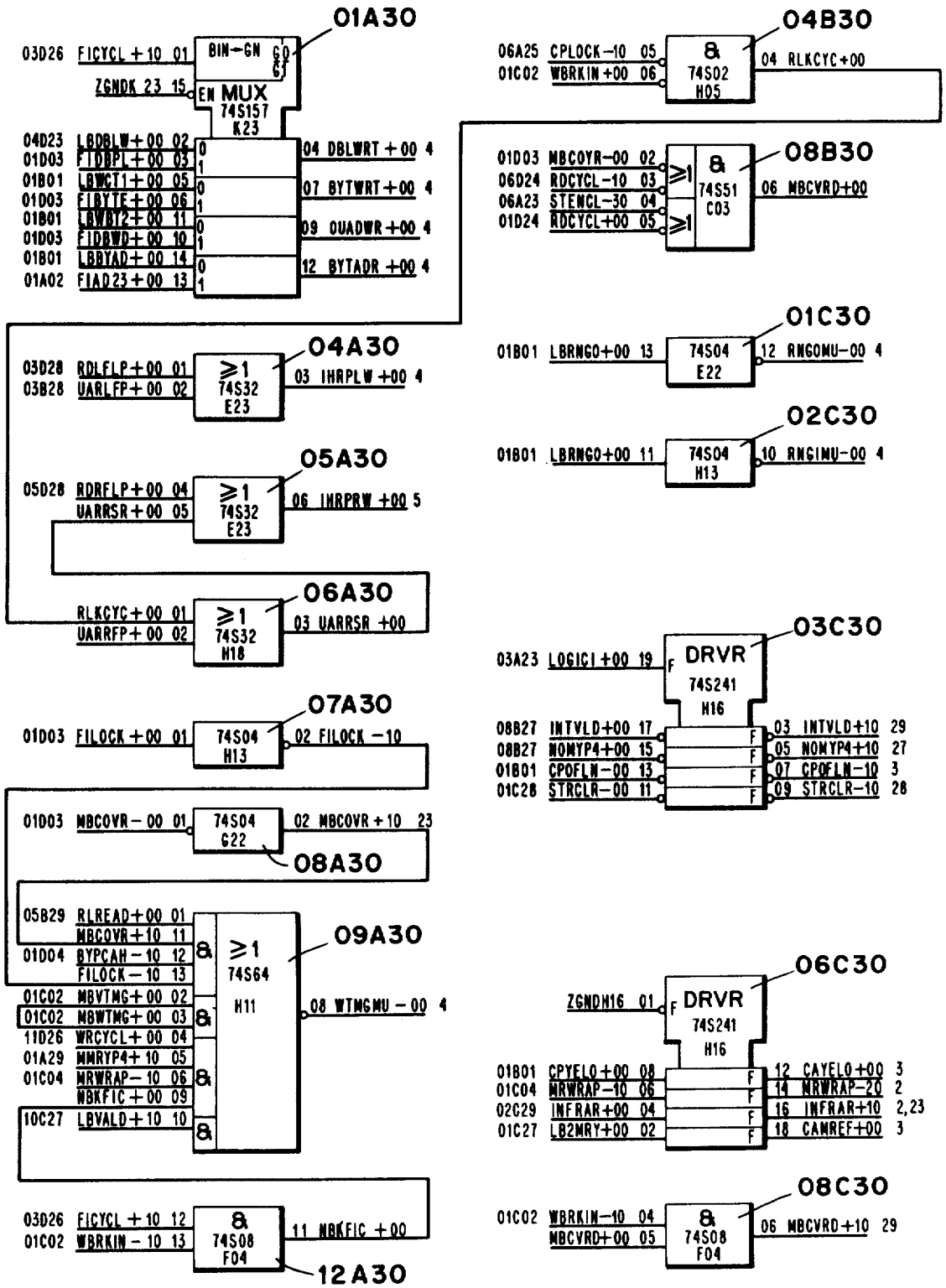

The circuitry illustrated in FIGS. 47(a) and 47(b) generates additional control signals for controlling information transfers in the local bus system and the megabus adapter. As an example, the multiplexer 01A30 selects between the double word and byte address signal supplied by the FIFO during a FIFO cycle or by the local bus processors.

6. Description of a Preferred Embodiment of the Cache Directory Subsystem

FIGS. 48 through 68 illustrate a preferred circuitry embodiment for the cache directory subsystem of the instant invention. Basically, the circuits set forth therein comprise an embodiment of the cache directory subsystem as illustrated in block diagram form in FIG. 19(b).

As described above, the small segment descriptor RAM 751 stores 16 segment descriptors describing the first 16 memory segments. Each of the small segments stores up to 4K data word storage locations.

Since each small segment descriptor can address up to 4K virtual data word storage locations, twelve address bits, VAIN11:12, are necessary to describe the address numbers within each of these segments. Moreover, four address bits, VAIN7:4, are necessary to distinguish among the 16 small segments.

Each large memory segment includes up to 64K virtual data word storage locations. Accordingly, the address bits VAIN3:20 are required to describe the large addresses included within a large segment.

Figure 48A:
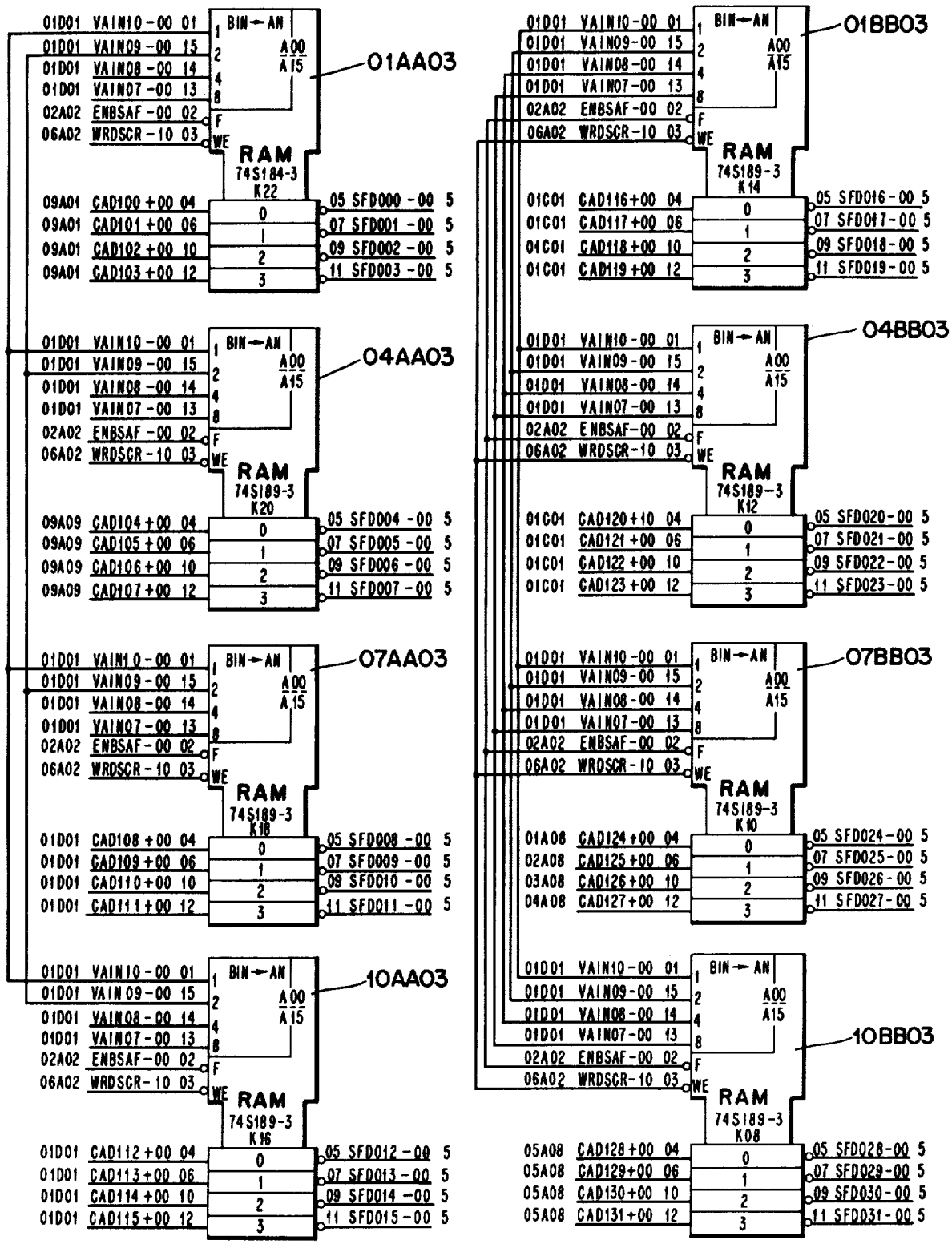
FIGS. 48(a)-68 are detailed logic block diagrams illustrating a hardware embodiment of the cache directory subsystem of the cache memory of the instant invention.

FIG. 48(a) illustrates an embodiment of the small segment descriptor RAM 751. This embodiment comprises eight 4×16 random access memory chips. This enables the storing of the 16×32 bit small segment descriptors.

The random access memory chip 01AA03, for example, receives as inputs CADI00–CADI03 from the output of the cache data input multiplexer 703 (FIG. 19(a)). The random access memory chip 01AA03 outputs the four low order bits of the small segment descriptors having the signal designations SFDO00–SFDO03.

The random access memory chip 01AA03 is addressed by the signals VAIN07–VAIN10. Reading from and writing into the random access memory chip 01AA03 is under the control of the write enable signal WRDSCR. Writing a segment descriptor is permitted whenever a small segment descriptor is to be stored in the random access memory chips illustrated in FIG. 48(a). The enable small segment descriptor signal, ENBSAF, is a two-state signal enabling the writing into or the reading from the random access memory chip 01AA03 whenever a small segment descriptor is being referenced.

The seven other random access memory chips, illustrated in FIG. 48(a), are addressed by the same input signals and enabled by the same enable signal. They are responsible, however, for transferring the input data bits CADI04–CADI31 from the cache data input multiplexer 703 into the random access memory chips. Further, the outputs of these memory chips comprise the bits SFDO04–SFDO31 which are the twenty-eight least significant bits of the small segment descriptors.

Figure 48B:
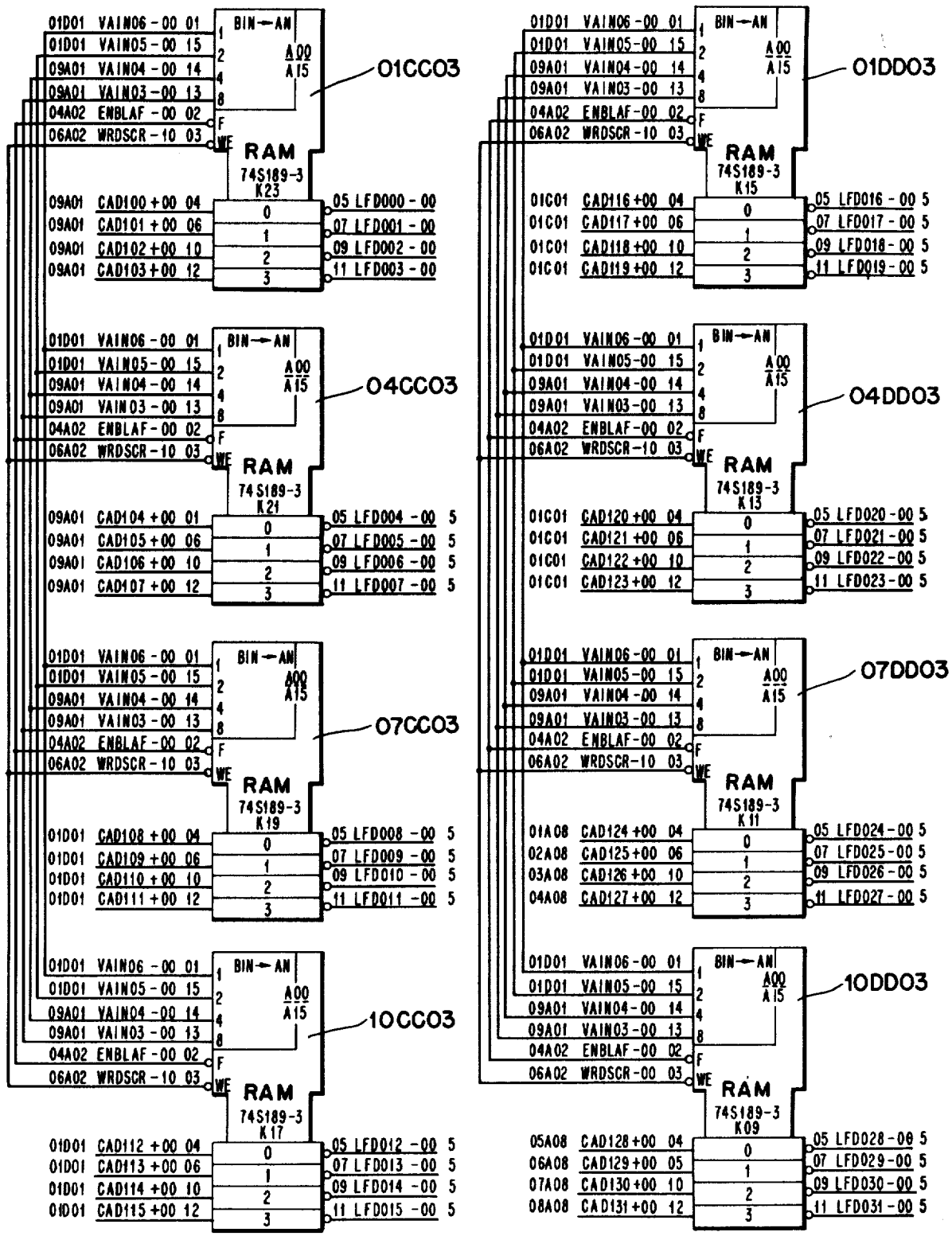

FIG. 48(b) illustrates an embodiment of the large segment descriptor RAM 753 (FIG. 19(b)). This embodiment also comprises 8 4×16 bit random access memory chips which receive as inputs the cache data input signals, CADI0:32, from the cache input multiplexer 703. These random access memory chips generate as outputs the thirty-two bits of the large segment descriptors, LFDO00–LFDO31.

Random access memory chip 01CC03 (FIG. 48(b)), comprises a 4×16 bit random access memory chip addressed by address number bits VAIN3:4. Writing into and reading from the random access memory chip 01CC03 is under the control of the write descriptor enable signal WRDSCR and the enable large segment descriptor signal, ENBLAF.

Figure 49:
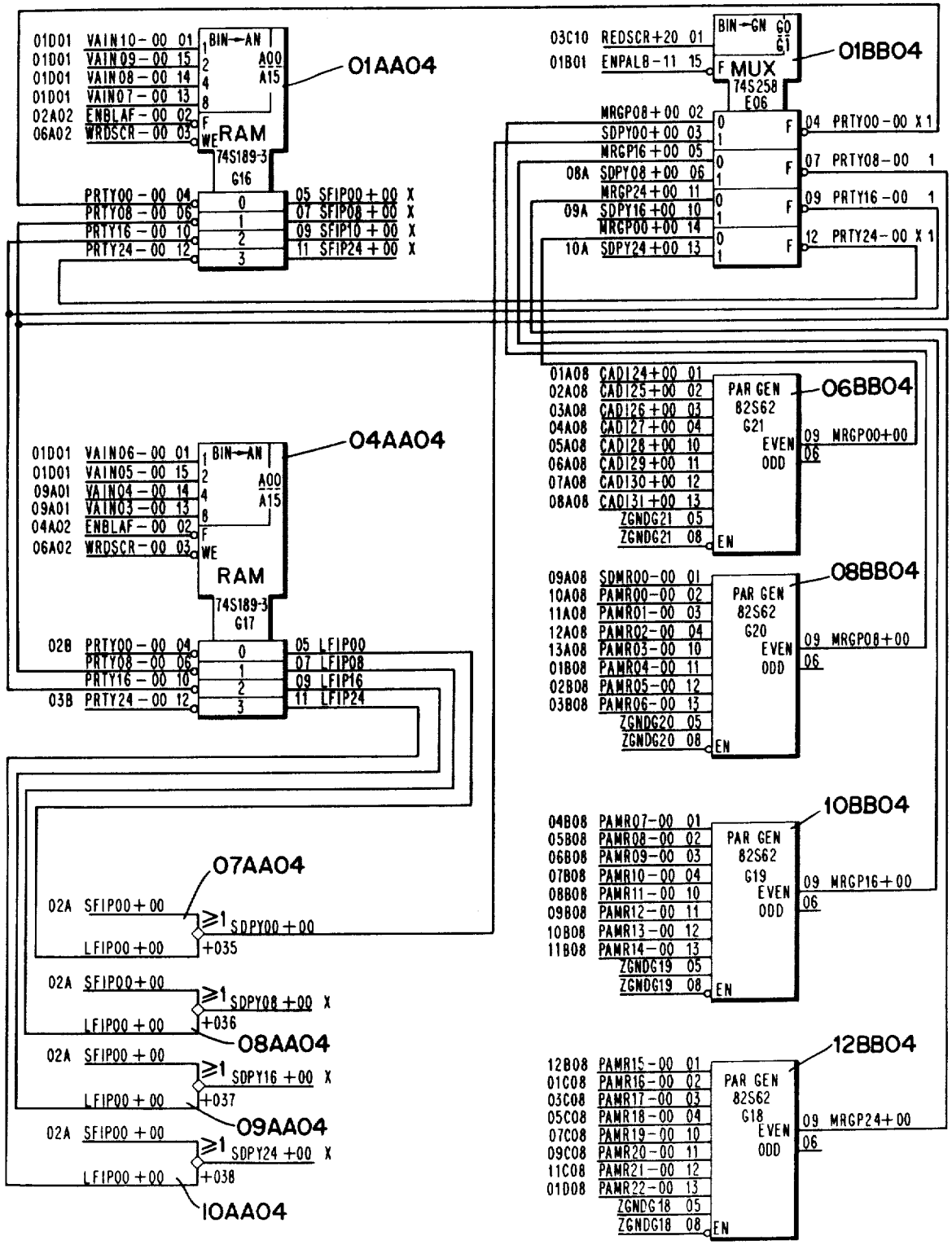

FIG. 49 illustrates a random access memory chip 01AA04 for storing the parity bits associated with the small segment descriptors stored in the small segment descriptor RAM 751. The random access memory chip 04AA04 stores the parity bits for the large segment descriptors stored in the large segment descriptor RAM 753. The enable signals and address signals for the random access memory chips illustrated in FIG. 49 are the same as for their corresponding data storing random access memory chips.

The parity generator circuits 06BB04, 08BB04, 10BB04, and 12BB04 are for generating parity bits for the segment descriptors transferred from the cache directory subsystem by the physical address multiplexer 773. The multiplexer circuit 01BB04 selects either the outputs of the parity generators or the outputs of the parity memory chips under the control of the read segment descriptor signal, REDSCR, and the enable physical address to local bus signal ENPALB to generate parity signals PRTY00, PRTY08, PRTY16, and PRTY24.

Figure 50:
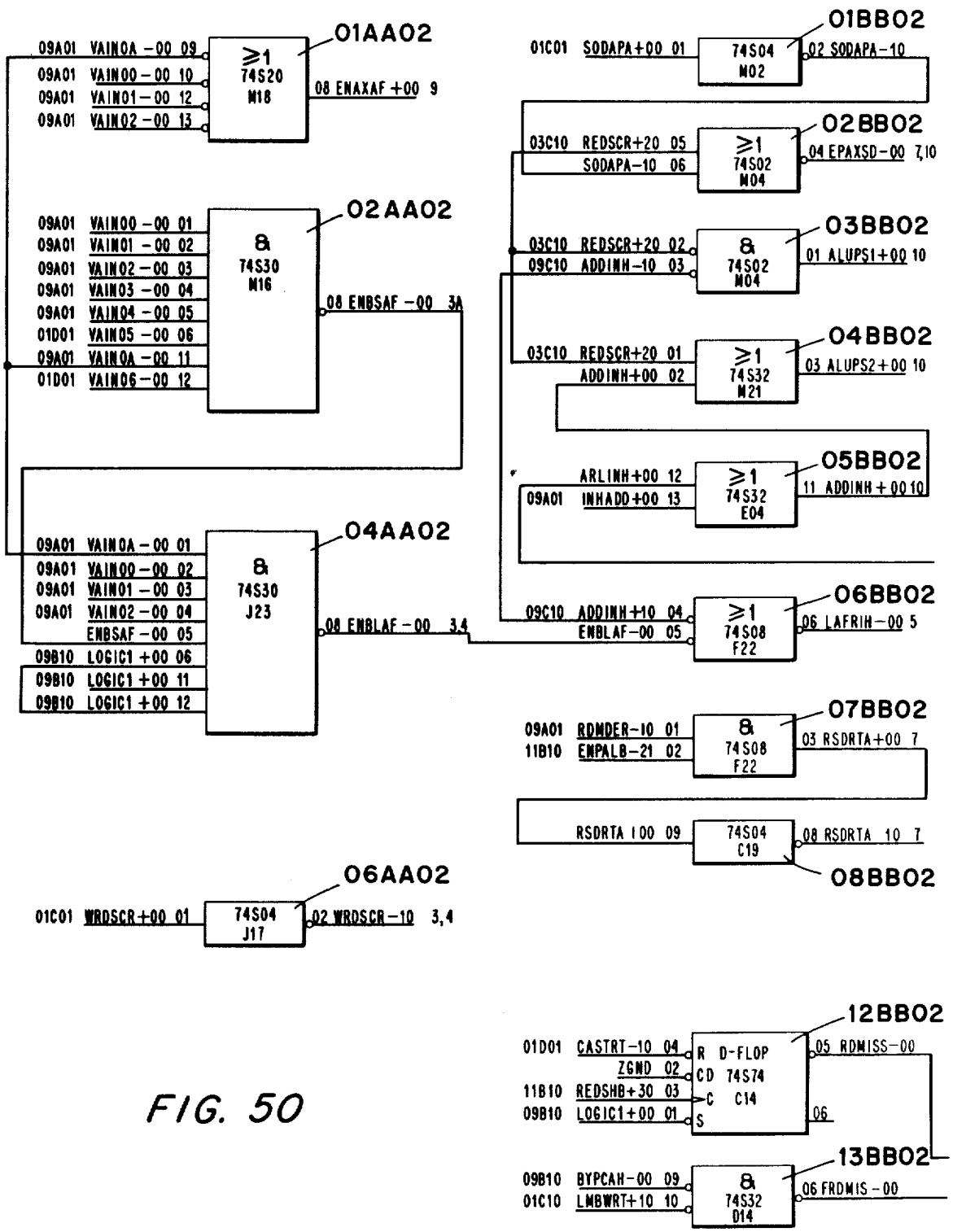

FIG. 50 illustrates the circuitry for enabling the reading and writing of the previously described small or large segment descriptor random access memory chips. The eight input AND gate 02AA02 generates the enable small segment descriptor signal, ENBSAF, whenever a small segment descriptor is to be written into or read from the small segment descriptor RAM 751. The input signals to the AND circuit 02AA02, VAIN0-0–VAIN06, comprise the seven most significant bits of the address number of the data word being requested from the cache. As previously explained, with reference to FIG. 17, these address bits are ZERO when a virtual address is being accessed in one of the small segments of the system.

The AND gate 04AA02 controls the generation of the enable large segment descriptor signal, ENBLAF, to enable the reading and writing of segment descriptors in the large segment descriptor RAM 753.

The enable signal, WRDSCR, is the output of inverter 06AA02, and it will be true whenever a segment descriptor is to be written into either the large or small segment descriptor RAMs 751, 753, respectively. An OR gate 06BB02 generates the large-segment-or inhibit bit, LAFRIH, whenever either ENBLAF is true or the adder-inhibit bit, ADDINH, is true. As will be discussed hereinafter, the adder-inhibit bit is employed as a control signal when translating a virtual address to a physical address.

Figure 51:
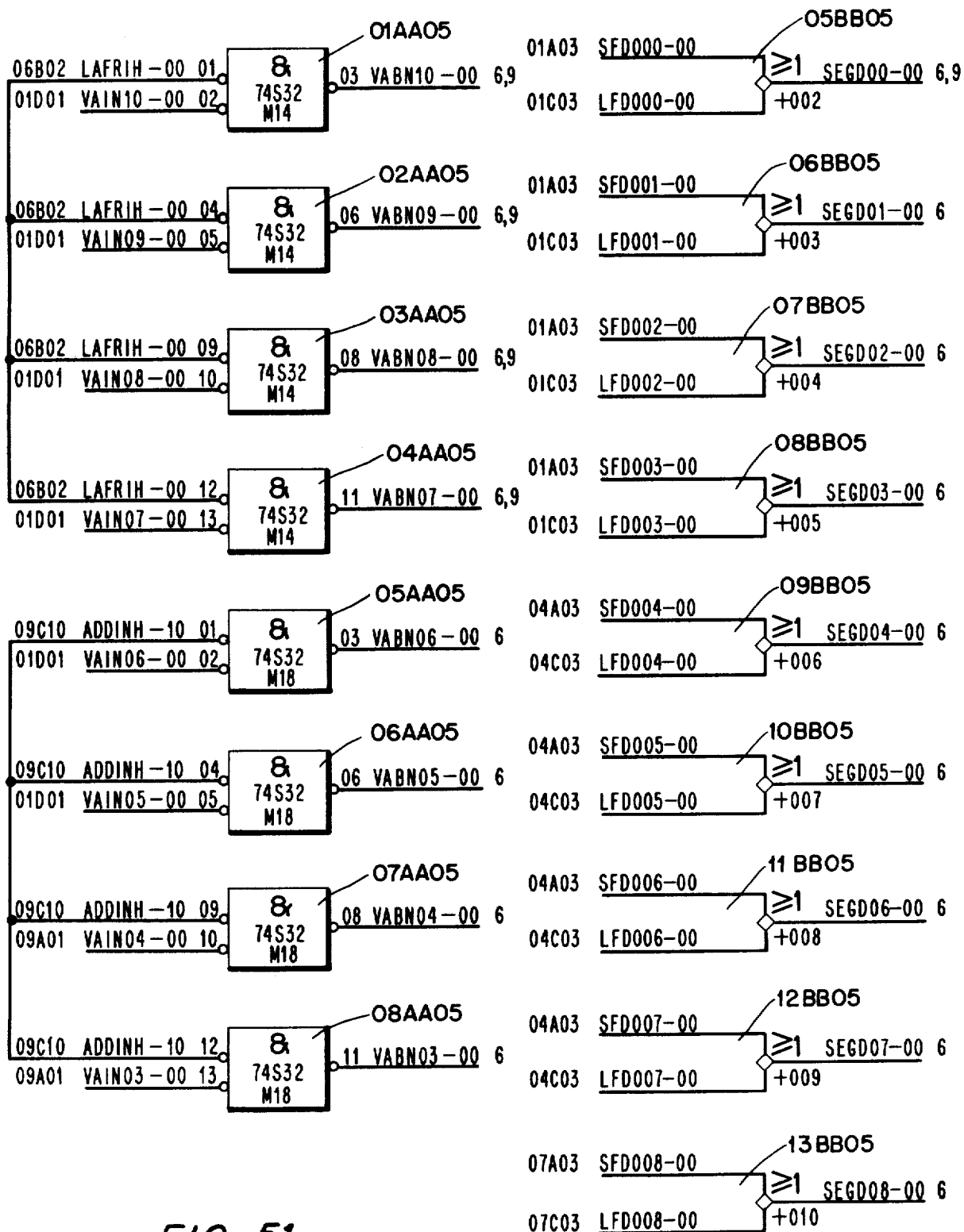
Figure 52:
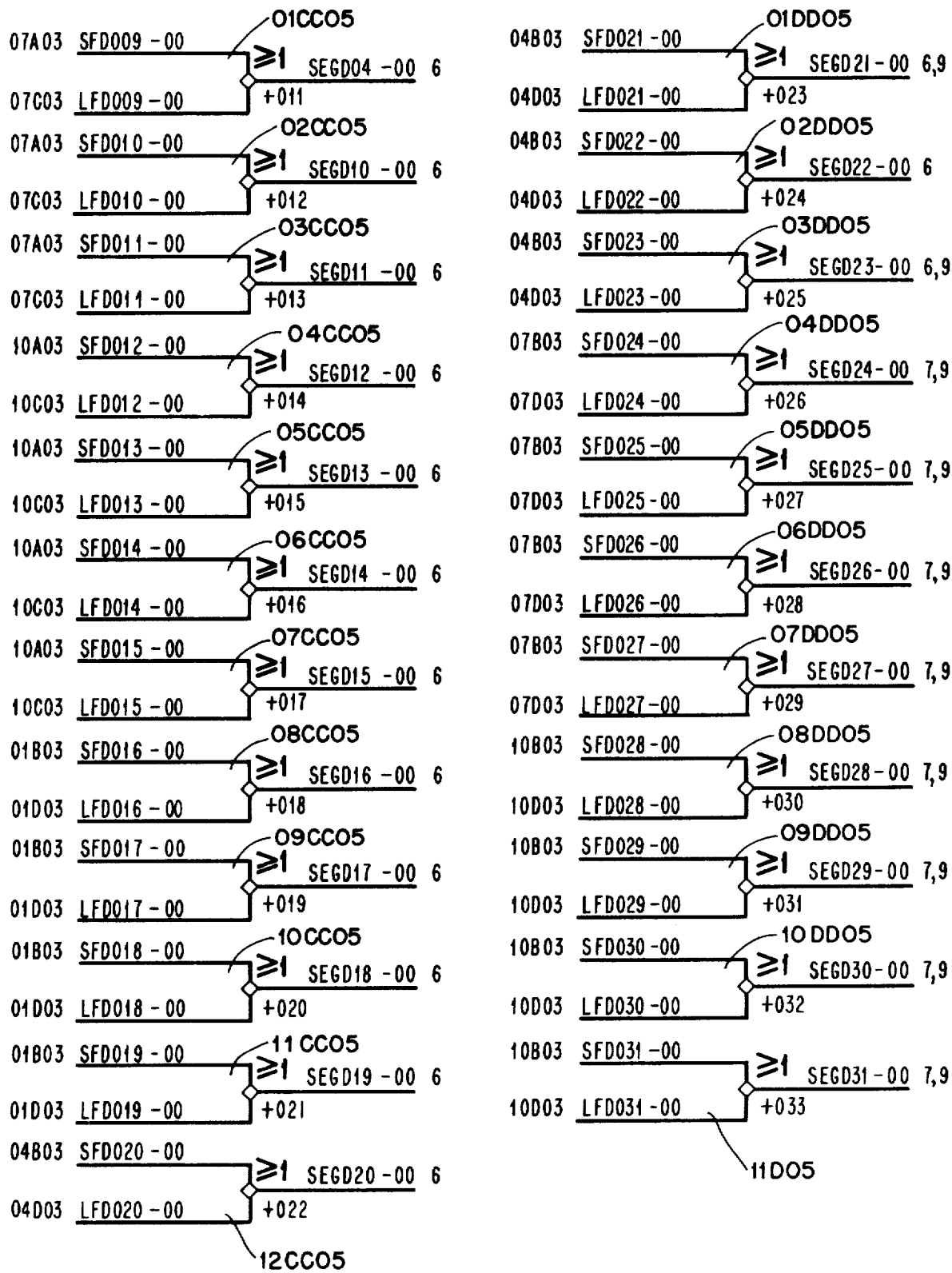

FIGS. 51 and 52 illustrate 32 two-input OR gates 05BB05-13BB05, 01CC05-12CC05, and 01DD05-11DD05 for setting the values of the segment descriptor bits, SEGD0:32 to either the output of the small segment descriptor RAM 751, SFDO0:32, or the large segment descriptor RAM 753, LFDO0:32. Also illustrated in FIG. 51 are eight AND gates, 01AA05-08AA05, for selectively setting the virtual address number signals VABN03:8 to either ZERO or to the present value of the virtual address number signals, VAIN03:8. If a small segment descriptor has been selected by ENBSAF, the adder-inhibit signal, ADDINH, is supplied to one of the input terminals of each of the AND gates 01AA05-08AA05 and will be equal to ZERO. This will cause the output signals VABN03:8, as supplied by the output terminals of the AND gates 01AA05-08AA05, to be ZERO. As will be explained hereinafter, the odd adder 765 and even adder 767 receive the signals VABN03:8 when generating the odd and even physical address numbers, respectively.

Figure 53:
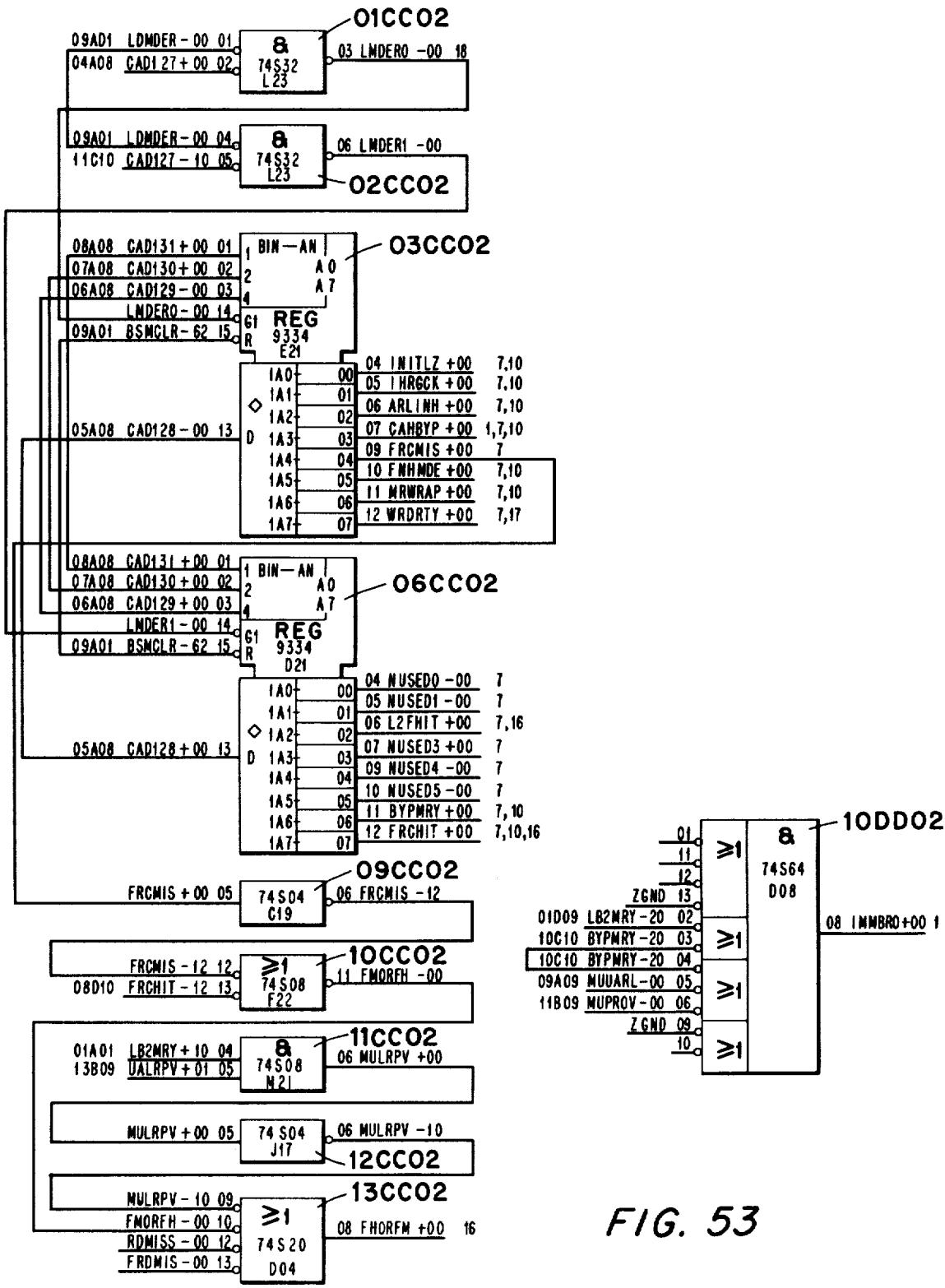

FIG. 53 illustrates an embodiment of the mode register 757 of the instant invention. This mode register comprises register circuit chips 03CC02 and 06CC02. These chips are cleared by the master clear signal, BSMCLR, whenever a master clear is performed on the computer system. Data are entered into the mode register 03CC02 under the control of the load mode register zero signal, LMDER0. Similarly, the bits in the register chip 06CC02 are loaded under the control of the load mode register one signal, LMDER1. Data to be loaded into the mode register are received from the cache data input multiplexer 703 (FIG. 19(a)) and comprise bit 28 of the cache data input word, CADI28. The register storage location is selected by cache data input signals CADI29-CADI31.

Figure 54:
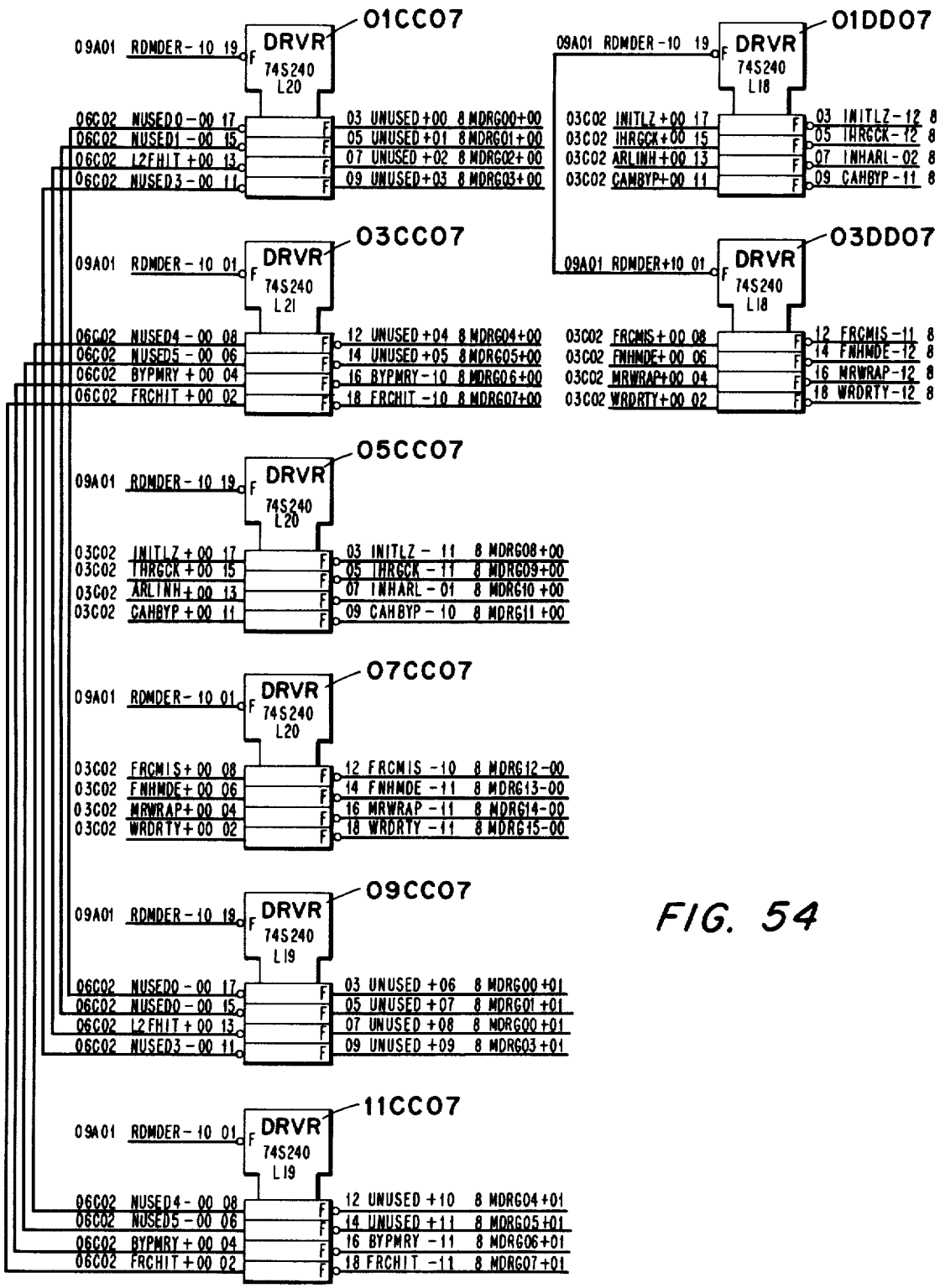

The driver circuits 01CC07-11CC07, 01DD07, and 03DD07, illustrated in FIG. 54, are coupled to the output terminals of the mode register circuit chips 03CC02 and 06CC02 and are controlled by the read mode register signal, RDMDER.

As evident to one of ordinary skill in the art, supplying the address bits CADI29:03 to address the mode register circuit chips 03CC02 and 06CC02 enables the selective setting and clearing of the control signals stored in the mode register. This enables the CPU to conduct various diagnostic tests on selected components of the central subsystem as well as the cache/MMU and the megabus adapter. The function of these mode register signals has been explained above and the manner in which the mode register and the mode register signals cooperate with the other hardware elements to operate in the diagnostic mode will be apparent from the description of the cache directory subsystem.

Figure 55A:
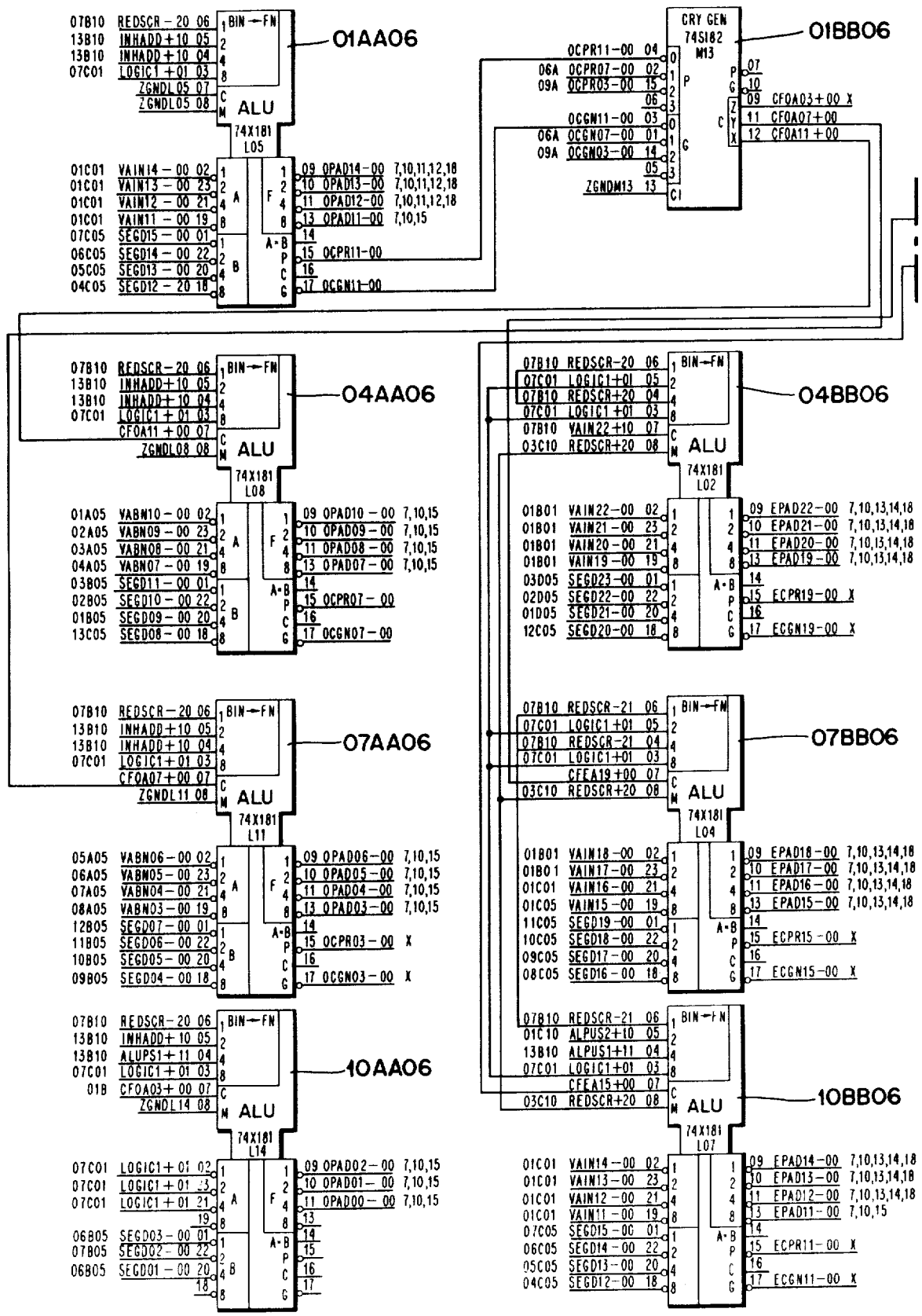
Figure 55B:
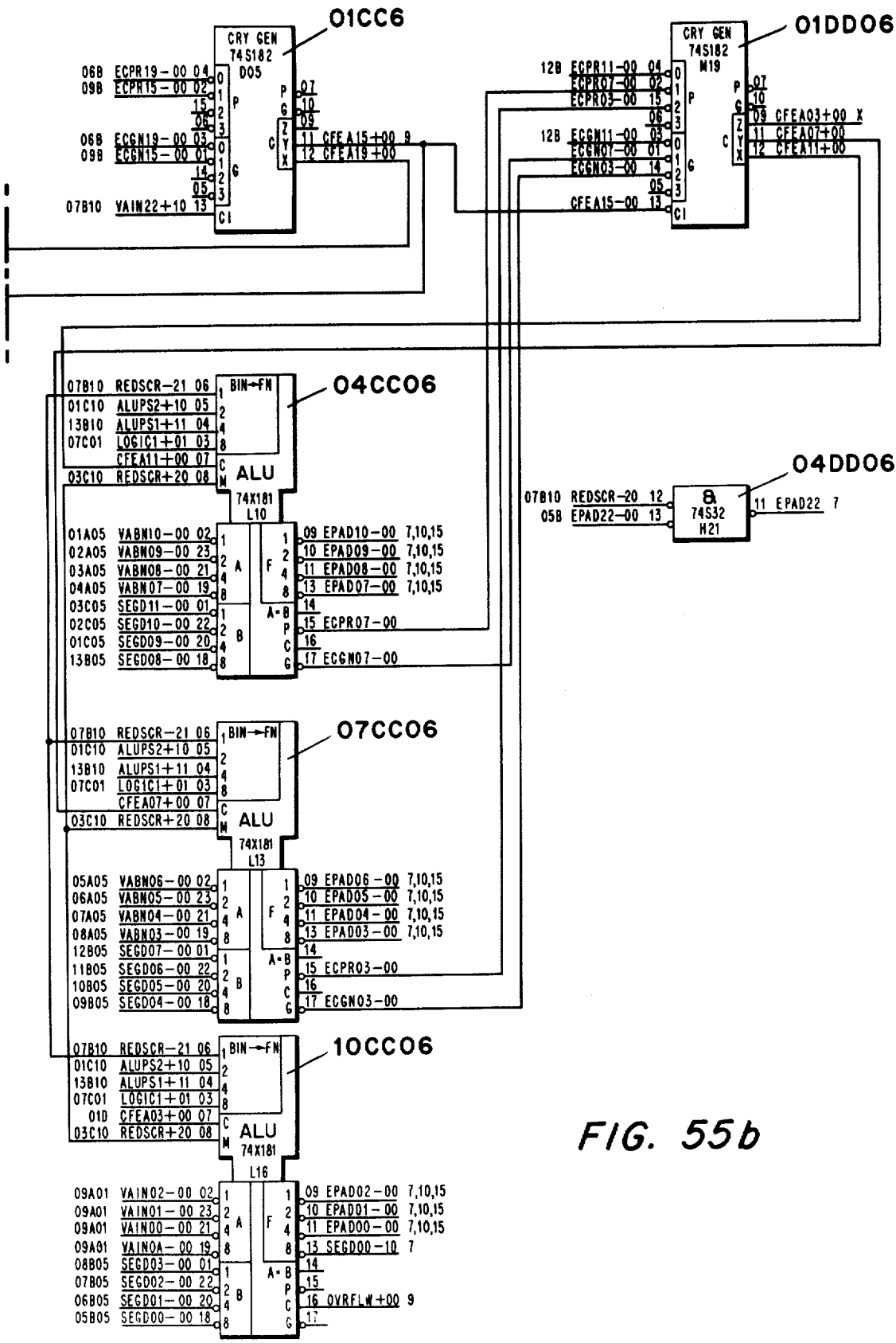

FIGS. 55(a) and 55(b) illustrate embodiments of the odd adder 765 and the even adder 767 (FIG. 19(b)) for generating odd physical address signals OPAD0:15 and even physical address segments EPAD0:23. The odd adder includes ALU circuit chips 01AA06, 04AA06, 07AA06, and 10AA06 and 01B06. The ALU circuit chip 01AA06 adds segment descriptor bits SEGD12—SEGD15 supplied by the OR gates illustrated in FIG. 52 to the virtual address number bits VAIN1-1-VAIN14 to generate odd physical address number bits OPAD11-OPAD14.

The ALU circuit chip 04AA06 generates the odd physical address numbers OPAD07-OPAD10. When the physical address number being generated corresponds to a memory address in one of the small segments, the inputs VABN07-VABN10 will be equal to ZERO as supplied by the AND gates 01AA05-04AA05 (FIG. 51). In such a case, the odd physical address bits, OPAD07-OPAD10, assume the value of the small segment descriptor bits SEGD08-SEGD11. However, if the segment descriptor bits originated from the large segment descriptor RAM 753, then VABN07-VABN10 will be equal to the address number bits VAIN07-VAIN10, and OPAD07-OPAD10 will be the sum of the corresponding signals VABN07-VABN10 and SEGD08-SEGD11.

The outputs of the ALU circuit chip 07AA06 comprise the physical address number bits OPAD03-OPAD06. This ALU circuit chip operates in the same manner as the ALU circuit chip 04AA06 and sets OPAD03-OPAD06 equal to SEGD04-SEGD07 if a small segment descriptor has been selected by ENBSAF. Otherwise, OPAD03-OPAD06 are set equal to the sum of the corresponding signals in the fields VAIN03-VAIN06 and SEGD04-SEGD07.

The ALU circuit chip 10AA06 sets OPAD00-OPAD02 equal to SEGD01-SEGD03 or to ZERO.

The carry generator 01BB06 is coupled to the ALU circuit chips 01AA06, 04AA06, 07AA06, and 10AA06 to speed any carry resulting from the additions.

The ALU circuit chips which generate the odd physical address numbers are controlled by the values of the read descriptor signal, REDSCR, and the inhibit adder signal, INHADD. The values for these signals will be appropriately set by the previously explained circuitry to set the odd physical address numbers to the proper values. For example, when VAIN11-VAIN14 are to be added to SEGD12-SEGD16 to generate OPAD11-14, REDSCR will be equal to ZERO and INHADD will be equal to ZERO to control ALU circuit chip 01AA06 to perform an ADD operation. FIGS. 55(a) and 55(b) illustrate an embodiment of the even adder 767 (FIG. 19(b)) for generating the even physical address number bits, EPAD0:22. These ALU circuit chips operate in the same manner as the ALU circuit chips which implement the odd adder. For example, ALU circuit chips 04CC06 and 07CC06 receive as inputs SEGD04-SEGD11 and VABN03-VABN10. For the reasons stated above with regard to the odd adder ALU circuit chips, if a small segment is being accessed, the ZERO values of VABN03:4 will be directly transferred to the input of ALU circuit chip 07CC06 under the control of the signals REDSCR, ALUPS2, ALUPS1, and LOGIC1 which will all be equal ONE. Otherwise, EPAD03:4 will equal the sum of SEGD04:4 and VABN03:4. The ALU circuit chip 04AA06 sets EPAD07:4 equal to the sum of SEGD08:4 and VABN07:4.

The ALU circuit chip 10BB06 when properly controlled adds the segment descriptor bits SEG12-SEG15 to the virtual address number bits VAIN11-VAIN14 to generate the even physical address number bits EPAD11-EPAD14.

The ALU circuit chips 07BB06 and 04BB06 are used to set EPAD15-EPAD22 to the current values of VAIN15:8 if VAIN15:8 is even or to VAIN15:8 +1 if VAIN15:8 is odd.

The carry propagation circuits 01CC06 and 01DD06 implement the above-explained conversion of an odd virtual address number to an even virtual address number. The carry circuit 01CC06 receives as an input the least significant bit of the virtual address number, VAIN22. If VAIN22 is odd then the even adder 767, as implemented by the ALU circuit chips in FIGS. 55(a) and 55(b), will generate the next successive physical address number with regard to the physical address number corresponding to the inputted virtual address number, VAIN0;23. Whenever VAIN22 is equal to ONE, the carry generation circuits 01CC10 and 01DD10 will propagate a carry through the ALU circuit chips embodying the even adder to convert an odd address number into an even address number.

Figure 56:
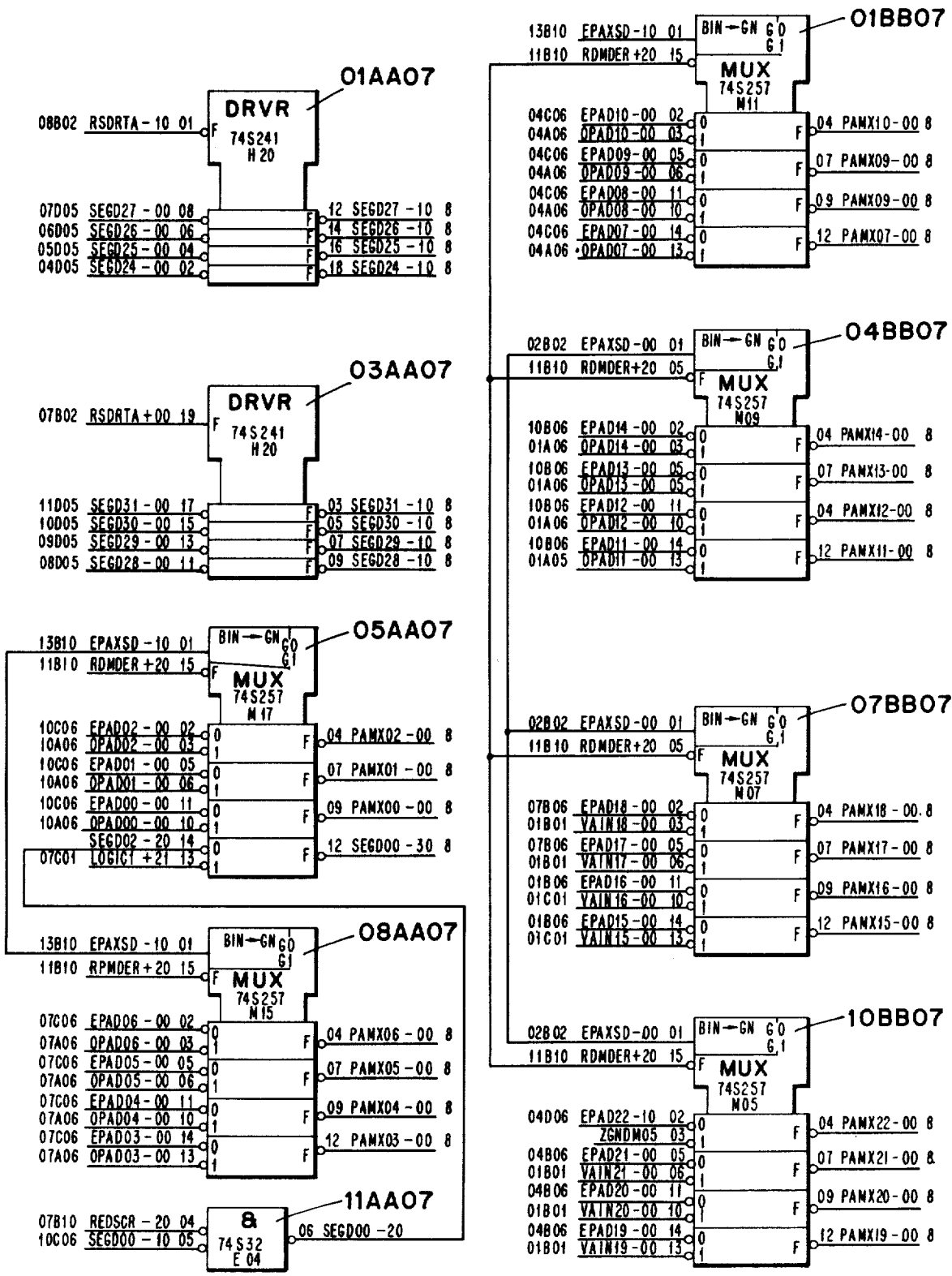
Figure 57A:
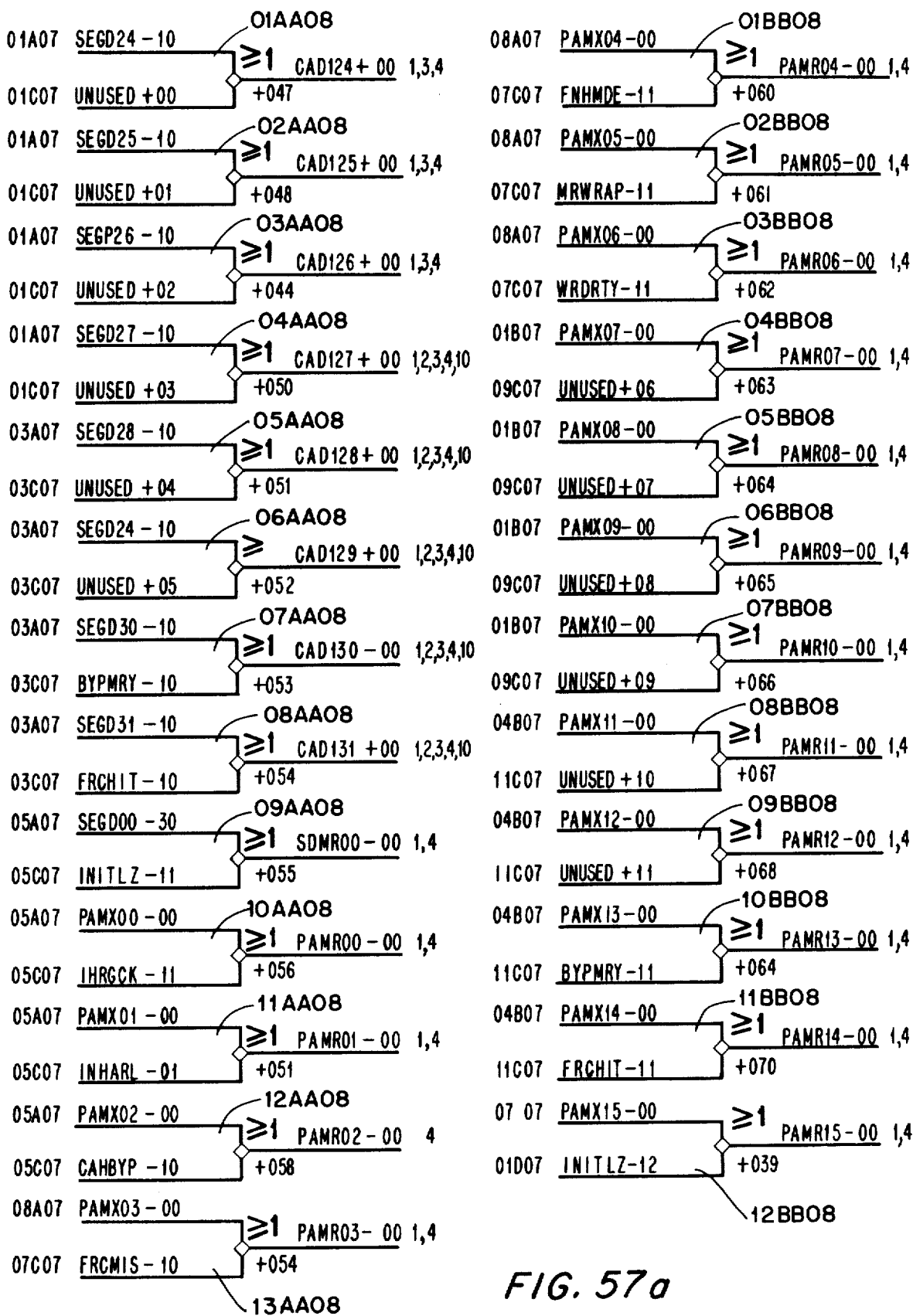
Figure 57B:
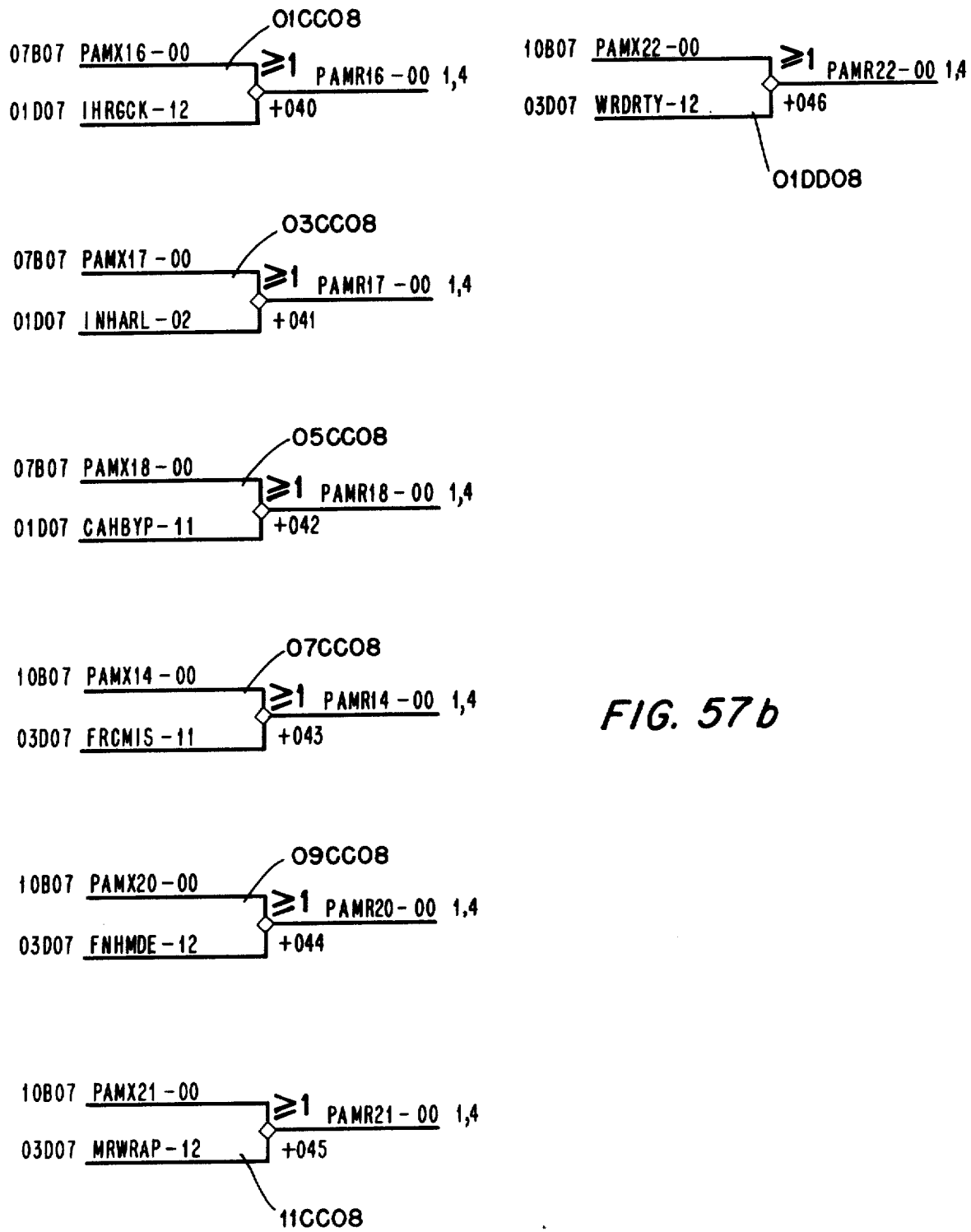

FIG. 56 illustrates an embodiment of the physical address multiplexer 773 (FIG. 19(b)). This multiplexer comprises multiplexer circuit chips 05AA07, 08AA07, 01BB07, 04BB07, 07BB07, and 10BB07. The low-order physical address bits outputted from the physical address multiplexer 773, PAMX15-PAMX21 comprise selection between EPAD15-EPAD21 and VAIN1-5-VAIN21. The output PAMS22 is selected as either EPAD22 or ONE. The signal EPAXSD as outputted by the OR gate 02BB02 (FIG. 50) chooses between the two inputs.

Figure 58A:
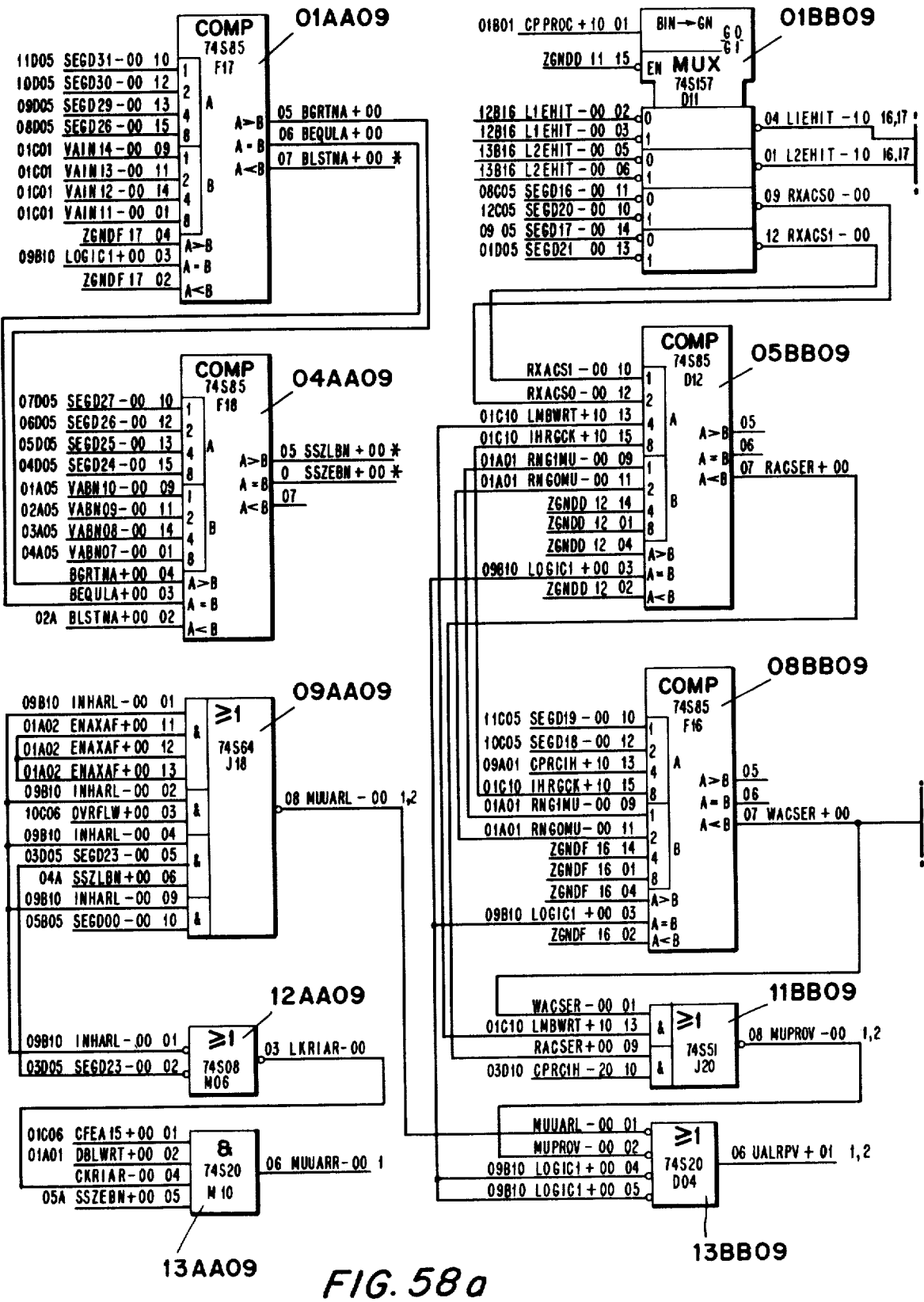

FIG. 58(a) illustrates an embodiment of the access rights checker circuit 759 and of the segment size comparator 763. The access rights checker circuit 759 comprises comparators 05BB09 and 08BB09. The comparator 05BB09 receives as inputs RXACS1 and RXACS0 which are the outputs of two 2×1 multiplexers embodied in the multiplexer circuit chip 01BB09. The inputs to the first of the two 2×1 multiplexer circuits are SEGD16 and SEGD20. The inputs to the other multiplexer circuits are SEGD17 and SEGD21. If CPPROC, the selector signal for the multiplexer 01BB09 is equal to ZERO, then RXACS0 is set equal to SEGD16 and RXACS1 is set to SEGD17. This means that the read ring number from the accessed segment descriptor is transferred to one input of the comparator 05BB09. However, if CPPROC is equal to ONE, the RXACS0 is set equal to SEGD20 and RXACS1 is set equal to SEGD21. This transfers the EXECUTE ring number from the currently active segment descriptor to the input terminals of the comparator 05BB09.

The comparator 05BB09 also receives as inputs the ring number, RNG1MU, RNG0MU, associated with the device requesting either a memory read or a memory access. If the ring number in the segment descriptor is less than the right number of the requesting device, then a read access error, RACSER, is set to indicate that there is insufficient privilege associated with the requesting device.

The comparator 07BB15 compares the write ring number associated with the currently active segment descriptor, SEGD18-SEGD19, to the ring number of the requesting device as received in the inputs RNG1MU and RNG0MU. If the ring number in the segment descriptor is less than the ring number associated with the requesting device, then a write access error is indicated by the generation of WACSER.

The two-way selector 11BB09 generates the protection violation signal MUPROV in response to the generation of the write access error and read access error signals.

The comparators 01AA09 and 04AA09 determine whether the offset field of the virtual address number, VAIN07-VABN10 and VAIN11-VAIN14, will cause an overflow of an addressed segment. Accordingly, eight bits of the segment size field, SEGD24-SEGD31 are compared to the eight bits of the virtual address offset, and the signals, SSZEBN and SSZLBN, are respectively generated if the segment size is equal to or less than the segment offset.

If the segment size is greater than the virtual address offset, then SSZLBN is generated. If the segment size is equal to the virtual address offset, then the signal SSZEBN is generated.

The four-way selector 09AA09 generates an unavailable resource left error signal, MUUARL, signifying that the high order output data word corresponding to the virtual address number VAIN0:23 is unavailable, if SSZLBN equals ONE and SEGD23 and INHARL equal ZERO. It is the function of the AND gate 13AA09 to generate an unavailable resource right error signal, MUUARR, indicating that the low order output data word identified by the virtual address number VAIN0:23 incremented by one is unavailable, if a double word has been requested, as indicated by DBLWRT, SSZEBN, and CFEA15 all being equal to ONE and LKRIAR will be equal to ZERO. The signal LKRIAR is the inverted output of the OR gate 12AA09 and will be equal to ZERO on input to the AND gate 13AA09 if either SEGD23 or INHARL is equal to ZERO.

FIG. 58(b) illustrates a multiplexer circuit chip 01DD09 for transmitting to the CPU either the write ring number from an active segment descriptor, SEGD-18-SEGD19, or the ring number of the device (CPU) requesting a memory access, RNG0MU-RNG1MU, whichever is greater.

Figure 59:
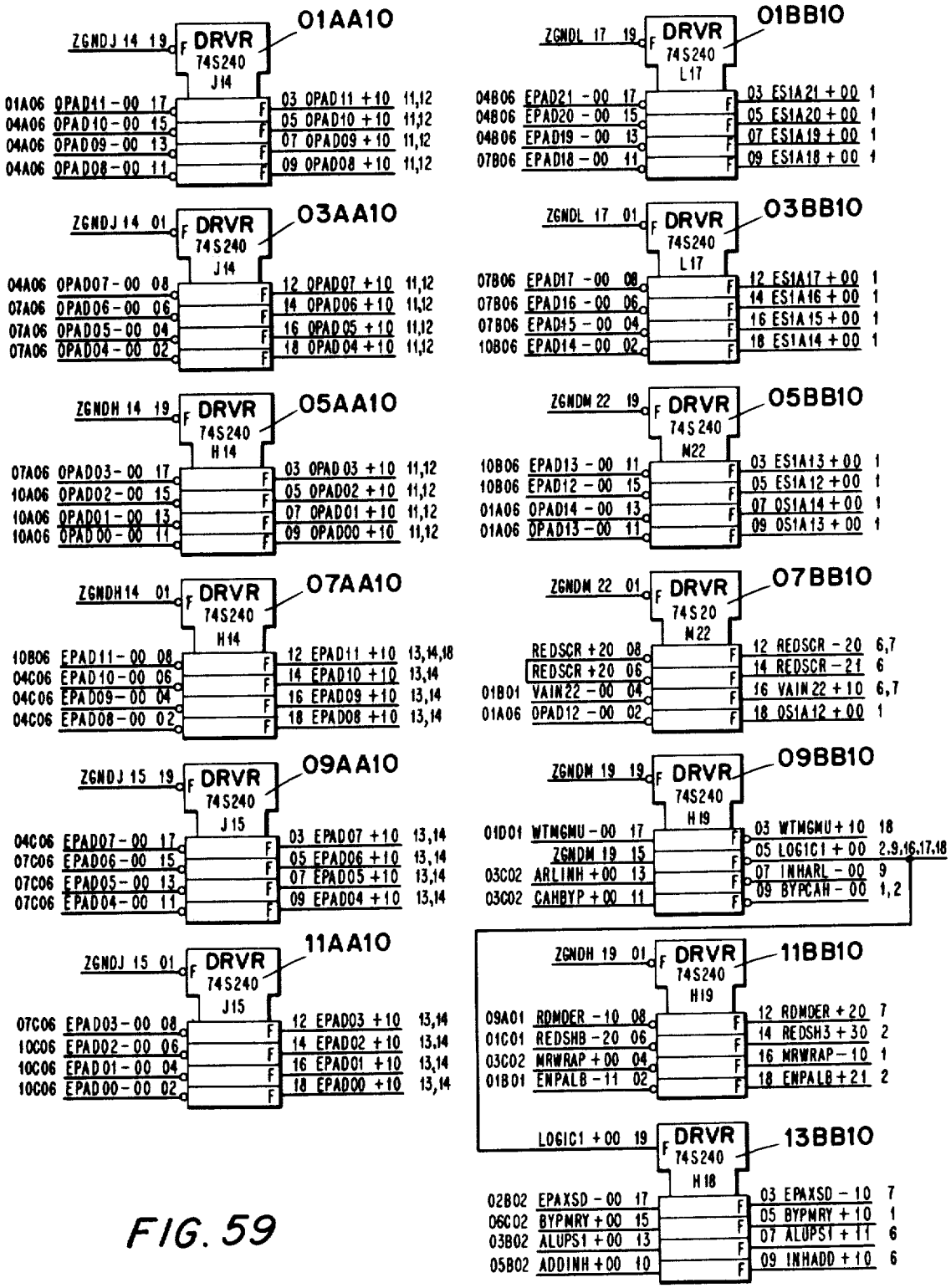

FIG. 59 illustrates an embodiment of the odd and even address driver 769, 771. Driver circuits 01AA10, 03AA10, and 05AA10 comprise the odd physical address drivers 769. The driver circuits 07AA10, 09AA10, and 11AA10 comprise the even physical address drivers for the 12 most significant bits of the physical address number, EPAD00:12. The driver circuits 05BB10, 03BB10, and 01BB10 comprise the driver circuits for the 10 least significant bits of the even physical address number, EPAD12:10, and bits 13 and 14 of the odd physical address number, OPAD13:2.

The circuit chips 07BB10, 09BB10, 11BB10, and 13BB10 comprise driver circuits for miscellaneous control signals employed within the cache directory subsystem as well as bit 12 of the odd physical address, OPAD12:1.

Figure 60A:
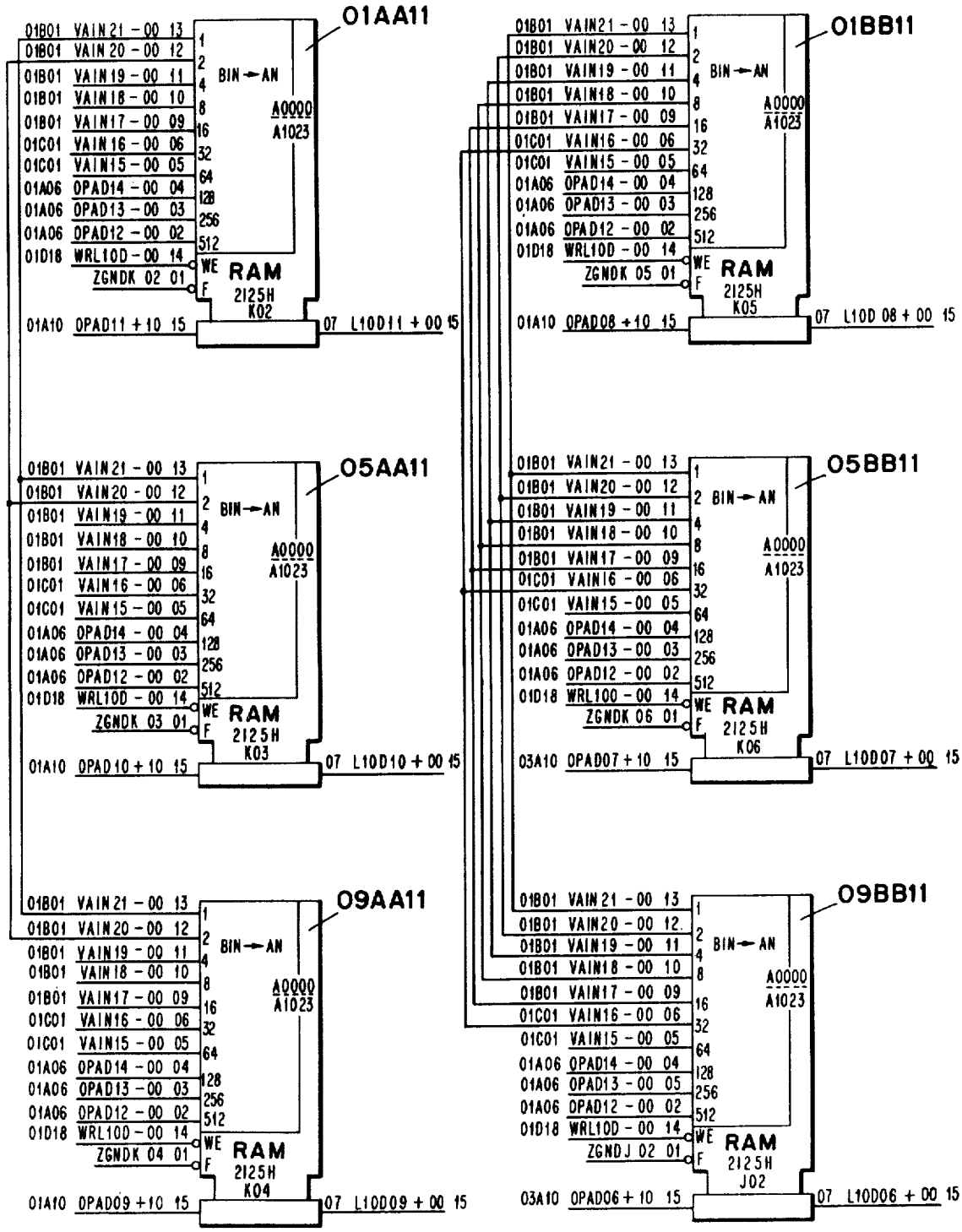
Figure 60B:
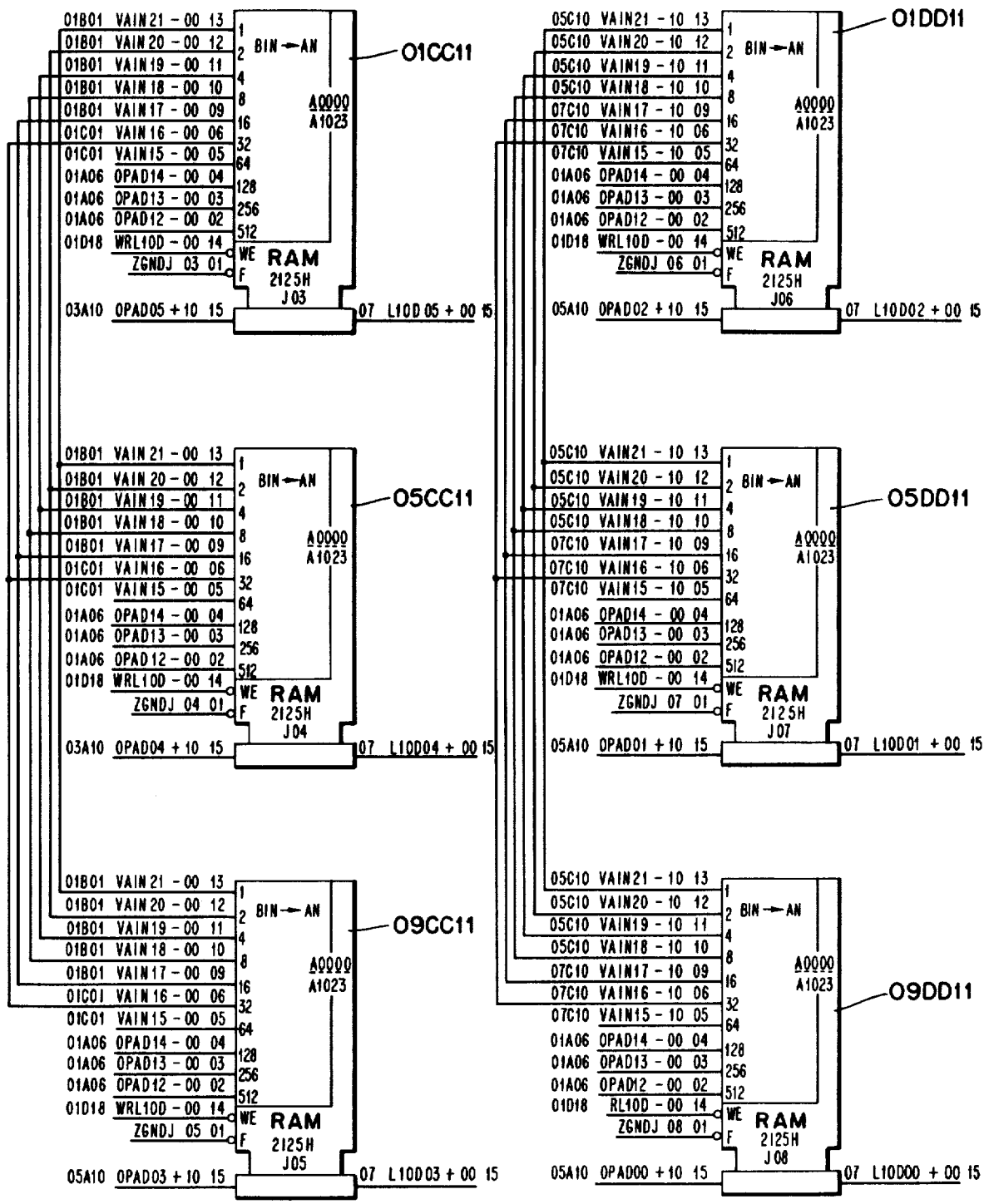

FIGS. 60(a) and 60(b) comprise an embodiment of the level 1 odd directory 777 (FIG. 19(b)). When in the write mode, the odd physical address number bits OPAD00-OPAD11 are written into the level 1 odd directory. When in the read mode, the level 1 odd directory outputs the data signals LIOD00-LIOD11.

The memory chip 01AA11 is a 1024×1 random access memory. Writing and reading of the random access memory chip 01AA11 is under the control of the write level 1 odd directory signal, WRLIOD, generated, in a manner to be hereinafter explained, by the cache update logic 797. The random access memory chip 01AA11 is addressed by the signals OPAD12:3 and VAIN15:7. When addressed in parallel, the 12 random access memory chips comprising the level 1 odd directory will input and output a 12 bit directory word.

Figure 61A:
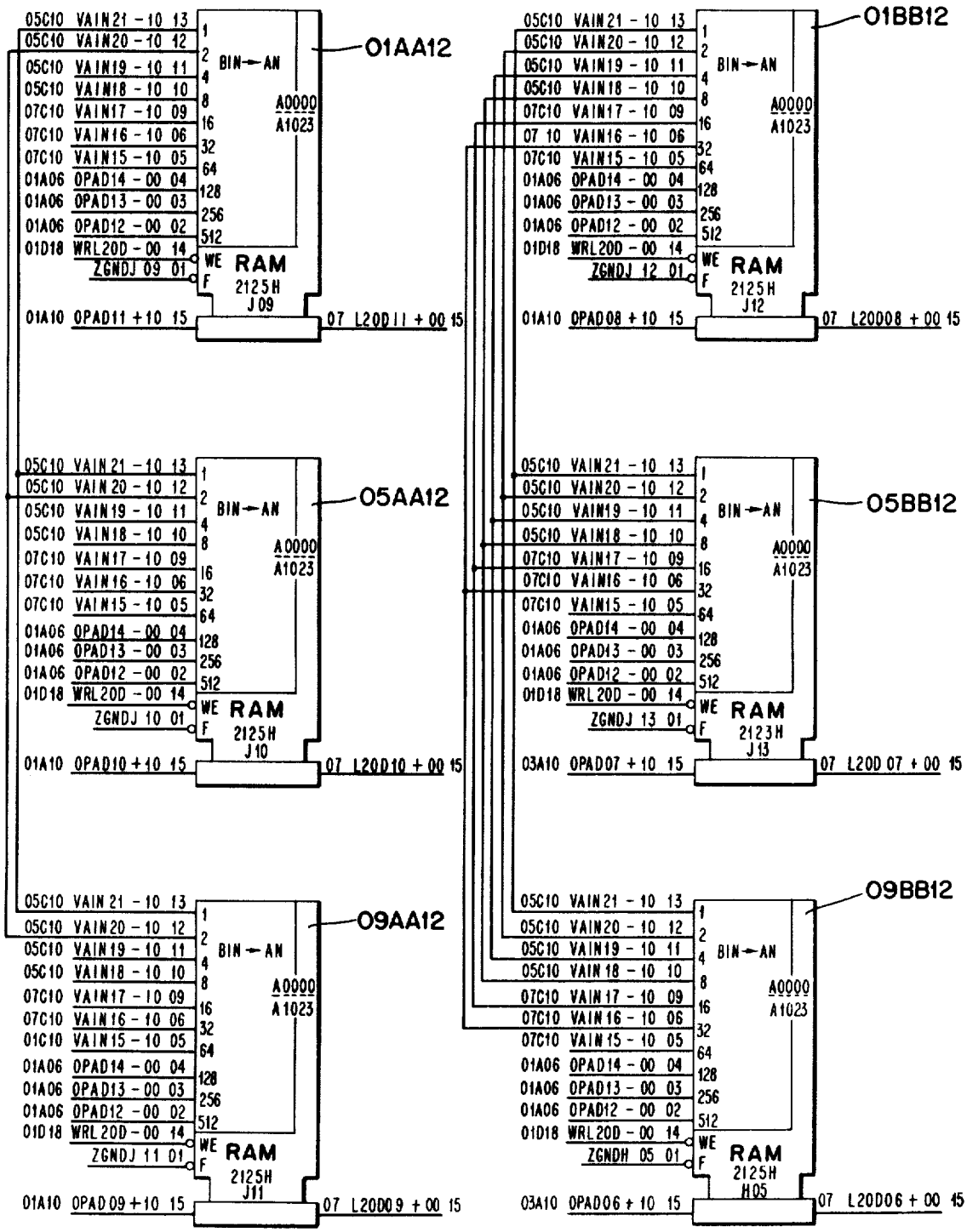
Figure 61B:
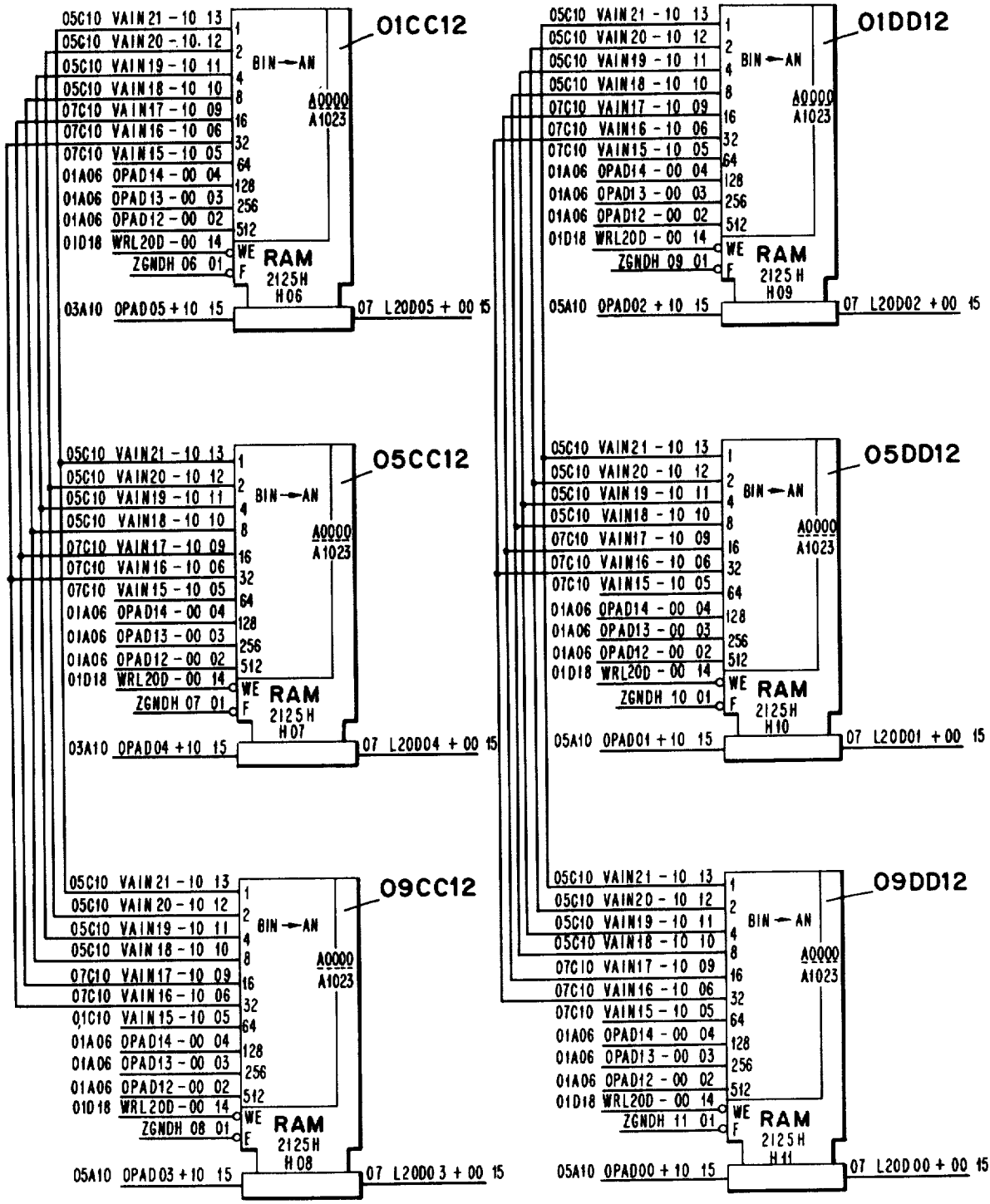

FIGS. 61(a) and 61(b) illustrate an embodiment of the level 2 odd directory 779. This directory also comprises 12 1024×1 random access memory chips which are addressed by the same address signals as the level one odd directory 777. Writing and reading of the 12 random access memory chips comprising the level 2 odd directory 779 is controlled by the write level 2 odd directory signal, WRL2OD, which is also generated by the cache update logic 797.

Figure 62A:
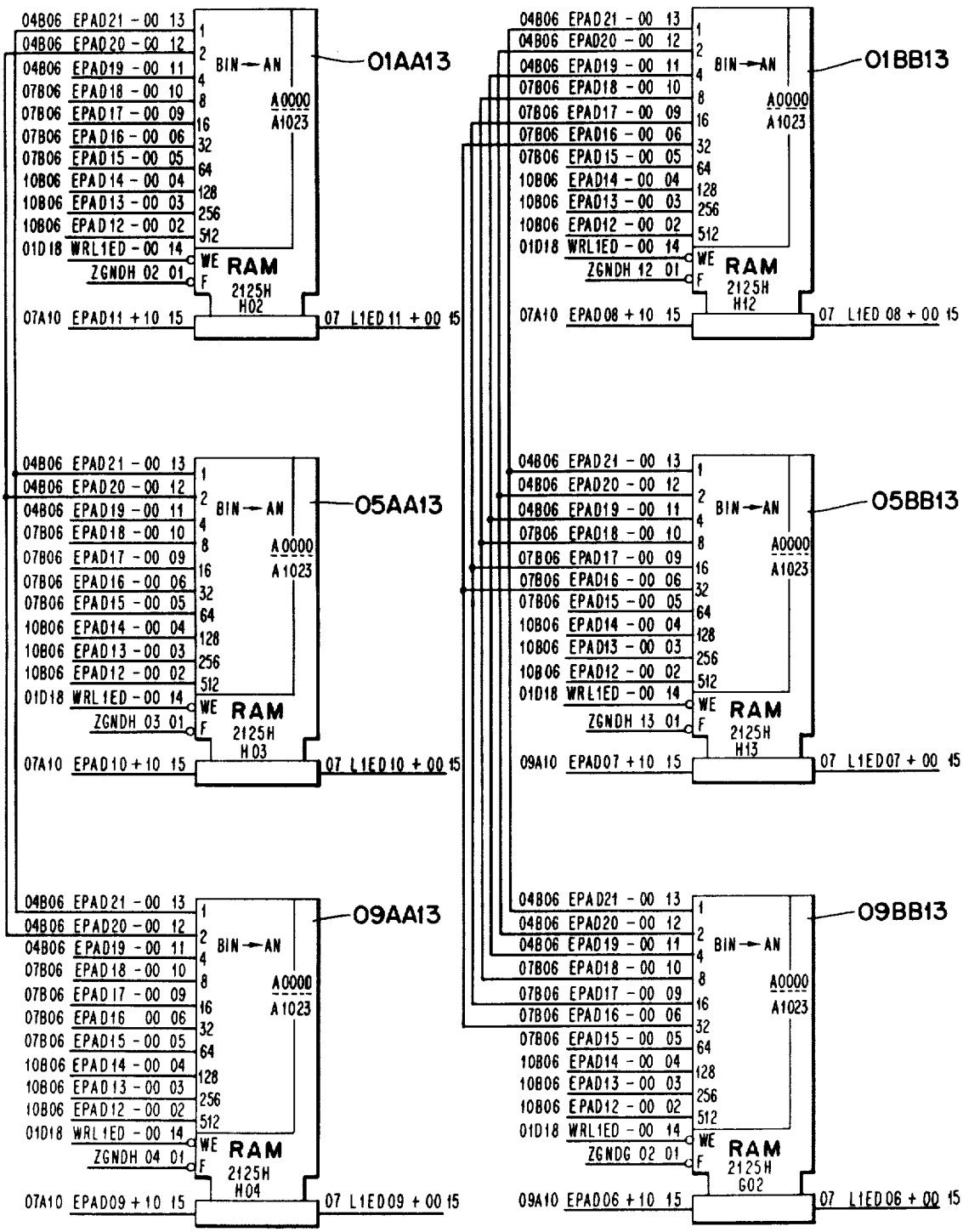
Figure 62B:
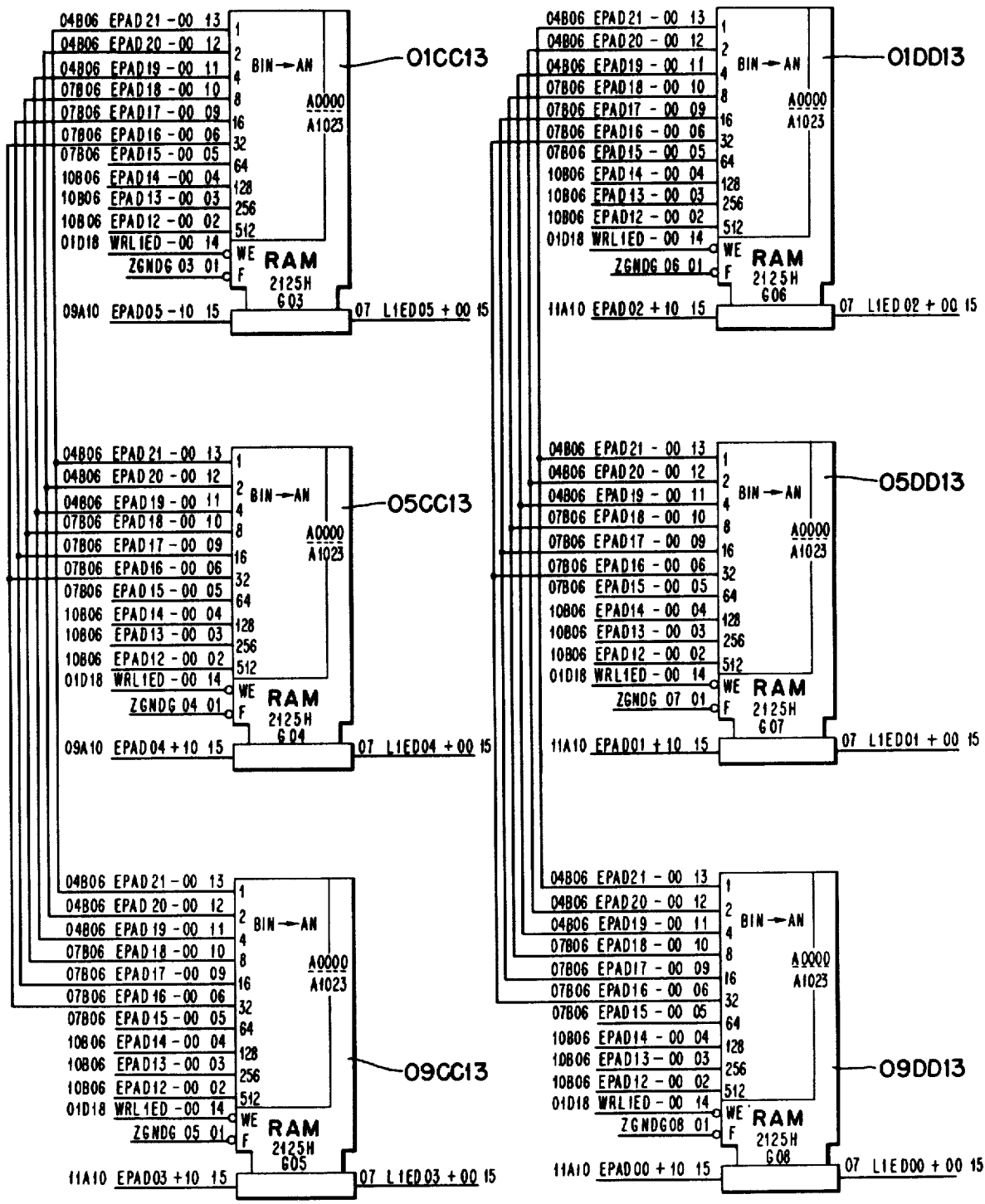

FIGS. 62(a) and 62(b) illustrate and embodiment of the level 1 even directory 781. This embodiment also comprises 12 1024×1 random access memory chips addressed by the physical address number signals EPAD12:10. The data inputs to the random access memory chips comprise the even physical address number signals EPAD0:12 and the outputs comprise the signals L1ED00:12. Writing and reading of the random access memory chips is under the control of the write level 1 even directory signal, WRL1ED, generated by the cache update logic 797.

Figure 63A:
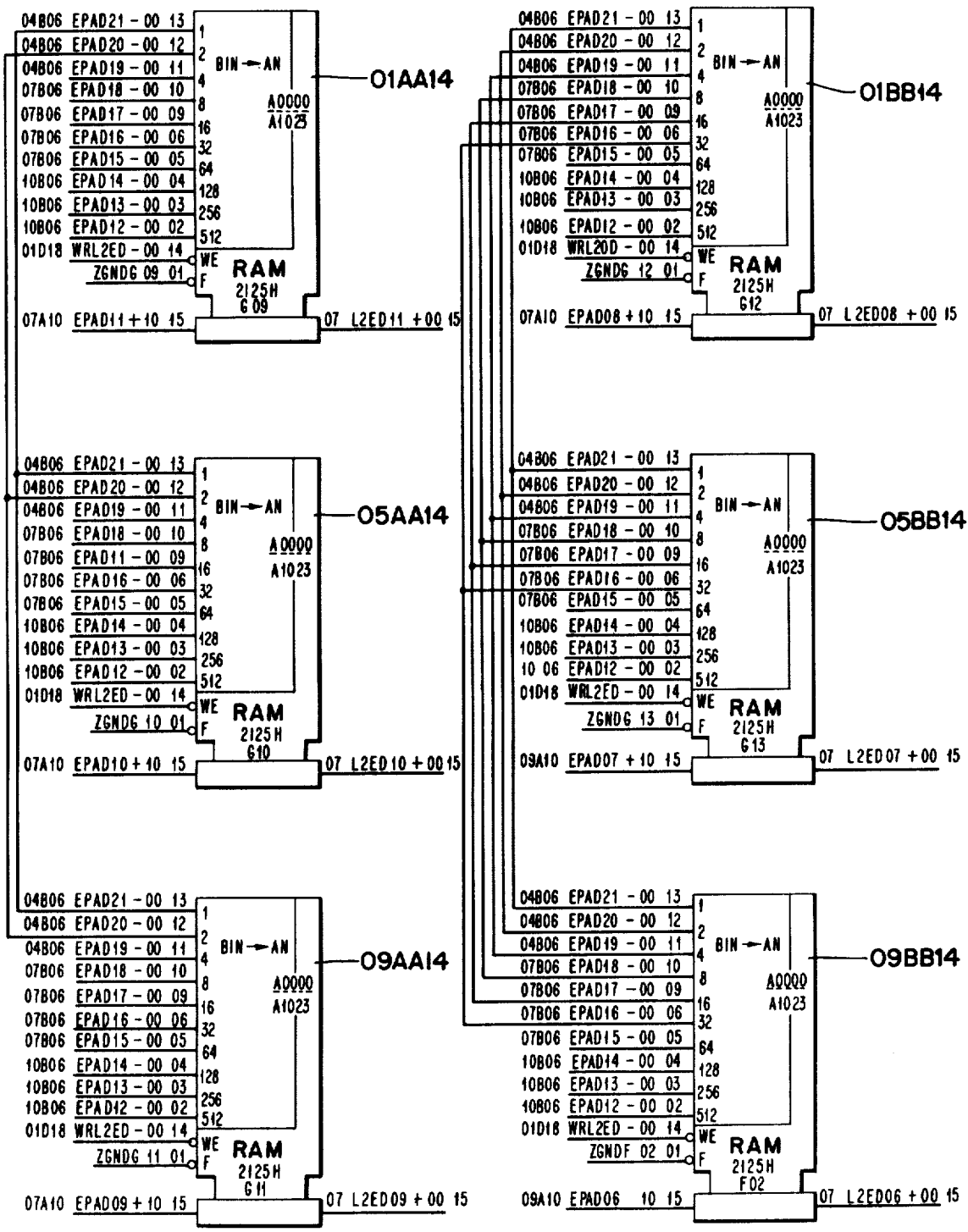
Figure 63B:
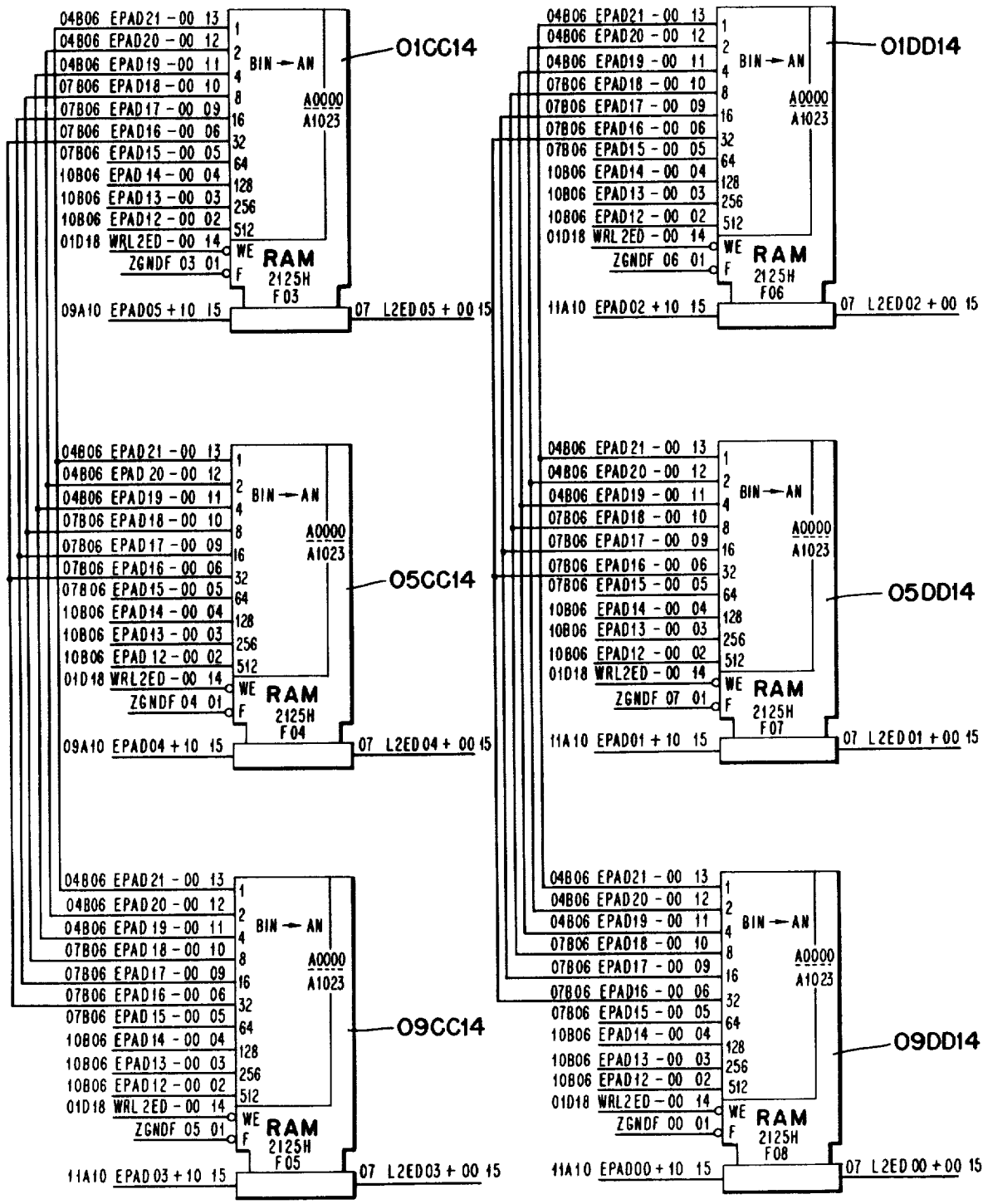

FIGS. 63(a) and 63(b) illustrate an embodiment of the level 2 even directory 783. This directory also comprises 12 1024×1 random access memory chips addressed by the even physical address number signals EPAD12:10. The inputs of these random access memory chips comprise the even physical address number signals EPAD00:12 and the outputs comprise the signals L2ED00:12. Writing and reading of the random access memory chips comprising the level 2 even directory 783 are under the control of the write level 2 even directory signal, WRL2ED, generated by the cache update logic 797.

Figure 64A:
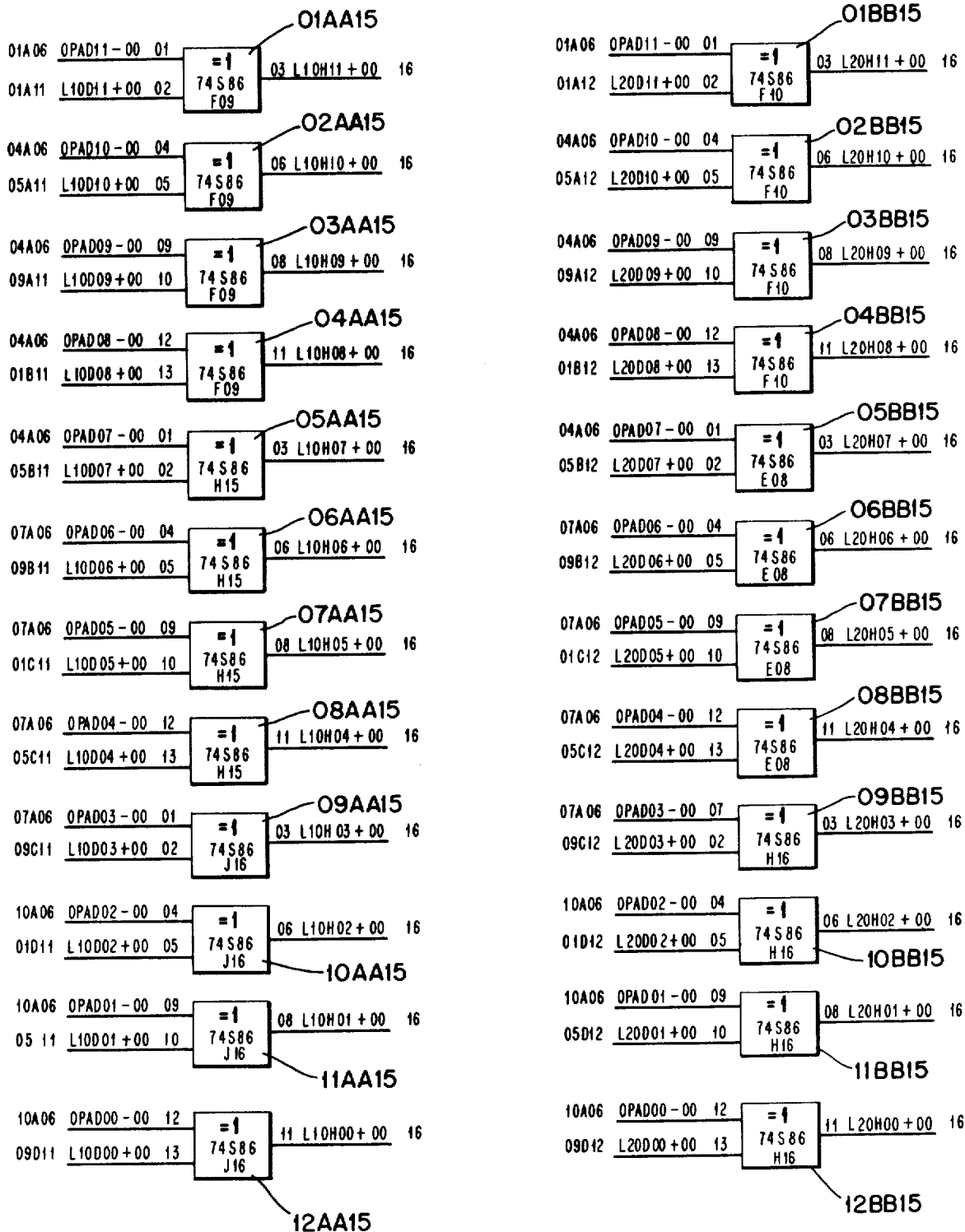

FIG. 64(a) illustrates an embodiment of the level 1 odd comparator 787 and the level 2 odd comparator 789. The level 1 odd comparator comprises 12 AND gate circuits, 01AA15-12AA15. These AND gate circuits receive as input signals OPAD00:12 and L1OD00:12 the outputs of the odd adder 765 and the level 1 odd directory 777, respectively. The output signals, L1OH00:12, will be equal to ONE if the input signals are identical, otherwise they will be equal to ZERO. If all of the output signals, L1OH00:12, are equal to ONE, then a hit has been detected in the level 1 odd directory 777, indicating that the data word stored in the system memory at the addressed odd physical number is currently resident in the level 1 odd data store 711.

The AND gates 01BB15-12BB15 comprise an embodiment of the level 2 odd comparator 789. These AND gates receive the 12 most significant bits of the odd physical address, OPAD00:12, as generated by the odd adder 765 and the output of the level 2 odd directory 779, L2OD0:12. The outputs of the AND gates comprise the hit signals L2OH00:12. The output signal will be equal to ONE if the input signals to the AND gates are identical. If all of the output signals are true, then a hit has been detected in the level 2 odd directory 779 indicating that the data word identified by the address OPAD00:14 concatenated with VAIN15:7 is resident in the level 2 odd data store 715.

Figure 64B:
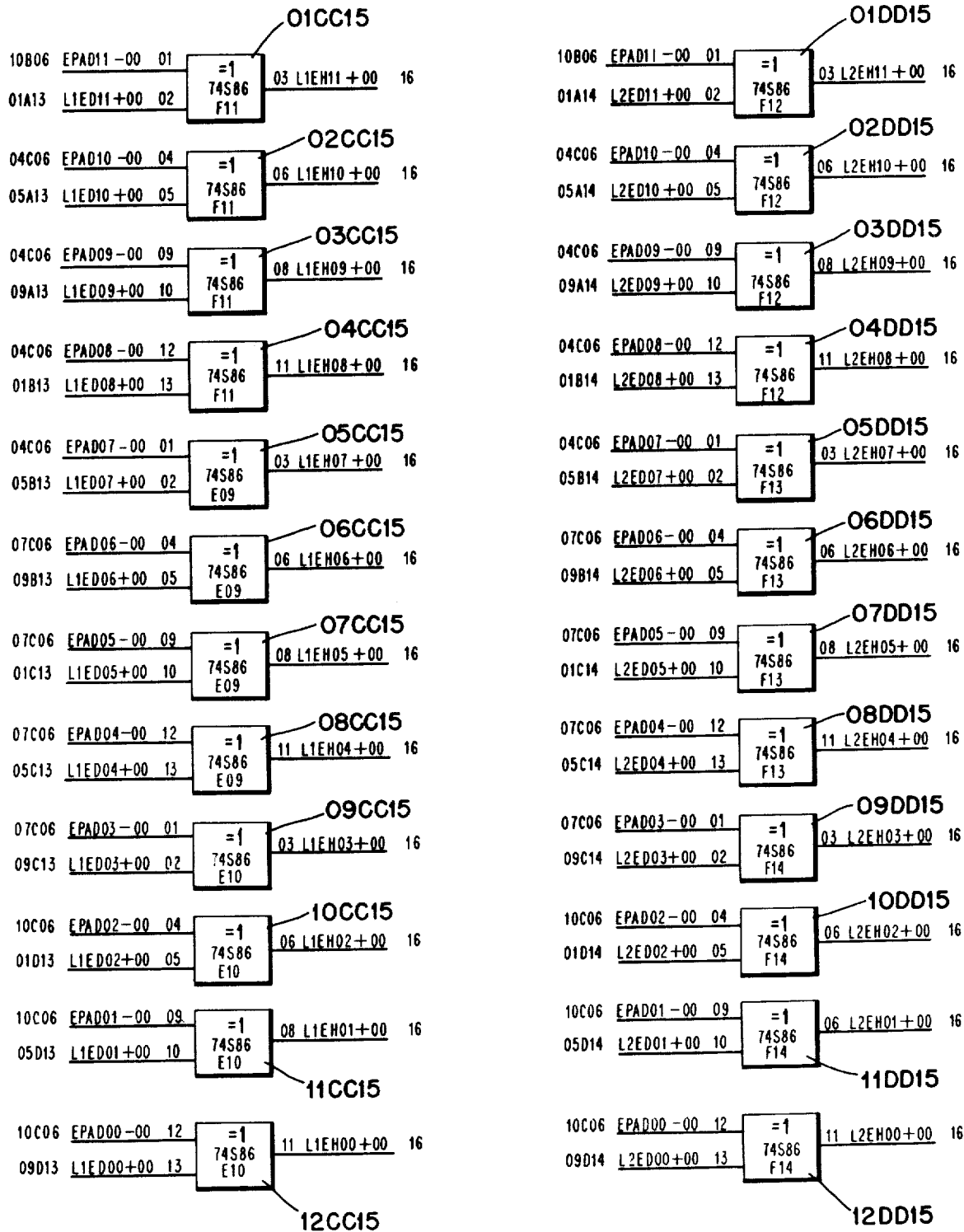

FIG. 64(b) illustrates embodiments of the level 1 even comparator 791 and the level 2 even comparator 793. The AND gates 01CC15-12CC15 comprise the level 1 even comparator 791. These AND gates receive the inputs EPAD00:12 and L1ED00:12 and generate the outputs L1EH00:12. If all of the generated output signals, L1EH00:12, are equal to ONE, a hit has been detected for the data word identified by the even physical address number EPAD0:22 and that data word is currently resident in the level 1 even data source 709.

The AND gates 01DD15-12DD15 comprise an embodiment of the level 2 even comparator 793. These AND gates receive the even physical address number bits EPAD00:12 and the output of the level 2 even directory L2ED00:12. The outputs of the AND gates comprise the level 2 even hit signals L2EH0:12. If all of the level 2 even hit signals are equal to ONE then a determination has been made that the data word addressed by the even physical address number EPAD0:22 is resident in the level 2 even data store 713.

Figure 65A:
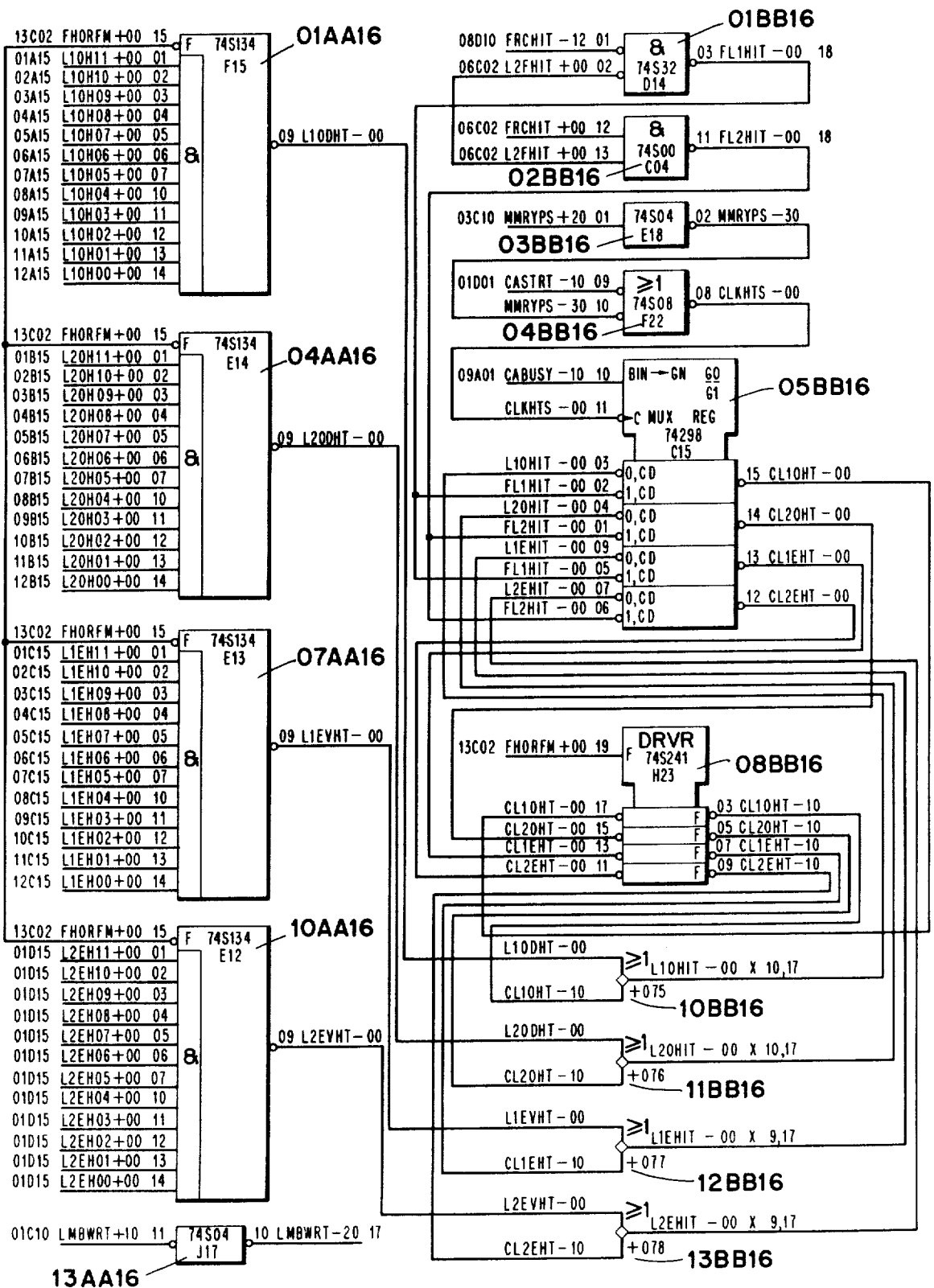
Figure 65:
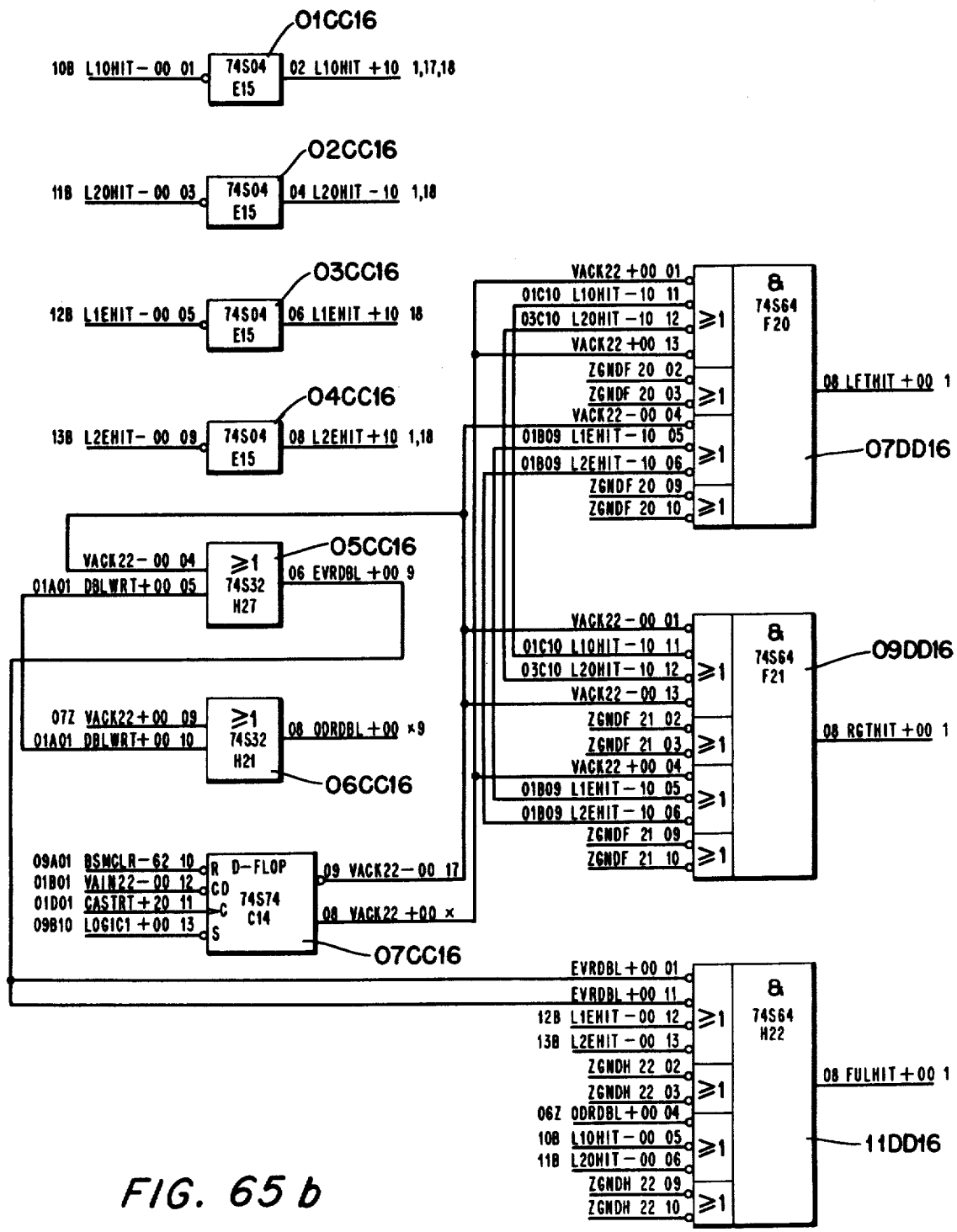
Figure 66A:
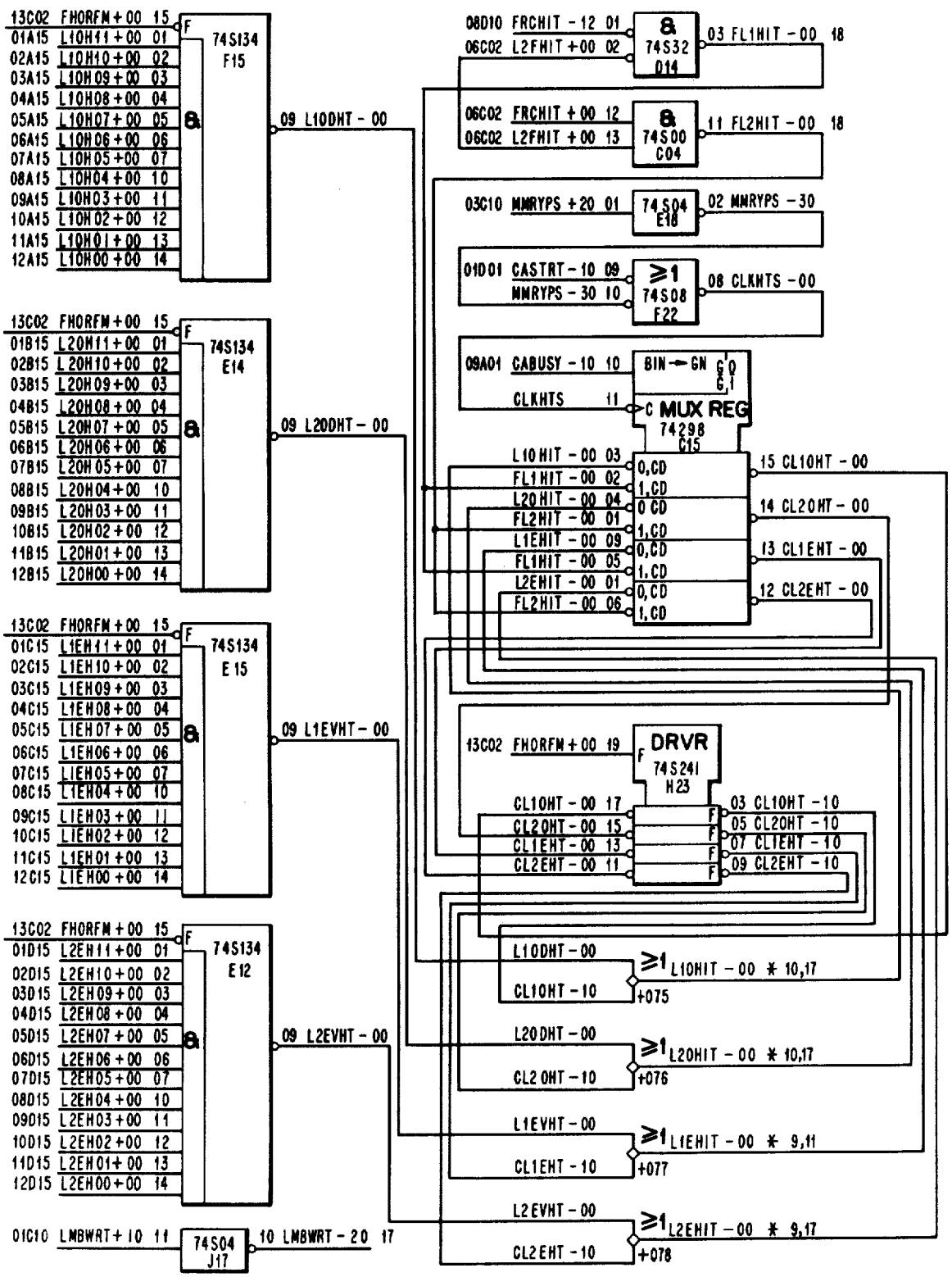
Figure 66B:
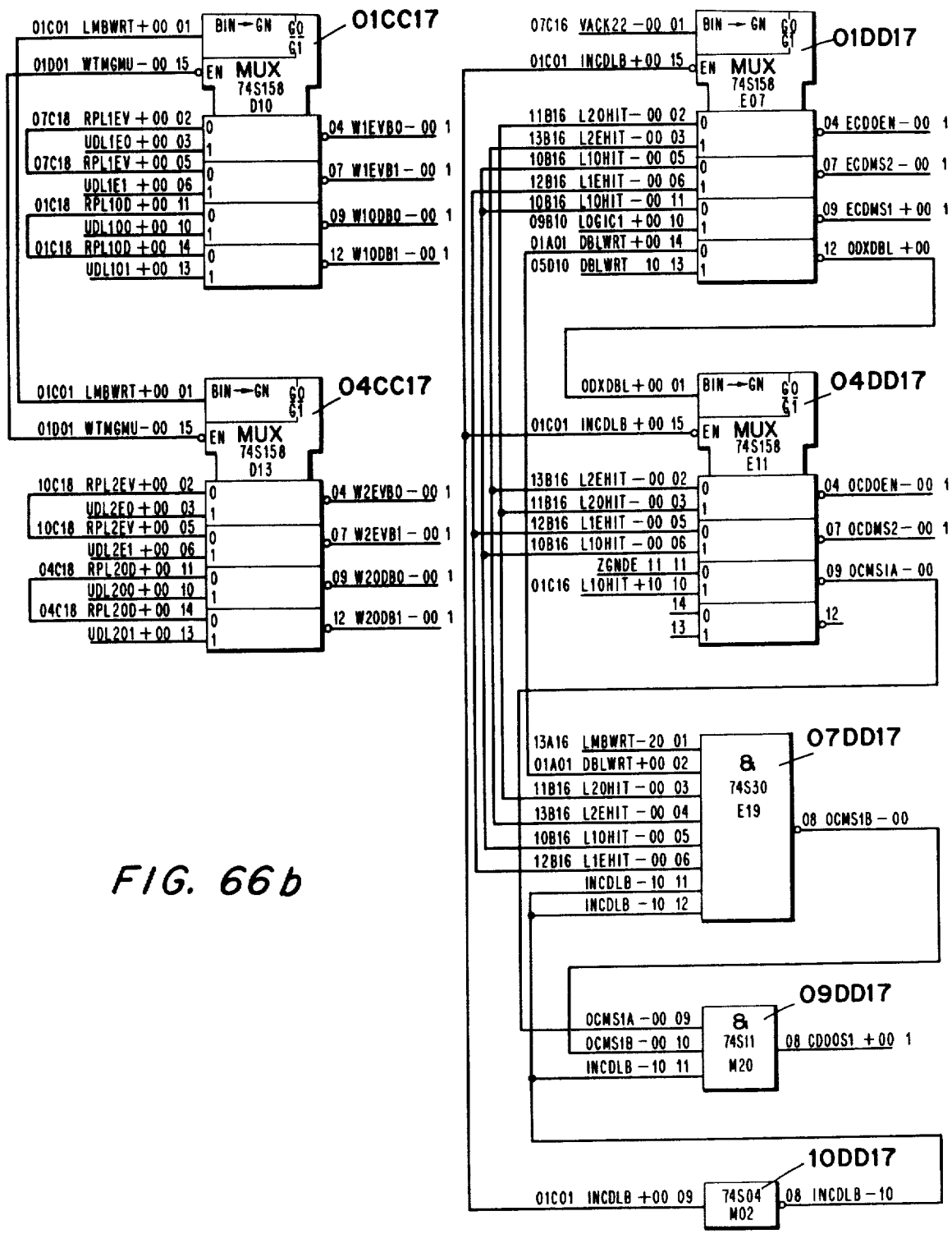

FIGS. 65(a) and 65(b) illustrate an embodiment of the hit detector 795. The 12 input AND gate 01AA16 determines whether a hit has been detected in the level 1 odd data store 711. The AND gate receives the input signals L1OH00:12 and, as mentioned above, if all of the signals are equal to ONE it is determined that an address data word is currently resident in the level 1 odd data store 711. This cause the generation of the level 1 odd hit signal, L1ODHT.

Similarly, the 12 input AND gate 04AA16 determines whether the requested data word is resident in the level 2 odd data store 715. This AND gate receives the input signals L2OH00:12 which, if true, will cause L2ODHT to be generated, signalling that a hit has occurred in the level 2 odd data store 715.

The twelve-input AND gates 07AA16 and 10AA16 perform similar functions for the level 1 and level 2 even data stores 709 and 713, respectively. If the output, L1EVHT, of the AND gate 07AA16 is true, then the addressed data word is resident in the level 1 even data store 709. Finally, the AND gate 10AA16 generates the level 2 even hit signal, L2EVHT, whenever a hit has been detected in the level 2 even directory.

The outputs of the AND gates 01AA16, 04AA16, 07AA16, and 10AA16 are supplied to OR gates 10BB16, 11BB16, 12BB16, and 13BB16, respectively. These OR gates generate the signals L1OHIT, L2OHIT, L1EHIT, and L2EHIT, designating hits in the level 1 odd data store, level 2 odd data store, level 1 even data store, and level 2 even data store, respectively.

The outputs of the OR gates are supplied as inputs to a multiplexer circuit chip 05BB16 comprising 4 2×1 multiplexers. This multiplexer circuit chip 05BB16 is an interface between the cache directory subsystem and the diagnostic mode subsystem. The other four inputs to the four multiplexers are the outputs, FL1HIT and FL2HIT, of the AND gates 01BB16 and 02BB16.

The AND gate 01BB16 supplies the force level 1 hit signal, FL1HIT, equal to ONE whenever the force hit diagnostic mode signal, FRCHIT, supplied by inverter 08DD10 (FIG. 68) is equal to ONE and the level two force hit diagnostic mode signal, L2FHIT, as supplied by the mode register 06CC02, is equal to ZERO.

Similarly, the AND gate 02BB16 generates the force level 2 hit signal, FL2HIT, equal to ONE in response to the simultaneous occurrence of the force hit signal, FRCHIT, and the level 2 force hit signal, L2FHIT, supplied by the mode register 06CC02 of the diagnostic subsystem to the AND gate 02BB16.

Thus, the multiplexer circuit chip 05BB16 is capable of generating the level 1 and level 2 even and odd hit signals in response to the detection of actual hits in the cache directory subsystem or in response to the operation of the diagnostic mode subsystem. The inverter circuits 01CC16, 02CC16, 03CC16, and 04CC16 of FIG. 65(b) invert values of the L1OHIT, L2OHIT, L1EHIT, and L2EHIT, signals.

The three four-way selectors also illustrated in FIG. 65(b) generate the signals LFTHIT, RGTHIT, and FULHIT, respectively signifying that the high order requested data word, low order requested data word, or both requested data words are currently resident in the cache. The four-way selector 07DD16 receives as inputs signals VACK22— and VACK22+ which are the outputs of the delay flip-flop 07CC16. If VAIN22 is equal to ONE, signifying that the high order requested data word is identified by an odd address number, VACK22+ will be generated equal to ONE at the inverting output of the delay flip-flop 07CC16.

The first of the OR gates included in the four-way selector 07DD16 receives as inputs the signals VACK22, L1OHIT, and L2OHIT. A second of the OR gates included in the four-way selector 07DD16 receives as inputs VACK22, L1EHIT, and L2EHIT. The other two OR gates included in the four-way selector 07DD16 are wired to generate outputs of ONE on a continuous basis.

In operation, if the least significant bit of the virtual address, VAIN22, is odd then a left hit can be detected only if either L1OHIT or L2OHIT is equal to ONE.

The four-way selector 09DD16 operates in the same manner as the four way selector 07DD16, except that the polarity of the VACK22 signals is inverted. Thus, RGTHIT will be equal to ONE to indicate that the low order requested data word has been detected in the odd data store if either L1OHIT or L2OHIT is equal to ONE simultaneously with VAIN22 being equal to ZERO. The second case that the RGTHIT signal will be equal to ONE is if either L1EHIT or L2EHIT is true and VAIN22 is equal to ONE. This combination of signal values necessarily means that the requested low order data word is resident in the data storing subsystem of the cache memory.

The OR gates 05CC16 and 06CC16 generate the signals EVRDBL and ODRDBL, respectively. These are enable signals to two of the OR gates included in the four-way selector 11DD16. The signal EVRDBL, as generated by the OR gate 05CC16, will be equal to ONE if the virtual address is even or if the double write signal, DBLWRT, is equal to ONE. The converse is true for the ODRDBL signal generated by the OR gate 06CC16. The signals EVRDBL and ODRDBL are supplied to the OR gates included in the four-way selector 11DD16 as illustrated in FIG. 65(b). The OR gate which receives the signal EVRDBL will generate a ONE if either of the signals L1EHIT or L2EHIT is equal to ONE.

Similarly, the OR gate receiving ODRDBL will generate a ONE output signal if either L1OHIT or L2OHIT is equal to ONE.

The four-way selector 11DD16 will set the full hit signal, FULHIT, to ONE if a double-word access has been requested and a hit has been detected in both the even and odd cache directories, or if a single-word access has been requested and the appropriate (even or odd) directory has signalled a hit.

FIGS. 66(a), 66(b), 67(a), and 67(b) illustrate an embodiment of the cache update logic 797 (FIG. 19(b)). The circuitry illustrate in FIGS. 66(a) and 66(b) generates the control signals for the data storing subsystem of the cache memory.

Data words will be written into the level 1 and level 2 even and odd data stores under two conditions. The first condition is that a data word currently stored in the data storing subsystem is to be updated, i.e., new data is to be stored that is identified by the same address number. In such a case, there is no need to update the cache directory subsystem but only to change information stored in the data storing subsystem. The second motivation for writing into the data storing subsystem is when a data word is to be replaced by another data word identified by a different address number. As mentioned above, a different plurality of system memory locations map to each of the data storage locations in the level 1 and level 2 even and odd data stores. Thus, it will be necessary to replace one data word with a different data word, depending upon the nature of a memory request, i.e. when the storage location in the level 1 and level 2 data stores associated with a particular system memory location both are storing data words.

When a data word stored in the data storing subsystem is being replaced, it is also necessary to replace the address information stored in the associated location in the cache directory subsystem. Moreover, since data words are written into the data stores on a byte basis, eight write enable signals are necessary in order to write into the first and second bytes of the level 1 and level 2 odd and even data stores.

The inverter 01AA17 inverts the write directory signal, WRDRTY, and supplies it to one input of an AND gate 02AA17. The other input to the AND gate 02AA17 is the inhibit replace left word signal, IHRPLW, and the output of the AND gate 02AA17 is a new value of the inhibit replace left word signal, IHRPLW—.

The AND gate 03AA17 receives the write directory signal, WRDRTY, and the inhibit replace right word, IHRPRW, and generates the signal IHRPRW—. The AND gate 04AA17 receives the least significant bit of the virtual address, VAIN22, and the IHRPRW— signal as generated by the output of the AND gate 03AA17. The output of the AND gate 04AA17 is the write enable odd byte A signal, WENOSA.

The AND gate 05AA17 also receives the least significant bit of the virtual address number, VAIN22, and the inhibit replace left word signal, IHRPLW—, as generated by the AND gate 02AA17. The AND gate 05AA17 generates the write enable odd byte B signal, WENOSB.

The signals WENOSA and WENOSB are supplied to inputs to the OR gate 06AA17 to generate the write enable odd signal, WNBLOD.

The AND gate 07AA17 receives as inputs the least significant bit of the virtual address number, VAIN22, and the inhibit replace left word, IHRPLW—, signal and generates the write enable even bit A signal, WENESA. The AND gate 08AA17 receives the least significant bit of the virtual address number, VAIN22, and the inhibit replace write word signal, IHRPRW—, and generates the write enable even byte B signal, WENESB. The OR gate 09AA17 receives the signals WENESA and WENSESB and generates the write enable even signal, WNBLEV.

An AND gate 10AA17, an inverter 11AA17, an OR gate 12AA17, and an AND gate 13AA17 cooperate to generate the signals for designating which of the four possible bytes of two data words are to be written. The AND gate 10AA17 receives the byte write signal BYTWRT, and the byte address signal, BYTADR, and generates the odd byte write signal ODBYTW. The inverter 11AA17 inverts the byte write signal, BYTWRT, as an input to OR gate 12AA17 along with the byte address signal, BYTADR, to generate the signal OBARWW. The AND gate 13AA17 generates the right justified data word signal RJSFDW from the inputs double write, DBLWRT, and the QUADWR signal.

The two-way selector 01BB17 generates the update odd byte 0 signal, UPDOB0. The selector includes two OR gates, the first of which receives as inputs the signals WENOSA and DBLWRT. The seocnd OR gate receives the signals WENOSB and ODBYTW. The signal UPDOB0 indicates whether an update is to be made of byte 0, the high order byte of the addressed data word in either the level 1 or level 2 odd data stores.

The two-way selector 02BB17 generates the update odd byte one signal, UPDOB1. The inputs to the selector are the signals WENOSA, RJSFDW, WENOSB, and OBARWW. The output signal UPDOB1, indicates whether an update is to be made of byte 1, the low order byte, of the addressed data word in either the level 1 or level 2 odd data stores.

The two-way selectors 03BB17 and 04BB17 generate the update even byte 0 and byte 1 signals, UPDEB0 and UPDEB1, respectively. The inputs to the two-way selector 03BB17 comprise ODBYTW, WENESA, DBLWRT, and WENESB, and the output, UPDEB0, indicates whether byte 0 of the addressed data word in either the level 1 or level 2 even data stores is to be updated. The two-way selector 04BB17 receives as inputs the signals OBARWW, WENESA, RJSFDW, and WENESB and generates the update even byte 1 signal, UPDEB1, indicating whether byte 1, the low order byte, of the addressed data word in either the level 1 or level 2 even data stores to be updated.

The eight AND gates 05BB17–12BB17 generate the eight update control signals for bytes zero and one of each of the level 1 and level 2 even and odd data stores. For example, the AND gate 05BB17 receives the update odd byte 0 signal, UPDOB0, and the level 1 odd hit signal L1OHIT and generates the update level 1 odd byte 0 signal, UDL1OO. Thus, if a hit has been detected in the level 1 odd directory as indicated by the L1OHIT signal and if byte 0 of the data word in the odd directory is to be updated as indicated by the signal UPDOB0, then UDL1OO will be equal to ONE.

The AND gate 06BB17 generates the update level 1 odd byte 1 signal, UDL1O1, from the input signals UPDOB1 and L1OHIT. The AND gate 07BB17 generates the update level 1 even byte 0 signal, UDL1E0, from the input signals UPDEB0 and L1EHIT. The AND gate 08BB17 generates the update level 1 even byte 1 signal, UDL1E1, from the input signals UPDEB1 and L1EHIT.

The AND gate 09BB17 generates the update level 2 odd byte 0 signal, UDL2O0, from the inputs UPDOB0 and L2OHIT. The AND gate 10BB17 generates the update level 2 odd byte one signal, UDL2O1, from the input signals UPDOB1 and L2OHIT. The AND gate 11BB17 generates the update level 2 even byte 0 signal, UDL2E0, from the input signals UPDEB0 and L2EHIT. Finally, the AND gate 12BB17 generates the update level 2 even byte one signal, UDL2E1, from the input signals UPDEB1 and L2EHIT.

Two multiplexer circuit chips 01CC17 and 04CC17, each including four 2X1 multiplexers, generate the output signals for controlling the writing of byte 0 and byte 1 of the level 1 and level 2 even and odd data stores. For example, the first multiplexer in the multiplexer circuit chip 01CC17 receives as inputs the replace level 1 even byte 0 signal, RPL1EV, and the update level 1 even byte 0 signal, UDL1E0. This multiplexer generates the write level 1 even byte 0 signal, W1EVB0.

The selection of one of the two inputs signals is under the control of the local bus to megabus write signal, LMBWRT. If LMBWRT is equal to ONE, then data is being transferred from the local bus processors to the system memory and, therefore, it can if the addressed data words are resident in the cache memory, an update type of write is to be performed instead of a replace write.

If LMBWRT is equal to ZERO, then data is being transferred from the system memory to the local bus processors and will necessarily be stored in the data storing subsystem of the cache memory. Thus, it may be necessary to replace the data word stored in a particular storage location of the data storing subsystem and a replacement write may be performed. The manner in which the replace control signals, e.g., RPL1EV, RPL1OD, RPL2EV, and RPL2OD, are generated will be explained hereinafter with regard to FIG. 67(a).

The four multiplexers included in the multiplexer circuit chip 04CC17 select between the replace signals RPL2EV, RPL2OD and the update signals UDL2E0, UDL2E1, UDL2O0, and UDL2O1 to generate the output signals W2EVB0, W2EVB1, W2ODB0, and W2ODB1. These write enable output signals are supplied to the random access memory chips illustrated in FIGS. 28(a)–35(b), explained with regard to the data storing subsystem.

The multiplexer circuit chips 01DD17 and 04DD17 generate the previously referenced control signals ECDOEN, ECDMS2, ECDMS1, ODXDBL, OCDOEN, OCDMS2, and OCMS1A. The multiplexer circuit chip 01DD17 is controlled by the selector signal VACK22 generated by the delay flip-flop 07CC16 (FIG. 65(b). If the signal VACK22 is equal to ZERO then the signals ECDOEN, ECDMS2, and ECDMS1 are set equal to the signals L2EHIT, L1EHIT, and ZERO, respectively. However, if the signal VACK22 is ONE then the signals ECDOEN, ECDMS2, and ECDMS1 are set equal to the signals L2OHIT, L1OHIT, and L1OHIT, respectively. The signal ODXDBL is set equal to either the signal DBLWRT or its complement depending upon the value of the signal VACK22. If the signal VACK22 is equal to ZERO then the signal ODXDBL is set equal to the value of the signal DBLWRT. If the signal VACK22 is equal to ONE then the signal ODXDBL is set equal to the inverted value of the siganl DBLWRT.

The multiplexer circuit chip 04DD17 functions in a manner similar to that of the multiplexer circuit chip 01DD17 to set the signals OCDOEN, OCDMS2, and OCMS1A equal to the signals L2EHIT, L1EHIT, and ONE, respectively, when the signal ODXDBL, as supplied by multiplexer circuit chip 01DD17 is equal to ZERO. However, the signals OCDOEN, OCDMS2, and OCMS1A are set to the value of the signals L2OHIT, L1OHIT, and L1OHIT, respectively, when the value of the signal ODXDBL as supplied by the multiplexer circuit chip 01DD17 is equal to ONE.

The inverter 10DD17 generates the inhibit cache data to local bus signal INCDLB and supplies it to one of the inputs of each of the AND gates 09DD17 and 07DD17. The other inputs to the AND gate 07DD17 are the local bus to megabus write signal, LMBWRT, the double write signal, DBLWRT, and the level 2 and level 1 even and odd hit signals, L2OHIT, L2EHIT, L1OHIT, and L1EHIT. The AND gate 07DD17 generates the signal OCMS1B and supplies it to a second of the input terminals of the AND gate 09DD17. The third input terminal of the AND gate 09DD17 receives the output signal OCMS1A of the multiplexer circuit chip 04DD17. The AND gate 09DD17 generates the output signal CDOOS1.

Figure 67A:
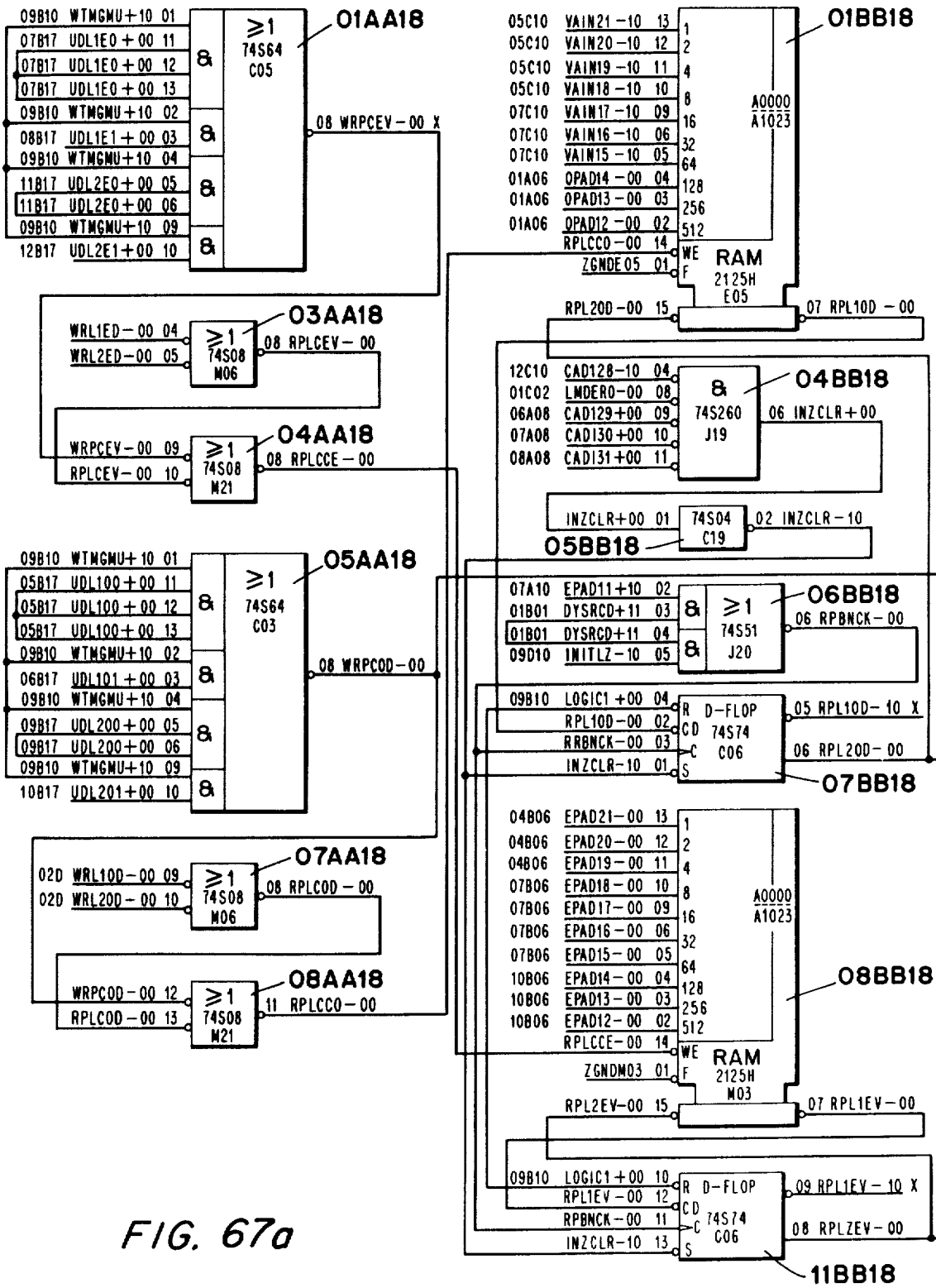
Figure 67B:
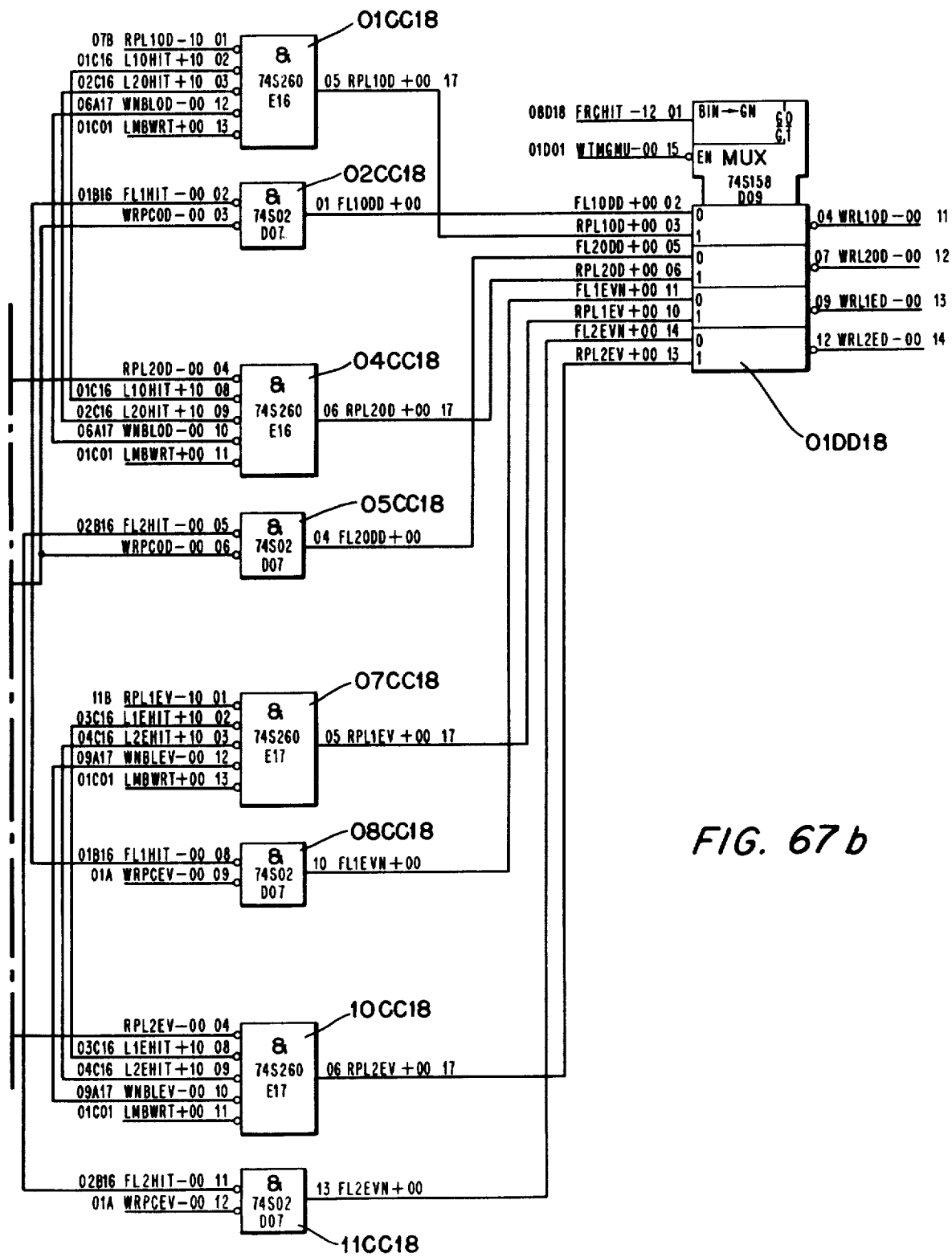

The update circuitry for the cache directory subsystem includes random access memory chips 01BB18 and 08BB18 illustrated in FIG. 67(a). The random access memory chip 01BB18 comprises a 1024×1 random access memory addressed by the odd physical address bits OPAD12:3 and the virtual address bits VAIN15:7. Each of the 1,024 storage locations in the random access memory chip 01BB18 is associated with similarly addressed storage location in the level 1 odd directory 777 and the level 2 odd directory 779. The value stored in a storage location of the random access memory chip 01BB18 indicates whether the similarly addressed storage location in the level 1 odd directory 777 or the level 2 odd directory 779 will be replaced next if a system memory read requires the storing of another data word in the data storing subsystem of the cache memory.

Referring to the capability of the instant cache memory to have a plurality of system memory storage locations map to a particular address number in both the level 1 and level 2 even or odd directories, it will be apparent to one of ordinary skill in the art that if one of the plurality of system memory storage locations is requested to transfer a data word to the cache memory and that data word is not currently stored in the data storing subsystem, then it will be necessary to store the requested data in the corresponding mapping address of either the level 1 or level 2 odd data store. If the addressed storage location in the random access memory chip 01BB18 currently stores a ONE, then the mapping address in the level 2 odd directory 779 is to be replaced next. However, if the addressed storage location in the random access memory chip 01BB18 stores a ZERO then the mapping address in the level 1 odd directory 777 is to be replaced next.

The random access memory chip 01BB18 receives as a data input the output, RPL2OD, of the flip-flop 07BB18. The output of the random access memory chip 01BB18 comprises the replace level 1 odd signal, RPL1OD. The RPL1OD signal is supplied to an input of the flip-flop 07BB18. The set terminal of the flip-flop 07BB18 receives the signal INZCLR from the inverter 05BB18.

The input to the inverter 05BB18 is the output of the five input AND gate 04BB18. The inputs to the AND gate 04BB18 comprise the cache data input signals CADI28:4 and the load mode register signal LMDER0. The flip-flop 07BB18 in combination with the random access memory chip 01BB18 comprise a round robin store for setting the addressed storage locations in the random access memory chip 01BB18 to ZERO or ONE to indicate which of the storage locations in the cache directory subsystem is to be replaced next.

The random access memory chip 08BB18 in combination with the flip-flop 11BB18 comprise a second round robin store for indicating which of similarly addressed storage locations in the level 1 or level 2 even directories in the cache directory subsystem is to be replaced next. The random access memory chip 08BB18 is addressed by the even physical address signals EPAD12:10. The input to the random access memory chip 08BB18 is the output of the flip-flop 11BB18, RPL2EV, and the output of the random access memory chip 08BB18 is the replace level 1 even signal, RPL1EV, which is supplied as an input to the flip-flop 11BB18.

The OR gate 08AA18 generates the replace signal, RPLCCO, which serves as the write enable signal for the random access memory chip 01BB18. The inputs to the OR gate 08AA18 are the replace odd signal, RPLCOD and the write replace odd signal, WRPCOD. The replace odd signal, RPLCOD, is the output of OR gate 07AA18 which receives as inputs the write level 1 odd signal, WRL1OD, and the write level 2 odd signal, WRL2OD, generated by the multiplexer circuit chip 01DD18.

The write replace odd signal, WRPCOD, is the output of the four-way selector 05AA18. The inputs to the first of the AND gates included in the four-way selector 05AA18 are the write memory management unit signal, WTMGMU, which is the output of the driver circuit 09BB18 (FIG. 59(b)) and the update level 1 odd byte 0 signal, UDL1O0. The second AND gate included in the four-way selector 05AA18 receives the write memory management unit signal, WTMGMU, and the update level 1 odd byte 1 signal, UDL1O1. The third of the AND gates included in the four-way selector 05AA18 receives as inputs the write memory management unit signal, WTMGMU, and the update level 2 odd byte 0 signal, UDL2O0. The final AND gate included in the four-way selector 05AA18 receives as inputs the write memory management signal, WTMGMU, and the update level 2 odd byte 1 signal, UDL2O1.

The OR gate 04AA18 generates the replace even signal, RPLCCE, which serves as the write enable signal for the random access memory chip 08BB18. The inputs to the OR gate 04AA18 are the write replace even signal WRPCEV, and the replace even signal, RPLCEV. The replace even signal, RPLCEV, is the output of the OR gate 03AA18 which receives as inputs the write level 1 even directory signal, WRL1ED, and the write level 2 even directory signal, WRL2ED. The write level 1 and level 2 even directory signals are also outputs of the multiplexer circuit chip 01DD18.

The write replace even signal, WRPCEV, is the output of the four-way selector chip 01AA18. The first of the AND gates included in the four-way selector chip 01AA18 receives as inputs the write memory management unit signal, WTMGMU and the update level 1 even byte 0 signal, UDL1E0. The second of the AND gates included in the four-way selector 01AA18 receives as inputs the write memory management unit signal, WTMGMU, and the update level 1 even byte 1 signal, UDL1E1. The third of the AND gates included in the four-way selector chip 01AA18 receives as inputs the write memory management unit signal, WTMGMU, and the update level 2 even byte 0 signal, UDL2E0. The final AND gate included in the four-way selector 01AA18 receives as inputs the write memory management unit signal, WTMGMU, and the update level 2 even byte 1 signal, UDL2E1.

As stated above, the multiplexer circuit chip 01DD18 generates the output signals WRL1OD, WRL2OD, WRL1ED, and WRL2ED. The write level 1 odd signal, WRL1OD, is set equal to the force level 1 odd signal, FL1ODD, or the replace level 1 odd signal, RPL1OD, whenever the force hit signal supplied by the mode register, FRCHIT, is ONE or ZERO, respectively. Similarly, the write level 2 odd directory signal, WRL2OD is set equal to the value of the force level 2 odd signal, FL2ODD, when the force hit signal, FRCHIT, is set equal to ONE or to the value of replace level 2 odd signal, RPL2OD, when the force hit signal, FRCHIT, is equal to ZERO.

The write level 1 even directory signal, WRL1ED, and the write level 2 even directory signal, WRL2ED, are respectively set equal to the force level 1 even signal, FL1EVN, and the force level 2 even signal FL2EVN, when the force hit signal, FRCHIT, is equal to ONE and are set equal to the replace level 1 even signal, RPL1EV, and the replace level 2 even signal, RPL2EV, when the force hit signal, FRCHIT, is set equal to ZERO.

The replace level 1 odd signal is the output of a five input AND gate 01CC18. The AND gate 01CC18 receives as inputs the replace level 1 odd signal, RPL1OD, the level 1 odd hit signal, L1OHIT, the level 2 odd hit signal, L2OHIT, the write enable odd signal, WNBLOD, and the local bus to megabus write signal, LMBWRT. The replace level 1 odd signal, RPL1OD, will be equal to ONE whenever there has been a failure to detect a hit in the level 1 and level 2 odd directories as indicated by the values of L1OHIT and L2OHIT, respectively.

The force level 1 odd signal, FL1ODD, is the output of an AND gate 02CC18 which receives as inputs the force level 1 hit signal, FL1HIT, and the write replace odd signal, WRPCOD. This enables the cache diagnostic subsytem to selectively set the write level 1 odd directory signal, WRL1OD, to either ZERO or ONE depending upon the value of the force level 1 odd signal, FL1ODD. As previously mentioned, in certain operations, the cache diagnostic subsystem will generate signals indicating either a hit or a miss in the cache directory subsystem in order to test and evaluate the operation of the circuitry in the cache directory subsystem, the data storing subsystem, the local bus adapter and the megabus adapter.

The five input AND gate 04CC18 receives the replace level 2 odd signal, RPL2OD, the level 1 and level 2 odd hit signals, L1OHIT and L2OHIT, the write enable odd signal, WNBLOD, and the local bus to memory bus write signal, LMBWRT. If no hit has been detected in the level 1 and level 2 odd directory stores, and the RPLOD signal designates the level 2 odd directory as the next directory for replacement, RPL2OD will be equal to ONE.

The AND gate 05CC18 generates the force level 2 odd signal, FL2ODD, from the inputs FL2HIT and WRPCOD. As was the case with the AND gate 02CC18, the AND gate 05CC18 enables the cache diagnostic subsytem to generate a write level 2 odd directory signal, WRL2OD, equal to ONE or ZERO depending upon whether a diagnostic procedure requires writing into the level 2 odd directory.

The AND gate 07CC18 generates the replace level 1 even signal, RPL1EV from the inputs RPL1EV, the level 1 and level 2 even hit signals, L1EHIT and L2EHIT, the write enable even signal, WNBLEV, and the local bus to megabus write signal, LMBWRT. If a hit has not be detected in the level 1 and level 2 even directories and RPL1EV indicates that the level 1 even directory includes the next mapping address to be replaced, then RPL1EV will be equal ONE. The AND gate 08CC18 generates the force level 1 even signal, FL1EVN, for the same purposes as the AND gate 02CC18 and 05CC18 generate the FL1ODD and FL2ODD signals, except that the cache diagnostic sytem is selectively controlling the replacement of data in the level one even data store.

It will be apparent from the above that the AND gate 10CC18 generates the replace level 2 even signal, RPL2EV, whenever a hit has not been detected in the level 1 and level 2 even directories, as indicated by the signals L1EHIT and L2EHIT, and the level 2 even data store is designated as including the mapping address to be updated next. Similarly, the AND gate 11CC18 enables the cache diagnostic subsystem to generate the force level 2 even signal, FL2EVN, to selectively control the value of the write level 2 even directory signal, WRL2ED.

Figure 68:
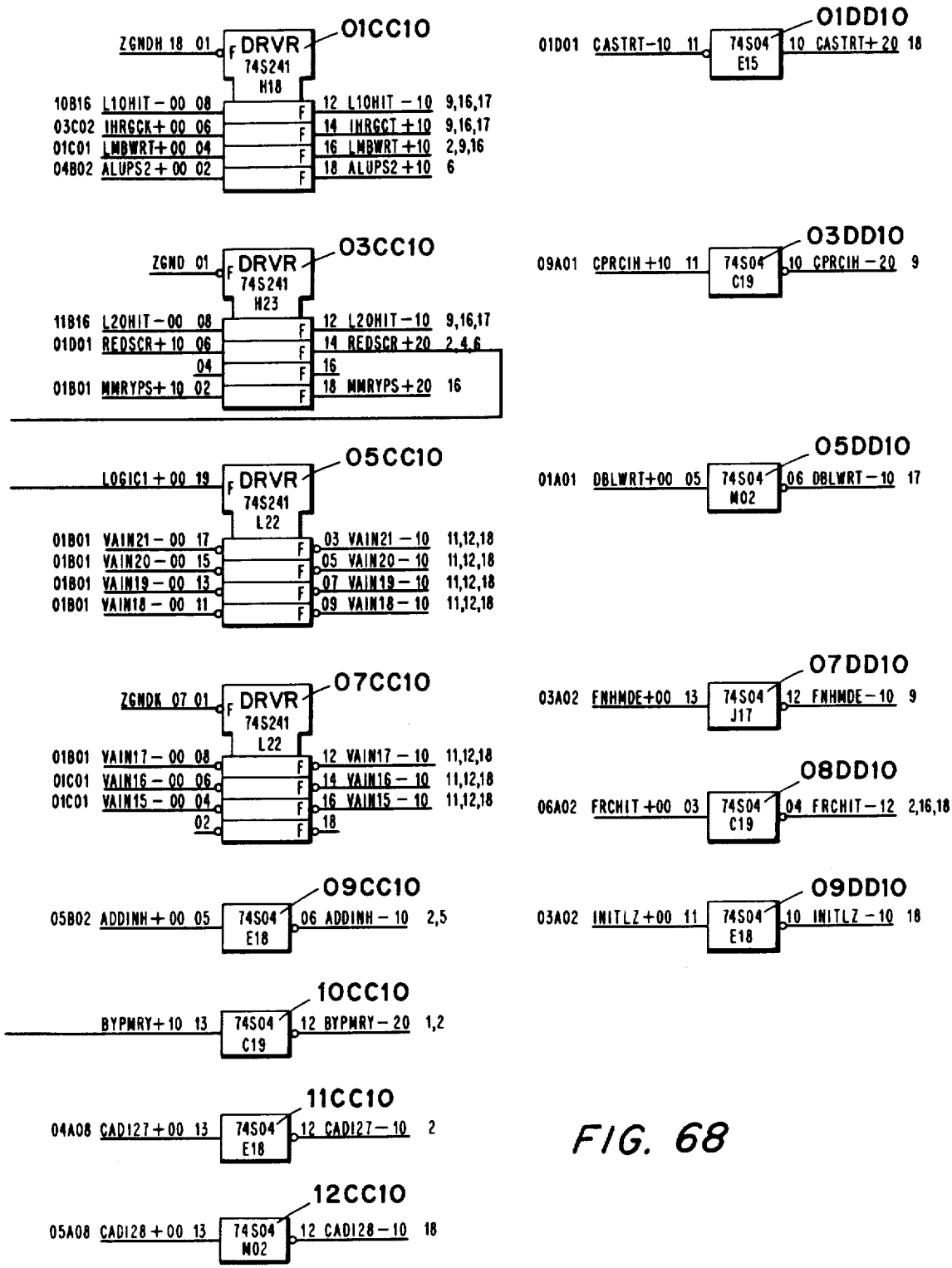

FIG. 68 includes driver circuits 01CC10, 03CC10, 05CC10, and 07CC10 for the virtual address number bits VAIN15:7, and the control signals L1OHIT, IHRGCK, LMBWRT, ALUPS2, L2OHIT, REDSCR, and MMRYP5.

FIG. 68 also illustrates an embodiment of ten inverters which simply generate output signals which are the inverse of the signals received on input. One of ordinary skill in the art would readily recognize the purpose and operation of such inverter circuits.

It will apparent, to those skilled in the art, that modifications and variations can be made in the preferred embodiment disclosed herein without departing from the scope or the spirit of the invention. Thus, it is intended that the present invention include these modifications and variations which come within the scope of the appended claims and their equivalents.

What is claimed is:

1. In a data processing system including a system memory for addressably storing a plurality of data words identified by a like plurality of associated odd and even address numbers, each of the address numbers including a segment portion and an offset portion, and wherein system elements generate memory requests for the transfer of a pair of data words identified by successive address numbers, each memory request including a memory request address number identifying the first of the pair of data words requested, a cache memory comprising;

memory means for storing a selected subset of said data words stored in said system memory and for supplying the requested data words to the requesting system elements in the place of the system memory if the requested data words are stored in said memory means, said memory means including an odd memory module for storing said data words identified by said odd address numbers and an even memory module for separately storing said data words identified by said even address numbers;

means for receiving said data words and said associated addresses from said system memory;

cache data input multiplexer means coupled to said receiving means for supplying said received data words to said odd memory module and to said even memory module;

cache address driver means receiving said addresses associated with said received data words and for controlling said cache data input multiplexer means to supply to said odd memory module said transferred data words having associated odd address numbers and to supply to said even memory module said transferred data words having associated even address numbers;

an odd directory memory for storing said address numbers identifying said data words stored in said odd memory module;

an even directory memory for storing said address numbers identifying said data words stored in said even memory module;

means coupled to said odd directory memory and said even directory memory for receiving each of said address numbers supplied by said system elements and for comparing said memory request address number and said next successive address number to said odd address numbers stored in said odd directory memory and said even address numbers stored in said even directory memory to determine if said data words associated with said memory request address number and said next successive address number are stored in said odd or even memory modules;

hit detector circuit means coupled to said receiving and determining means for generating a full hit signal if both said memory request and said next successive address numbers are determined to be stored in said odd and even directory memories, a partial hit signal if only one of said memory request and said next successive address numbers are determined to be stored in said odd and even directory memories, and a no hit signal if neither said memory request nor said next successive address numbers is determined to be stored in said odd and even directory memories; and diagnostic control means for enabling the testing of operation of said cache memory, said diagnostic control means including means connected to said data input multiplexer for inhibiting the storing of a said data word in said odd memory module or said even memory module and hit detector override means for controlling the generation of said full hit signal, said partial hit signal, and said no hit signal by said hit detector circuit means even when said memory request or said next successive address number is determined to be stored in said odd and even directory memories.

2. In a data processing system including a system memory for addressably storing a plurality of data words identified by a like plurality of associated odd and even address numbers, each of the address numbers including a segment portion and an offset portion, and wherein system elements generate memory requests for the transfer of a pair of data words identified by successive address numbers, each memory request including a memory request address number identifying the first of the pair of data words requested, a cache memory comprising;

memory means for storing a selected subset of said data words stored in said system memory and for supplying the requested data words to the requesting system elements in the place of the system memory if the requested data words are stored in said memory means, said memory means including an odd memory module for storing said data words identified by said odd address numbers and an even memory module for separately storing said data words identified by said even address numbers;

means for receiving said data words and said associated addresses from said system memory;

cache data input multiplexer means coupled to said receiving means for supplying said received data words to said odd memory module and to said even memory module;

cache address driver means receiving said addresses associated with said received data words and for controlling said cache data input multiplexer means to supply to said odd memory module said transferred data words having associated odd address numbers and to supply to said even memory module said transferred data words having associated even address numbers;

an odd directory memory for storing said address numbers identifying said data words stored in said odd memory module;

an even directory memory for storing said address numbers identifying said data words stored in said even memory module;

means coupled to said odd directory memory and said even directory memory for receiving each of said address numbers supplied by said system elements and for comparing said memory request address number and said next successive address number to said odd address numbers stored in said odd directory memory and said even address numbers stored in said even directory memory to determine if said data words associated with said memory request address number and said next successive address number are stored in said odd or even memory modules;

hit detector circuit means coupled to said receiving and determining means for generating a full hit signal if both said memory request and said next successive address numbers are determined to be stored in said odd and even directory memories, a partial hit signal if only one of said memory request and said next successive address numbers are determined to be stored in said odd and even directory memories, and a no hit signal if neither said memory request nor said next successive address numbers is determined to be stored in said odd and even directory memories;

diagnostic control means for enabling the testing of operation of said cache memory, said diagnostic control means including means connected to said data input multiplexer for inhibiting the storing of a said data word in said odd memory module or said even memory module and hit detector override means for controlling the generation of said full hit signal, said partial hit signal, and said no hit signal by said hit detector circuit means, said hit detector override means comprising:

a first register for supplying a false level one hit signal;

a second register for supplying a false level two hit signal; and means for supplying said false level one hit signal to said hit detector circuit means as an indication that said data word associated with said memory request address number is stored in said odd or even memory module and said false level two hit signal to said hit detector circuit means as an indication that said data word associated with said next successive address number is stored in said odd or even memory module.

3. A cache memory according to claim 1 wherein said inhibiting means comprises:

a write inhibit register for supplying a cache write inhibit signal; and address driver control means for receiving said cache write inhibit signal and for controlling said cache data input multiplexer means to prevent the supplying of said received pair of data words to said odd memory module and said even memory module.

4. A cache memory according to claim 1 wherein said odd memory module comprises a first odd data random access memory for storing said data words associated with said odd address numbers in a plurality of first odd storage locations, each said first odd storage location being addressable by said offset portion of said address number associated with said data word stored therein, and a second odd data random access memory for storing data words associated with said odd address numbers in a plurality of second odd storage locations, each said second odd storage location being addressable by said offset portion of said address number associated with said data word stored therein, each said first odd storage location being associated with a different one of said second odd storage locations, each said associated first and second odd storage locations being identified by a plurality of odd system address numbers having identical offset portions.

5. A cache memory according to claim 4 wherein said even memory module comprises a first even data random access memory for storing data words associated with said even address numbers in a plurality of first even storage locations, each said first even storage location being addressable by said offset portion of said address number associated with said data word stored therein, and a second even data random access memory for storing data words associated with said even address numbers in a plurality of second even storage locations, each said second even storage location being addressable by said offset portion of said address number associated with said data word stored therein, each said first even storage location being associated with a different one of said second even storage locations, each said associated first and second even storage locations being identified by a plurality of even system address numbers having identical offset portions.

6. A cache memory according to claim 5 wherein said odd directory memory comprises a first odd directory random access memory for storing the address segment portions of said address numbers associated with said data words stored in said first odd data random access memory in a plurality of first odd directory storage locations, each said first odd directory storage location being addressable by said address offset portion associated with said address segment portion stored therein, and a second odd directory random access memory for storing the address segment portions of said address numbers associated with said data words stored in said second data random access memory in a plurality of second odd directory storage locations, each said second odd directory storage location being addressable by said address offset portion associated with said address segment portion stored therein, each said first odd directory storage location being associated with a different one of said second odd directory storage locations, each said associated first and second odd directory storage locations being identified by a plurality of odd system address numbers having identical offset portions.

7. A cache memory according to claim 6 wherein said even directory memory comprises a first even directory random access memory for storing the address segment portions of said address numbers associated with said data words stored in said first even data random access memory in a plurality of first even directory storage locations, each of said first even directory storage locations being addressable by a said address offset portion associated with said address segment portion stored therein, and a second even directory random access memory for storing the memory segment portions of said address numbers associated with said data words stored in said second even data random access memory in a plurality of second even directory storage locations, each said second even directory storage location being addressable by a said address offset portion associated with said address segment portion stored therein, each of said first even directory storage locations being associated with a different one of said second even directory storage locations, each said associated first and second even directory storage locations being identified by a plurality of even system address numbers having identical offset portions.

8. A cache memory according to claim 7 further including cache update logic means comprising:

an odd update random access memory having a plurality of update storage locations, each said update storage location being associated with one of said associated pairs of first and second odd directory storage locations and being addressed by the offset portion of a said memory request address number, each said update storage location for storing an odd module update signal having a first value to designate said associated first odd directory storage location as the one to be updated if a said data word identified by a said system memory address number associated with said pair of associated first and second odd directory storage locations is to be stored in said cache memory or a second value to designate said associated second odd directory storage location as the one to be updated if said data word identified by said system memory address number associated with said pair of associated first and second odd directory storage locations is to be stored in said cache memory.

9. A cache memory according to claim 8 wherein said cache update logic further includes:

an even update random access memory having a plurality of even update storage locations, each said even update storage location being associated with one of said associated pairs of first and second directory storage locations and being addressed by the offset portion of a said memory request address number, each said even update storage location for storing an even module update signal having a first value to designate said associated first even directory storage location as the one to be updated if a said data word identified by a said system memory address number associated with said pair of associated first and second even directory storage locations is to be stored in said cache memory or a second value to designate said associated second even directory storage location as the one to be updated if a said data word identified by a said system memory address number associated with said pair of associated first and second even directory storage locations is to be stored in said cache memory.

10. A cache memory according to claim 9 further including cache update control means for addressing said even update storage locations in said even update random access memory and said odd update storage locations in said odd update random access memory responsive to said offset portions of said memory request address number and said next successive address number being even or odd, respectively, and for controlling said cache address driver means to enable the storing of said data words associated with said memory request address number and said next successive address number in said even and odd memory modules responsive to said even module update signal and said odd module update signal, respectively.

11. In a data processing system including a system memory for addressably storing a plurality of data words identified by a like plurality of associated odd and even address numbers, each of the address numbers including a segment portion and an offset portion and wherein system elements generate memory requests for the transfer of a pair of data words identified by successive address numbers, each memory request including a memory request address number identifying the first of the pair of data words requested, a cache memory comprising;

memory means for storing a selected subset of said data words stored in said system memory and for supplying the requested data words to the requesting system elements in the place of the system memory if the requested data words are stored in said memory means, said memory means including an odd memory module for storing said data words identified by said odd address numbers and an even memory module for separately storing said data words identified by said even address numbers;

means for receiving said data words and said associated addresses from said system memory;

cache data input multiplexer means coupled to said receiving means for supplying said received data words to said odd memory module and to said even memory module;

cache address driver means receiving said addresses associated with said received data words and for controlling said cache data input multiplexer means to supply to said odd memory module said transferred data words having associated odd address numbers and to supply to said even memory module said transferred data words having associated even address numbers;

an odd directory memory for storing said address numbers identifying said data words stored in said odd memory module;

an even directory memory for storing said address numbers identifying said data words stored in said even memory module;

means coupled to said odd directory memory and said even directory memory for receiving each of said address numbers supplied by said system elements and for comparing said memory request address number and said next successive address number to said odd address numbers stored in said odd directory memory and said even address numbers stored in said even directory memory to determine if said data words associated with said memory request address number and said next successive address number are stored in said odd or even memory modules;

hit detector circuit means coupled to said receiving and determining means for generating a full hit signal if both said memory request and said next successive address numbers are determined to be stored in said odd and even directory memories, a partial hit signal if only one of said memory request and said next successive address numbers are determined to be stored in said odd and even directory memories, and a no hit signal if neither said memory request nor said next successive address numbers is determined to be stored in said odd and even directory memories;

diagnostic control means for enabling the testing of operation of said cache memory, said diagnostic control means including means connected to said data input multiplexer for inhibiting the storing of a said data word in said odd memory module or said even memory module and hit detector override means controlling the generation of said full hit signal, said partial hit signal, and said no hit signal by said hit detector circuit means;

said diagnostic control means further including:
a replacement control register for providing an inhibit replacement signal; and
cache update replacement inhibit means responsive to said inhibit replacement signal to disable said cache update control means from controlling said cache address driver means to enable the storing of said data words associated with said memory request address number and said next successive address number in said even and odd memory modules responsive to said even module update signal and said odd module update signal, respectively.

12. A cache memory according to claim 11 wherein said diagnostic control means includes:

an initialize register for supplying a cache initialize signal; and cache initialize control means responsive to said cache initialize signal for addressing selected data words in said system memory to transfer said selected data words to said receiving means and for controlling said cache address driver means to control the supplying of said received selected data words to said odd and even memory modules for storing therein.

* * * * *